(12) United States Patent
Hatakeyama

(10) Patent No.: US 9,360,753 B2
(45) Date of Patent: Jun. 7, 2016

(54) RESIST COMPOSITION AND PATTERNING PROCESS

(75) Inventor: Jun Hatakeyama, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 61 days.

(21) Appl. No.: 13/542,014

(22) Filed: Jul. 5, 2012

(65) Prior Publication Data

US 2013/0029270 A1   Jan. 31, 2013

(30) Foreign Application Priority Data

Jul. 25, 2011   (JP) ................................ 2011-161640

(51) Int. Cl.
  *G03F 7/004* (2006.01)
  *G03F 7/039* (2006.01)

(52) U.S. Cl.
  CPC ............ *G03F 7/0043* (2013.01); *G03F 7/0045* (2013.01); *G03F 7/0046* (2013.01); *G03F 7/0392* (2013.01); *G03F 7/0397* (2013.01)

(58) Field of Classification Search
  None
  See application file for complete search history.

(56) References Cited

U.S. PATENT DOCUMENTS

| | | | |
|---|---|---|---|
| 5,415,749 A * | 5/1995 | Hamilton ...................... 204/492 |
| 5,879,851 A | 3/1999 | Takahashi et al. |
| 5,989,776 A * | 11/1999 | Felter et al. ................ 430/270.1 |
| 6,312,867 B1 | 11/2001 | Kinsho et al. |
| 6,448,420 B1 | 9/2002 | Kinsho et al. |
| 6,485,883 B2 | 11/2002 | Kodama et al. |
| 6,746,817 B2 | 6/2004 | Takeda et al. |
| 7,449,277 B2 | 11/2008 | Hatakeyama et al. |
| 7,482,108 B2 | 1/2009 | Matsumaru et al. |
| 7,501,223 B2 | 3/2009 | Takeda et al. |
| 7,537,880 B2 | 5/2009 | Harada et al. |
| 7,569,326 B2 | 8/2009 | Ohsawa et al. |
| 7,598,016 B2 | 10/2009 | Kobayashi et al. |
| 7,771,914 B2 | 8/2010 | Hatakeyama et al. |
| 8,288,076 B2 | 10/2012 | Masunaga et al. |
| 2004/0197702 A1 * | 10/2004 | Shirakawa et al. ......... 430/270.1 |
| 2004/0260031 A1 | 12/2004 | Takeda et al. |
| 2007/0231738 A1 | 10/2007 | Kaneko et al. |
| 2008/0090172 A1 | 4/2008 | Hatakeyama et al. |
| 2008/0096128 A1 | 4/2008 | Takeda et al. |
| 2008/0096131 A1 | 4/2008 | Hatakeyama et al. |
| 2008/0214011 A1 | 9/2008 | Colburn et al. |
| 2008/0241736 A1 | 10/2008 | Kobayashi et al. |
| 2008/0311507 A1 | 12/2008 | Isono et al. |
| 2009/0233223 A1 * | 9/2009 | Tachibana et al. ......... 430/270.1 |
| 2009/0269696 A1 * | 10/2009 | Ohsawa et al. ............ 430/270.1 |
| 2009/0274978 A1 | 11/2009 | Ohashi et al. |
| 2009/0317742 A1 * | 12/2009 | Toriumi et al. ............ 430/270.1 |
| 2010/0035185 A1 | 2/2010 | Hagiwara et al. |
| 2010/0159392 A1 | 6/2010 | Hatakeyama et al. |
| 2010/0304302 A1 | 12/2010 | Masunaga et al. |
| 2010/0316955 A1 * | 12/2010 | Masunaga et al. ......... 430/285.1 |
| 2011/0212391 A1 | 9/2011 | Masunaga et al. |
| 2011/0294070 A1 | 12/2011 | Hatakeyama et al. |
| 2012/0108043 A1 | 5/2012 | Hatakeyama et al. |
| 2012/0135349 A1 | 5/2012 | Hatakeyama et al. |
| 2012/0202153 A1 | 8/2012 | Hatakeyama |

FOREIGN PATENT DOCUMENTS

| | | | |
|---|---|---|---|
| EP | 0473547 A1 | 3/1992 |
| EP | 2090931 A1 | 8/2009 |
| EP | 2112554 A2 | 10/2009 |
| JP | 53126929 A * | 11/1978 |
| JP | 58202441 A * | 11/1983 |
| JP | 4-230645 A | 8/1992 |
| JP | 9-309874 A | 12/1997 |
| JP | 2000-327633 A | 11/2000 |
| JP | 2000-336121 A | 12/2000 |
| JP | 2001-281849 A | 10/2001 |
| JP | 2001-329228 A | 11/2001 |
| JP | 3429592 B2 | 7/2003 |
| JP | 2004-115630 A | 4/2004 |
| JP | 2004-175755 A | 6/2004 |
| JP | 2005-008766 A | 1/2005 |
| JP | 2005-084365 A | 3/2005 |
| JP | 2006-045311 A | 2/2006 |
| JP | 2006-169302 A | 6/2006 |
| JP | 2006-178317 A | 7/2006 |
| JP | 3865048 B2 | 1/2007 |
| JP | 2007-114728 A | 5/2007 |
| JP | 2007-297590 A | 11/2007 |
| JP | 2008-095009 A | 4/2008 |

(Continued)

OTHER PUBLICATIONS

Translation of JP 53-126929. Nov. 6, 1978.*
Machine translation JP 2010-152136. Jul. 8, 2010.*
Translation JP 58-202441. Nov. 25, 1983.*
Bodner Research Web, Transition Metals, Purdue Chem, http://chemed.chem.purdue.edu/genchem/topicreview/bp/ch12/trans.php, access date Jan. 26, 2014.*
Kishikawa et al., "Assessment of trade-off between resist resolution and sensitivity for optimization of hyper-NA immersion lithography", Proc. of SPIE, 2007, pp. 65203L1-L9, vol. 6520.
Hinsberg et al., "Extendibility of Chemically Amplified Resists: Another Brick wall?", Proc. of SPIE, 2003, pp. 1-14, vol. 5039.

(Continued)

*Primary Examiner* — Cynthia H Kelly
*Assistant Examiner* — Alyssa L Cepluch
(74) *Attorney, Agent, or Firm* — Westerman, Hattori, Daniels & Adrian, LLP

(57) ABSTRACT

A resist composition is provided comprising a (co)polymer comprising recurring units of acid labile group-substituted (meth)acrylic acid, styrenecarboxylic acid or vinylnaphthalenecarboxylic acid and/or recurring units having an acid labile group-substituted phenolic hydroxyl group, an acid generator, and a metal salt of carboxylic acid or a metal complex of β-diketone. Due to a high contrast of alkaline dissolution rate before and after exposure, high resolution, high sensitivity, and controlled acid diffusion rate, the composition forms a pattern with satisfactory profile and minimal LER.

8 Claims, No Drawings

(56) References Cited

FOREIGN PATENT DOCUMENTS

| | | | |
|---|---|---|---|
| JP | 2008-111103 A | 5/2008 | |
| JP | 2008-122932 A | 5/2008 | |
| JP | 2008102383 A | 5/2008 | |
| JP | 2008-133448 A | 6/2008 | |
| JP | 2008-239918 A | 10/2008 | |
| JP | 2009-007327 A | 1/2009 | |
| JP | 2009-019199 A | 1/2009 | |
| JP | 2009-237150 A | 10/2009 | |
| JP | 2009-269953 A | 11/2009 | |
| JP | 2010-152136 A | 7/2010 | |
| JP | 2010152136 A | * | 7/2010 |
| WO | 2010-026973 A1 | 3/2010 | |
| WO | 2010-119910 A1 | 10/2010 | |
| WO | 2010-150917 A1 | 12/2010 | |

OTHER PUBLICATIONS

European Search Report dated May 30, 2011, issued in corresponding European Patent Application No. 11001592.2 (7 pages).

Guerrero, Douglas et al., "A New Generation of Bottom Anti-Reflective Coatings (BARCs): Photodefinable BARCs", Proceedings of SPIE, 2003, p. 129-135, vol. 5039.

Meador, Jim et al., "Development of 193-nm wet BARCs for implant applications", Proceedings of SPIE, 2006, p. 61532P10, vol. 61532.

Brainard, Robert et al., "Shot Noise, LER and Quantam Efficiency of EUV Photoresists", Proc. of SPIE, 2004, pp. 74-85, vol. 5374.

Chae et al., "Preparation of Chemically Amplified Photoresists with N-hydroxyphthalimide Styrenesulfonate groups and Their Properties," Journal of Photopolymer Science and Technology, vol. 7, No. 1), p. 183-186, 1994.

Kozawa, Takahiro et al., "Basic aspects of acid generation processes in chemically amplified resists for electron beam lithography", Proc. of SPIE, 2005, pp. 361-367, vol. 5753.

Nakano, Atsuro et al., "Deprotonation mechanism of poly(4-hydroxystyrene) and its derivative", Proc. of SPIE, 2005, pp. 1034-1039, vol. 5753.

Hutchinson, John M., "The Shot Noise Impact on Resist Roughness in EUV Lithography", Proc. of SPIE, 1998, pp. 531-536, vol. 3331.

Wang, Mingxing et al., "Novel Anionic Photoacid Generator (PAGs) and Photoresist for sub-50 nm Patterning by EUVL and EBL", Proc. of SPIE, 2007, pp. 6519F1-F6, vol. 6519.

* cited by examiner

RESIST COMPOSITION AND PATTERNING PROCESS

CROSS-REFERENCE TO RELATED APPLICATION

This non-provisional application claims priority under 35 U.S.C. §119(a) on Patent Application No. 2011-161640 filed in Japan on Jul. 25, 2011, the entire contents of which are hereby incorporated by reference.

TECHNICAL FIELD

This invention relates to a resist composition, and more particularly to a chemically amplified positive resist composition adapted for the EB and EUV lithography processes; and a patterning process using the same.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, manufacturing of microelectronic devices at the 65-nm node by the ArF lithography has been implemented in a mass scale. Manufacturing of 45-nm node devices by the next generation ArF immersion lithography is approaching to the verge of high-volume application. The candidates for the next generation 32-nm node include ultra-high NA lens immersion lithography using a liquid having a higher refractive index than water in combination with a high refractive index lens and a high refractive index resist film, EUV lithography of 13.5 nm wavelength, and double patterning version of the ArF lithography, on which active research efforts have been made.

The current technology is approaching to the processing size which is reduced below 50 nm as minimum line width. When the processing size is so reduced, the thickness of resist film must be reduced below 100 nm, depending on the surface material of the substrate to be processed, because of such factors as the structural strength to maintain the pattern against the surface tension of developer and the adhesion strength to the substrate. On use of prior art chemically amplified resist materials intended to form high-resolution resist film, for example, based on a base resin having an acetal protective group, no significant degradation of line edge roughness (LER) does occur with a resist film having a thickness of 150 nm, but LER is substantially exacerbated when the film thickness is reduced below 100 nm.

With respect to high-energy radiation of very short wavelength such as EB or x-ray, hydrocarbons and similar light elements used in resist materials have little absorption. Then polyhydroxystyrene base resist materials are under consideration. Resist materials for EB lithography are practically used in the mask image writing application. Recently, the mask manufacturing technology becomes of greater interest. Reduction projection exposure systems or steppers have been used since the time when the exposure light was g-line. While their demagnification factor was 1/5, a factor of 1/4 is now used as a result of chip size enlargement and projection lens diameter increase. It becomes of concern that a dimensional error of a mask has an impact on the dimensional variation of a pattern on wafer. It is pointed out that as the pattern feature is reduced, the value of a dimensional variation on the wafer becomes greater than the value of a dimensional error of the mask. This is evaluated by a mask error enhancement factor (MEEF) which is a dimensional variation on wafer divided by a dimensional error of mask. Patterns on the order of 45 nm often show an MEEF in excess of 4. In a situation including a demagnification factor of 1/4 and a MEEF of 4, the mask manufacture needs an accuracy substantially equivalent to that for equi-magnification masks.

The exposure system for mask manufacturing made a transition from the laser beam exposure system to the EB exposure system to increase the accuracy of line width. Since a further size reduction becomes possible by increasing the accelerating voltage of the electron gun in the EB exposure system, the accelerating voltage increased from 10 keV to 30 keV and reached 50 keV in the current mainstream system, with a voltage of 100 keV being under investigation.

As the accelerating voltage increases, a lowering of sensitivity of resist film becomes of concern. As the accelerating voltage increases, the influence of forward scattering in a resist film becomes so reduced that the contrast of electron image writing energy is improved to ameliorate resolution and dimensional control whereas electrons can pass straightforward through the resist film so that the resist film lowers its sensitivity. Since the mask exposure tool is designed for exposure by direct continuous writing, a lowering of sensitivity of resist film leads to an undesirably reduced throughput. Due to a need for higher sensitivity, chemically amplified resist compositions are contemplated.

As the feature size is reduced, image blurs due to acid diffusion become a problem (see Non-Patent Document 1). To insure resolution for fine patterns with a size of 45 nm et seq., not only an improvement in dissolution contrast is requisite, but control of acid diffusion is also important (see Non-Patent Document 2). Since chemically amplified resist compositions are designed such that sensitivity and contrast are enhanced by acid diffusion, an attempt to minimize acid diffusion by reducing the temperature and/or time of post-exposure bake (PEB) fails, resulting in drastic reductions of sensitivity and contrast.

Addition of an acid generator capable of generating a bulky acid is effective for suppressing acid diffusion. It is then proposed to copolymerize a polymer with an acid generator in the form of an onium salt having polymerizable olefin. Patent Documents 1 to 3 disclose sulfonium salts having polymerizable olefin capable of generating a sulfonic acid and similar iodonium salts. Patent Document 1 discloses a polymer-bound sulfonium salt in which sulfonic acid is directly attached to the backbone.

The EB writing of a resist film encounters a problem that the point of writing is shifted by electrostatic charges on the resist film. It is proposed to overlay the resist film with an antistatic film to prevent the resist film from being charged. Undesirably coating of the antistatic film adds to the cost of the overall process.

It was avoided to use metal-containing materials as the photoresist material for the semiconductor lithography because of a possible malfunction of semiconductor devices. However, it is known in the application other than the semiconductor, for example, as the resist material for forming color filters for LCD (see Patent Document 2), to use a metal-containing (meth)acrylate as a copolymerizable monomer. The metal-containing (meth)acrylate is typically contemplated as the antifouling paint for ships. Patent Document 3 shows many examples such as zinc acrylate, copper acrylate and magnesium acrylate.

Patent Document 4 discloses EB resist and antistatic film having alkali metal, alkaline earth metal and cesium salts added thereto. These salts improve the sensitivity on EB exposure at no sacrifice of resolution.

CITATION LIST

Patent Document 1: JP-A 2006-178317
Patent Document 2: JP-A 2009-237150
Patent Document 3: JP-A 2001-329228
Patent Document 4: JP-A 2010-152136
Non-Patent Document 1: SPIE Vol. 5039 μl (2003)
Non-Patent Document 2: SPIE Vol. 6520 p65203L-1 (2007)

DISCLOSURE OF INVENTION

An object of the invention is to provide a resist composition, specifically chemically amplified positive resist composition which has both high resolution and sensitivity, forms a pattern with a satisfactory profile and minimal LER after exposure and development, and has an electro-conductive function to prevent charging during image writing; and a patterning process using the same.

In one aspect, the invention provides a resist composition comprising a polymer comprising recurring units of acid labile group-substituted (meth)acrylic acid, styrenecarboxylic acid or vinylnaphthalenecarboxylic acid and/or recurring units having an acid labile group-substituted phenolic hydroxyl group, and an acid generator, or a copolymer comprising recurring units of acid labile group-substituted (meth)acrylic acid, styrenecarboxylic acid or vinylnaphthalenecarboxylic acid and/or recurring units having an acid labile group-substituted phenolic hydroxyl group and recurring units having an acid generator. The resist composition further comprises a metal salt of a mono- to tetra-functional $C_1$-$C_{20}$ carboxylic acid or a metal complex of a β-diketone, the metal being selected from the group consisting of sodium, magnesium, chromium, manganese, iron, cobalt, nickel, copper, zinc, silver, cadmium, indium, tin, antimony, cesium, zirconium, and hafnium.

In a preferred embodiment, the polymer comprising recurring units of acid labile group-substituted (meth)acrylic acid, styrenecarboxylic acid or vinylnaphthalenecarboxylic acid and/or recurring units having an acid labile group-substituted phenolic hydroxyl group has recurring units (a1) and/or (a2), as represented by the general formula (1).

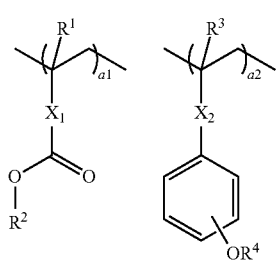

Herein $R^1$ and $R^3$ are each independently hydrogen or methyl, $R^2$ and $R^4$ each are an acid labile group, $X_1$ is a single bond, a $C_1$-$C_{12}$ linking group having at least one of ester moiety, lactone ring, phenylene moiety or naphthylene moiety, a phenylene group, or a naphthylene group, $X_2$ is a single bond or an ester or amide group, a1 and a2 are numbers in the range: $0 \leq a1 \leq 0.9$, $0 \leq a2 \leq 0.9$, and $0 \leq a1+a2<1$.

In addition to the recurring units (a1) and (a2), the polymer may comprise recurring units (b1), (b2) or (b3) of a sulfonium salt having the general formula (2).

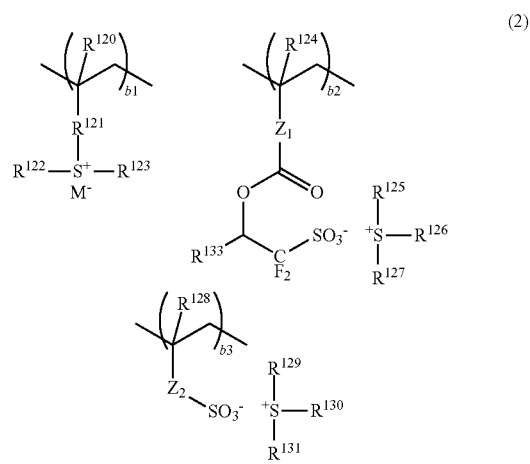

Herein $R^{120}$, $R^{124}$ and $R^{128}$ each are hydrogen or methyl, $R^{121}$ is a single bond, phenylene, —O—R—, or —C(=O)—Y—R—, Y is oxygen or NH, R is a straight, branched or cyclic $C_1$-$C_6$ alkylene group, $C_1$-$C_{10}$ alkenylene or phenylene group, which may contain a carbonyl, ester, ether or hydroxyl moiety, $R^{122}$, $R^{123}$, $R^{125}$, $R^{126}$, $R^{127}$, $R^{129}$, $R^{130}$, and $R^{131}$ are each independently a straight, branched or cyclic $C_1$-$C_{12}$ alkyl group which may contain a carbonyl, ester or ether moiety, or a $C_6$-$C_{12}$ aryl, $C_7$-$C_{20}$ aralkyl, or thiophenyl group which may contain a straight, branched or cyclic $C_1$-$C_{10}$ alkyl, halogen, trifluoromethyl, cyano, nitro, hydroxyl, alkoxy, alkoxycarbonyl or acyloxy radical, $Z_1$ is a single bond or —C(=O)—$Z_3$—$R^{132}$—, $Z_2$ is a single bond, methylene, ethylene, phenylene, fluorinated phenylene, —O—$R^{132}$— or —C(=O)—$Z_3$—$R^{132}$—, $Z_3$ is oxygen or NH, $R^{132}$ is a straight, branched or cyclic $C_1$-$C_6$ alkylene group, alkenylene, or phenylene group, which may contain a carbonyl, ester, ether or hydroxyl moiety, a pair of $R^{122}$ and $R^{123}$, $R^{125}$ and $R^{126}$, $R^{125}$ and $R^{127}$, $R^{126}$ and $R^{127}$, $R^{129}$ and $R^{130}$, $R^{129}$ and $R^{131}$, or $R^{130}$ and $R^{131}$ may bond directly or via a methylene moiety or ether bond to form a ring with the sulfur atom, $R^{133}$ is hydrogen or trifluoromethyl, $M^-$ is a non-nucleophilic counter ion, b1, b2 and b3 are in the range of $0 \leq b1 \leq 0.5$, $0 \leq b2 \leq 0.5$, $0 \leq b3 \leq 0.5$, and $0 < b1+b2+b3 \leq 0.5$.

In a preferred embodiment, the metal salt of a mono- to tetra-functional $C_1$-$C_{20}$ carboxylic acid or the metal complex of a β-diketone, in which the metal is selected from the group consisting of sodium, magnesium, chromium, manganese, iron, cobalt, nickel, copper, zinc, silver, cadmium, indium, tin, antimony, cesium, zirconium, and hafnium, is selected from compounds of the following general formulae.

$Na^+R^{11}COO^-$
$Mg^{2+}(R^{11}COO^-)_2$          $Mg^{2+}R^{12}(COO^-)_2$
$Cr^{2+}(R^{11}COO^-)_2$           $Cr^{2+}R^{12}(COO^-)_2$
$Cr^{3+}(R^{11}COO^-)_3$           $(Cr^{3+})_2(R^{12}(COO^-)_2)_3$          $Cr_3^{3+}(R^{11}COO^-)_7(OH)_2$
$(Cr^{3+})_2(R^{13}COO^-)_6$

-continued

| | | |
|---|---|---|
| $Mn^{2+}(R^{11}COO^-)_2$ | $Mn^{2+}R^{12}(COO^-)_2$ | $Mn^{3+}(R^{11}COO^-)_3$ |
| $(Mn^{3+})_2(R^{12}(COO^-)_2)_3$ | | |
| $Fe^{2+}R^{12}(COO^-)_2$ | $Fe^{3+}(R^{11}COO^-)_3$ | $(Fe^{3+})_2(R^{12}(COO^-)_2)_3$ |
| $Fe^{3+}R^{13}(COO^-)_3$ | $Fe^{2+}(R^{11}COO^-)_2$ | |
| $Co^{2+}(R^{11}COO^-)_2$ | $Co^{2+}R^{12}(COO^-)_2$ | |
| $Ni^{2+}(R^{11}COO^-)_2$ | $Ni^{2+}R^{12}(COO^-)_2$ | |
| $Cu^+R^{11}COO^-$ | $(Cu^+)_2R^{12}(COO^-)_2$ | $Cu^{2+}(R^{11}COO^-)_2$ |
| $Cu^{2+}R^{12}(COO^-)_2$ | | |
| $Zn^+R^{11}COO^-$ | $(Zn^+)_2R^{12}(COO^-)_2$ | $Zn^{2+}(R^{11}COO^-)_2$ |
| $Ag^+R^{11}COO^-$ | $(Ag^+)_2R^{12}(COO^-)_2$ | |
| $Cd^{2+}(R^{11}COO^-)_2$ | $Cd^{2+}R^{12}(COO^-)_2$ | |
| $In^{3+}(R^{11}COO^-)_3$ | $(In^{3+})_2(R^{12}(COO^-)_2)_3$ | $In^{3+}R^{13}(COO^-)_3$ |
| $Sn^{2+}(R^{11}COO^-)_2$ | $Sn^{2+}R^{12}(COO^-)_2$ | $Sn^{4+}(R^{11}COO^-)_4$ |
| $Sn^{4+}(R^{12}(COO^-)_2)_2$ | $Sn^{4+}R^{14}(COO^-)_4$ | |
| $Sb^{3+}(R^{11}COO^-)_3$ | $(Sb^{3+})_2(R^{12}(COO^-)_2)_3$ | $Sb^{3+}R^{13}(COO^-)_3$ |
| $Cs^+R^{11}COO^-$ | $(Cs^+)_2R^{12}(COO^-)_2$ | |
| $Hf^{4+}(R^{11}COO^-)_4$ | $Hf^{4+}(R^{12}(COO^-)_2)_2$ | $Hf^{4+}R^{14}(COO^-)_4$ |
| $Na^+(R^{15}COCH_2COR^{16})^-$ | | |
| $Mg^{2+}(R^{15}COCH_2COR^{16})^-_2$ | | |
| $Cr^{2+}(R^{15}COCH_2COR^{16})^-_2$ | $Cr^{3+}(R^{15}COCH_2COR^{16})^-_3$ | |
| $Mn^{2+}(R^{15}COCH_2COR^{16})^-_2$ | $Mn^{3+}(R^{15}COCH_2COR^{16})^-_3$ | |
| $Fe^{2+}(R^{15}COCH_2COR^{16})^-_2$ | $Fe^{3+}(R^{15}COCH_2COR^{16})^-_3$ | |
| $Co^{2+}(R^{15}COCH_2COR^{16})^-_2$ | | |
| $Ni^{2+}(R^{15}COCH_2COR^{16})^-_2$ | | |
| $Cu^+(R^{15}COCH_2COR^{16})^-$ | $Cu^{2+}(R^{15}COCH_2COR^{16})^-_2$ | |
| $Zn^+(R^{15}COCH_2COR^{16})^-$ | $Zn^{2+}(R^{15}COCH_2COR^{16})^-_2$ | |
| $Ag^+(R^{15}COCH_2COR^{16})^-$ | | |
| $Cd^{2+}(R^{15}COCH_2COR^{16})^-_2$ | | |
| $In^{3+}(R^{15}COCH_2COR^{16})^-_3$ | | |
| $Sn^{2+}(R^{15}COCH_2COR^{16})^-_2$ | $Sn^{4+}(R^{15}COCH_2COR^{16})^-_4$ | |
| $Sb^{3+}(R^{15}COCH_2COR^{16})^-_3$ | | |
| $Cs^+(R^{15}COCH_2COR^{16})^-$ | | |
| $Hf^{4+}(R^{15}COCH_2COR^{16})^-_4$ | | |

Herein $R^{11}$ is each independently hydrogen, or a straight, branched or cyclic $C_1$-$C_{20}$ alkyl, $C_2$-$C_{20}$ alkenyl, $C_2$-$C_{20}$ alkynyl, or $C_6$-$C_{20}$ aryl group which may have a hydroxyl, ether, ester, amino, amide, sulfonic acid ester, halogen, cyano, nitro, carbonate, carbamate, thiol, sulfide, thioketone radical or hetero-aromatic ring; $R^{12}$ is a single bond, or a straight, branched or cyclic $C_1$-$C_{20}$ alkylene, alkenylene, alkynylene, or $C_6$-$C_{20}$ arylene group which may have a hydroxyl, ether, ester, amino, amide, sulfonic acid ester, halogen, cyano, nitro, carbonate, carbamate, thiol, sulfide, thioketone radical or hetero-aromatic ring; $R^{13}$ and $R^{14}$ each are an alkylene, arylene, alkenylene or alkynylene group as defined for $R^{12}$, in which one or two hydrogen atoms are substituted by one or two carboxyl groups; $R^{15}$ and $R^{16}$ are each independently a straight, branched or cyclic $C_1$-$C_{20}$ alkyl, $C_2$-$C_{20}$ alkenyl, $C_2$-$C_{20}$ alkynyl, or $C_6$-$C_{20}$ aryl group which may have a hydroxyl, alkoxy, ether, ester, amino, amide, sulfonic acid ester, halogen, cyano, nitro, carbonate, carbamate, thiol, sulfide, thioketone radical or hetero-aromatic ring.

Typically the resist composition is a chemically amplified positive resist composition.

The resist composition may further comprise at least one component selected from among an organic solvent, a dissolution inhibitor, an acid generator, a basic compound, and a surfactant.

In another aspect, the invention provides a pattern forming process comprising the steps of coating the resist composition defined above onto a substrate, baking, exposing to high-energy radiation, and developing with a developer. Typically, the high-energy radiation is EUV radiation having a wavelength of 3 to 15 nm or an electron beam at an accelerating voltage of 1 to 150 keV.

Advantageous Effects of Invention

The resist composition has many advantages including a significantly high contrast of alkaline dissolution rate before and after exposure, a high sensitivity, a high resolution, a satisfactory pattern profile after exposure, a controlled rate of acid diffusion, and a minimal LER. The resist composition, typically chemically amplified positive resist composition is suited as the micropatterning material for VLSIs and photomasks, and the patterning material in the EB and EUV lithography.

DESCRIPTION OF EMBODIMENTS

The singular forms "a," "an" and "the" include plural referents unless the context clearly dictates otherwise. "Optional" or "optionally" means that the subsequently described event or circumstance may or may not occur, and that the description includes instances where the event occurs and instances where it does not. As used herein, the notation ($C_n$—$C_m$) means a group containing from n to m carbon atoms per group. The broken line depicted in a chemical formula denotes a valence bond.

The abbreviations and acronyms have the following meaning.

UV: ultraviolet radiation
DUV: deep ultraviolet
EUV: extreme ultraviolet
EB: electron beam
Mw: weight average molecular weight
Mn: number average molecular weight
Mw/Mn: molecular weight distribution or dispersity
GPC: gel permeation chromatography
PEB: post-exposure bake
LER: line edge roughness
LWR: line width roughness While the effort to reduce the pattern rule is in rapid progress to meet the demand for higher integration density and operating speed of LSIs as alluded to previously, there is a need for a resist composition which has a high resolution and a high sensitivity and forms a pattern with a satisfactory profile and minimal LER through exposure and development.

Seeking for a resist material having a high resolution, high sensitivity and minimal LER, the inventor has found that a resist composition, typically chemically amplified positive resist composition, comprising a polymer comprising recurring units having an acid labile group gives better results of lithography when a metal salt of carboxylic acid or a metal complex of β-diketone is added thereto.

More particularly, when a polymer obtained from polymerization of a monomer having an acid labile group-substituted phenolic hydroxyl group or a copolymer obtained from copolymerization of a monomer having an acid labile group-substituted phenolic hydroxyl group with a sulfonium salt monomer having polymerizable olefin is used as the base resin and a salt of a mono- to tetra-functional $C_1$-$C_{20}$ carboxylic acid or a complex of a β-diketone with a metal selected from the group consisting of sodium, magnesium, chromium, manganese, iron, cobalt, nickel, copper, zinc, silver, cadmium, indium, tin, antimony, cesium, zirconium, and hafnium is added thereto, there is formulated a resist composition, typically chemically amplified positive resist composition which has many advantages including a high sensitivity, a high resolution, controlled acid diffusion, a satisfactory pattern profile after exposure, and a minimal LER. In addition, the resist composition is effective for preventing electrostatic charges during EB image writing. The resist composition is thus suited as the micropatterning material for the fabrication of VLSIs and photomasks.

One embodiment of the invention is a resist composition comprising a polymer comprising recurring units of acid labile group-substituted (meth)acrylic acid, styrenecarboxylic acid or vinylnaphthalenecarboxylic acid and/or recurring units having an acid labile group-substituted phenolic hydroxyl group, and a metal salt of a mono- to tetra-functional $C_1$-$C_{20}$ carboxylic acid or a metal complex of a β-diketone, the metal being selected from among sodium, magnesium, chromium, manganese, iron, cobalt, nickel, copper, zinc, silver, cadmium, indium, tin, antimony, cesium, zirconium, and hafnium.

Specifically, the polymer comprises recurring units (a1) of acid labile group-substituted (meth)acrylic acid, styrenecarboxylic acid or vinylnaphthalenecarboxylic acid and/or recurring units (a2) having an acid labile group-substituted phenolic hydroxyl group, which may be represented by the general formula (1).

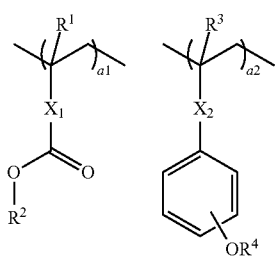

(1)

Herein $R^1$ and $R^3$ are each independently hydrogen or methyl, $R^2$ and $R^4$ each are an acid labile group, $X_1$ is a single bond, a $C_1$-$C_{12}$ linking group having at least one of ester moiety, lactone ring, phenylene moiety and naphthylene moiety, a phenylene group, or a naphthylene group, $X_2$ is a single bond or an ester or amide group, a1 and a2 are numbers in the range: $0 \le a1 \le 0.9$, $0 \le a2 \le 0.9$, and $0 < a1+a2 < 1$.

In addition to the recurring units (a1) and (a2), the polymer may comprise recurring units (b1), (b2) or (b3) of a sulfonium salt having the general formula (2).

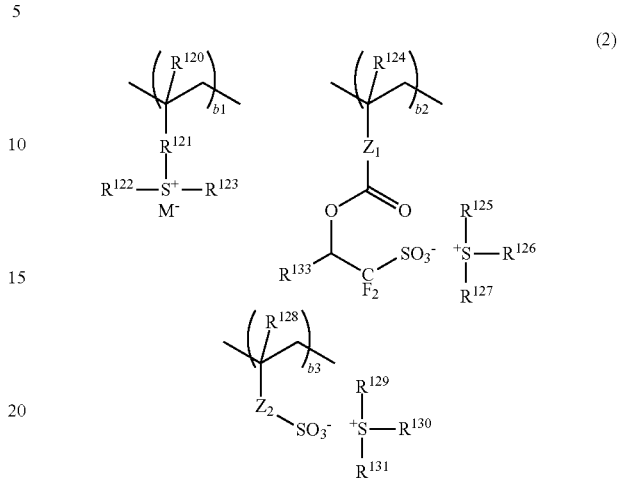

(2)

Herein $R^{120}$, $R^{124}$, and $R^{128}$ each are hydrogen or methyl. $R^{121}$ is a single bond, phenylene, —O—R—, or —C(=O)—Y—R— wherein Y is oxygen or NH, and R is a straight, branched or cyclic $C_1$-$C_6$ alkylene group, $C_3$-$C_{10}$ alkenylene or phenylene group, which may contain a carbonyl (—CO—), ester (—COO—), ether (—O—) or hydroxyl moiety. $R^{122}$, $R^{123}$, $R^{125}$, $R^{126}$, $R^{127}$, $R^{129}$, $R^{130}$, and $R^{131}$ are each independently a straight, branched or cyclic $C_1$-$C_2$, alkyl group which may contain a carbonyl, ester or ether moiety, or a $C_6$-$C_{12}$ aryl, $C_7$-$C_{20}$ aralkyl, or thiophenyl group which may contain a straight, branched or cyclic $C_1$-$C_{10}$ alkyl, halogen, trifluoromethyl, cyano, nitro, hydroxyl, alkoxy, alkoxycarbonyl or acyloxy radical. $Z_1$ is a single bond or —C(=O)—$Z_3$—$R^{132}$—. $Z_2$ is a single bond, methylene, ethylene, phenylene, fluorinated phenylene, —O—$R^{132}$— or —C(=O)—$Z_3$—$R^{132}$—, wherein $Z_3$ is oxygen or NH, and $R^{132}$ is a straight, branched or cyclic $C_1$-$C_6$ alkylene group, alkenylene, or phenylene group, which may contain a carbonyl, ester, ether or hydroxyl moiety. A pair of $R^{122}$ and $R^{123}$, $R^{125}$ and $R^{126}$, $R^{125}$ and $R^{127}$, $R^{126}$ and $R^{127}$, $R^{129}$ and $R^{130}$, $R^{129}$ and $R^{131}$, or $R^{130}$ and $R^{131}$ may bond directly or via a methylene moiety or ether bond to form a ring with the sulfur atom. $R^{133}$ is hydrogen or trifluoromethyl. $M^-$ is a non-nucleophilic counter ion. The subscripts b1, b2 and b3 are in the range of $0 \le b1 \le 0.5$, $0 \le b2 \le 0.5$, $0 \le b3 \le 0.5$, and $0 < b1+b2+b3 \le 0.5$.

The binding of the acid generator with the polymer is effective for shortening the distance of acid diffusion and reducing edge roughness.

According to the invention, a metal salt of carboxylic acid or metal complex of β-diketone having high absorption of EUV radiation is added to the polymer comprising acid labile group-bearing recurring units (a1) and/or (a2) and optionally acid generator-bearing recurring units (b1), (b2) or (b3) in the resist composition. This combination is effective for controlling acid diffusion, improving contrast and sensitivity, improving electric conductivity, and hence, preventing electrostatic charging during image writing. Particularly when exposed to short-wavelength high-energy radiation and EB, the resist composition is effective for forming a fine size pattern with a high resolution, high sensitivity, minimal LER and satisfactory profile. Thus a pattern can be formed at a very high accuracy.

Accordingly, the resist composition has many advantages including a high dissolution contrast, a high resolution, a high sensitivity, exposure latitude, process adaptability, a good pattern profile after exposure, and minimized LER. Because of these advantages, the resist composition is fully viable in practice and best suited as the micropatterning resist material for the fabrication of VLSIs. The resist composition, typically chemically amplified positive resist composition is used not only in the lithography for forming semiconductor circuits, but also in the formation of mask circuit patterns, micromachines, and thin-film magnetic head circuits.

In the resist composition, a specific metal salt of carboxylic acid or specific metal complex of β-diketone is formulated. Specifically, a metal salt of a mono- to tetra-functional $C_1$-$C_{20}$ carboxylic acid or a metal complex of a β-diketone is added, provided that the metal is selected from among sodium, magnesium, chromium, manganese, iron, cobalt, nickel, copper, zinc, silver, cadmium, indium, tin, antimony, cesium, zirconium, and hafnium. If a strong acid in the form of a sulfonic acid, especially a sulfonic acid having fluorine substituted at α-position, imide acid or methide acid is co-present, the salt of carboxylic acid or complex of β-diketone with sodium, magnesium, chromium, manganese, iron, cobalt, nickel, copper, zinc, silver, cadmium, indium, tin, antimony, cesium, zirconium, or hafnium undergoes ion exchange and forms a sodium, magnesium, chromium, manganese, iron, cobalt, nickel, copper, zinc, silver, cadmium, indium, tin, antimony, cesium, zirconium, or hafnium salt of α-position fluorinated sulfonic acid, imide acid or methide acid. Once the α-position fluorinated sulfonic acid, imide acid or methide acid that serves as a catalyst for deprotection of the acid labile group undergoes ion exchange with the metal salt of carboxylic acid or metal complex of β-diketone, the acid fails to induce deprotection reaction because of a significant drop of acid strength. That is, the metal salt functions as a quencher. Since the metal capable of forming a positive (+) ion forms a strong ionic bond with the α-position fluorinated sulfonic acid, imide acid or methide acid capable of forming a negative (−) ion, the metal salt or complex is more effective for controlling acid diffusion than the conventional amine quenchers.

The salts of mono- to tetra-functional $C_1$-$C_{20}$ carboxylic acid or complexes of β-diketone with sodium, magnesium, chromium, manganese, iron, cobalt, nickel, copper, zinc, silver, cadmium, indium, tin, antimony, cesium, zirconium, and hafnium include those of Groups A and B having the following general formulae.

| Group A | | |
|---|---|---|
| $Na^+R^{11}COO^-$ | | |
| $Mg^{2+}(R^{11}COO^-)_2$ | $Mg^{2+}R^{12}(COO^-)_2$ | |
| $Cr^{2+}(R^{11}COO^-)_2$ | $Cr^{2+}R^{12}(COO^-)_2$ | |
| $Cr^{3+}(R^{11}COO^-)_3$ | $(Cr^{3+})_2(R^{12}(COO^-)_2)_3$ | $Cr_3^{3+}(R^{11}COO^-)_7(OH)_2$ |
| $(Cr^{3+})_2(R^{13}COO^-)_6$ | | |
| $Mn^{2+}(R^{11}COO^-)_2$ | $Mn^{2+}R^{12}(COO^-)_2$ | $Mn^{3+}(R^{11}COO^-)_3$ |
| $(Mn^{3+})_2(R^{12}(COO^-)_2)_3$ | | |
| $Fe^{2+}R^{12}(COO^-)_2$ | $Fe^{3+}(R^{11}COO^-)_3$ | $(Fe^{3+})_2(R^{12}(COO^-)_2)_3$ |
| $Fe^{3+}R^{13}(COO^-)_3$ | $Fe^{2+}(R^{11}COO^-)_2$ | |
| $Co^{2+}(R^{11}COO^-)_2$ | $Co^{2+}R^{12}(COO^-)_2$ | |
| $Ni^{2+}(R^{11}COO^-)_2$ | $Ni^{2+}R^{12}(COO^-)_2$ | |
| $Cu^+R^{11}COO^-$ | $(Cu^+)_2R^{12}(COO^-)_2$ | $Cu^{2+}(R^{11}COO^-)_2$ |
| $Cu^{2+}R^{12}(COO^-)_2$ | | |
| $Zn^+R^{11}COO^-$ | $(Zn^+)_2R^{12}(COO^-)_2$ | $Zn^{2+}(R^{11}COO^-)_2$ |
| $Ag^+R^{11}COO^-$ | $(Ag^+)_2R^{12}(COO^-)_2$ | |
| $Cd^{2+}(R^{11}COO^-)_2$ | $Cd^{2+}R^{12}(COO^-)_2$ | |
| $In^{3+}(R^{11}COO^-)_3$ | $(In^{3+})_2(R^{12}(COO^-)_2)_3$ | $In^{3+}R^{13}(COO^-)_3$ |
| $Sn^{2+}(R^{11}COO^-)_2$ | $Sn^{2+}R^{12}(COO^-)_2$ | $Sn^{4+}(R^{11}COO^-)_4$ |
| $Sn^{4+}(R^{12}(COO^-)_2)_2$ | $Sn^{4+}R^{14}(COO^-)_4$ | |
| $Sb^{3+}(R^{11}COO^-)_3$ | $(Sb^{3+})_2(R^{12}(COO^-)_2)_3$ | $Sb^{3+}R^{13}(COO^-)_3$ |
| $Cs^+R^{11}COO^-$ | $(Cs^+)_2R^{12}(COO^-)_2$ | |
| $Hf^{4+}(R^{11}COO^-)_4$ | $Hf^{4+}(R^{12}(COO^-)_2)_2$ | $Hf^{4+}R^{14}(COO^-)_4$ |

| Group B | |
|---|---|
| $Na^+(R^{15}COCH_2COR^{16})^-$ | |
| $Mg^{2+}(R^{15}COCH_2COR^{16})^-_2$ | |
| $Cr^{2+}(R^{15}COCH_2COR^{16})^-_2$ | $Cr^{3+}(R^{15}COCH_2COR^{16})^-_3$ |
| $Mn^{2+}(R^{15}COCH_2COR^{16})^-_2$ | $Mn^{3+}(R^{15}COCH_2COR^{16})^-_3$ |
| $Fe^{2+}(R^{15}COCH_2COR^{16})^-_2$ | $Fe^{3+}(R^{15}COCH_2COR^{16})^-_3$ |
| $Co^{2+}(R^{15}COCH_2COR^{16})^-_2$ | |
| $Ni^{2+}(R^{15}COCH_2COR^{16})^-_2$ | |
| $Cu^+(R^{15}COCH_2COR^{16})^-$ | $Cu^{2+}(R^{15}COCH_2COR^{16})^-_2$ |
| $Zn^+(R^{15}COCH_2COR^{16})^-$ | $Zn^{2+}(R^{15}COCH_2COR^{16})^-_2$ |
| $Ag^+(R^{15}COCH_2COR^{16})^-$ | |
| $Cd^{2+}(R^{15}COCH_2COR^{16})^-_2$ | |
| $In^{3+}(R^{15}COCH_2COR^{16})^-_3$ | |
| $Sn^{2+}(R^{15}COCH_2COR^{16})^-_2$ | $Sn^{4+}(R^{15}COCH_2COR^{16})^-_4$ |
| $Sb^{3+}(R^{15}COCH_2COR^{16})^-_3$ | |
| $Cs^+(R^{15}COCH_2COR^{16})^-$ | |
| $Hf^{4+}(R^{15}COCH_2COR^{16})^-_4$ | |

Herein $R^{11}$ is each independently hydrogen, or a straight, branched or cyclic $C_1$-$C_{20}$ alkyl, $C_2$-$C_{20}$ alkenyl, $C_2$-$C_{20}$ alkynyl, or $C_6$-$C_{20}$ aryl group which may have a hydroxyl, ether, ester, amino, amide, sulfonic acid ester, halogen, cyano, nitro, carbonate, carbamate, thiol, sulfide, thioketone radical or hetero-aromatic ring. $R^{12}$ is a single bond, or a straight, branched or cyclic $C_1$-$C_{20}$ alkylene, alkenylene, alkynylene, or $C_6$-$C_{20}$ arylene group which may have a hydroxyl, ether, ester, amino, amide, sulfonic acid ester, halogen, cyano, nitro, carbonate, carbamate, thiol, sulfide, thioketone radical or hetero-aromatic ring. $R^{13}$ and $R^{14}$ each are an alkylene, arylene, alkenylene or alkynylene group as defined for $R^{12}$, in which one or two hydrogen atoms are substituted by one or two carboxyl groups. $R^{15}$ and $R^{16}$ are each independently a straight, branched or cyclic $C_1$-$C_{20}$ alkyl, $C_2$-$C_{20}$ alkenyl, $C_2$-$C_{20}$ alkynyl, or $C_6$-$C_{20}$ aryl group which may have a hydroxyl, alkoxy, ether, ester, amino, amide, sulfonic acid ester, halogen, cyano, nitro, carbonate, carbamate, thiol, sulfide, thioketone radical or hetero-aromatic ring.

Suitable carboxylate ions to form the carboxylic acid salts in Group A include the following examples. A salt of carboxylic acid having a more carbon count is more soluble in organic solvents.

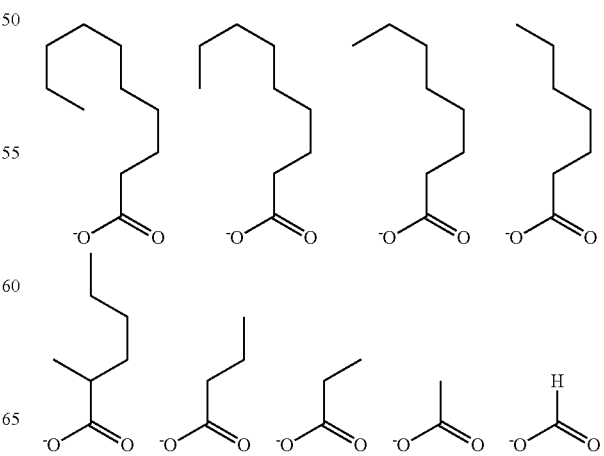

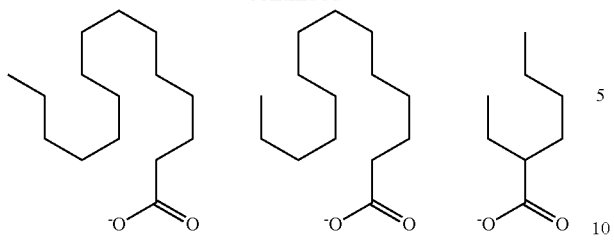
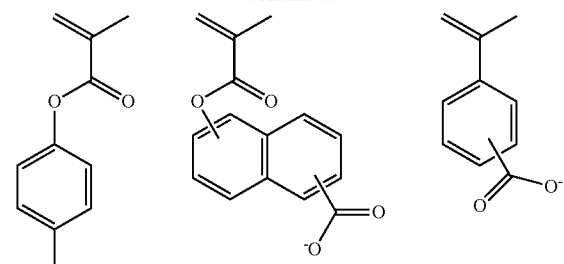
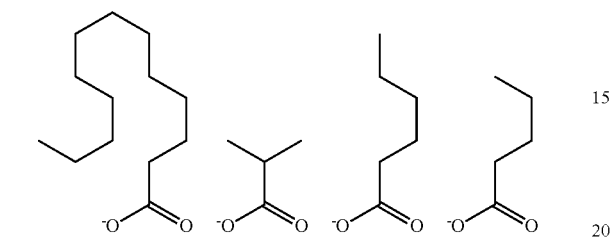
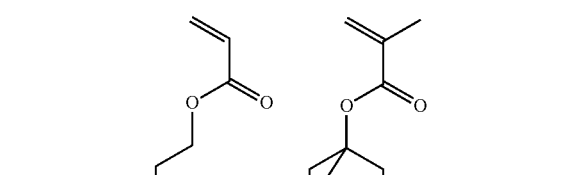
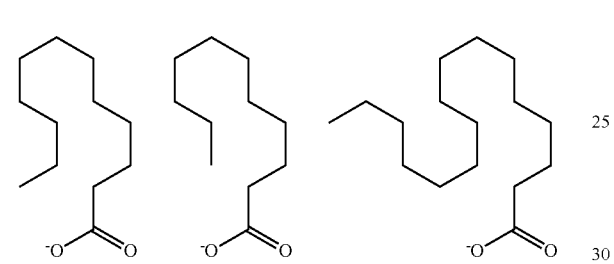
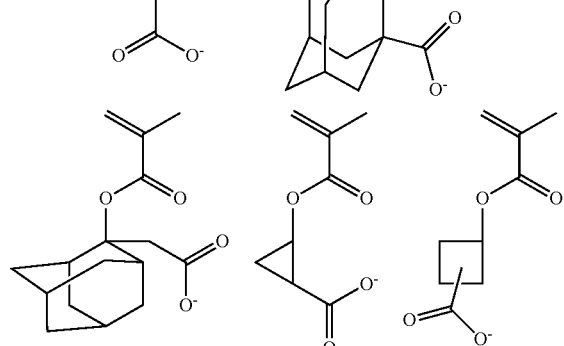
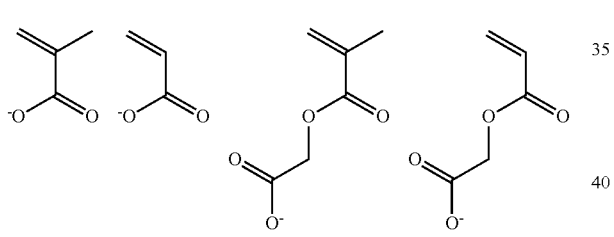
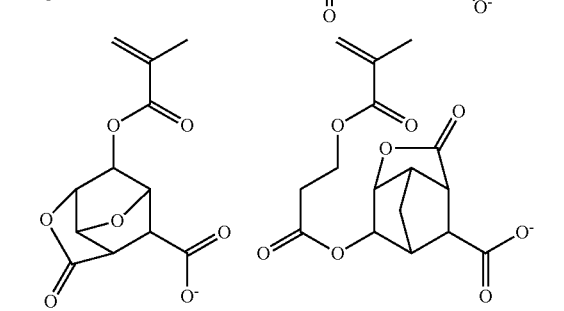
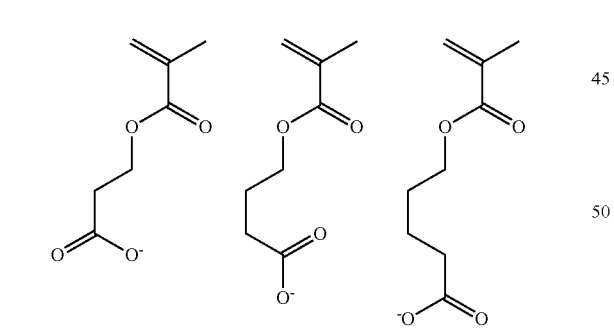
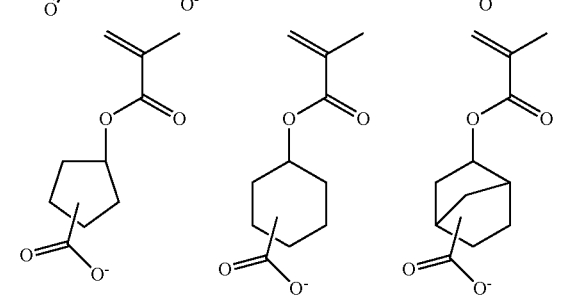
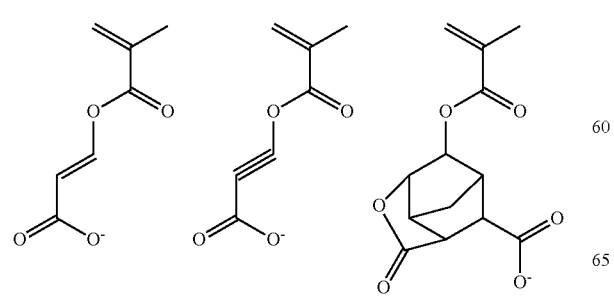
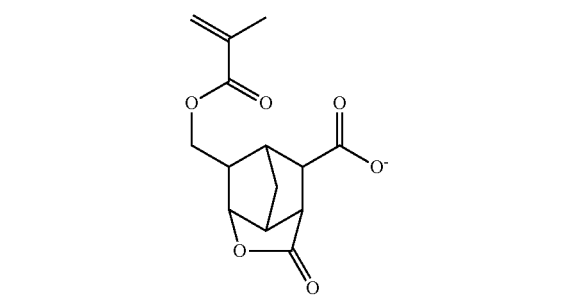

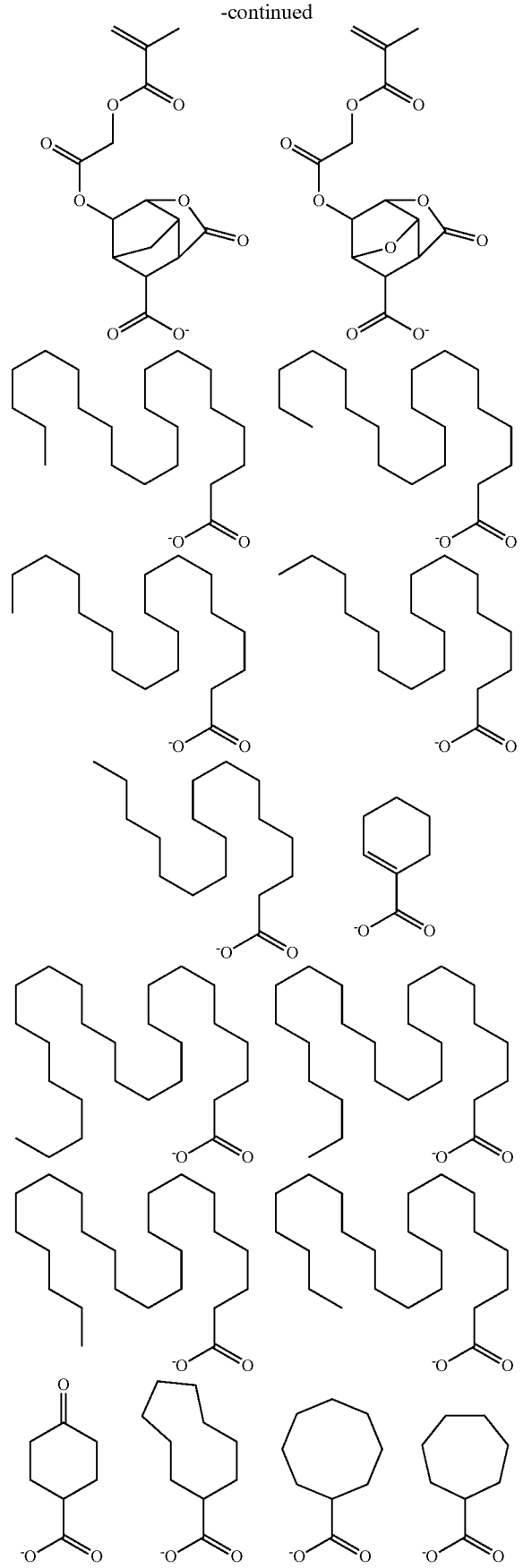
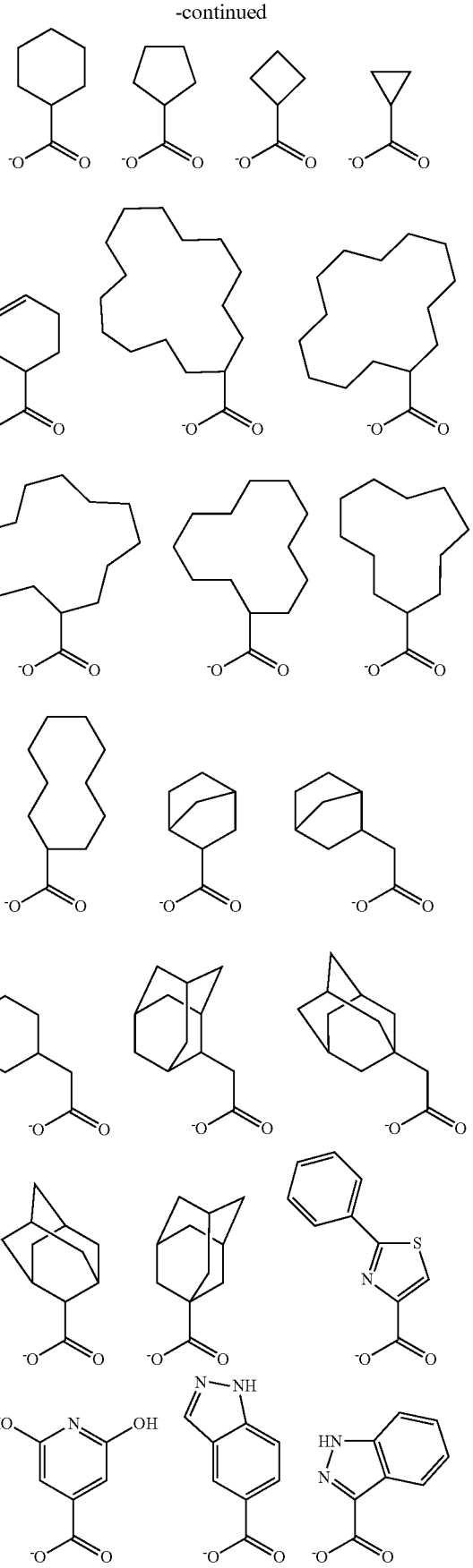

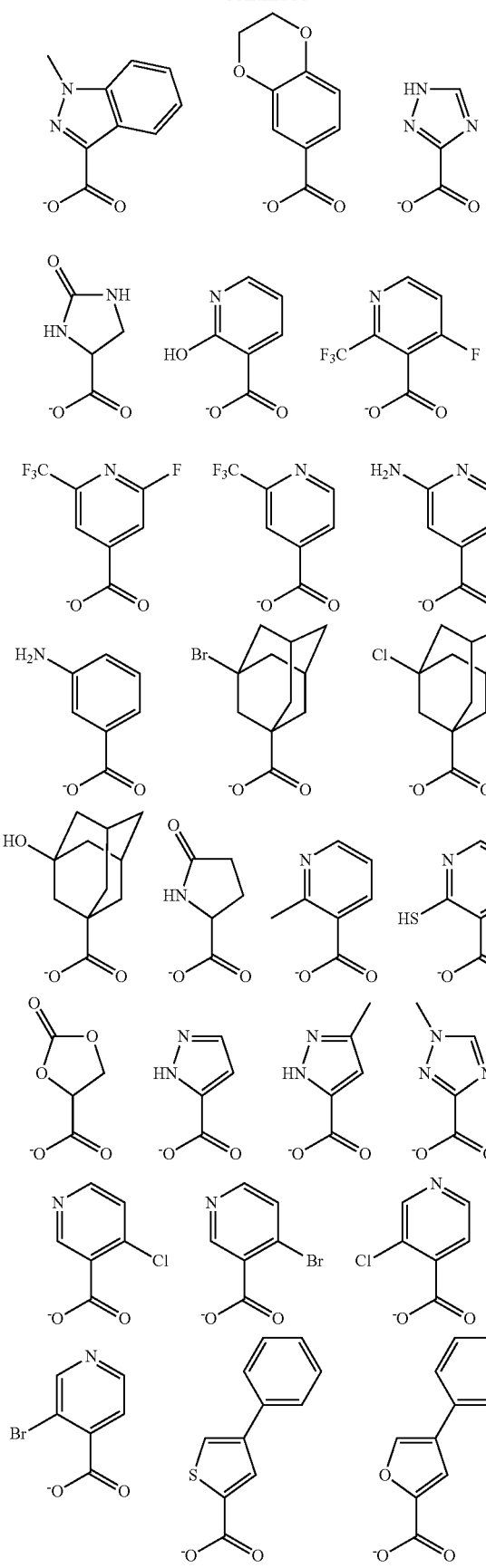
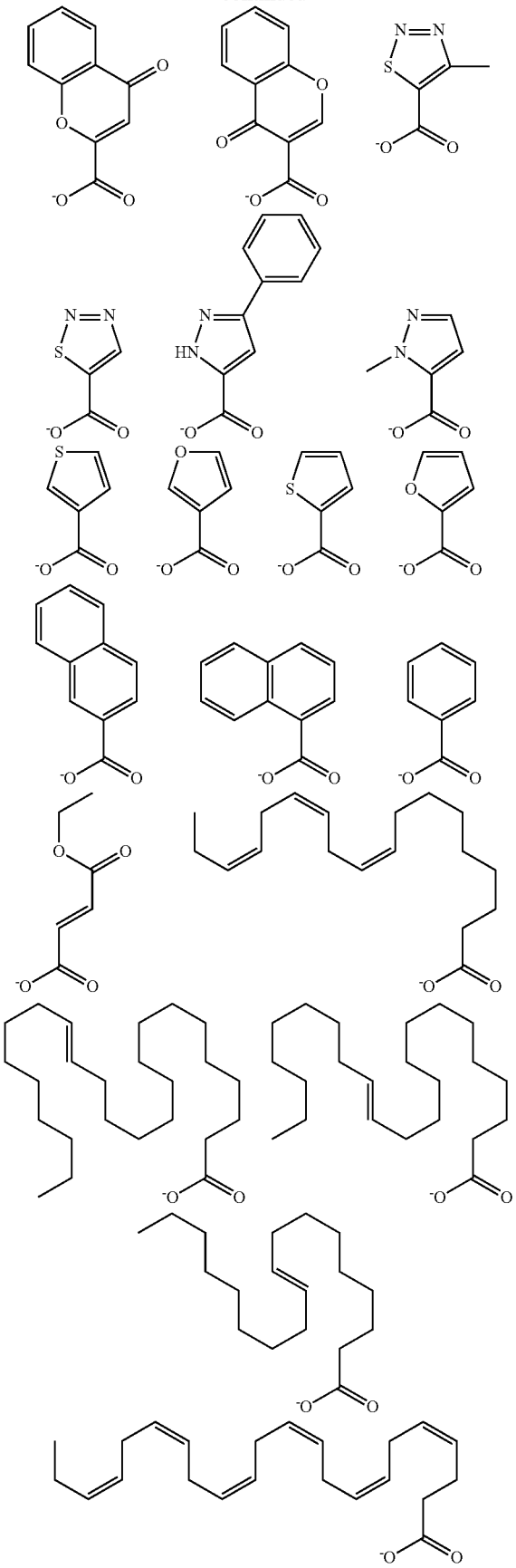

17
-continued
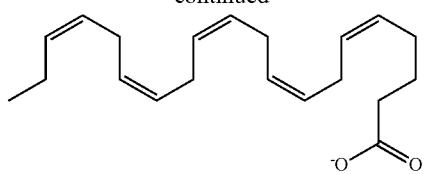
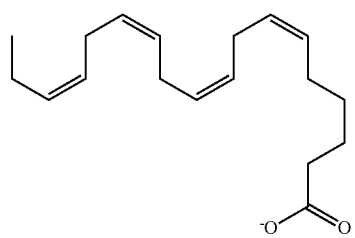
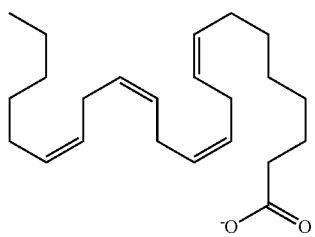
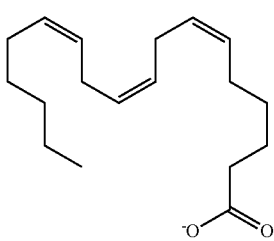
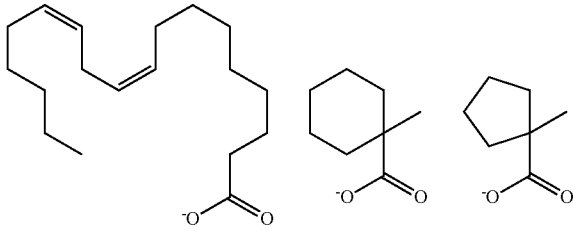
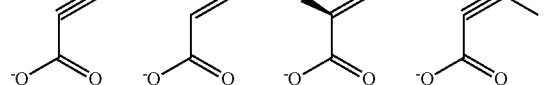
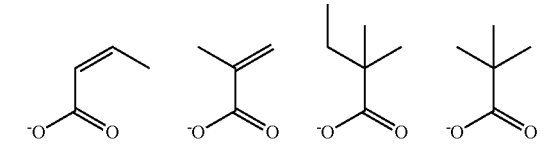
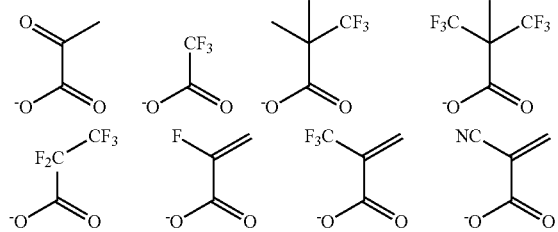
18
-continued
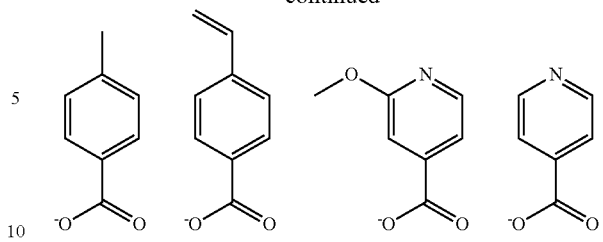
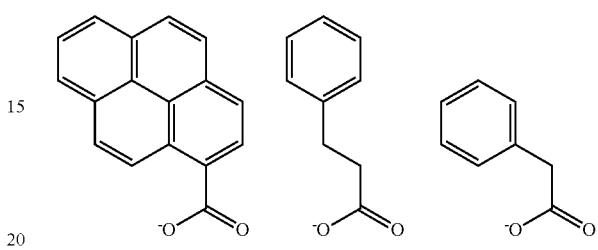
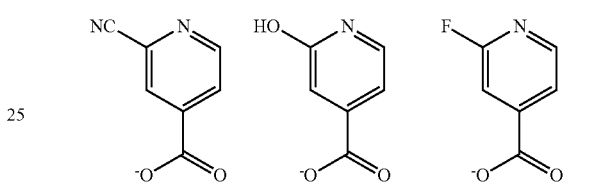
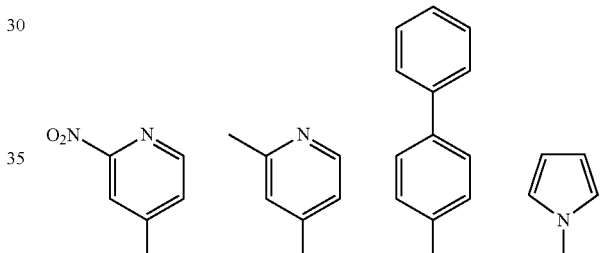
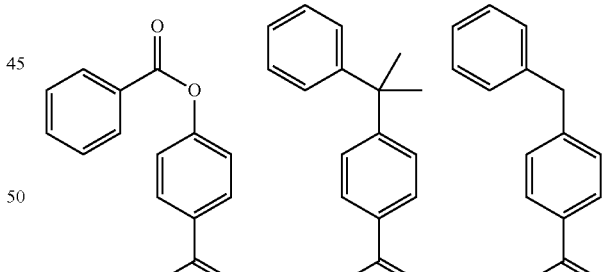
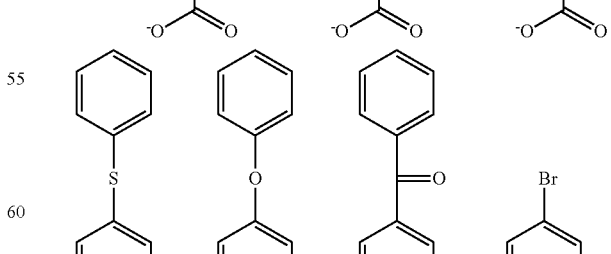
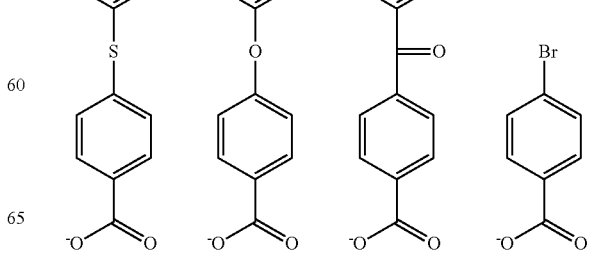

-continued
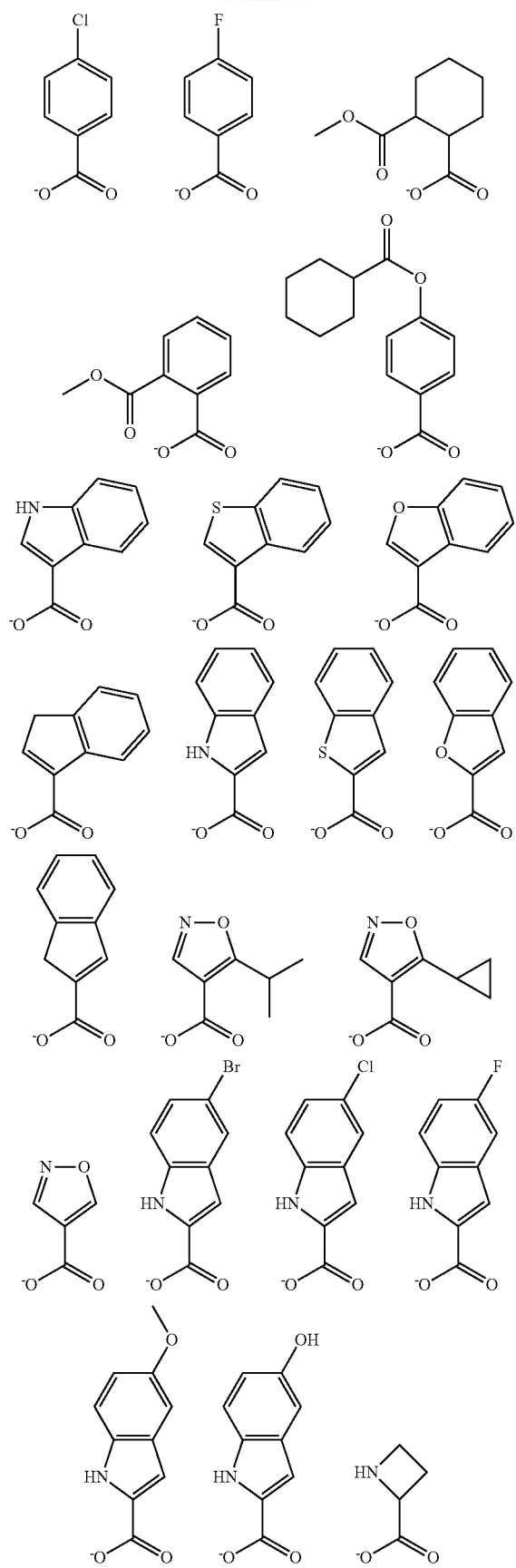
-continued
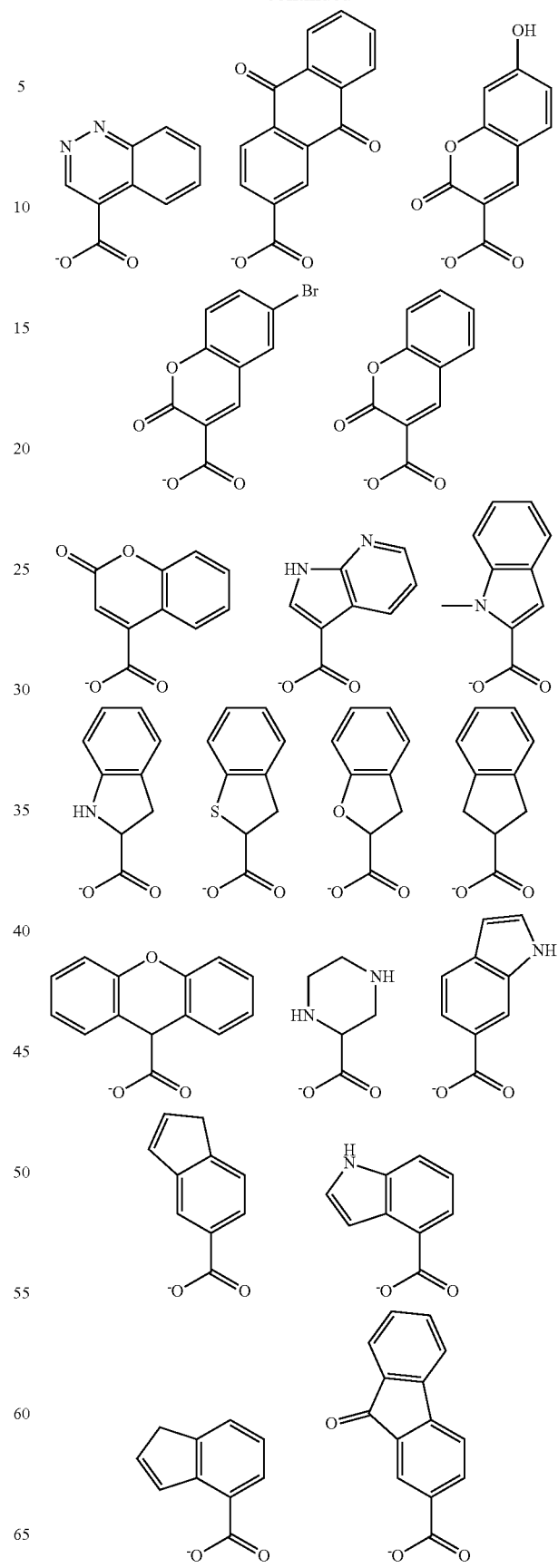

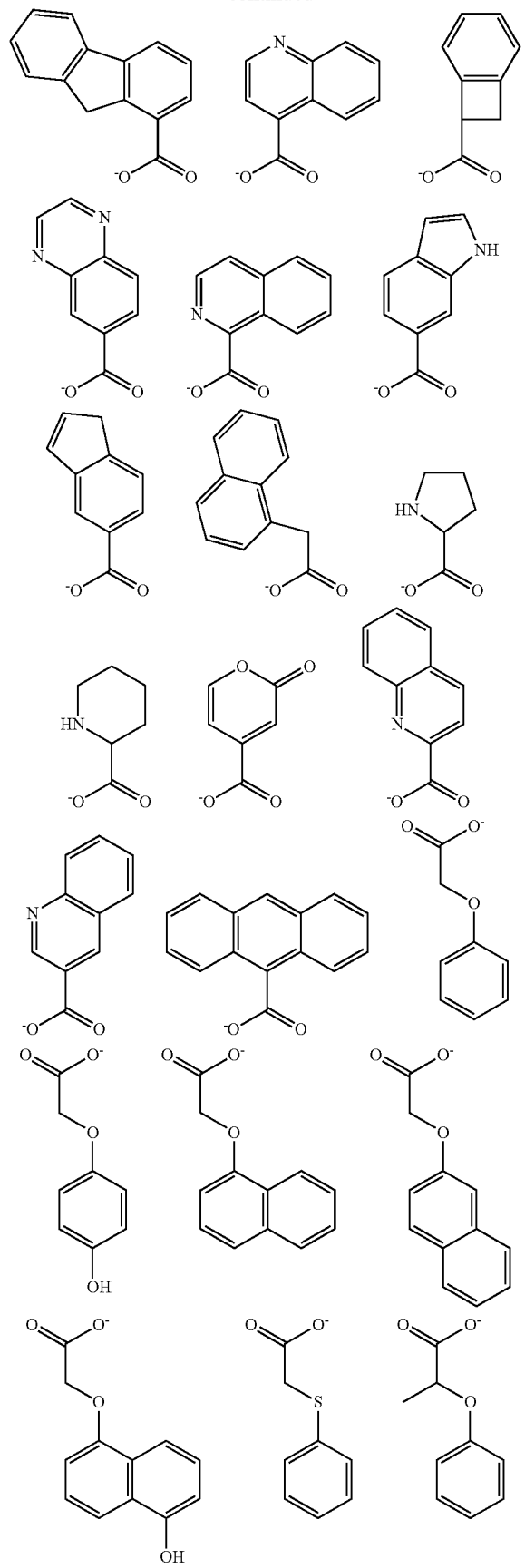
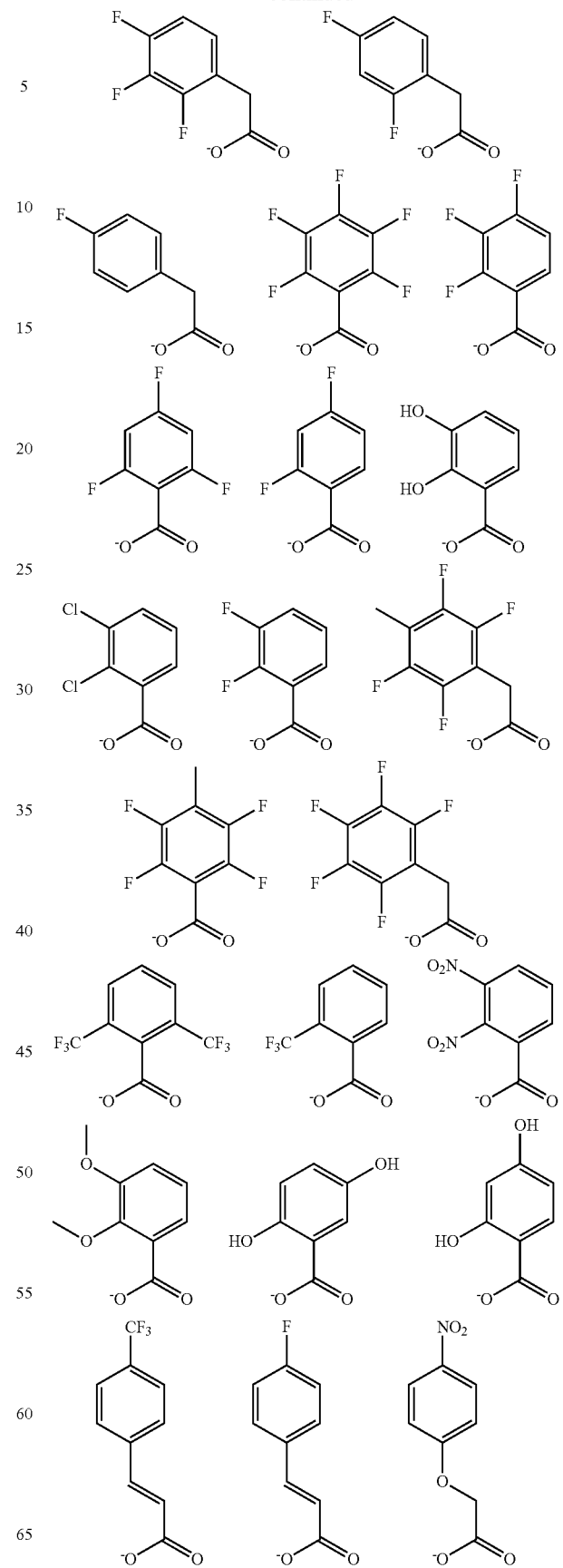

23
-continued
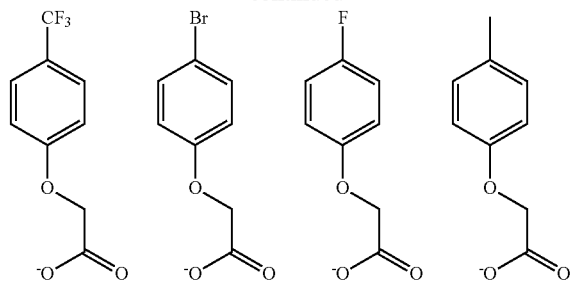
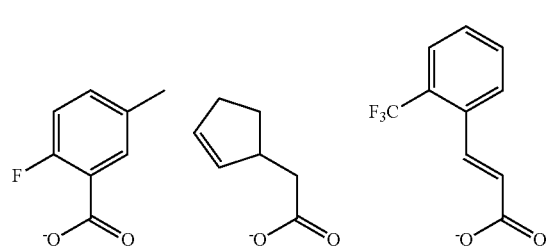
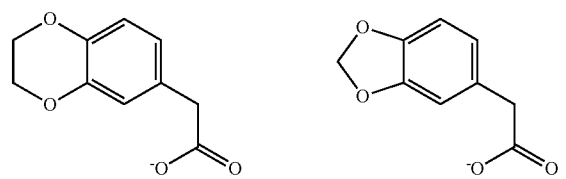
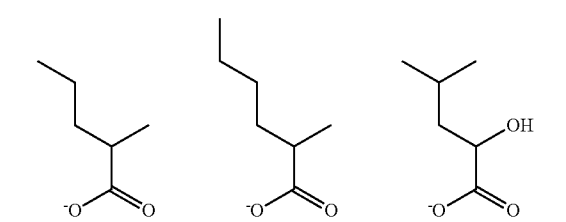
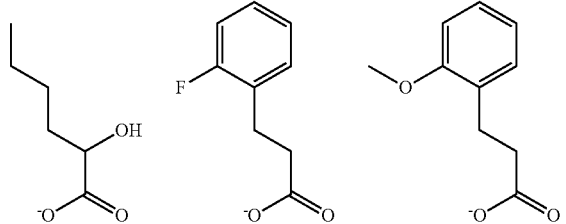
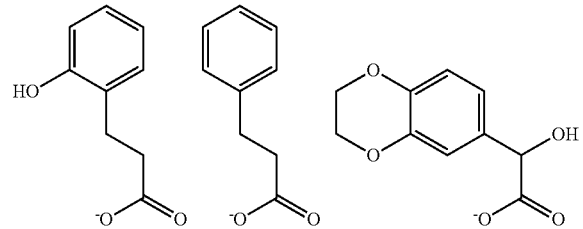
24
-continued
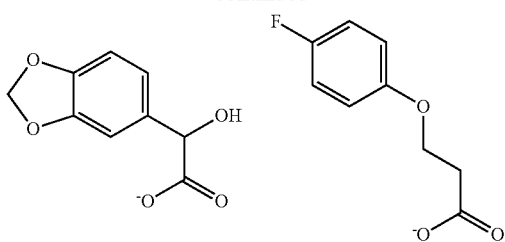
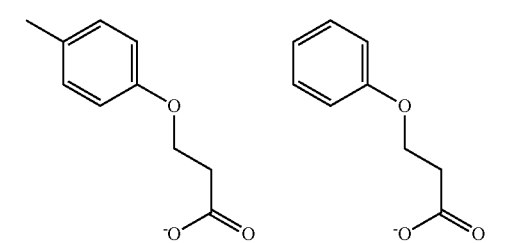
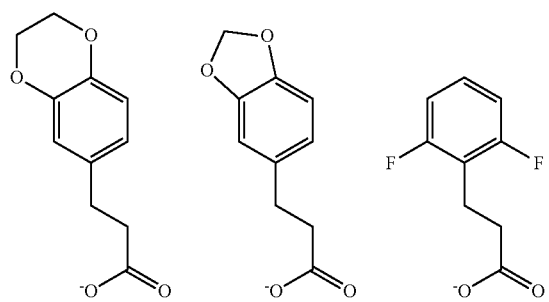
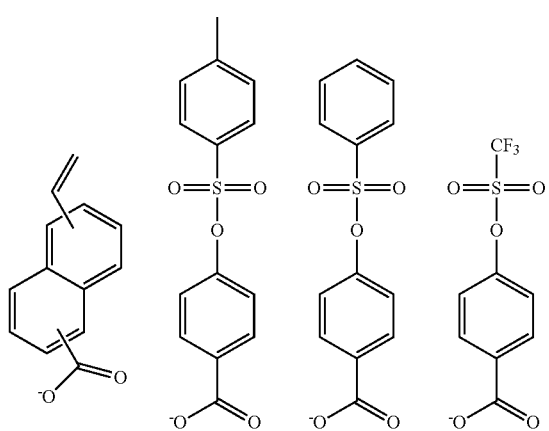
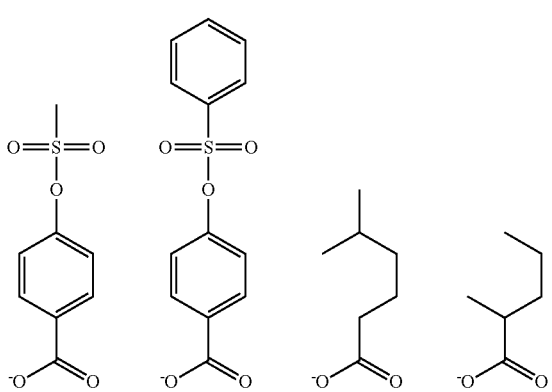

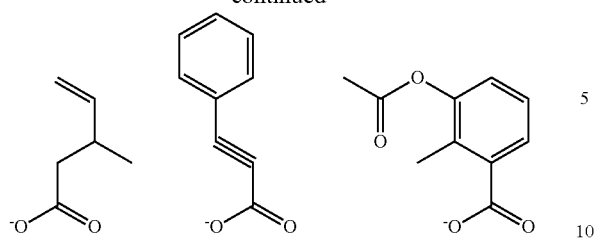
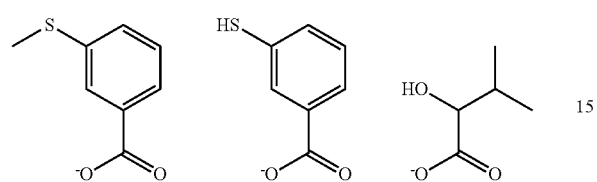
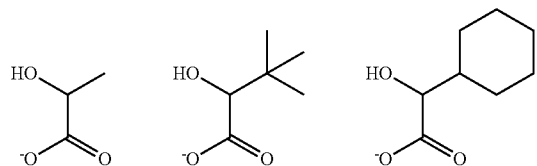
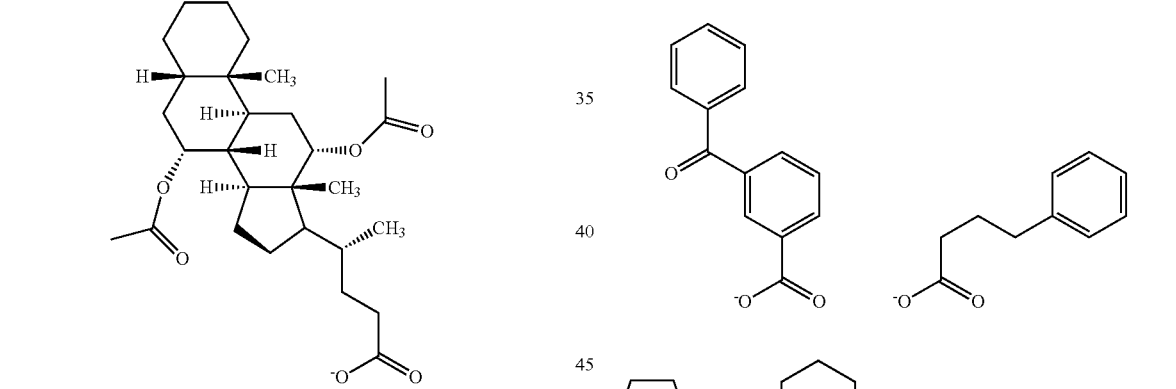
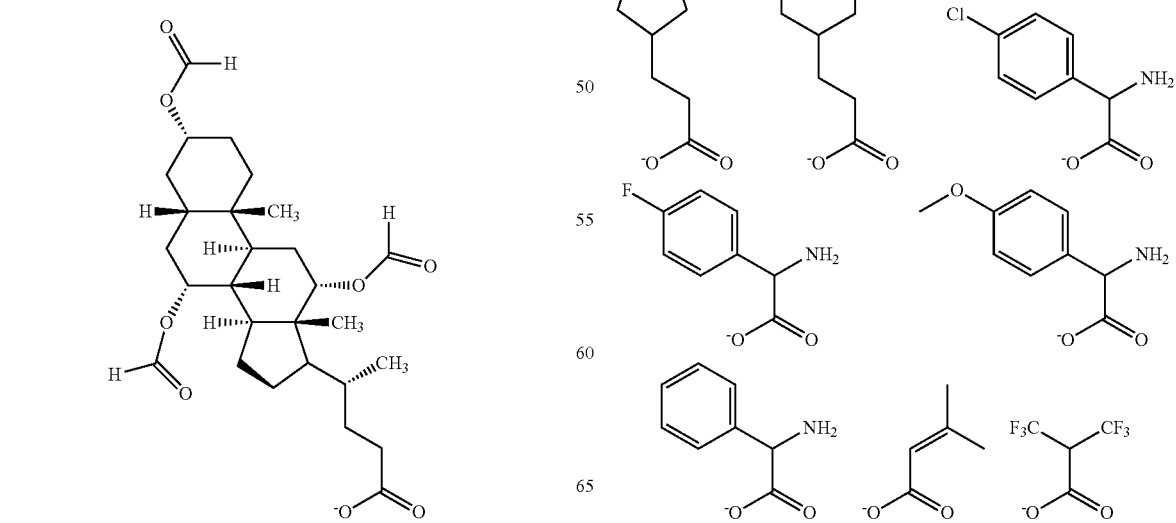
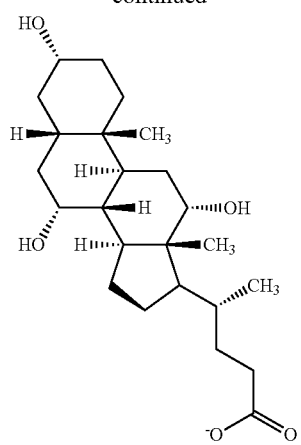
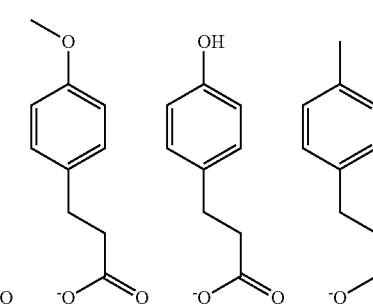
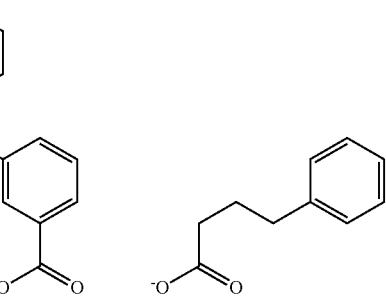
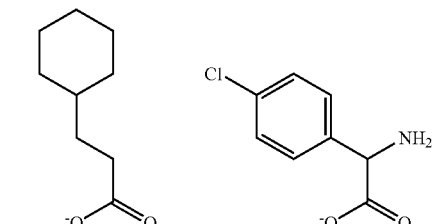
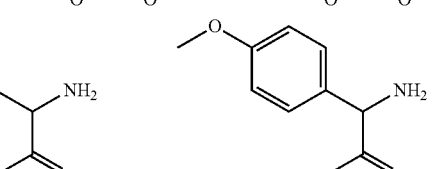
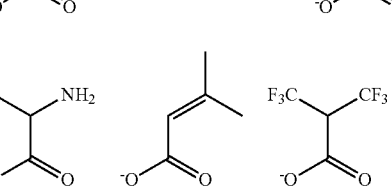

27
-continued
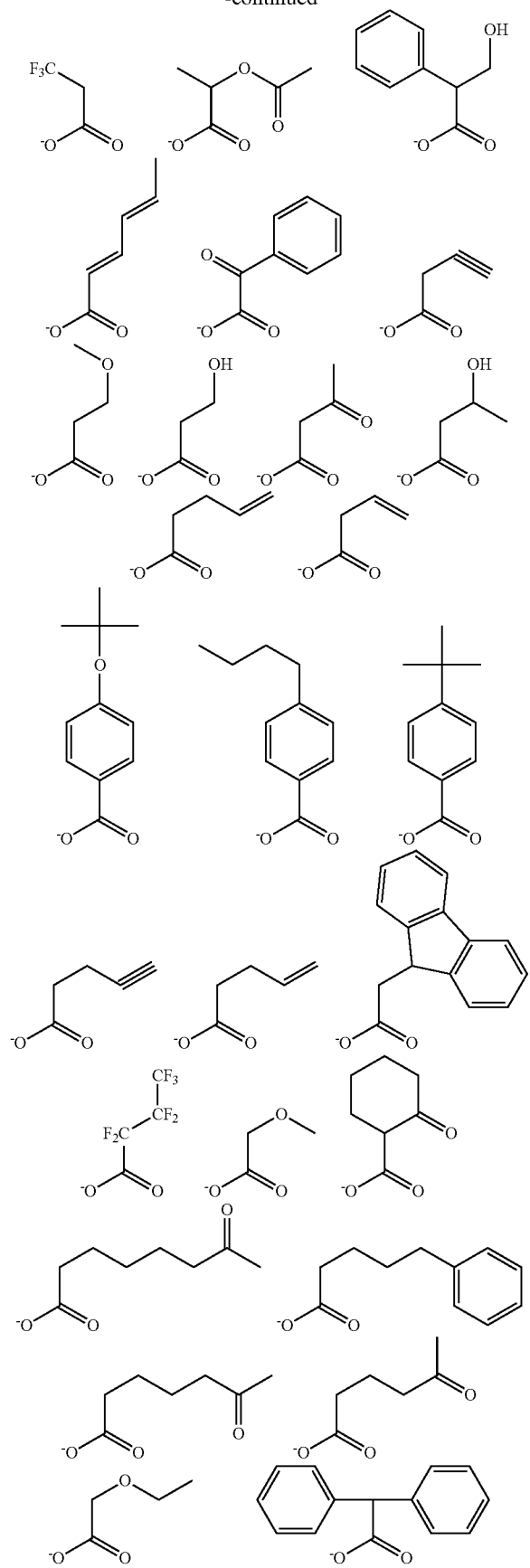
28
-continued
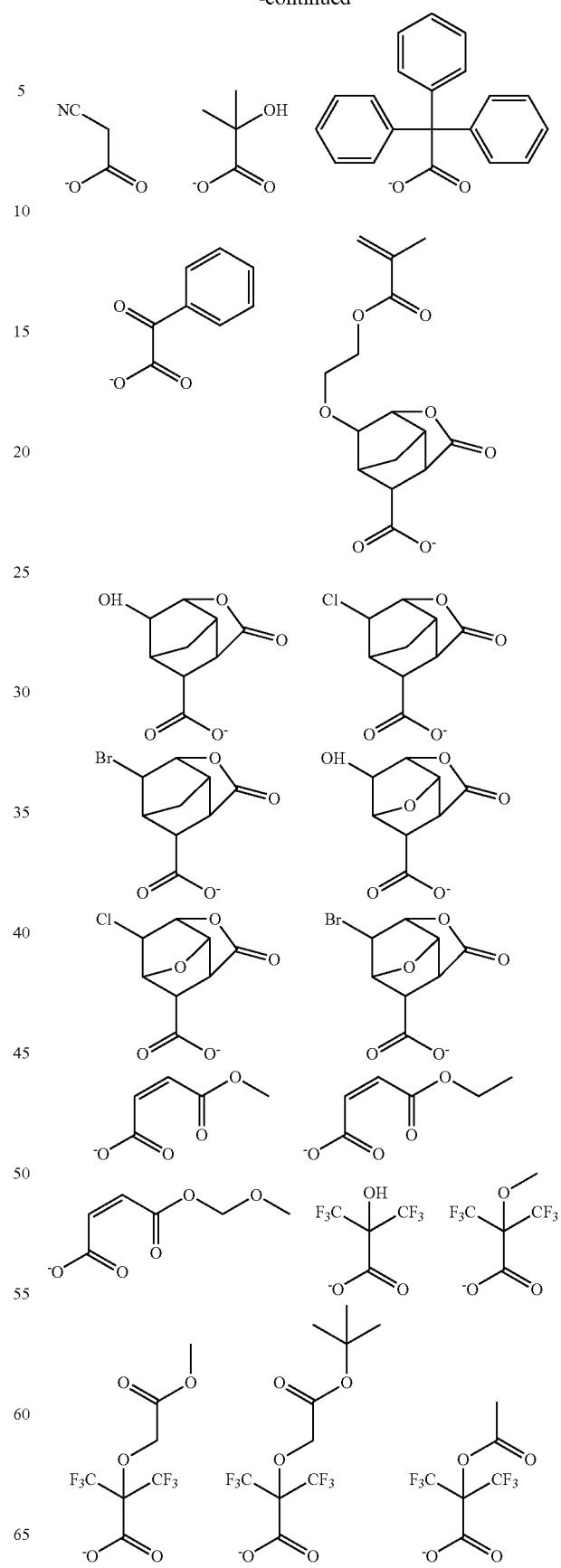

29
-continued
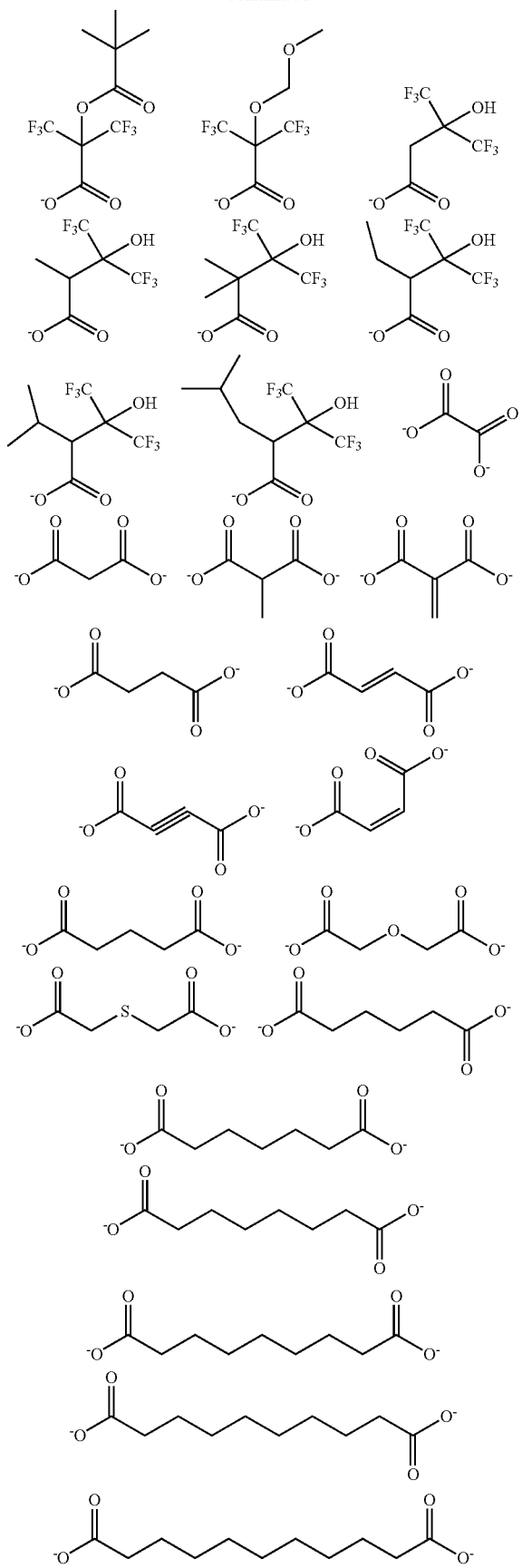
30
-continued
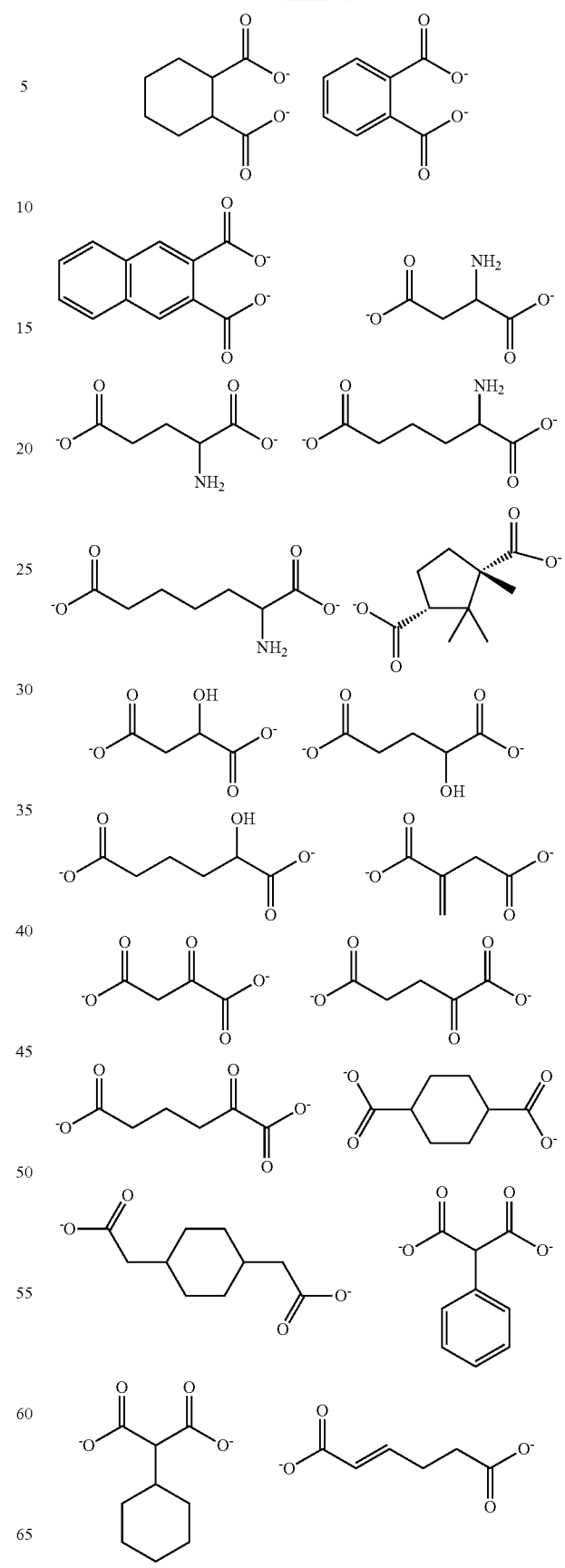

-continued
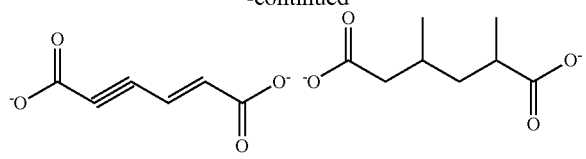
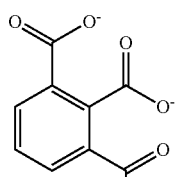
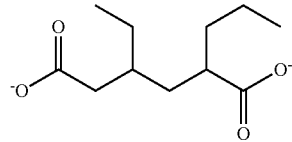
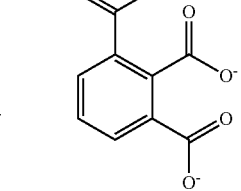
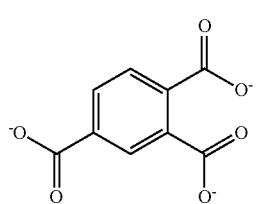
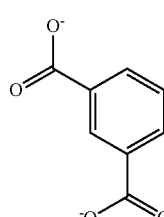
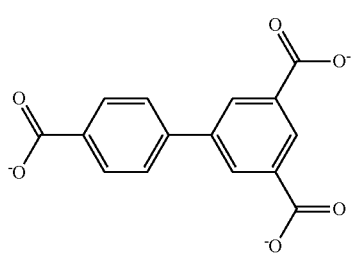
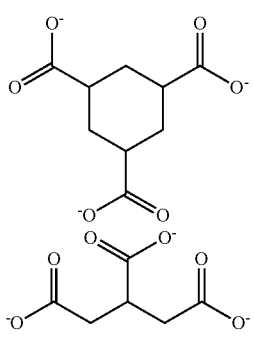
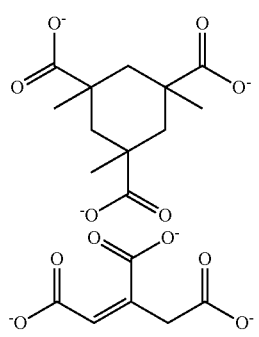
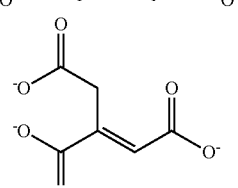
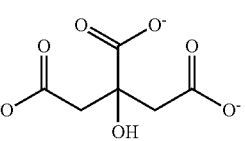
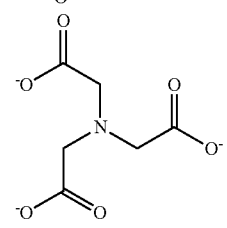
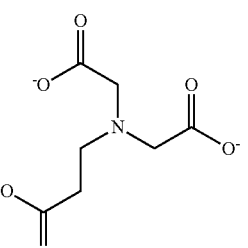
-continued
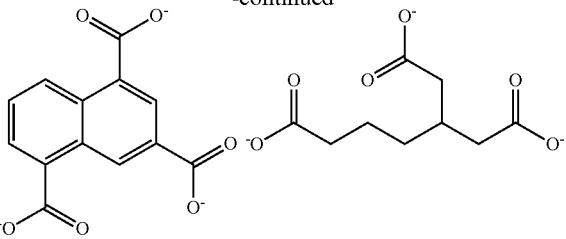
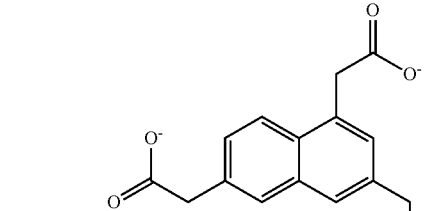
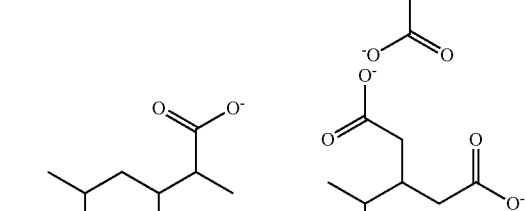
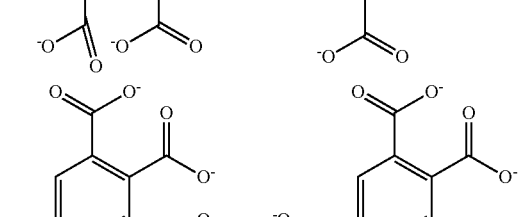
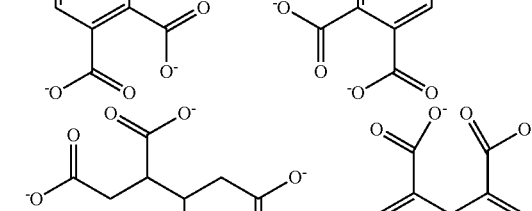
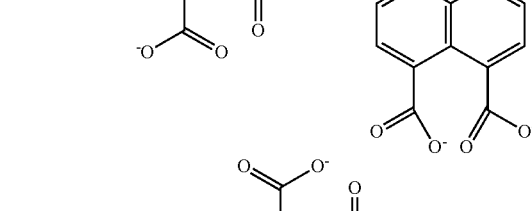
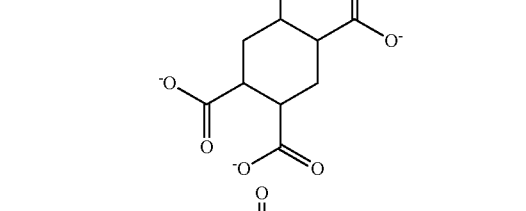
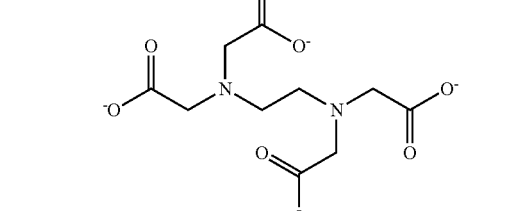

33
-continued
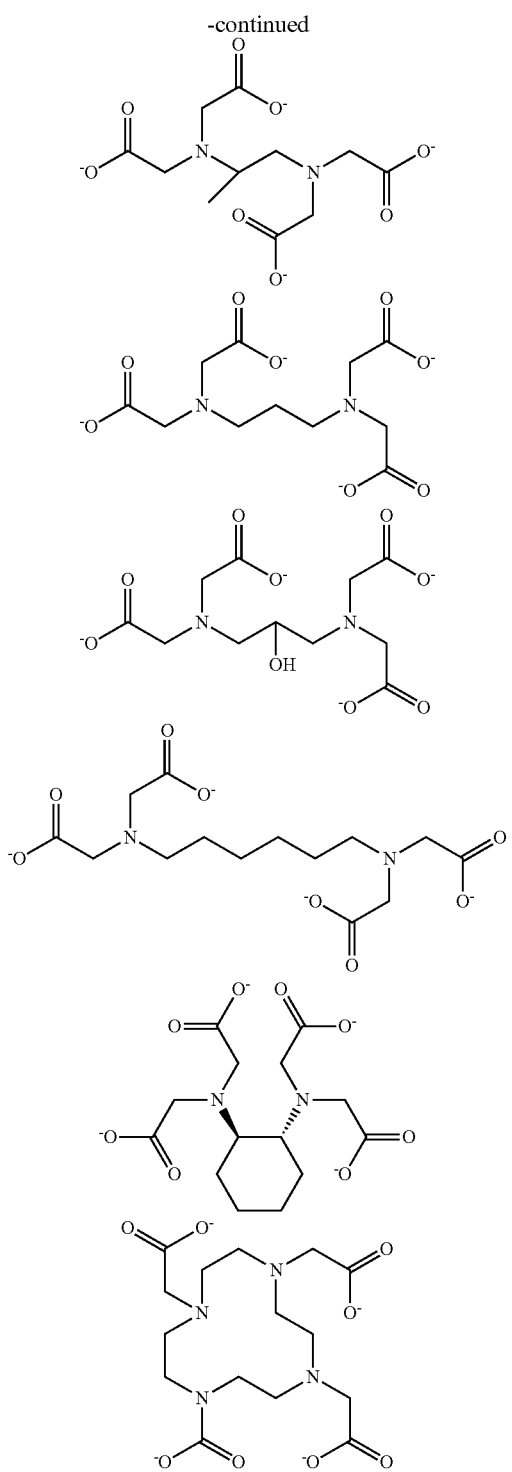
Acetylacetone, typical of the β-diketone, takes an enol form to create a complex with metal M as shown below.
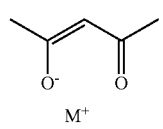
34
Suitable β-diketones belonging to Group B, that is, substituted or unsubstituted acetylacetones are illustrated below.
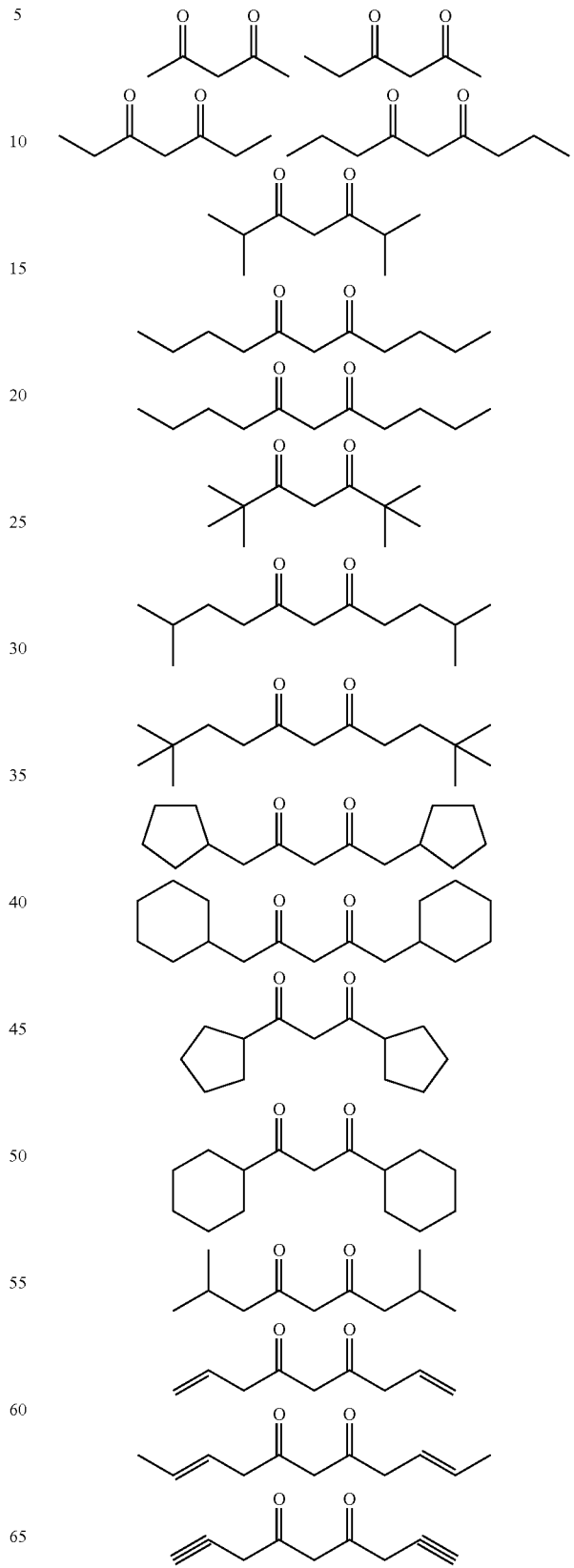

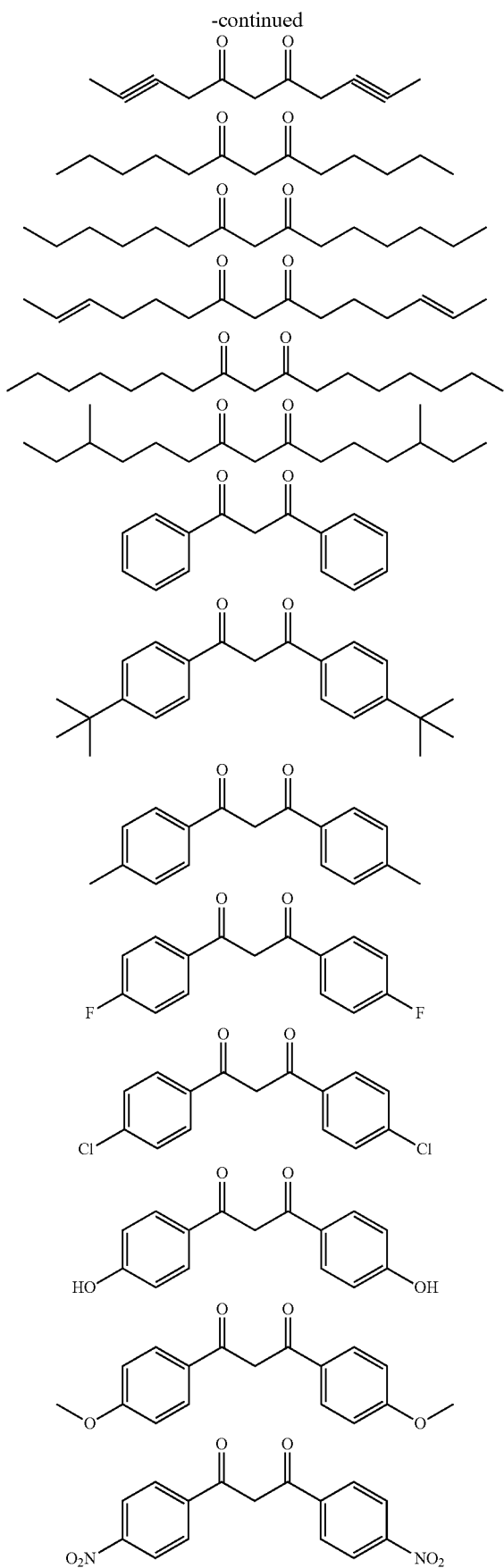
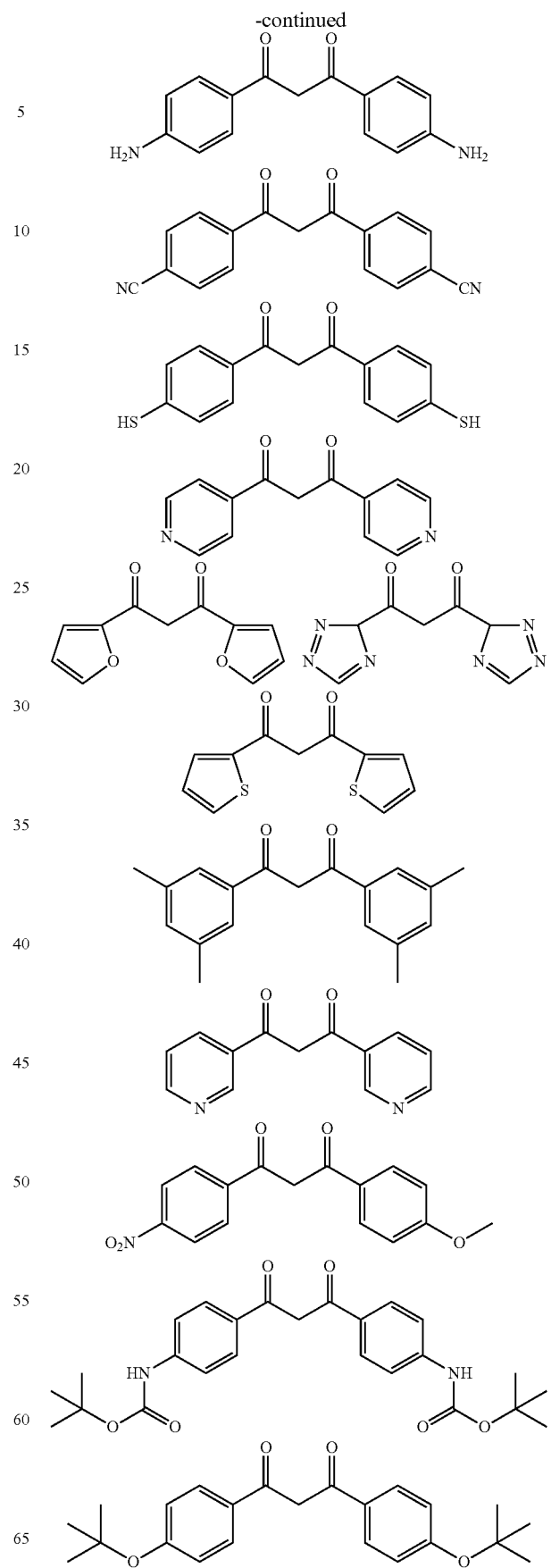

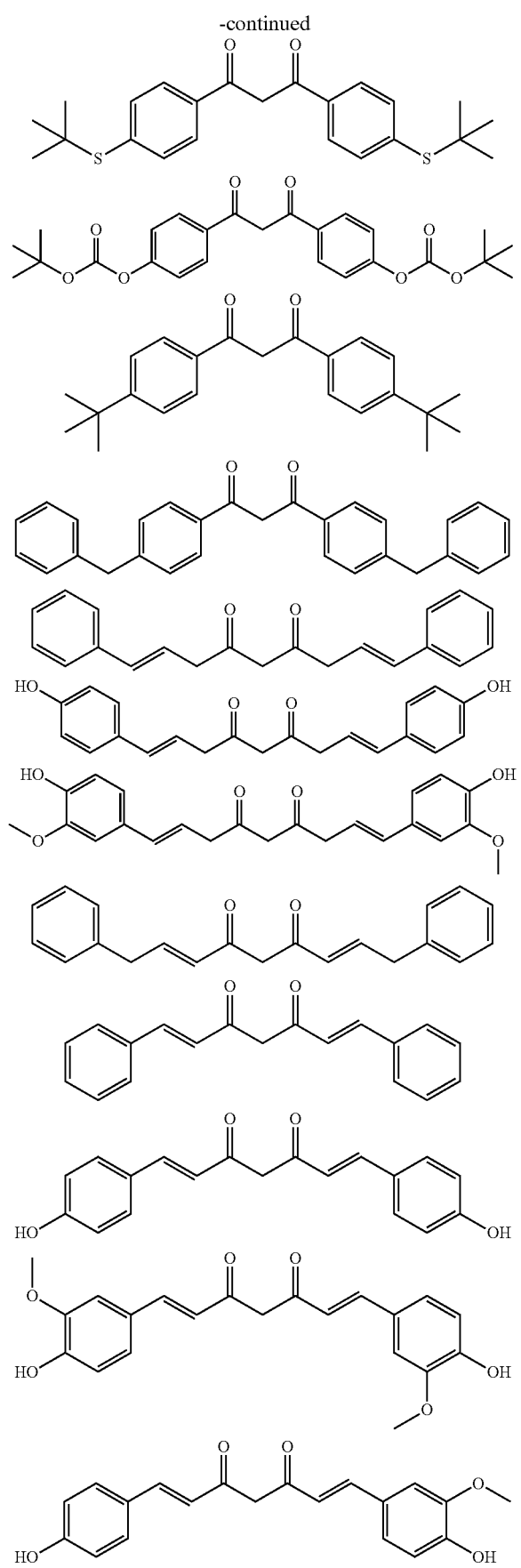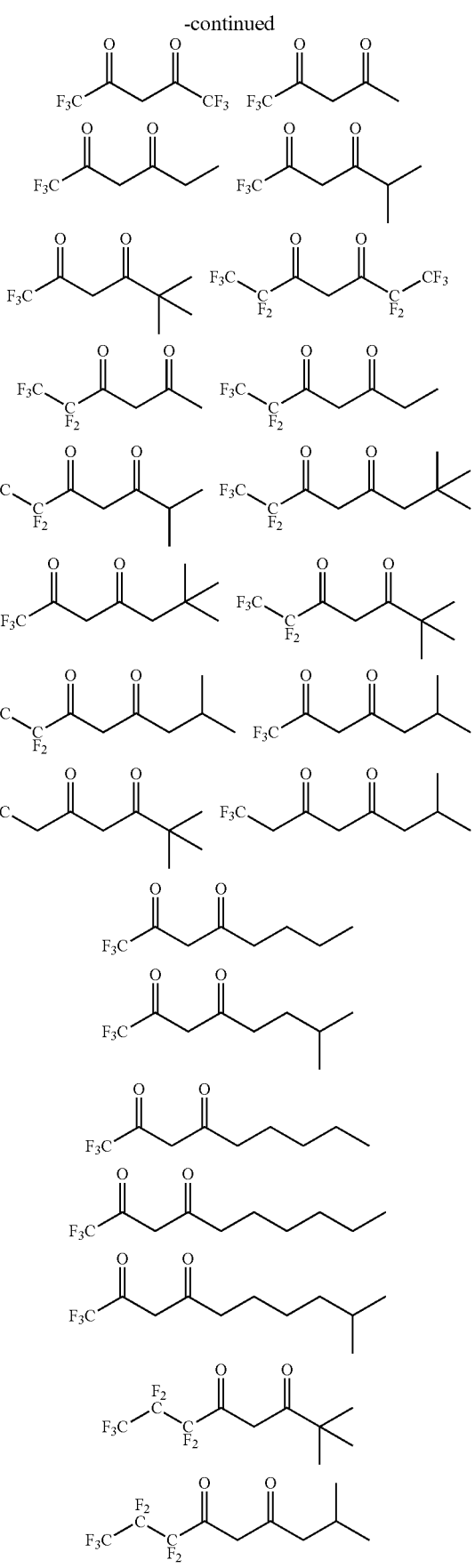

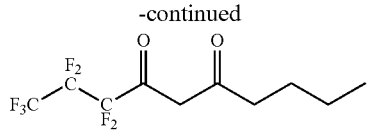
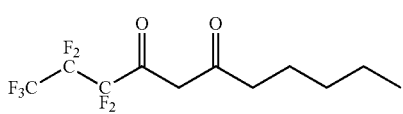
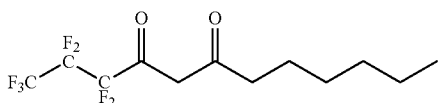
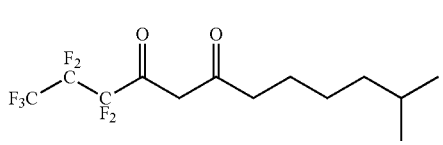
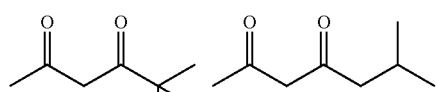
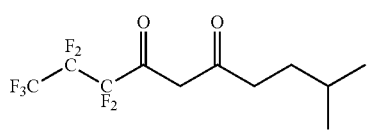
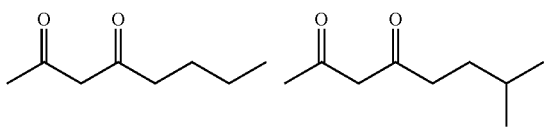
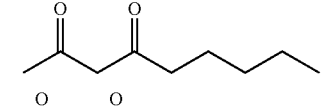
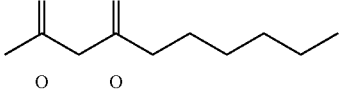
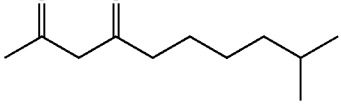

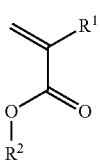
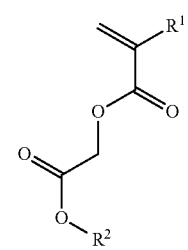
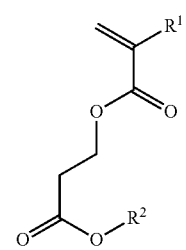
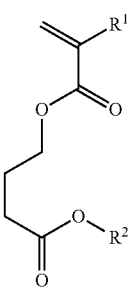
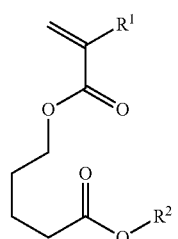
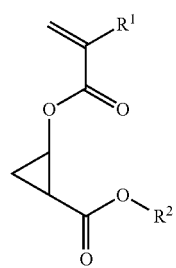
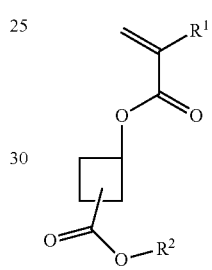
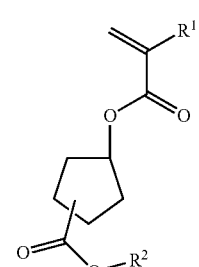
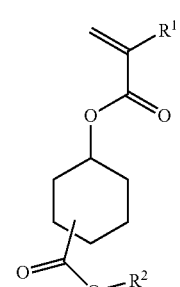
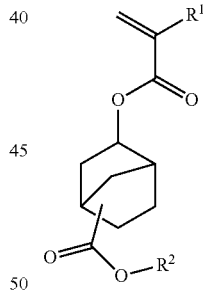
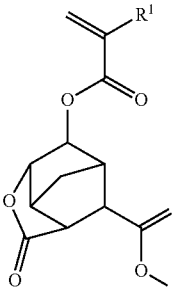
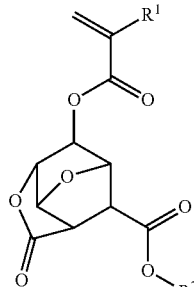

Although most β-diketones are of the above formulae wherein $R^{15}$ and $R^{16}$ are the same, $R^{15}$ and $R^{16}$ may be different as described in JP-A 2004-175755. Acetylacetone wherein both $R^{15}$ and $R^{16}$ are methyl is most common, but has the drawback of poor solubility in certain organic solvents. The total number of carbon atoms in $R^{15}$ and $R^{16}$ is preferably at least 3, more preferably at least 4.

Of the recurring units in the polymer used herein, the acid labile group-bearing recurring units, that is, the recurring units (a1) in formula (1) are units in which the hydrogen atom of carboxyl group, specifically the hydrogen atom of hydroxyl group on (meth)acrylate is substituted by an acid labile group. Suitable monomers from which these units are derived are exemplified below.

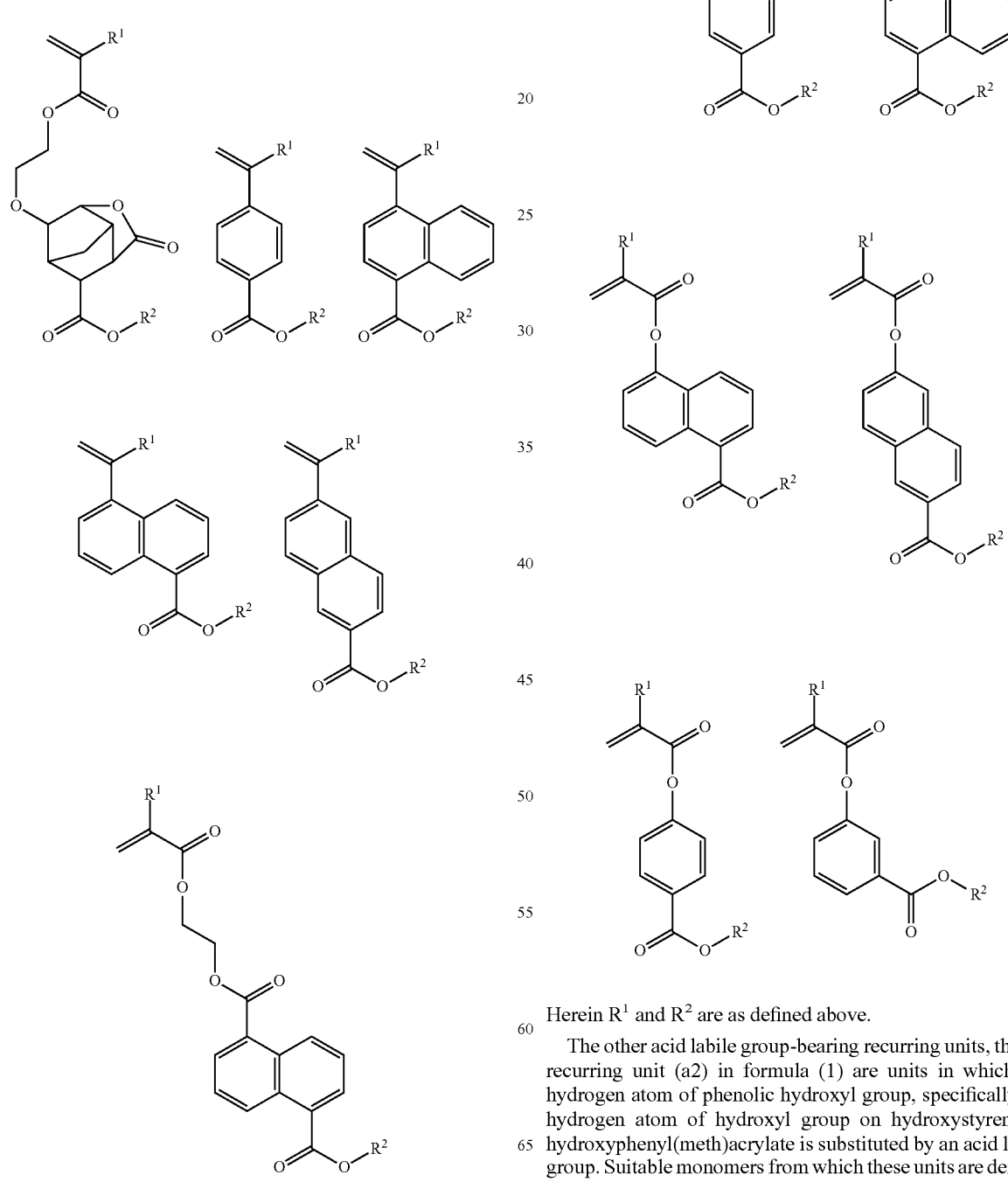

Herein R[1] and R[2] are as defined above.

The other acid labile group-bearing recurring units, that is, recurring unit (a2) in formula (1) are units in which the hydrogen atom of phenolic hydroxyl group, specifically the hydrogen atom of hydroxyl group on hydroxystyrene or hydroxyphenyl(meth)acrylate is substituted by an acid labile group. Suitable monomers from which these units are derived are exemplified below.

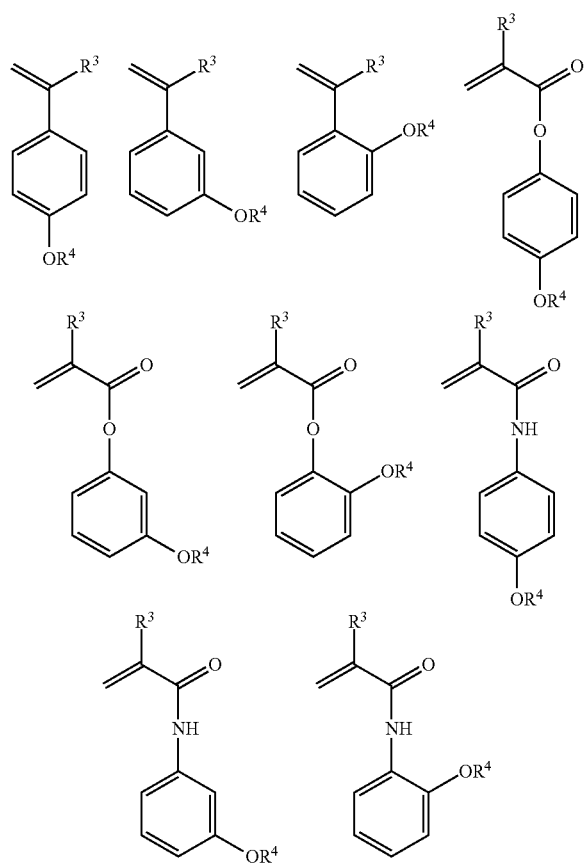

Herein R³ and R⁴ are as defined above.

The acid labile groups represented by R² and R⁴ may be selected from a variety of such groups. The acid labile groups may be the same or different and preferably include groups of the following formulae (A-1) to (A-3).

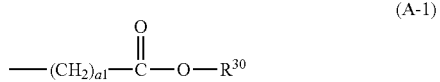

(A-1)

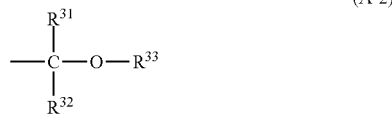

(A-2)

(A-3)

In formula (A-1), $R^{30}$ is a tertiary alkyl group of 4 to carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (A-3). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter a1 is an integer of 0 to 6.

In formula (A-2), $R^{31}$ and $R^{32}$ each are hydrogen or a straight, branched or cyclic alkyl group of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, and n-octyl. $R^{33}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of such alkyl groups in which some hydrogen atoms are replaced by hydroxyl, alkoxy, oxo, amino, alkylamino or the like. Illustrative examples of the substituted alkyl groups are shown below.

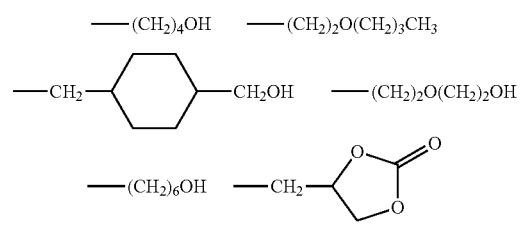

A pair of $R^{31}$ and $R^{32}$, $R^{31}$ and $R^{33}$, or $R^{32}$ and $R^{33}$ may bond together to form a ring with the carbon and oxygen atoms to which they are attached. Each of participant $R^{31}$, $R^{32}$ and $R^{33}$ is a straight or branched alkylene group of 1 to 18 carbon atoms, preferably 1 to 10 carbon atoms when they form a ring, while the ring preferably has 3 to 10 carbon atoms, more preferably 4 to 10 carbon atoms.

Examples of the acid labile groups of formula (A-1) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Also included are substituent groups having the formulae (A-1)-1 to (A-1)-10.

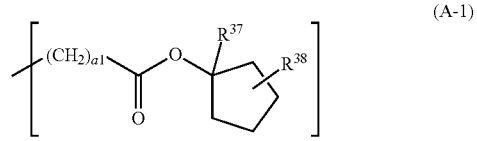

(A-1)

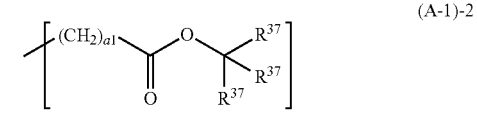

(A-1)-2

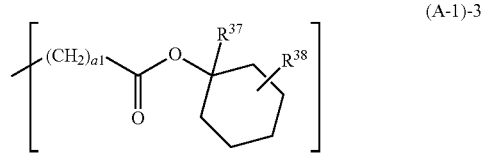

(A-1)-3

-continued

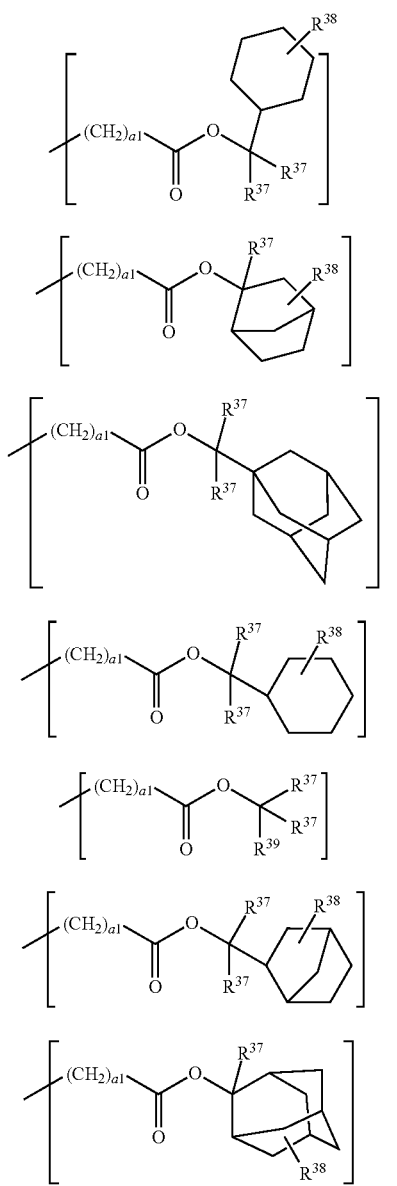

(A-1)-4
(A-1)-5
(A-1)-6
(A-1)-7
(A-1)-8
(A-1)-9
(A-1)-10

Herein R³⁷ is each independently a straight, branched or cyclic $C_1$-$C_{10}$ alkyl group or $C_6$-$C_{20}$ aryl group, R³⁸ is hydrogen or a straight, branched or cyclic $C_1$-$C_{10}$ alkyl group, R³⁹ is each independently a straight, branched or cyclic $C_2$-$C_{10}$ alkyl group or $C_6$-$C_{20}$ aryl group, and a1 is as defined above.

Of the acid labile groups of formula (A-2), the straight and branched ones are exemplified by the following groups having formulae (A-2)-1 to (A-2)-69.

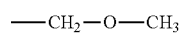 (A-2)-1

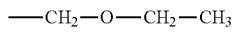 (A-2)-2

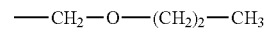 (A-2)-3

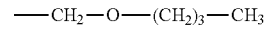 (A-2)-4

-continued

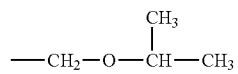 (A-2)-5

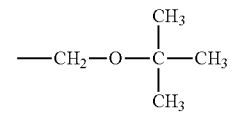 (A-2)-6

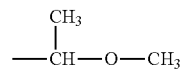 (A-2)-7

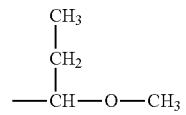 (A-2)-8

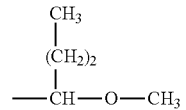 (A-2)-9

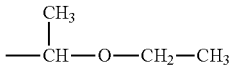 (A-2)-10

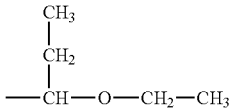 (A-2)-11

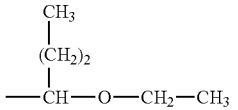 (A-2)-12

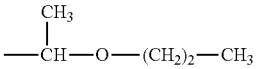 (A-2)-13

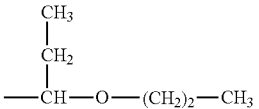 (A-2)-14

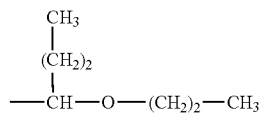 (A-2)-15

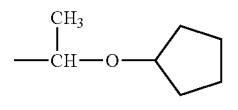 (A-2)-16

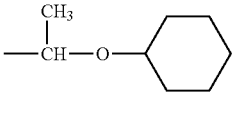 (A-2)-17

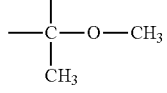 (A-2)-18

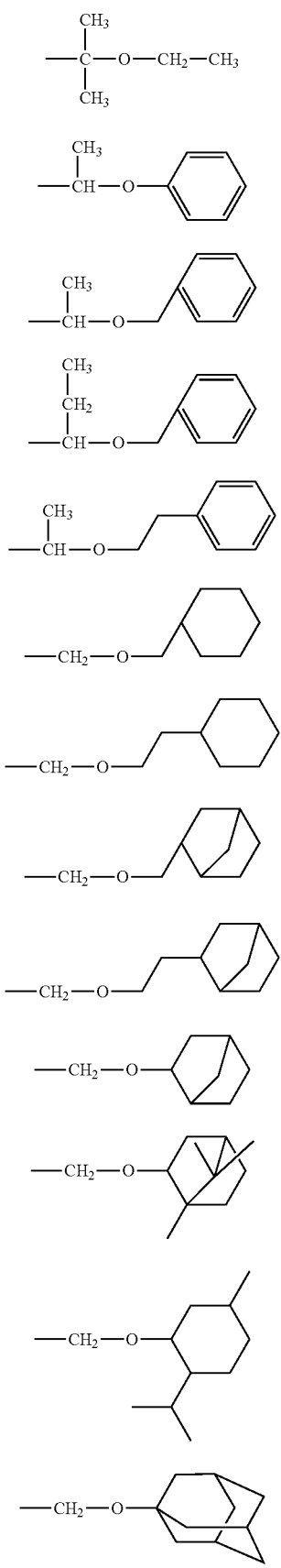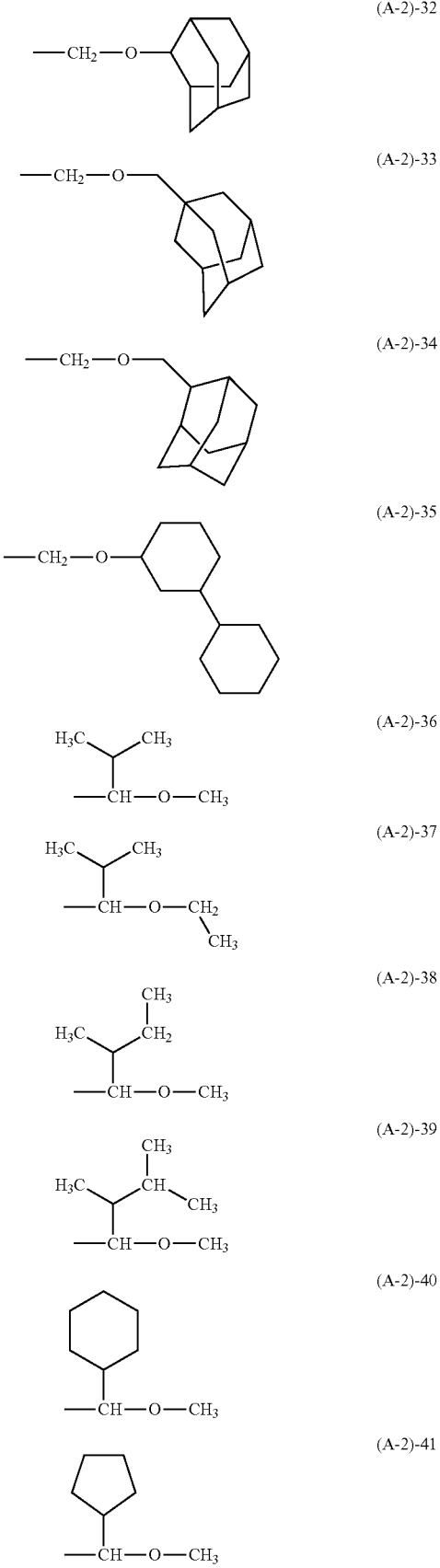

(A-2)-42 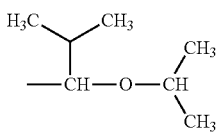
(A-2)-43 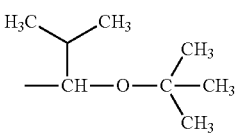
(A-2)-44 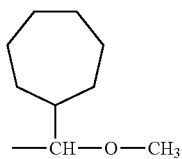
(A-2)-45 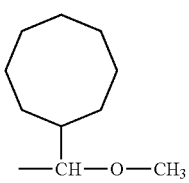
(A-2)-46 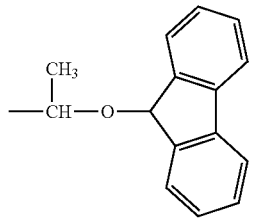
(A-2)-47 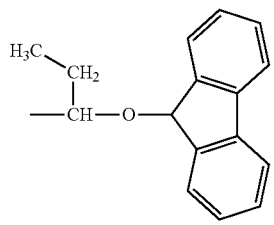
(A-2)-48 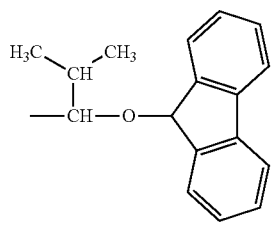
(A-2)-49 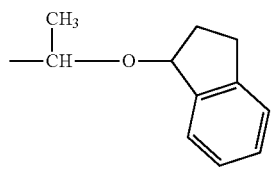
(A-2)-50 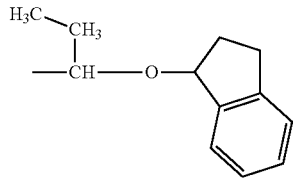
(A-2)-51 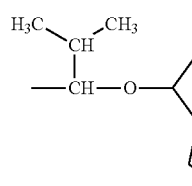
(A-2)-52 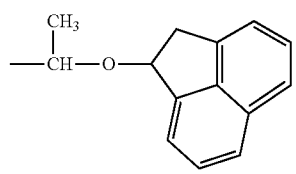
(A-2)-53 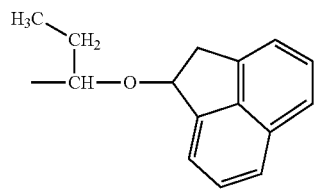
(A-2)-54 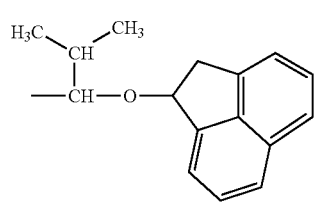
(A-2)-55 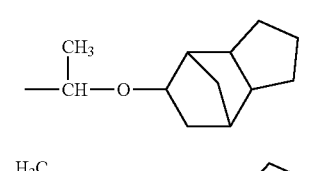
(A-2)-56 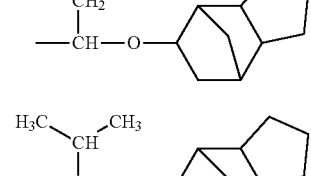
(A-2)-57 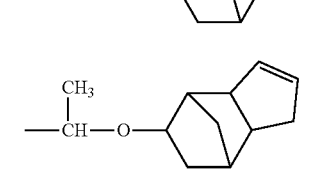
(A-2)-58
(A-2)-59

(A-2)-60 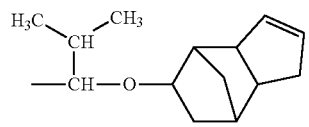

(A-2)-61 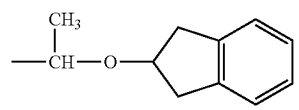

(A-2)-62 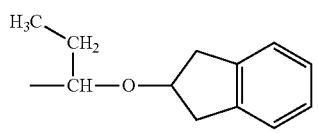

(A-2)-63 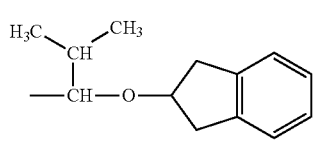

(A-2)-64 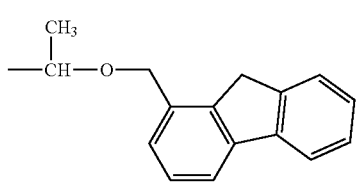

(A-2)-65 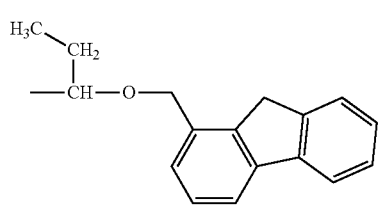

(A-2)-66 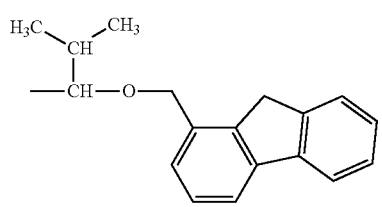

(A-2)-67 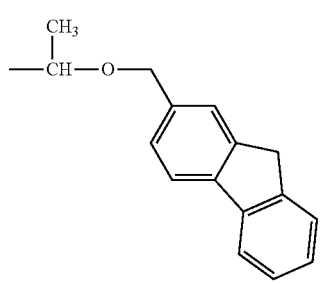

(A-2)-68 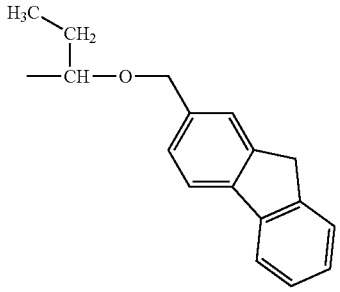

(A-2)-69 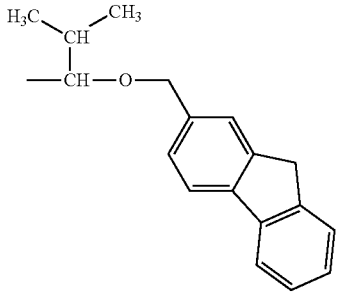

Of the acid labile groups of formula (A-2), the cyclic ones are, for example, tetrahydrofuran-2-yl, 2-methyltetrahydrofuran-2-yl, tetrahydropyran-2-yl, and 2-methyltetrahydropyran-2-yl.

Other examples of acid labile groups include those of the following formula (A-2a) or (A-2b) while the polymer may be crosslinked within the molecule or between molecules with these acid labile groups.

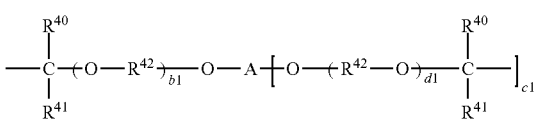
(A-2a)

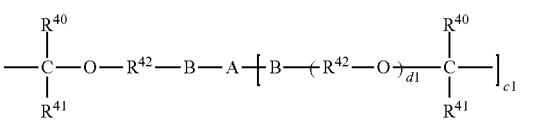
(A-2b)

Herein $R^{40}$ and $R^{41}$ each are hydrogen or a straight, branched or cyclic $C_1$-$C_8$ alkyl group, or $R^{40}$ and $R^{41}$, taken together, may form a ring with the carbon atom to which they are attached, and $R^{40}$ and $R^{41}$ are straight or branched $C_1$-$C_8$ alkylene groups when they form a ring. $R^{42}$ is a straight, branched or cyclic $C_1$-$C_{10}$ alkylene group. Each of b1 and d1 is 0 or an integer of 1 to 10, preferably 0 or an integer of 1 to 5, and c1 is an integer of 1 to 7. "A" is a (c1+1)-valent aliphatic or alicyclic saturated hydrocarbon group, aromatic hydrocarbon group or heterocyclic group having 1 to 50 carbon atoms, which may be separated by a heteroatom or in which some hydrogen atoms attached to carbon atoms may be substituted by hydroxyl, carboxyl, carbonyl moieties or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkyltriyl and alkyltetrayl groups, and $C_6$-$C_{30}$ arylene groups, which may contain a heteroatom or in which some hydrogen atoms attached to carbon atoms may be substituted by hydroxyl, carboxyl, acyl moieties or halogen atoms. The subscript c1 is preferably an integer of 1 to 3.

The crosslinking acetal groups of formulae (A-2a) and (A-2b) are exemplified by the following formulae (A-2)-70 through (A-2)-77.

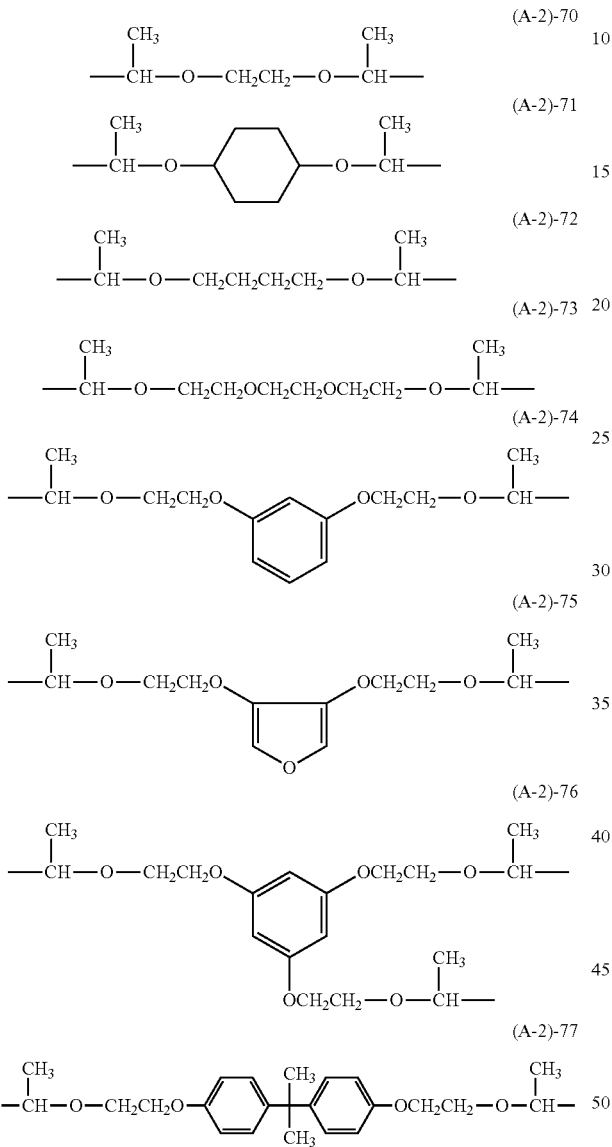

In formula (A-3), $R^{34}$, $R^{35}$ and $R^{36}$ each are a monovalent hydrocarbon group, typically a straight, branched or cyclic $C_1$-$C_{20}$ alkyl group or straight, branched or cyclic $C_2$-$C_{20}$ alkenyl group, which may contain a heteroatom such as oxygen, sulfur, nitrogen or fluorine. A pair of $R^{34}$ and $R^{35}$, $R^{34}$ and $R^{36}$, or $R^{35}$ and $R^{36}$ may bond together to form a $C_3$-$C_{20}$ aliphatic ring with the carbon atom to which they are attached.

Exemplary tertiary alkyl groups of formula (A-3) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Other exemplary tertiary alkyl groups include those of the following formulae (A-3)-1 to (A-3)-18.

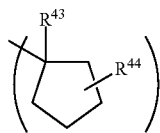
(A-3)-1

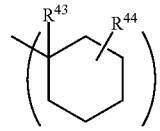
(A-3)-2

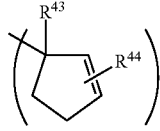
(A-3)-3

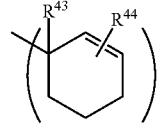
(A-3)-4

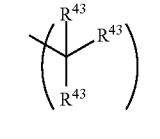
(A-3)-5

(A-3)-6

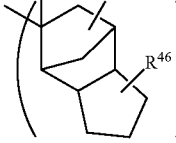
(A-3)-7

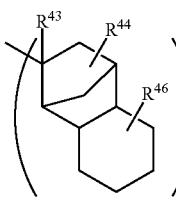
(A-3)-8

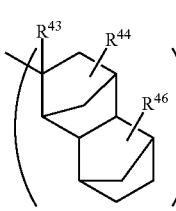
(A-3)-9

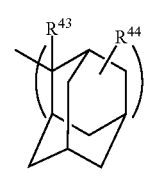
(A-3)-10

-continued (A-3)-11 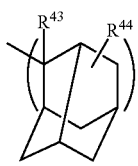

(A-3)-12

(A-3)-13 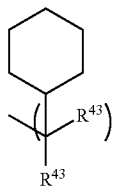

(A-3)-14 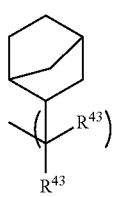

(A-3)-15 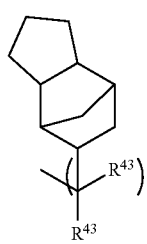

(A-3)-16 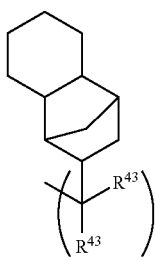

(A-3)-17 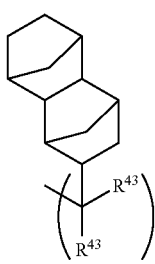

-continued (A-3)-18 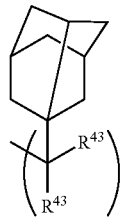

Herein $R^{43}$ is each independently a straight, branched or cyclic $C_1$-$C_8$ alkyl group or $C_6$-$C_{20}$ aryl group, typically phenyl, $R^{44}$ and $R^{46}$ each are hydrogen or a straight, branched or cyclic $C_1$-$C_{20}$ alkyl group, and $R^{45}$ is a $C_6$-$C_{20}$ aryl group, typically phenyl.

The polymer may be crosslinked within the molecule or between molecules with groups having $R^{47}$ which is a di- or multi-valent alkylene or arylene group, as shown by the following formulae (A-3)-19 and (A-3)-20.

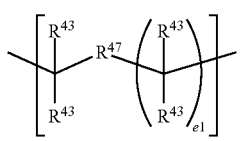
(A-3)-19

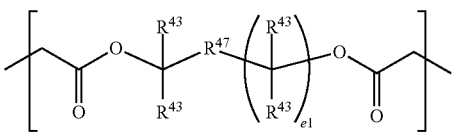
(A-3)-20

Herein $R^{43}$ is as defined above, $R^{47}$ is a straight, branched or cyclic $C_1$-$C_{20}$ alkylene group or arylene group, typically phenylene, which may contain a heteroatom such as oxygen, sulfur or nitrogen, and e1 is an integer of 1 to 3.

Of recurring units having acid labile groups of formula (A-3), recurring units of (meth)acrylate having an exo-form structure represented by the formula (A-3)-21 are preferred as recurring unit (a1).

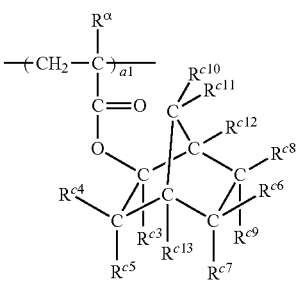
(A-3)-21

Herein, $R^\alpha$ is hydrogen or methyl; $R^{c3}$ is a straight, branched or cyclic $C_1$-$C_8$ alkyl group or an optionally substituted $C_6$-$C_{20}$ aryl group; $R^{c4}$ to $R^{c9}$, $R^{c12}$ and $R^{c13}$ are each independently hydrogen or a monovalent $C_1$-$C_{15}$ hydrocarbon group which may contain a heteroatom; and $R^{c10}$ and $R^{c11}$ are hydrogen or a monovalent $C_1$-$C_{15}$ hydrocarbon group which may contain a heteroatom. Alternatively, a pair of $R^{c4}$ and $R^{c5}$, $R^{c6}$ and $R^{c8}$, $R^{c6}$ and $R^{c9}$, $R^{c7}$ and $R^{c9}$, $R^{c7}$ and $R^{c13}$, $R^{c8}$ and $R^{c12}$, $R^{c10}$ and $R^{c11}$, or $R^{c11}$ and $R^{c12}$, taken together, may form a ring, and in that event, each ring-forming R is a divalent $C_1$-$C_{15}$ hydrocarbon group which may contain a heteroatom. Also, a pair of $R^{c4}$ and $R^{c13}$, $R^{c10}$ and $R^{c13}$, or $R^{c6}$ and $R^{c8}$ which are attached to vicinal carbon atoms may bond together directly to form a double bond. The formula also represents an enantiomer.

The ester form monomers from which recurring units having an exo-form structure represented by formula (A-3)-21 are derived are described in U.S. Pat. No. 6,448,420 (JP-A 2000-327633). Illustrative non-limiting examples of suitable monomers are given below.

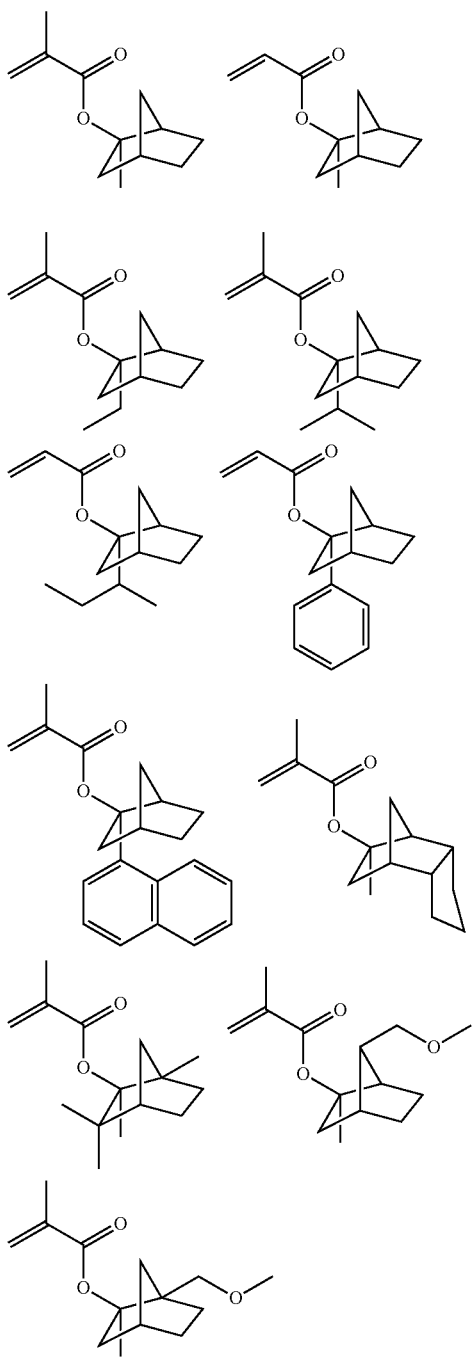

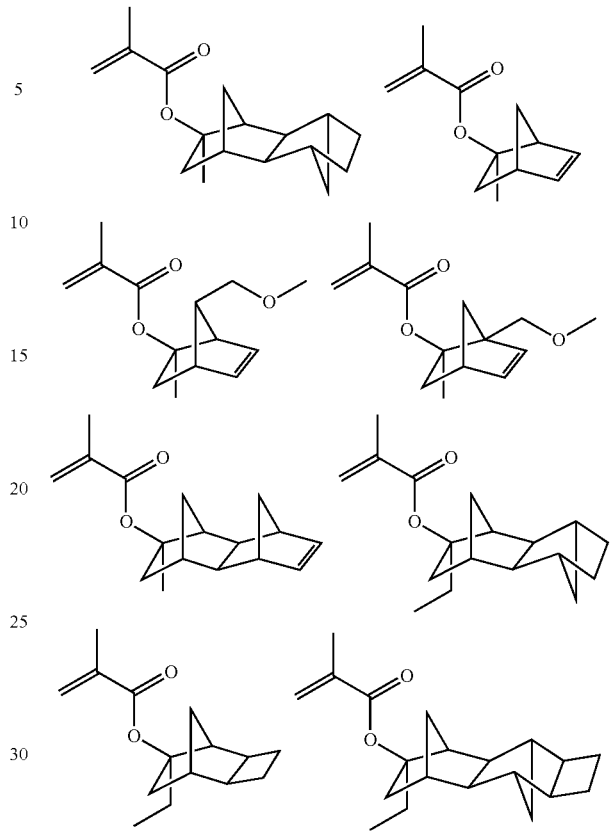

Also included in the acid labile groups of formula (A-3) in recurring units (a1) are acid labile groups of (meth)acrylate having furandiyl, tetrahydrofurandiyl or oxanorbornanediyl as represented by the following formula (A-3)-22.

(A-3)-22

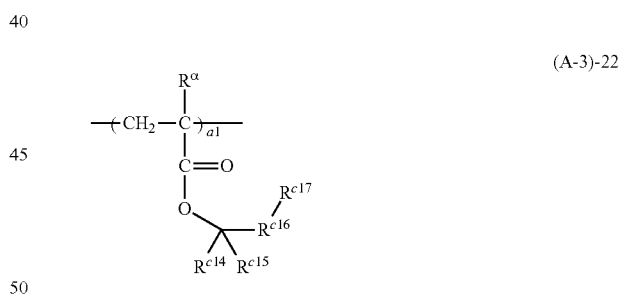

Herein, $R^\alpha$ is as defined above; $R^{c14}$ and $R^{c15}$ are each independently a monovalent, straight, branched or cyclic $C_1$-$C_{10}$ hydrocarbon group, or $R^{c14}$ and $R^{c15}$, taken together, may form an aliphatic hydrocarbon ring with the carbon atom to which they are attached. $R^{c16}$ is a divalent group selected from furandiyl, tetrahydrofurandiyl and oxanorbornanediyl. $R^{c17}$ is hydrogen or a monovalent, straight, branched or cyclic $C_1$-$C_{10}$ hydrocarbon group which may contain a heteroatom.

Examples of the monomers from which the recurring units substituted with acid labile groups having furandiyl, tetrahydrofurandiyl and oxanorbornanediyl are derived are shown below. Note that Me is methyl and Ac is acetyl.

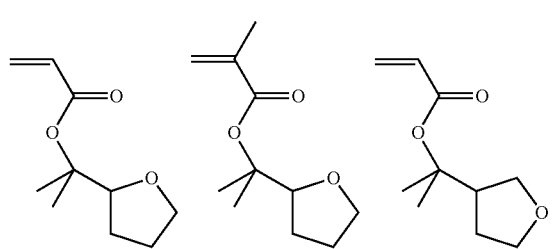
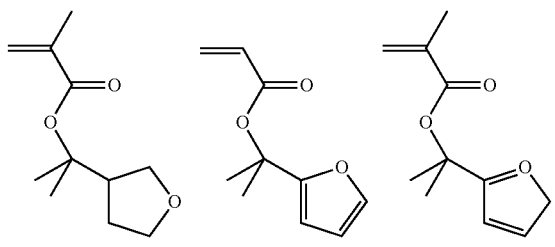
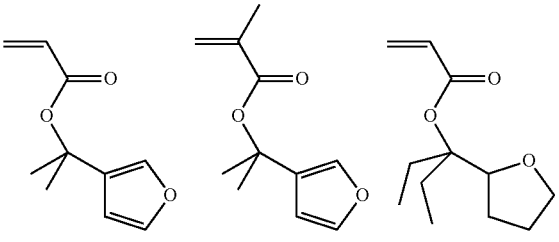
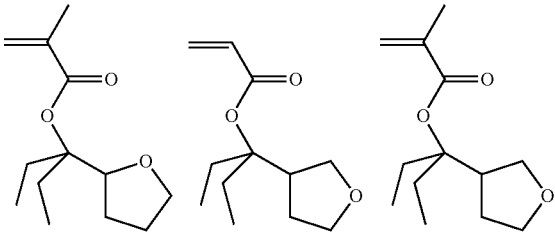
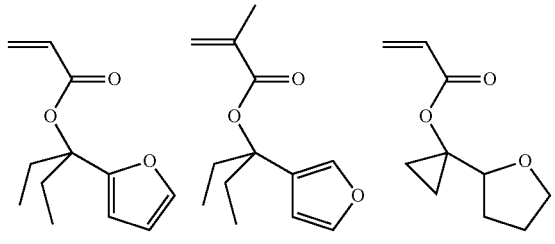
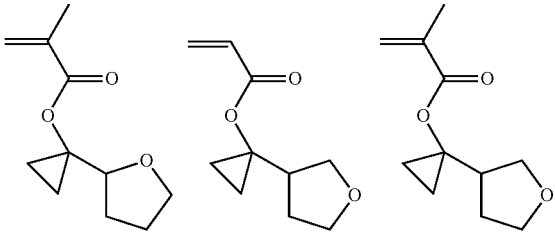
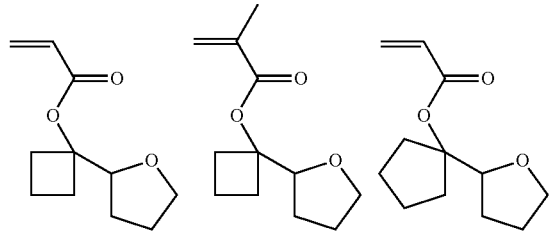
-continued
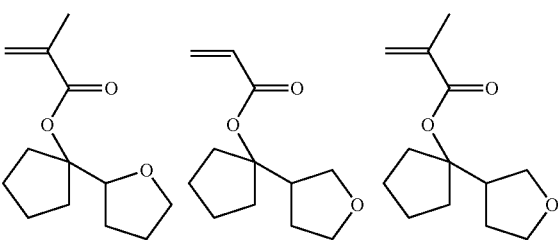
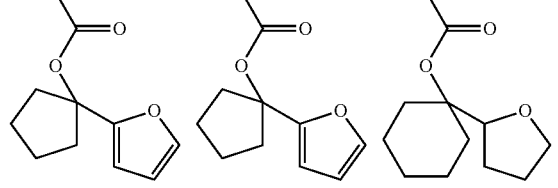
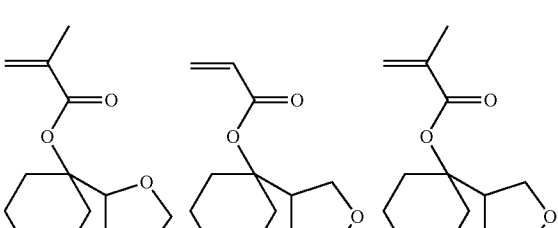
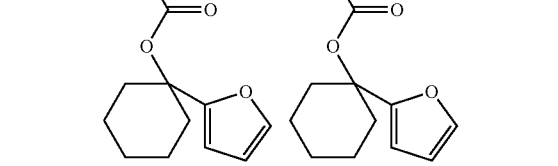
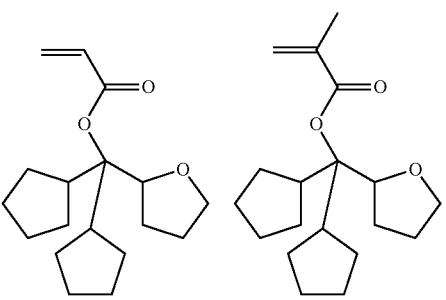
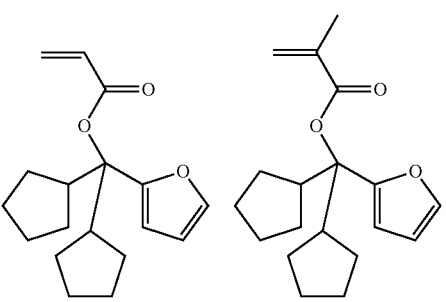

61
-continued
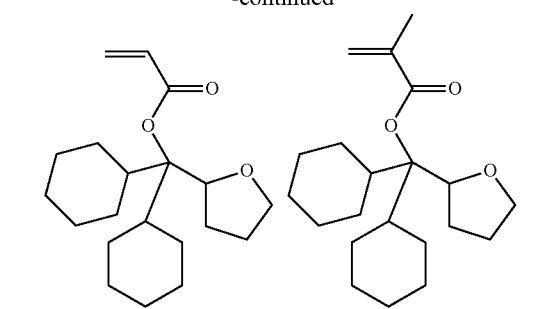
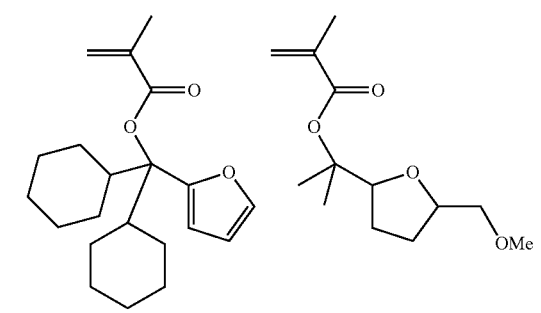
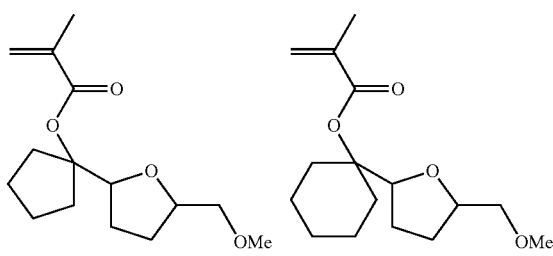
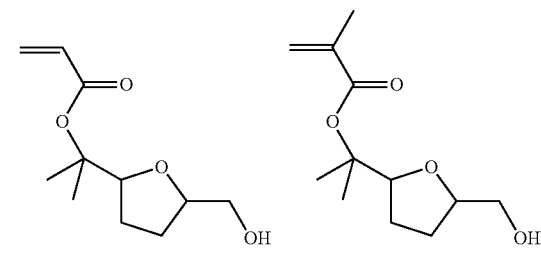
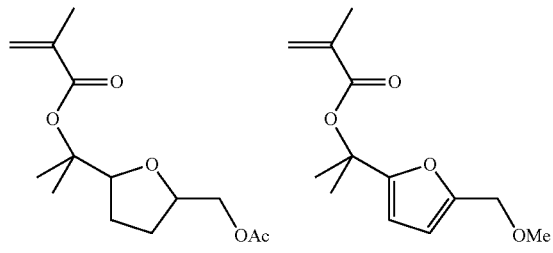
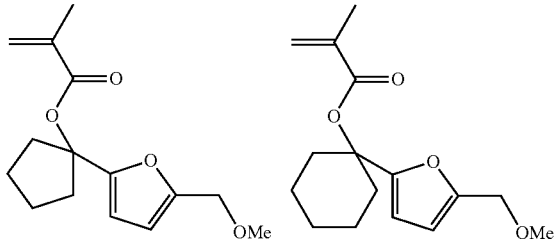
62
-continued
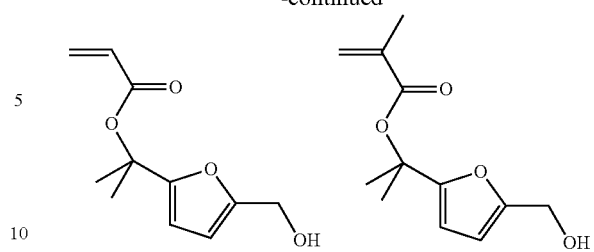
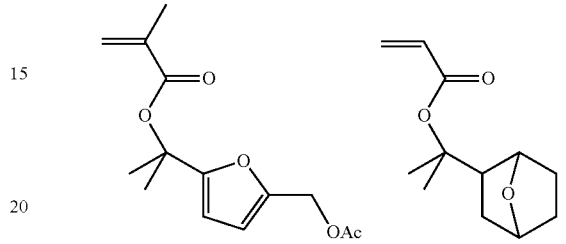
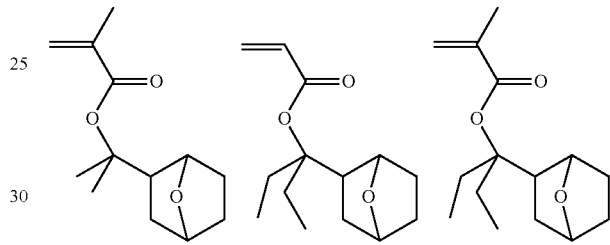
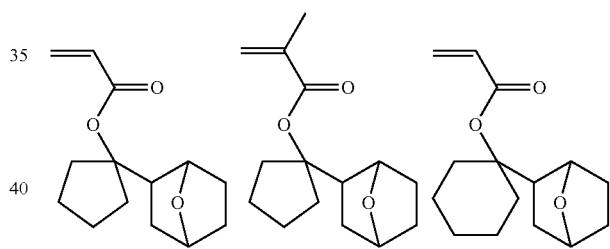
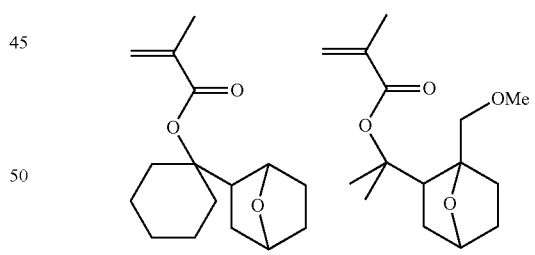
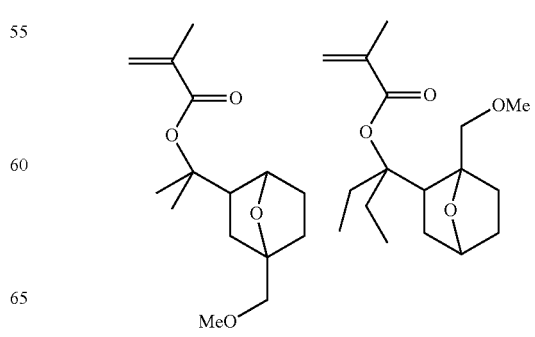

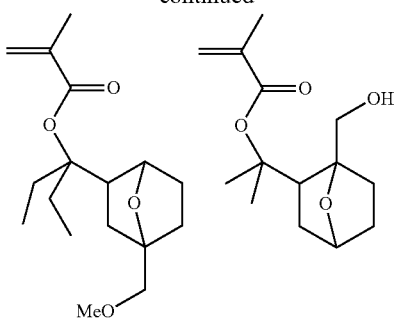
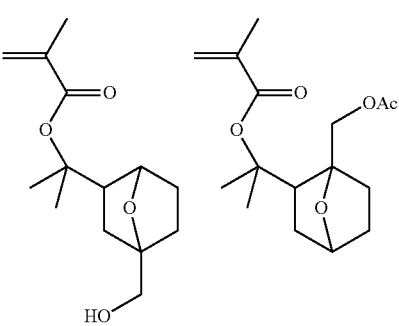
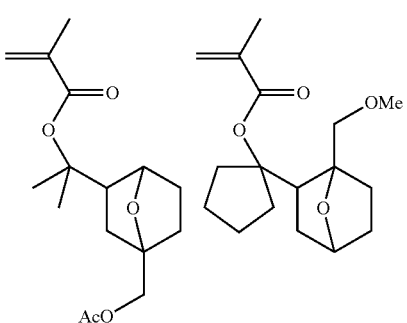
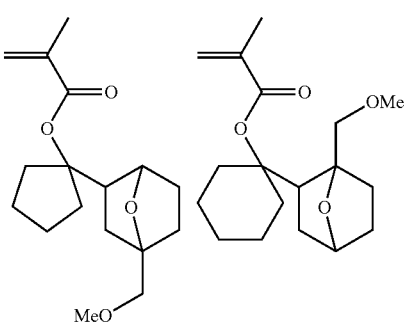
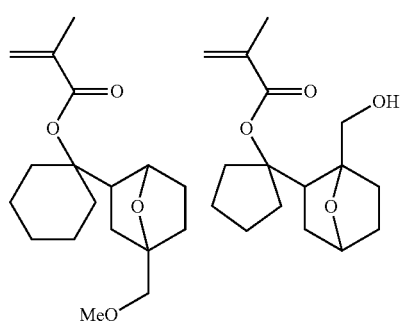

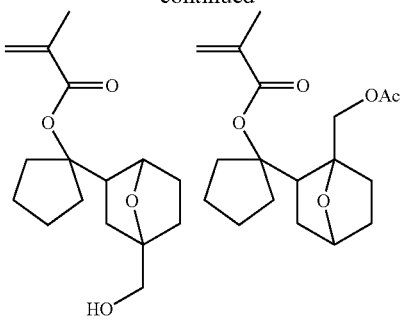

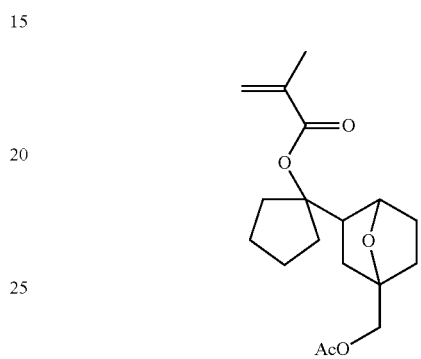

The acid labile group $R^2$ in recurring units (a1) may be a group having the general formula (A-3)-23.

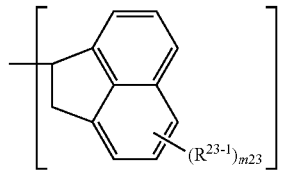

(A-3)-23

Herein $R^{23-1}$ is hydrogen, a $C_1$-$C_4$ alkyl, alkoxy, alkanoyl or alkoxycarbonyl, $C_6$-$C_{10}$ aryl, halogen or cyano group, and m23 is an integer of 1 to 4.

Examples of the monomer from which recurring units (a1) having an acid labile group of formula (A-3)-23 substituted thereon are derived are shown below.

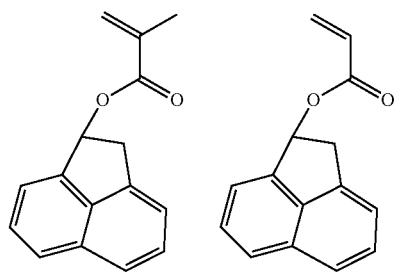

-continued
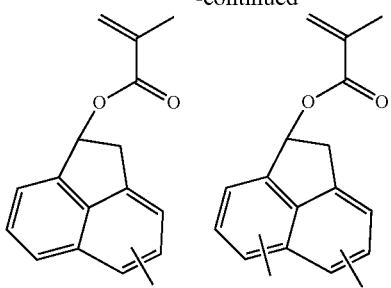
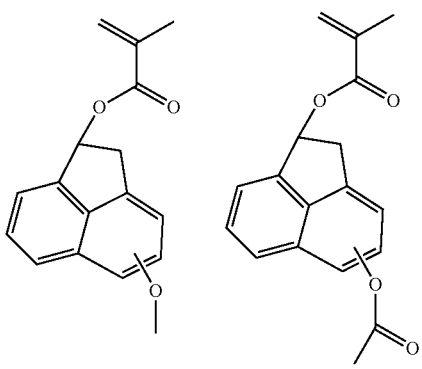
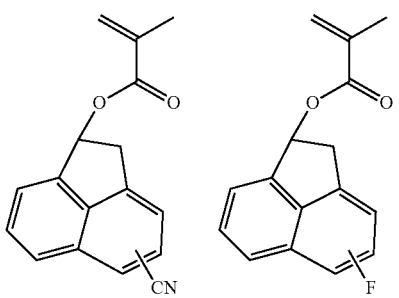
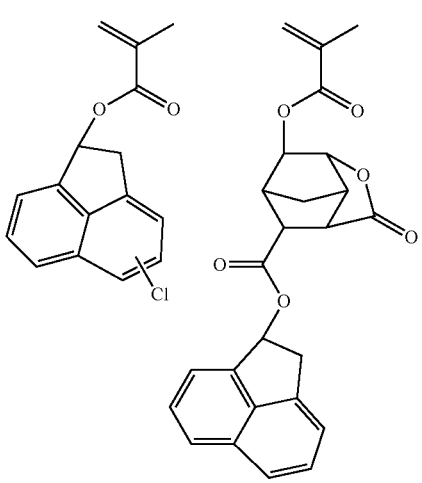
-continued
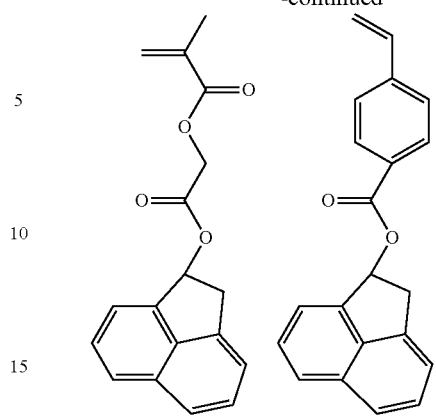
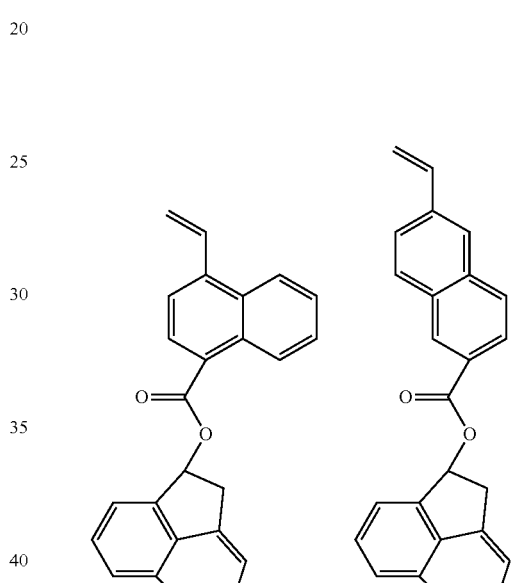
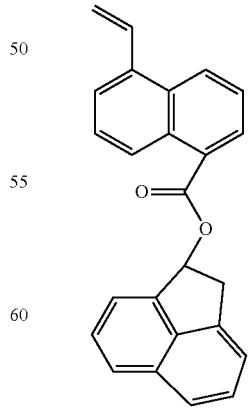
The acid labile group $R^2$ in recurring units (a1) may be a group having the general formula (A-3)-24.

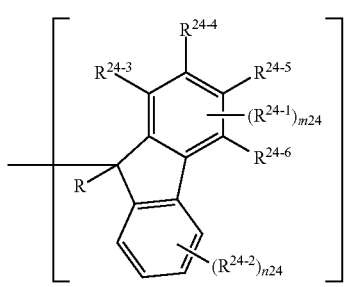
(A-3)-24

Herein $R^{24-1}$ and $R^{24-2}$ each are hydrogen, a $C_1$-$C_4$ alkyl, alkoxy, alkanoyl or alkoxycarbonyl, hydroxyl, $C_6$-$C_{10}$ aryl, halogen or cyano group, R is hydrogen, a straight, branched or cyclic $C_1$-$C_{12}$ alkyl group, $C_2$-$C_{12}$ alkenyl group, $C_2$-$C_{12}$ alkynyl group, or $C_6$-$C_{10}$ aryl group which may contain oxygen or sulfur, $R^{24-3}$, $R^{24-4}$, $R^{24-5}$, and $R^{24-6}$ are hydrogen or a pair of $R^{24-3}$ and $R^{24-4}$, $R^{24-4}$ and $R^{24-5}$, or $R^{24-5}$ and $R^{24-6}$, taken together, may form a benzene ring, and m24 and n24 each are an integer of 1 to 4.

Examples of the monomer from which recurring units (a1) having an acid labile group of formula (A-3)-24 substituted thereon are derived are shown below.

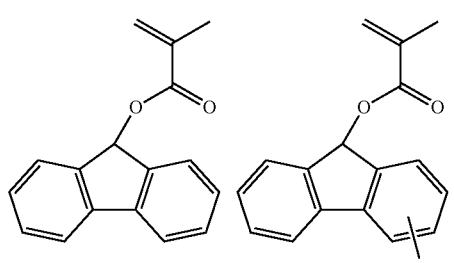

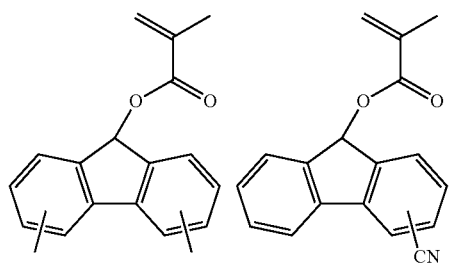

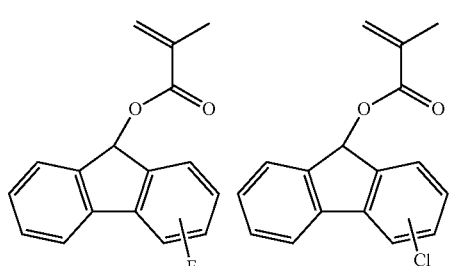

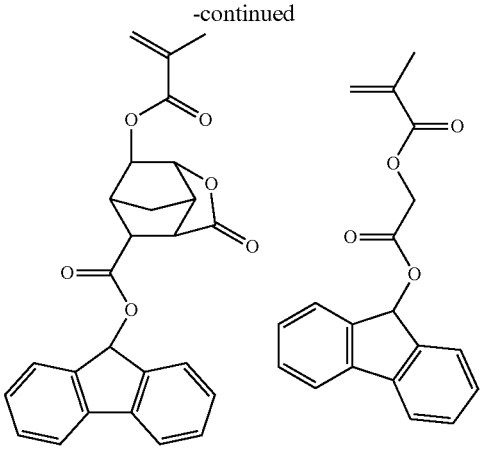

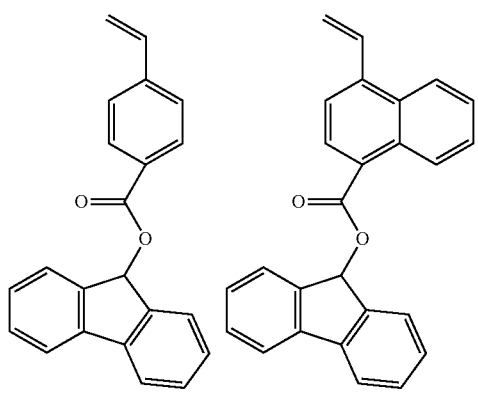

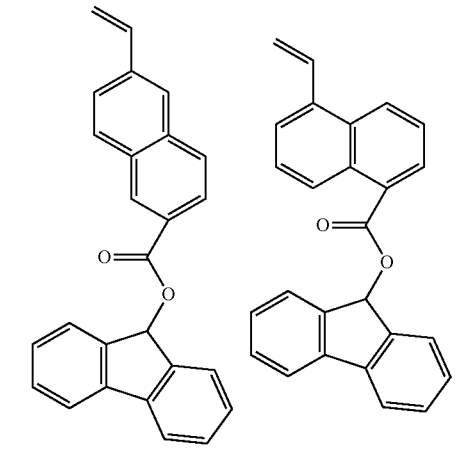

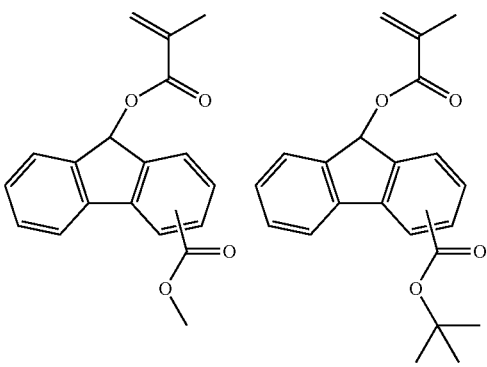

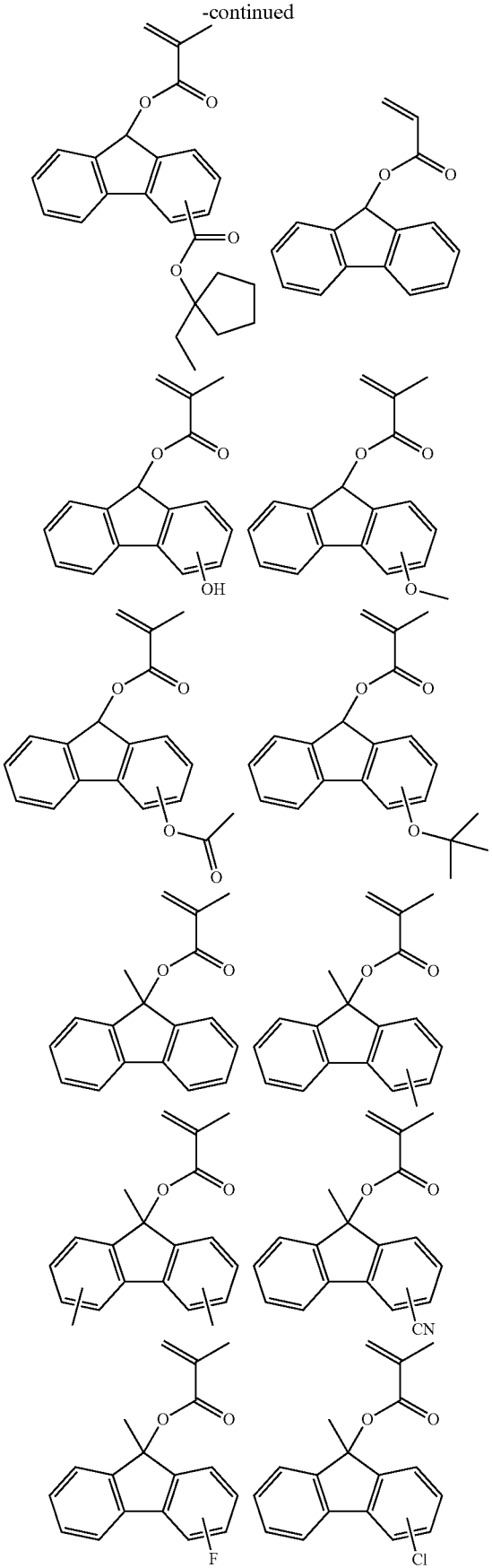
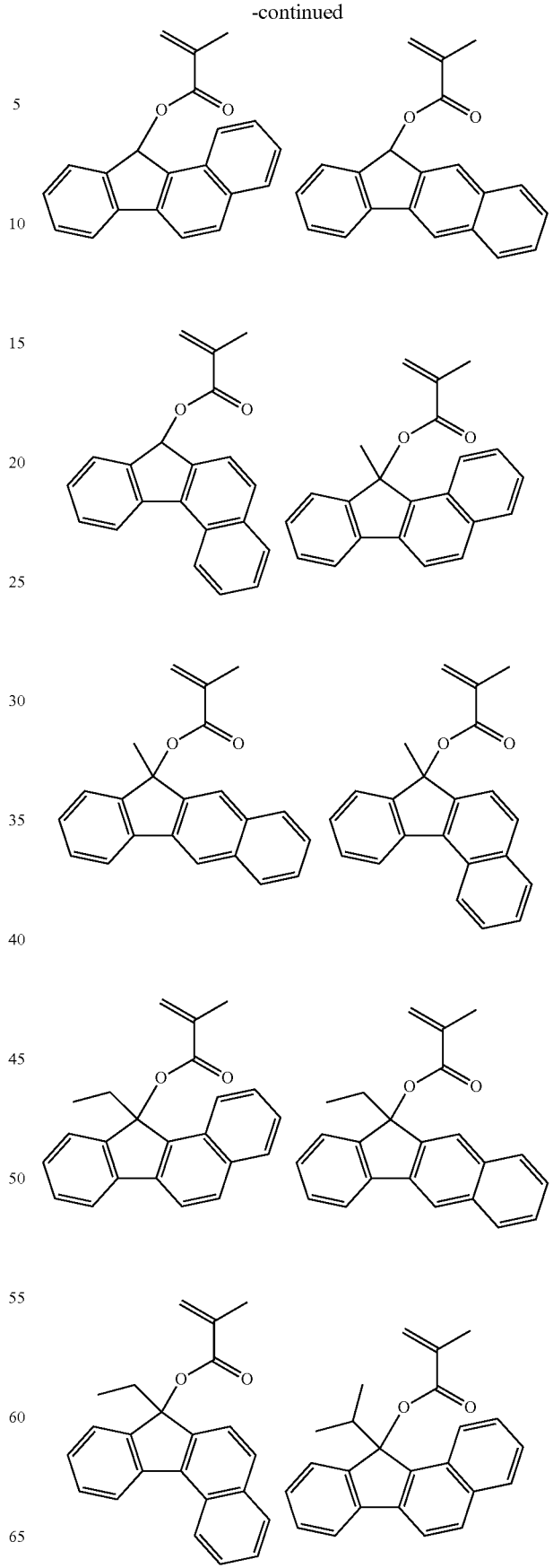

71
-continued
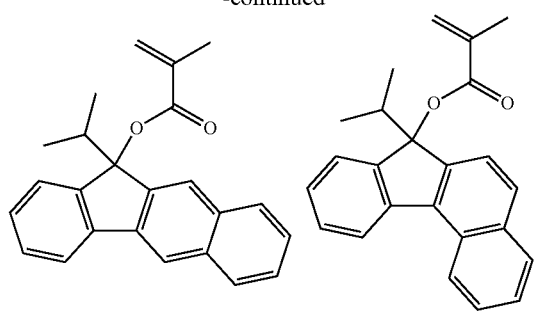
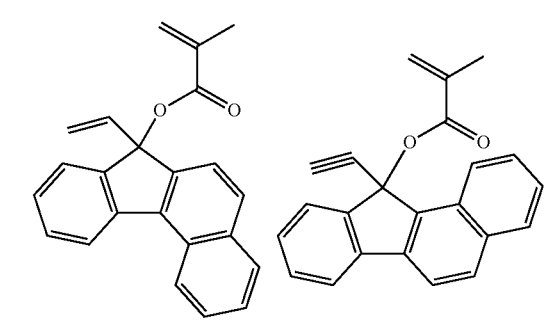
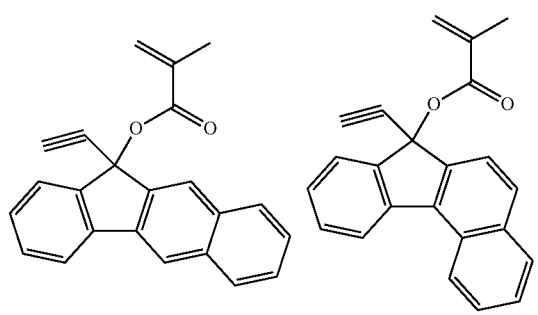
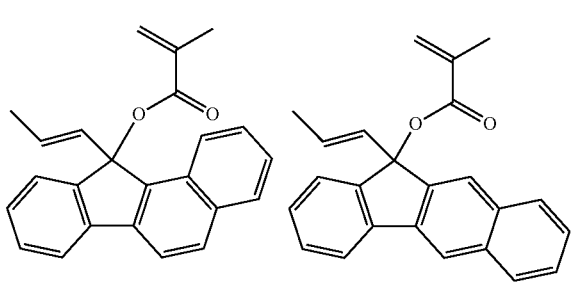
72
-continued
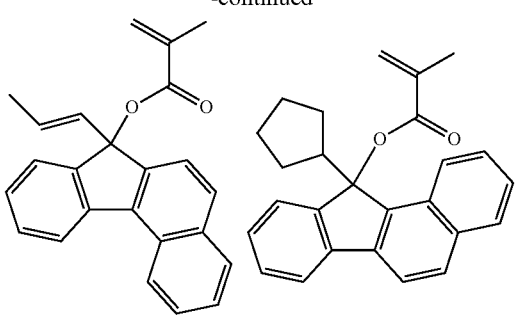
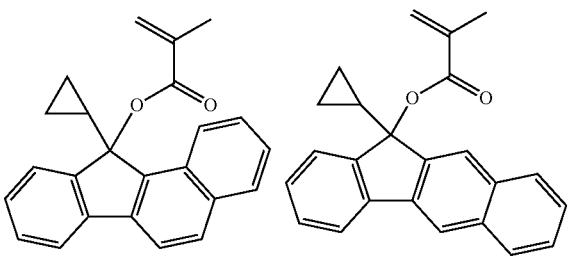
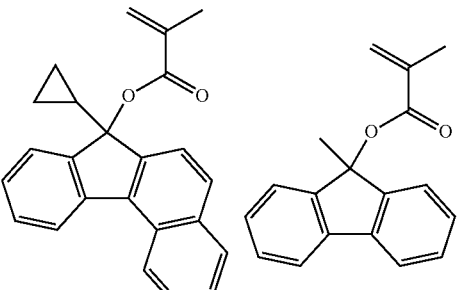
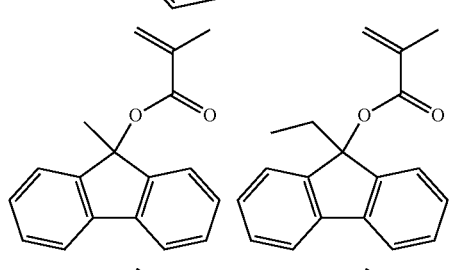
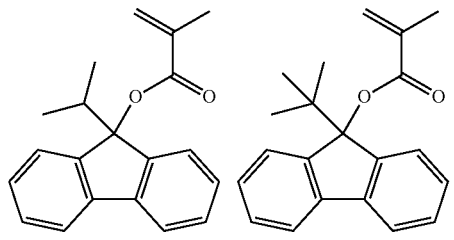

-continued

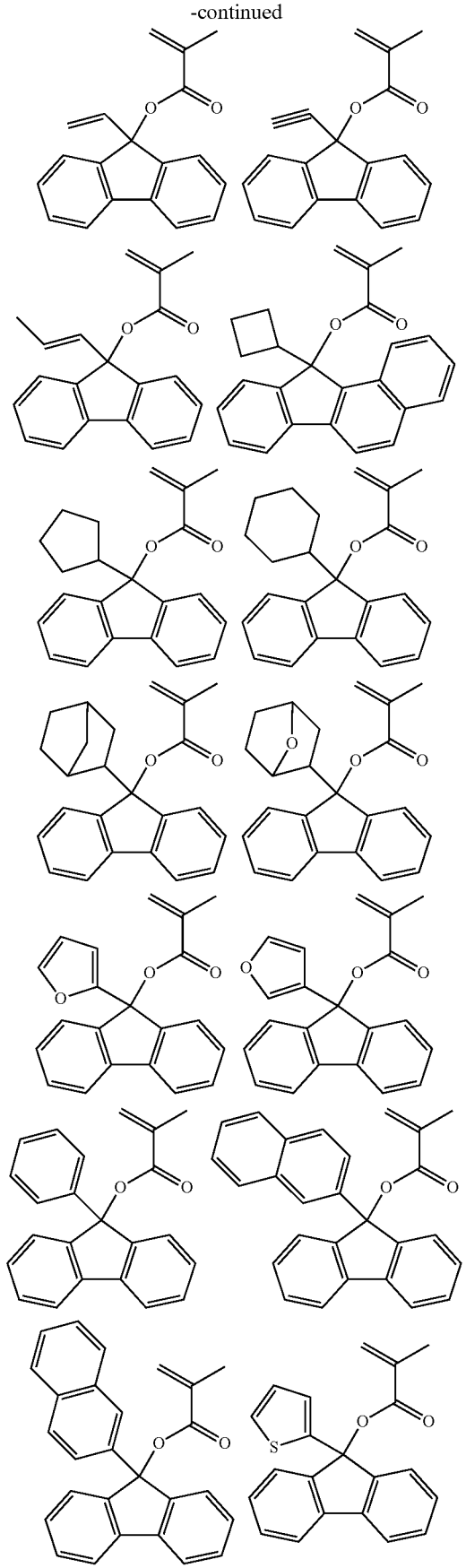

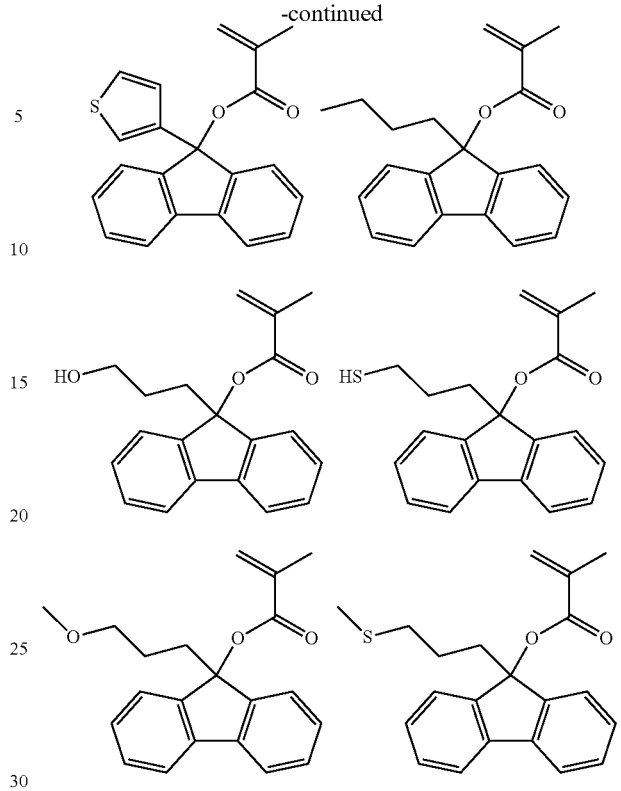

The acid labile group $R^2$ in recurring units (a1) may be a group having the general formula (A-3)-25.

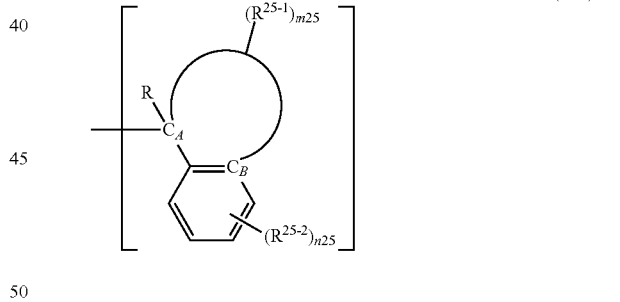

(A-3)-25

Herein $R^{25-1}$ is each independently hydrogen or a straight, branched or cyclic $C_1$-$C_6$ alkyl group. When m25 is 2 or more, two $R^{25-1}$ taken together may form a non-aromatic ring of 2 to 8 carbon atoms. The circle denotes a link between carbons $C_A$ and $C_B$, selected from among ethylene, propylene, butylene and pentylene. $R^{25-2}$ is a $C_1$-$C_4$ alkyl, alkoxy, alkanoyl or alkoxycarbonyl, hydroxyl, nitro, $C_6$-$C_{10}$ aryl, halogen or cyano group. R is as defined above. $R^{25-1}$ is not hydrogen when the circle is ethylene or propylene. The subscripts m25 and n25 are an integer of 1 to 4.

Examples of the monomer from which recurring units (a1) having an acid labile group of formula (A-3)-25 substituted thereon are derived are shown below.

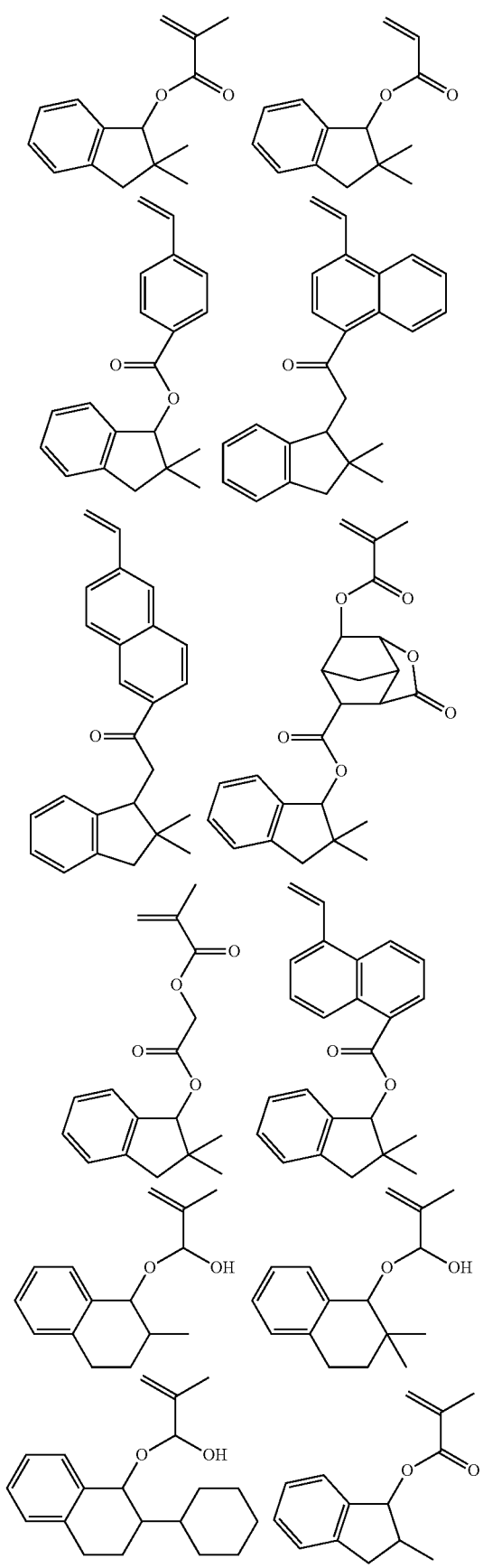
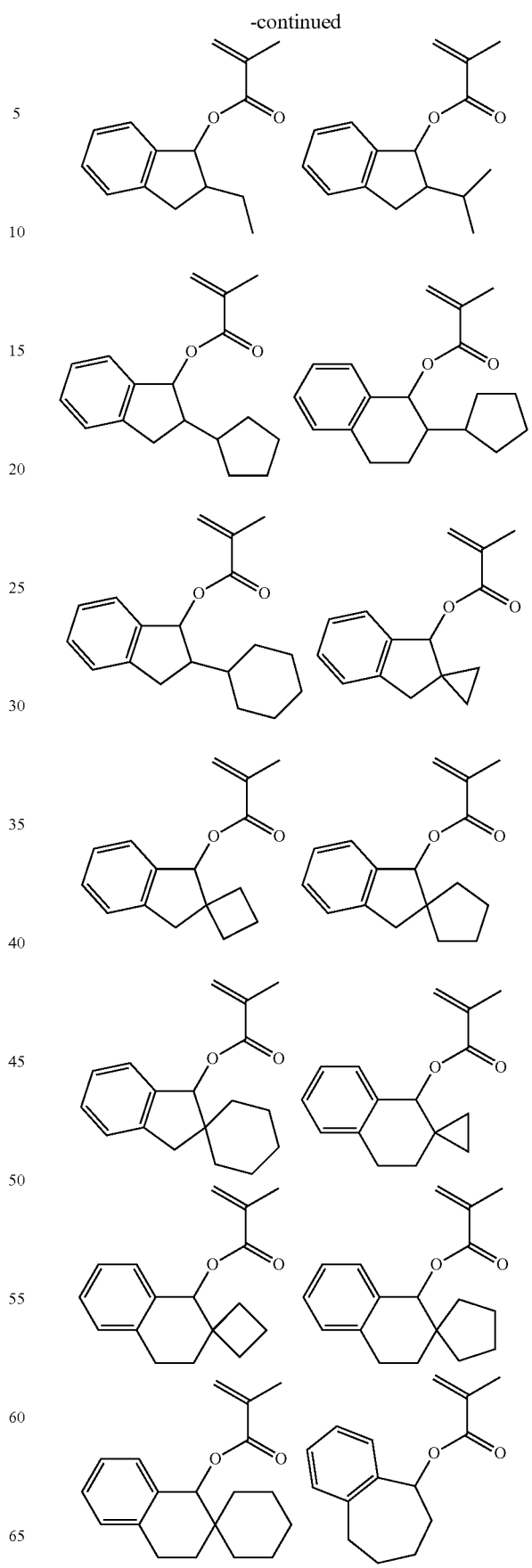

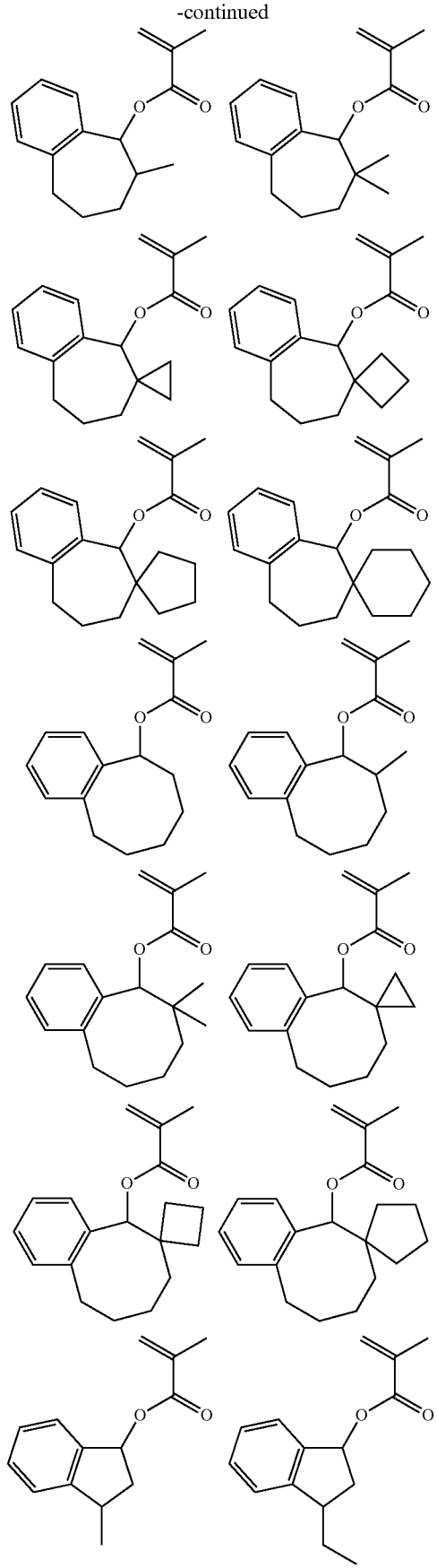
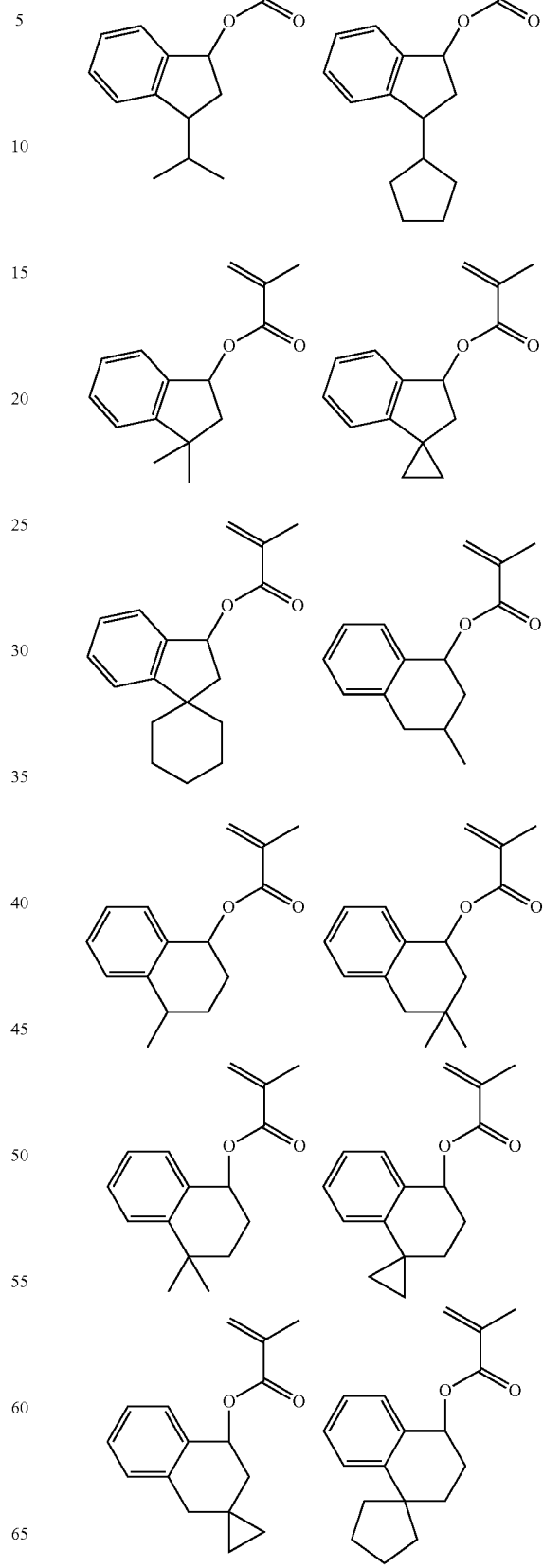

-continued
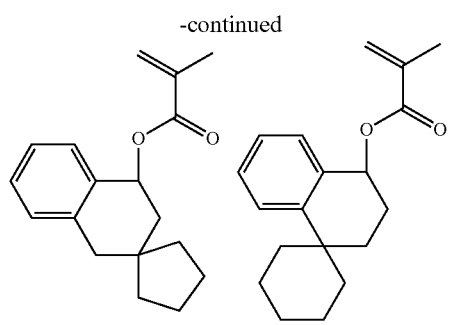
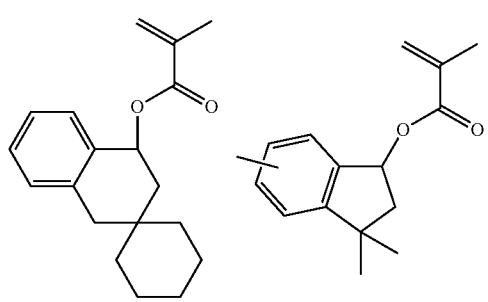
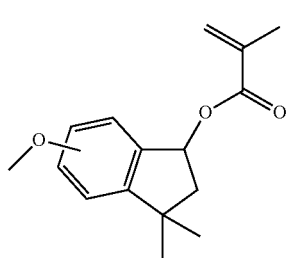
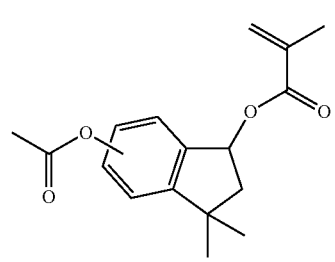
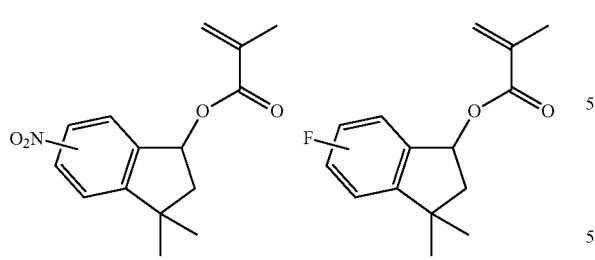
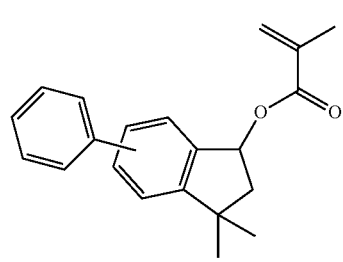
-continued
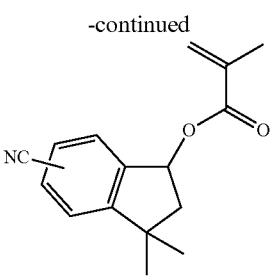
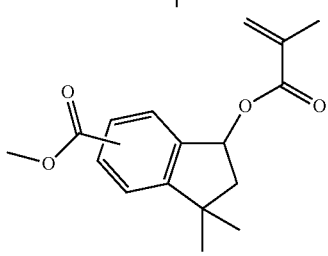
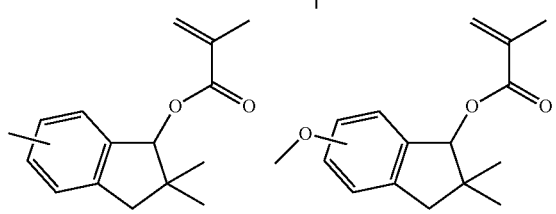
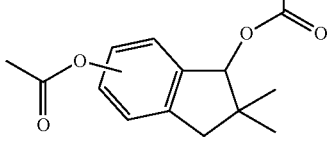
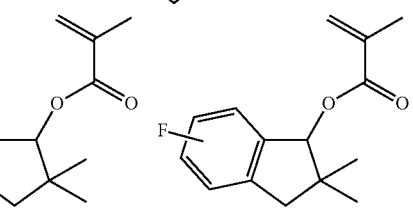
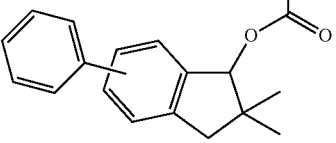
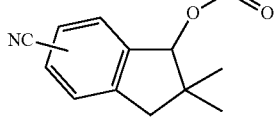
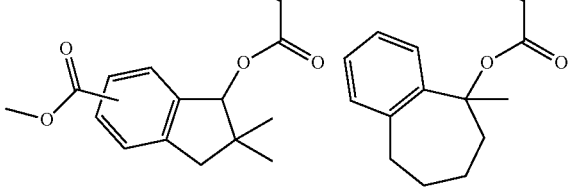

81
-continued
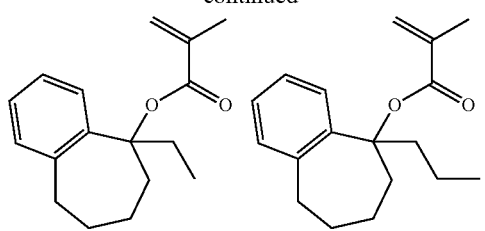
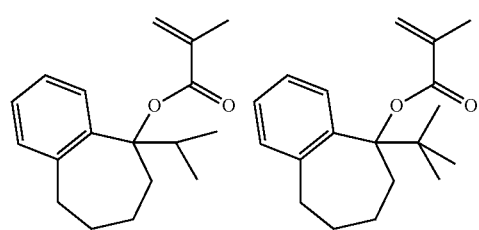
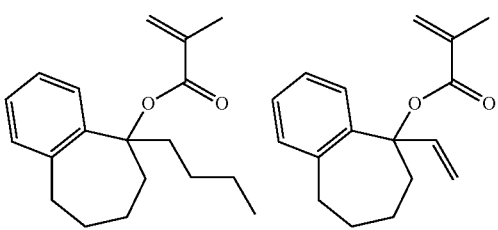
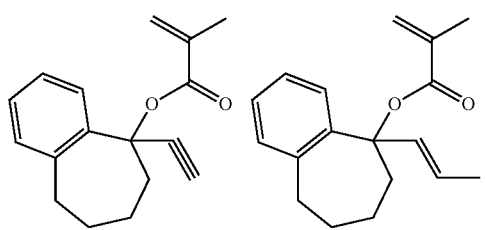
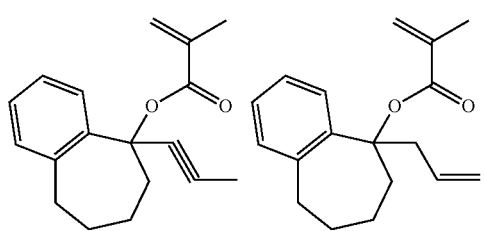
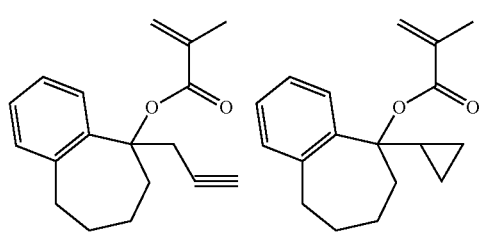
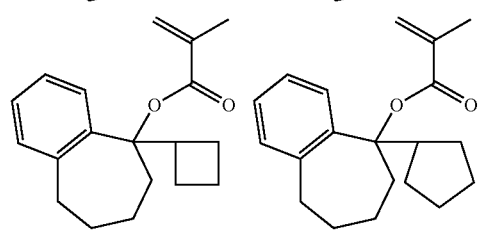
82
-continued
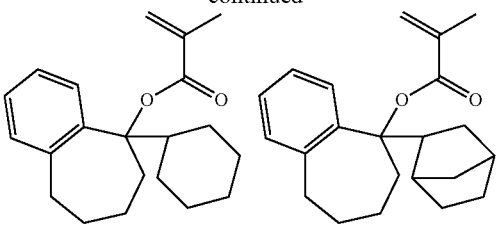
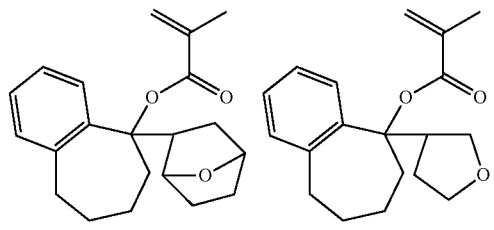
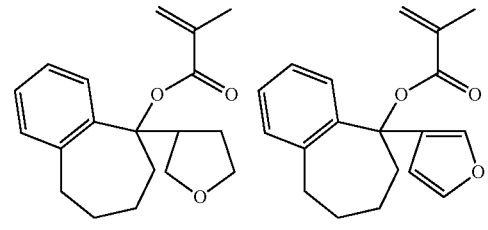
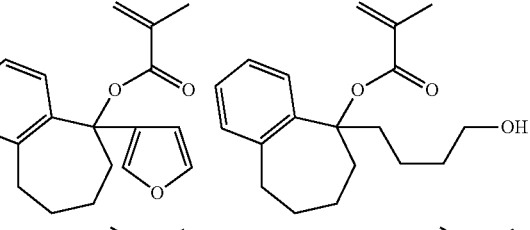
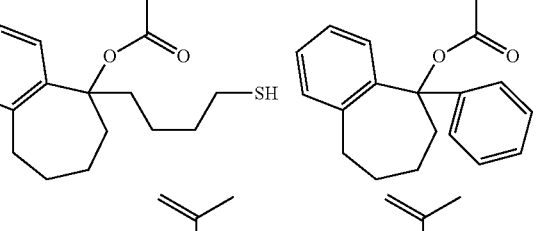
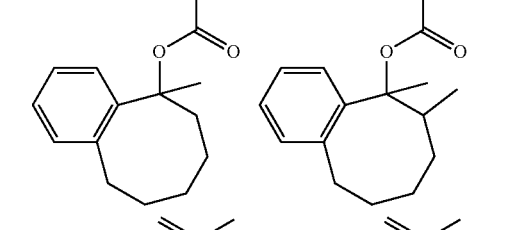
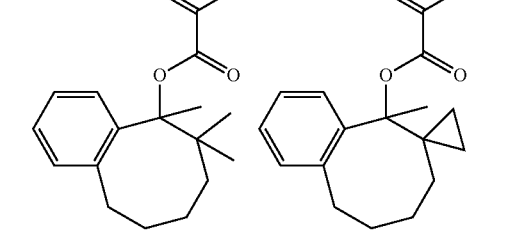

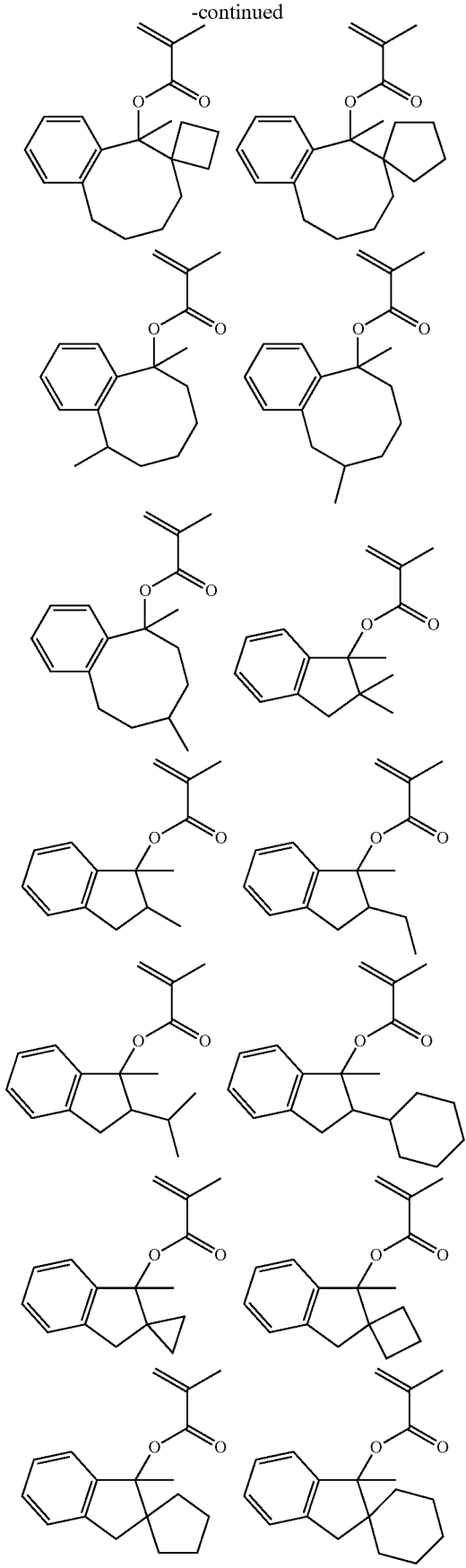
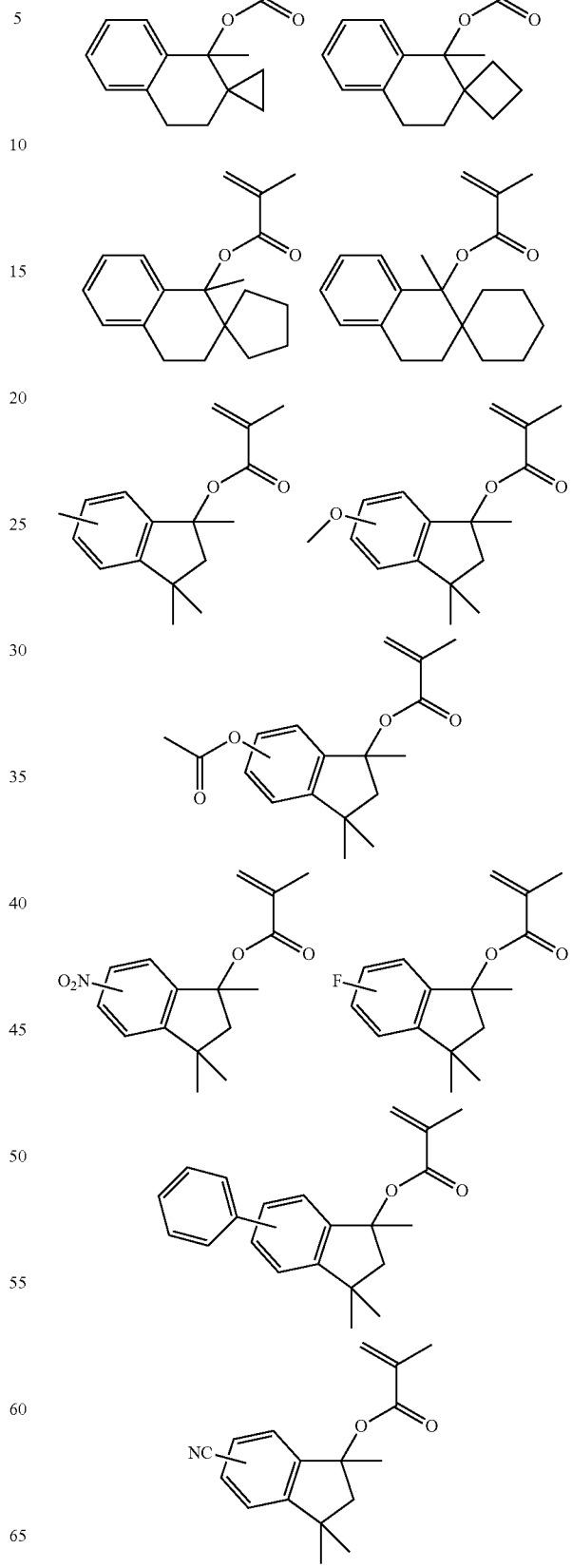

-continued

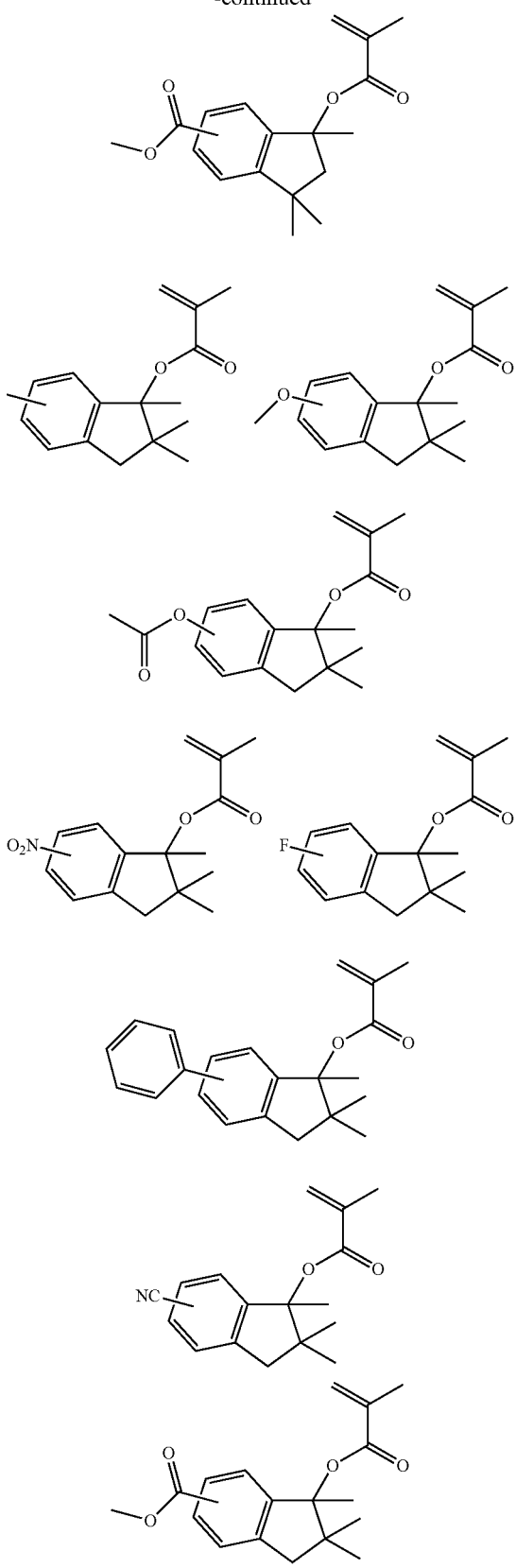

The acid labile group $R^2$ in recurring units (a1) may be a group having the general formula (A-3)-26.

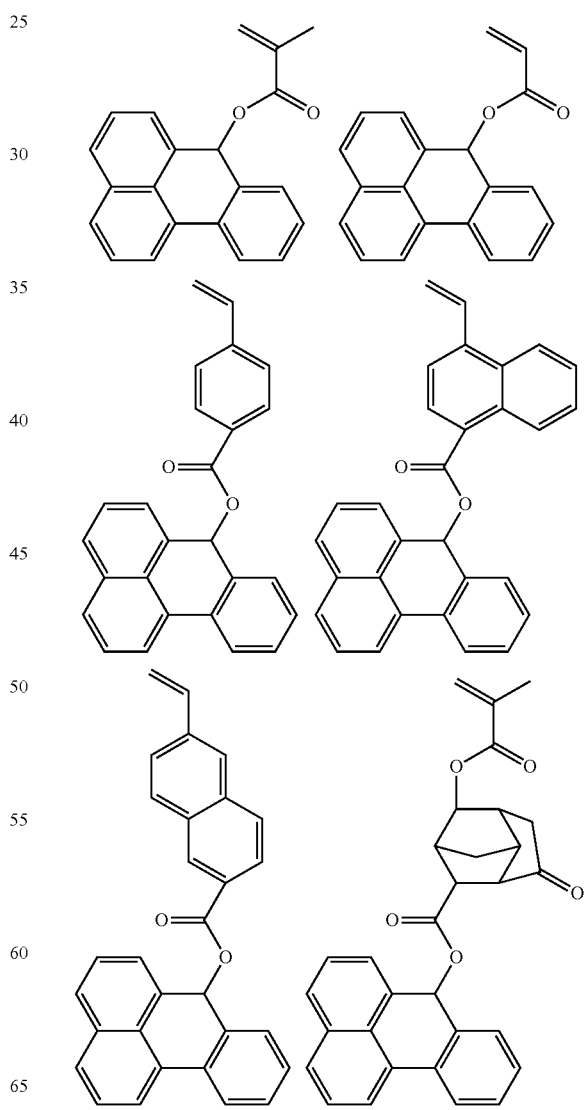

Herein $R^{26-1}$ and $R^{26-2}$ each are hydrogen, a $C_1$-$C_4$ alkyl, alkoxy, alkanoyl or alkoxycarbonyl, hydroxyl, nitro, $C_6$-$C_{10}$ aryl, halogen or cyano group, R is as defined above, and m26 and n26 are an integer of 1 to 4.

Examples of the monomer from which recurring units (a1) having an acid labile group of formula (A-3)-26 substituted thereon are derived are shown below.

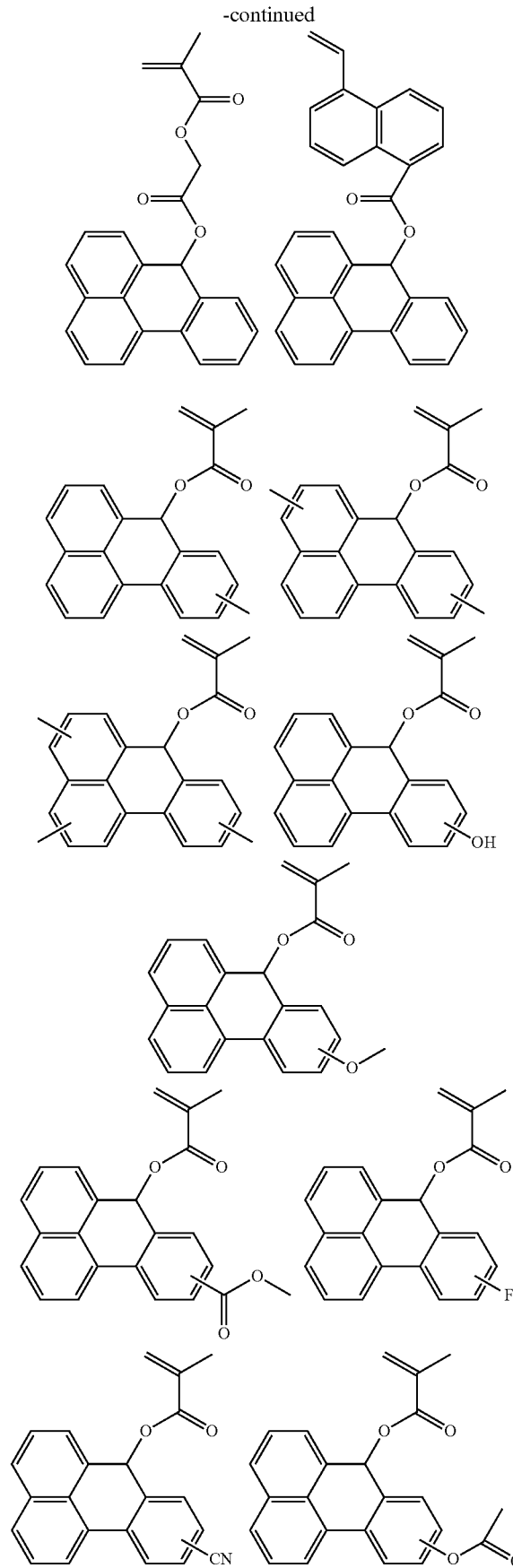
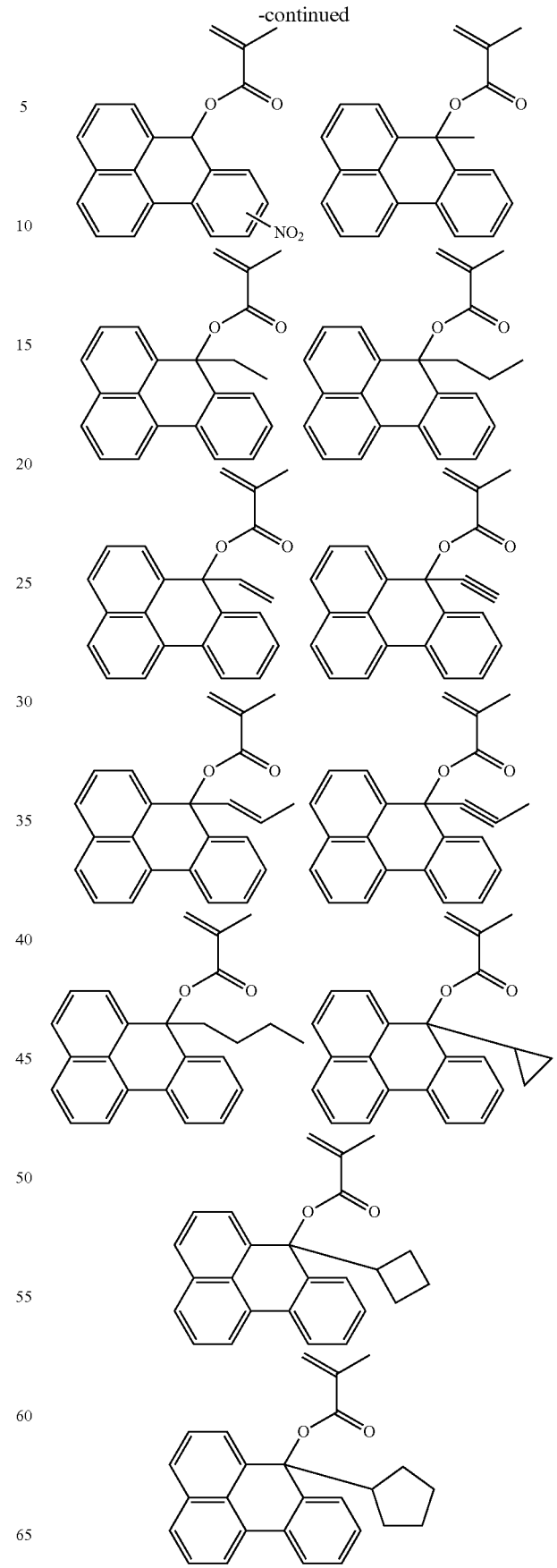

89
-continued
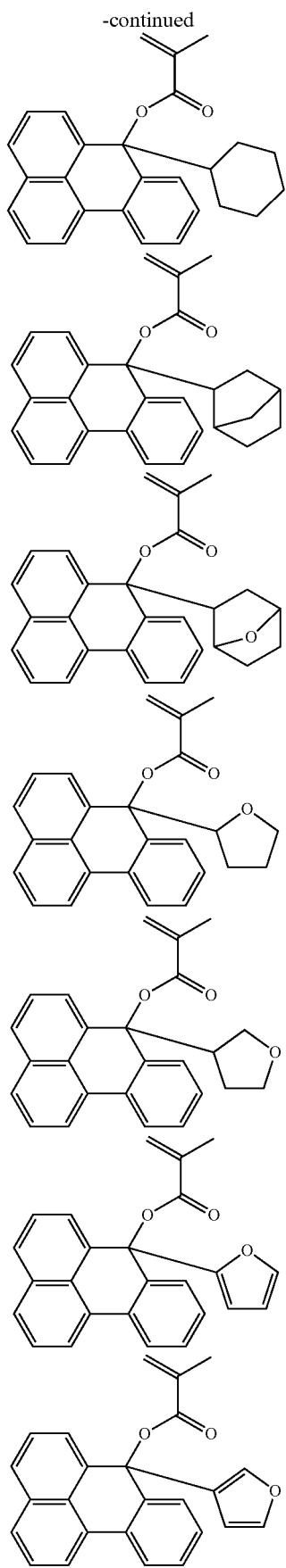
90
-continued
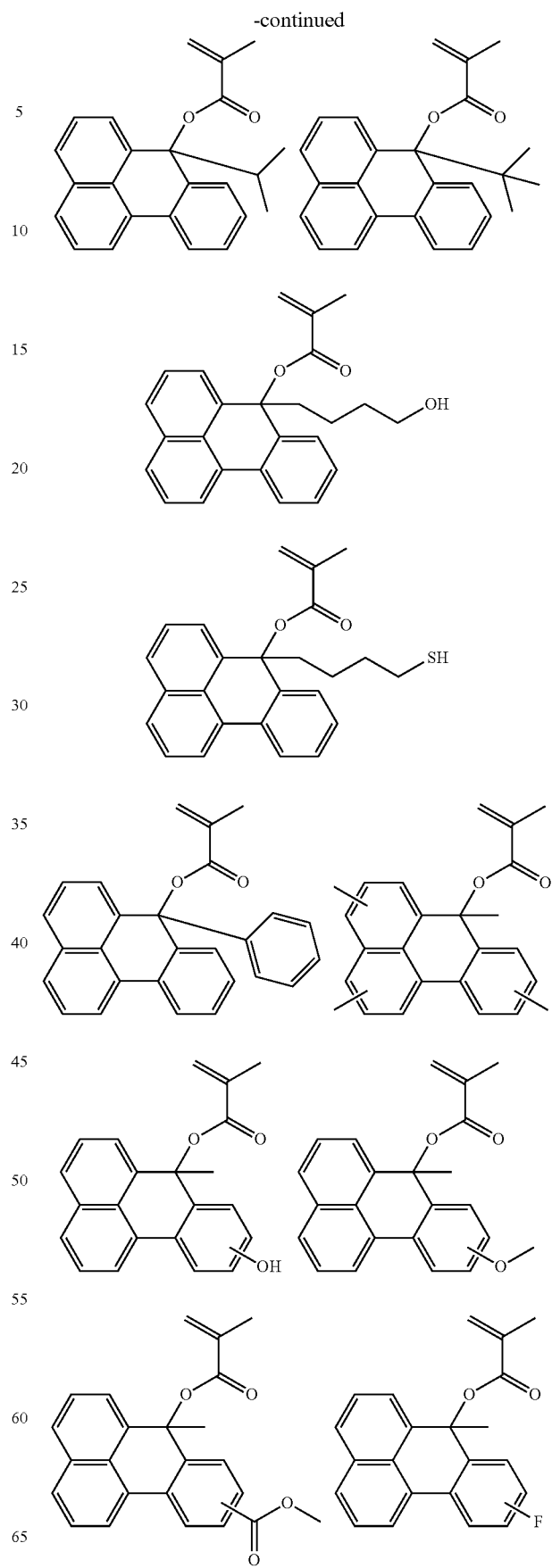

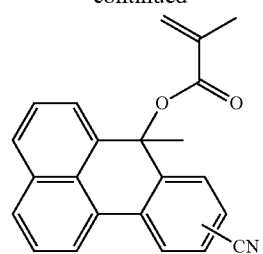

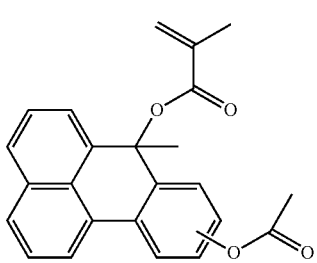

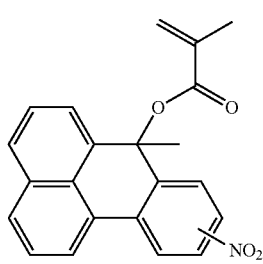

The acid labile group $R^2$ in recurring units (a1) may be a group having the general formula (A-3)-27.

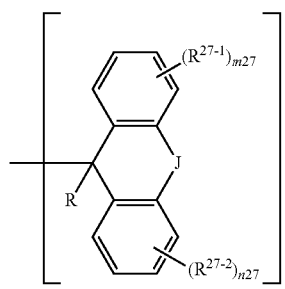
(A-3)-27

Herein $R^{27-1}$ and $R^{27-2}$ each are hydrogen, a $C_1$-$C_4$ alkyl, alkoxy, alkanoyl or alkoxycarbonyl, hydroxyl, $C_6$-$C_{10}$ aryl, halogen or cyano group, R is as defined above, J is methylene, ethylene, vinylene or —$CH_2$—S—, and m27 and n27 are an integer of 1 to 4.

Examples of the monomer from which recurring units (a1) having an acid labile group of formula (A-3)-27 substituted thereon are shown below.

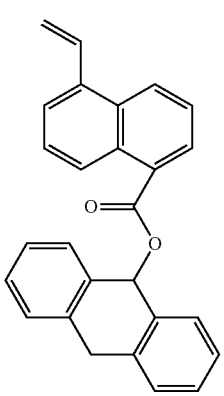

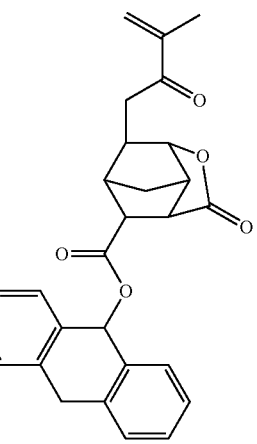

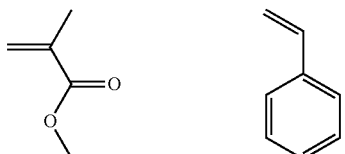

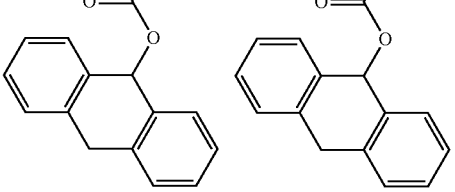

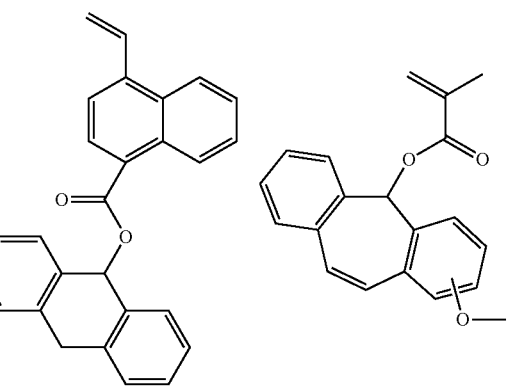

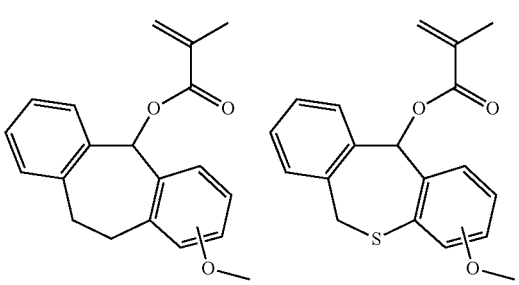

-continued
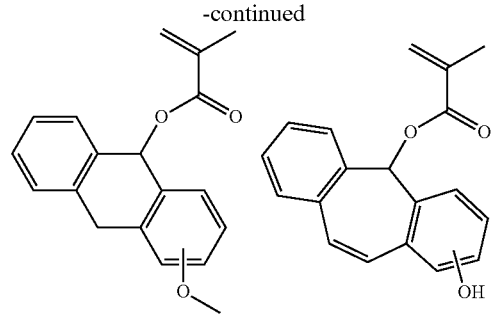
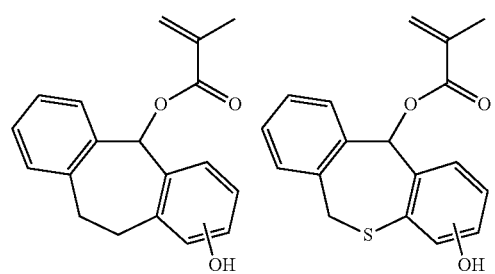
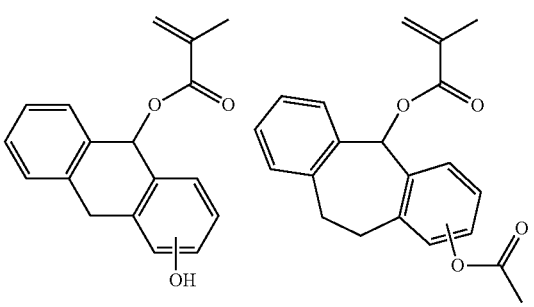
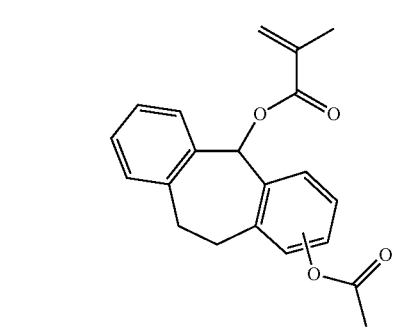
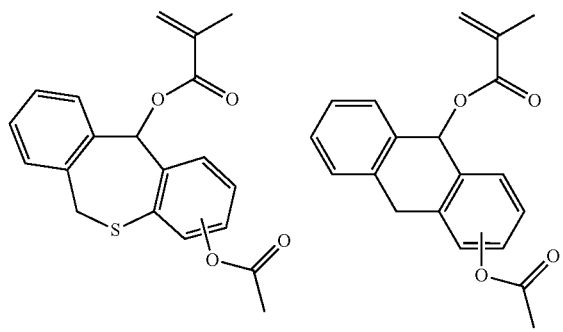
-continued
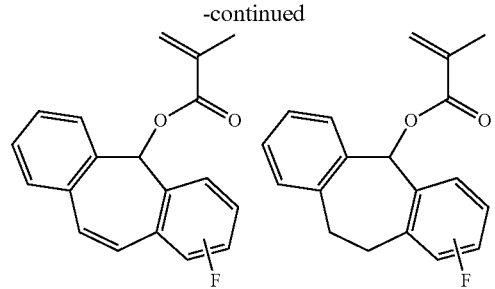
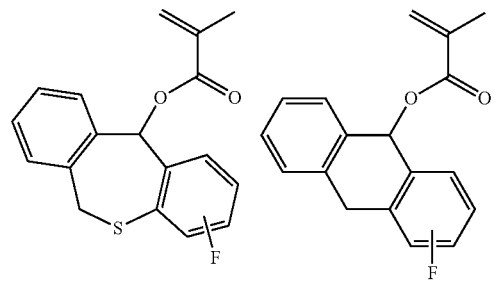
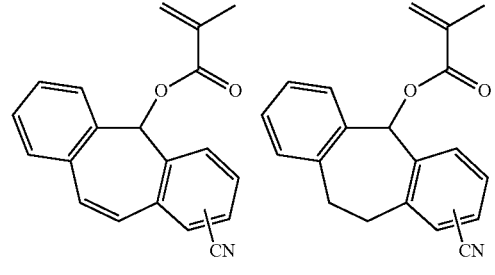
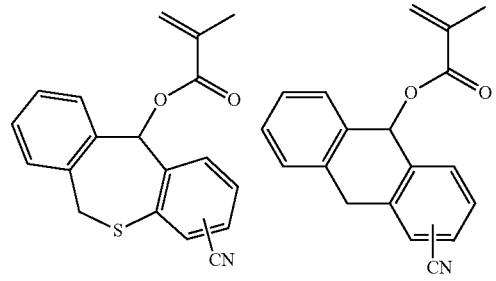
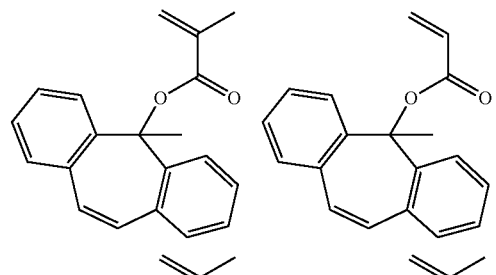
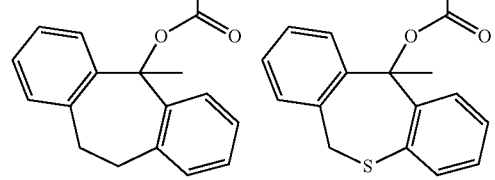

95
-continued
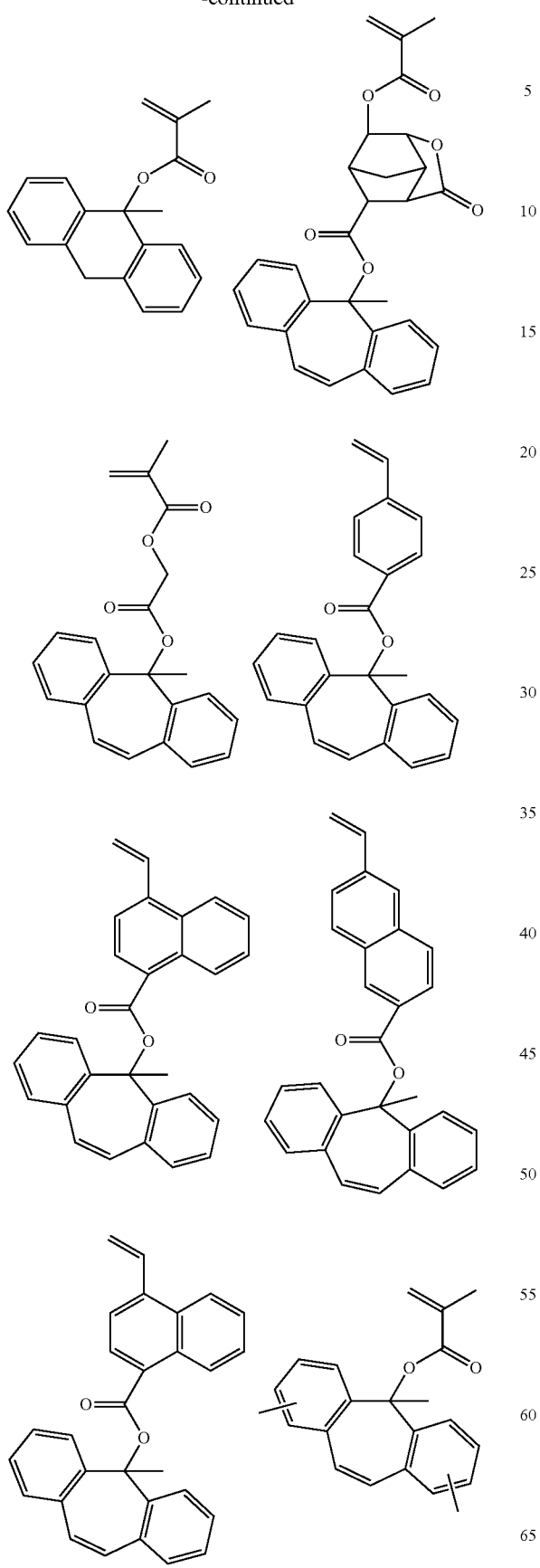
96
-continued
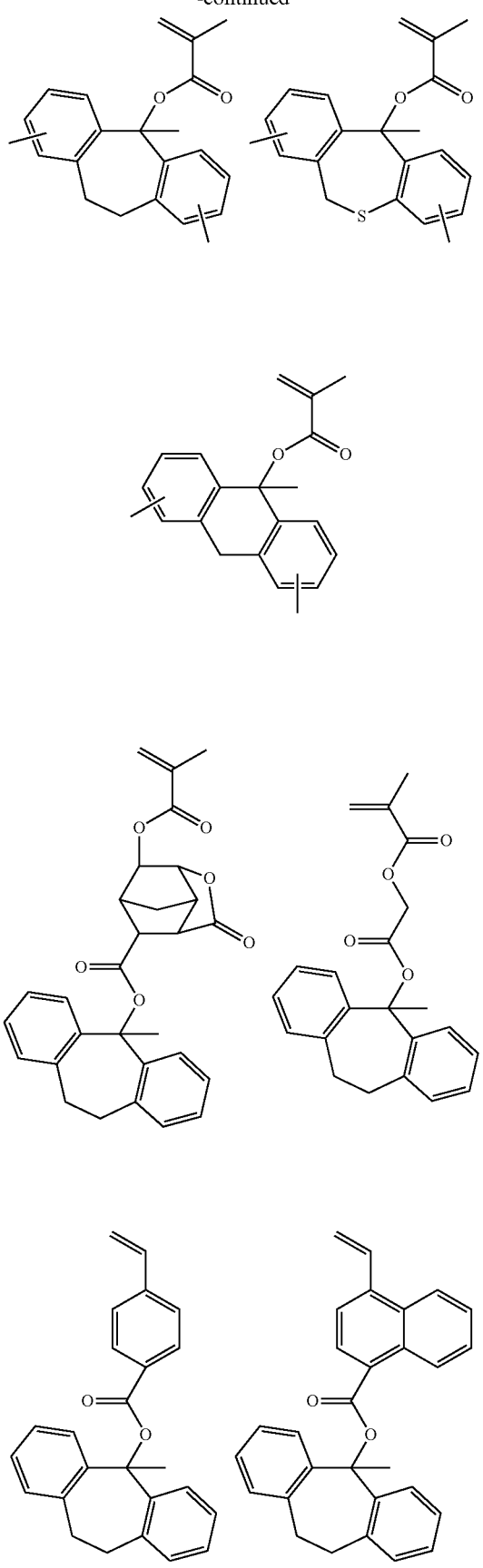

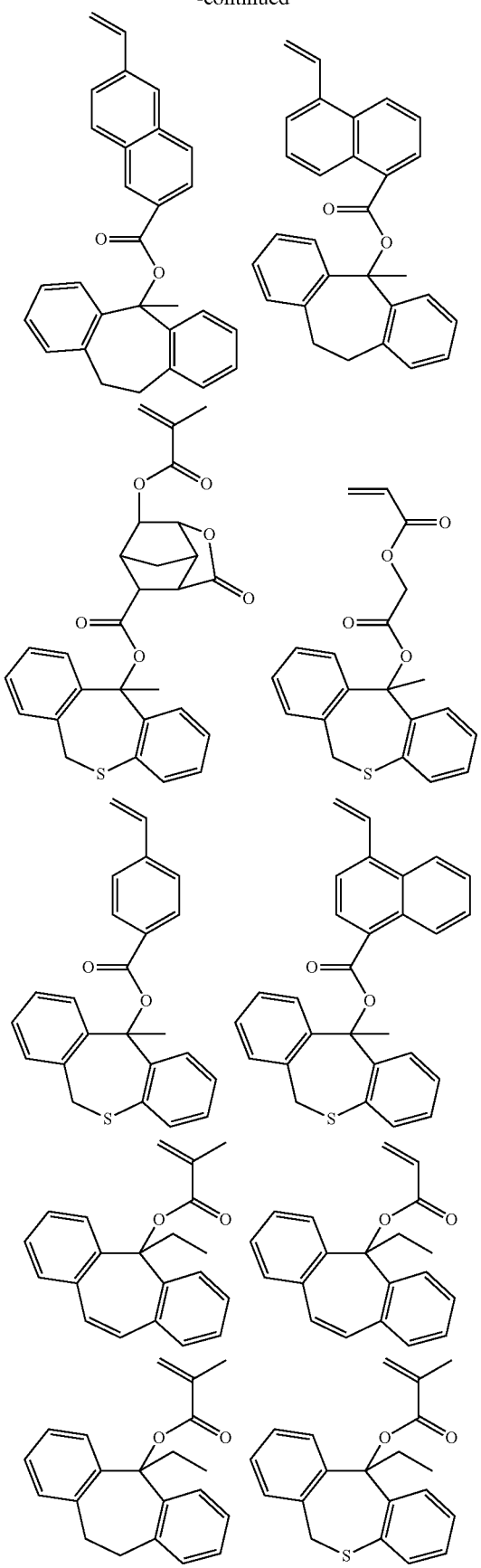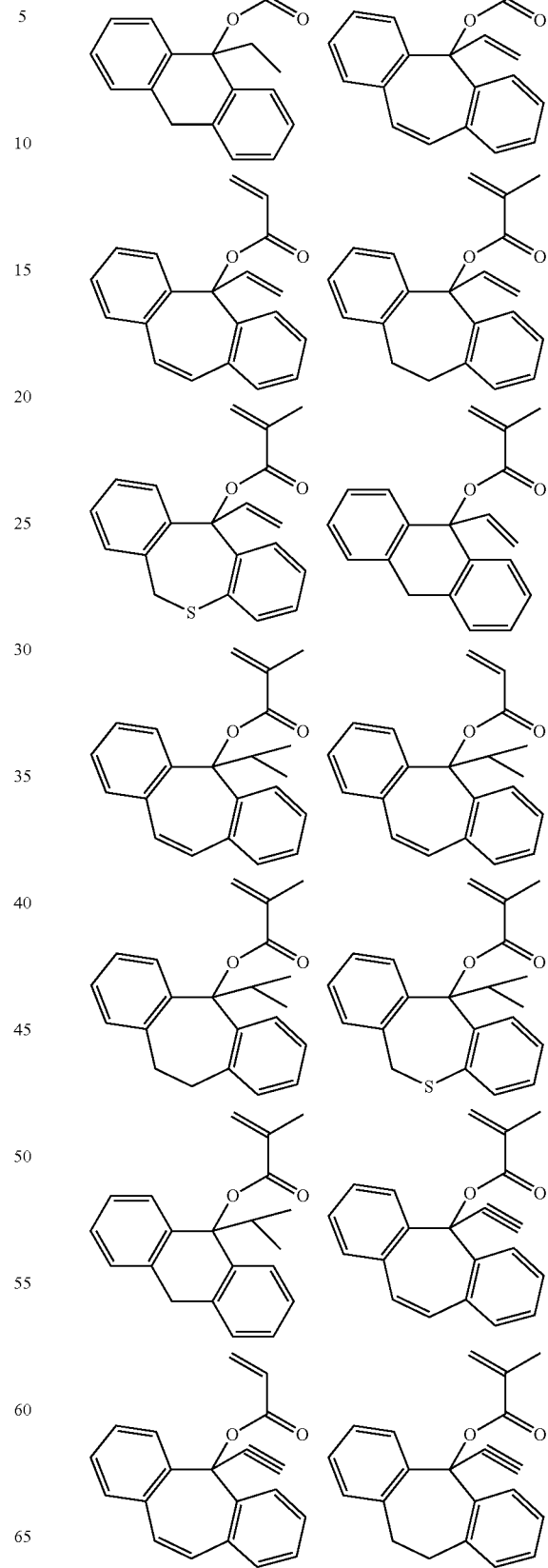

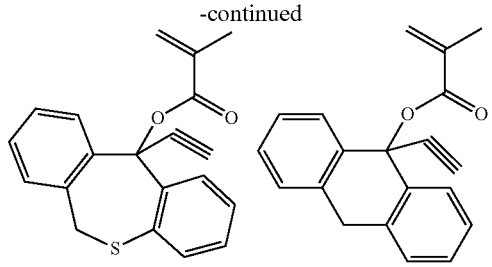

The acid labile group $R^2$ in recurring units (a1) may be a group having the general formula (A-3)-28.

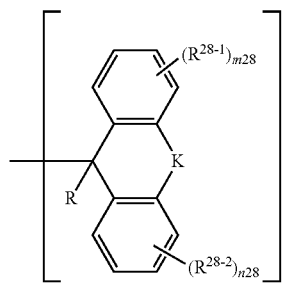

(A-3)-28

Herein $R^{28-1}$ and $R^{28-2}$ each are hydrogen, a $C_1$-$C_4$ alkyl, alkoxy, alkanoyl or alkoxycarbonyl, hydroxyl, $C_6$-$C_{10}$ aryl, halogen or cyano group, R is as defined above, K is carbonyl, ether, sulfide, —S(=O)— or —S(=O)$_2$—, and m28 and n28 are an integer of 1 to 4.

Examples of the monomer from which recurring units (a1) having an acid labile group of formula (A-3)-28 substituted thereon are derived are shown below.

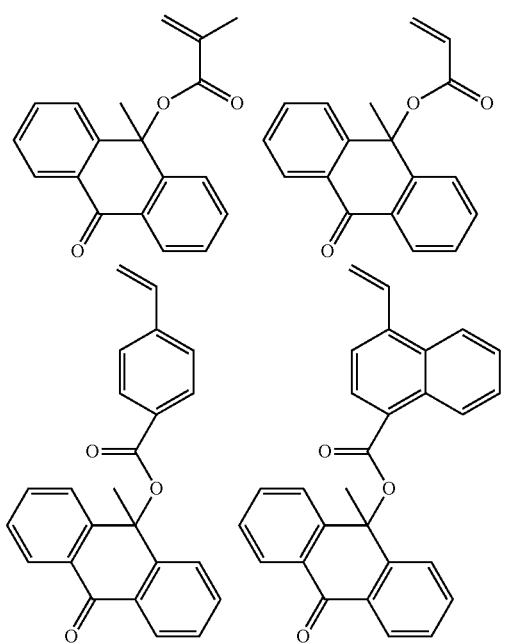

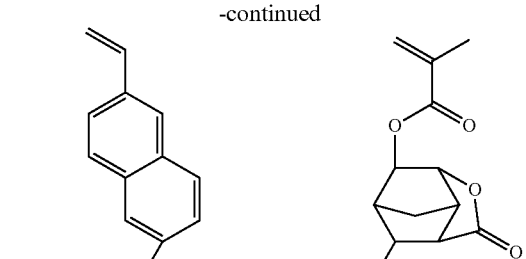

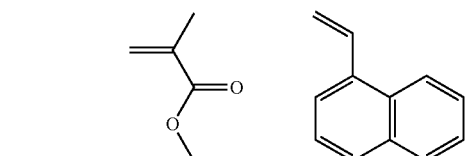

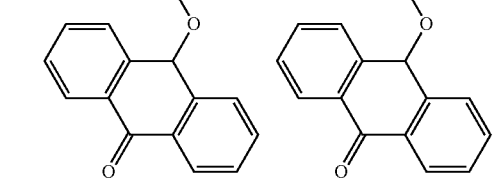

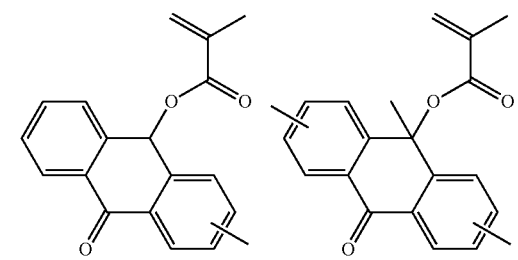

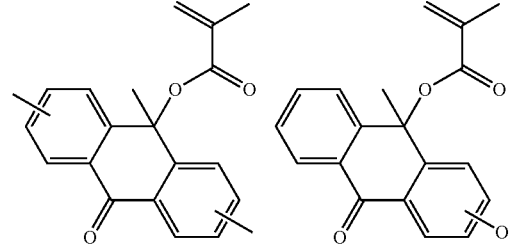

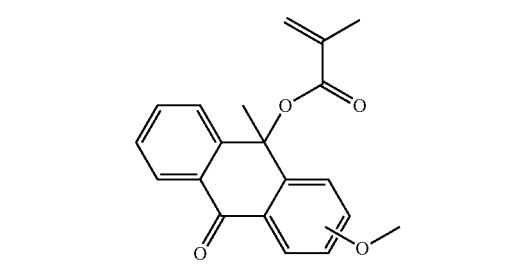

101
-continued
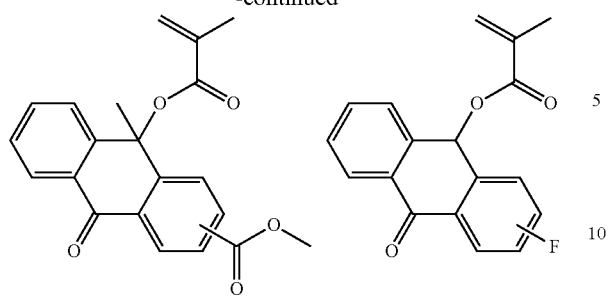
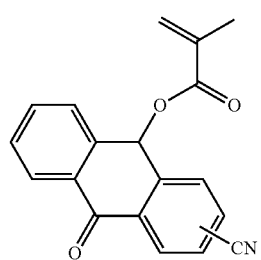
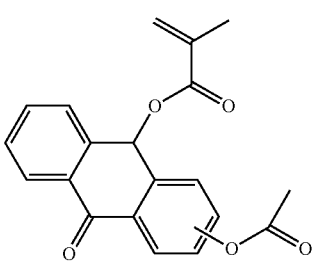
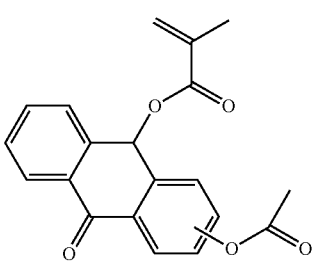
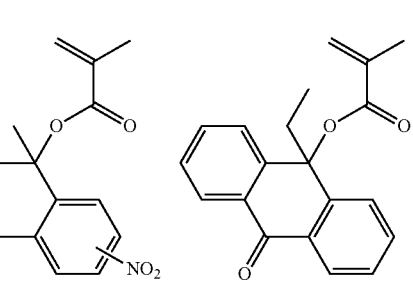
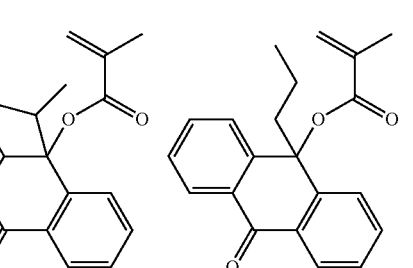
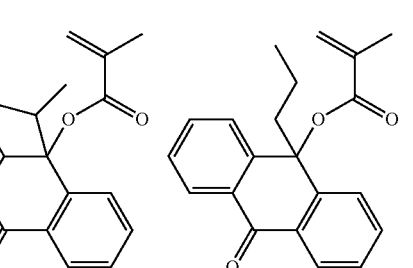
102
-continued
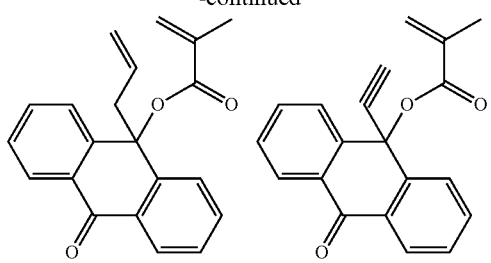
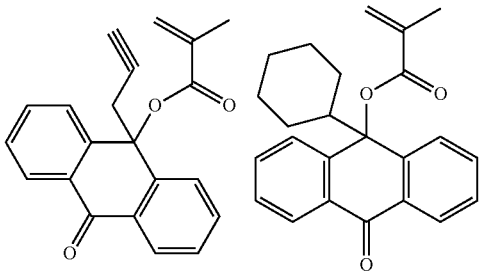
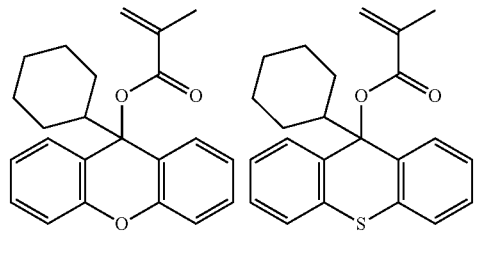
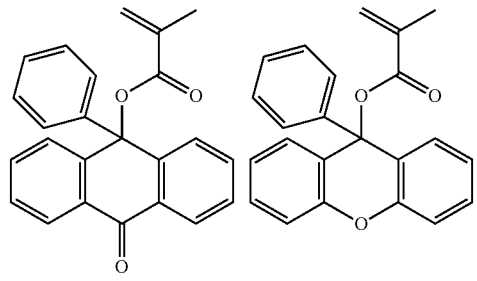
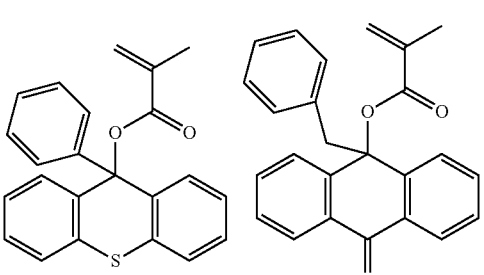
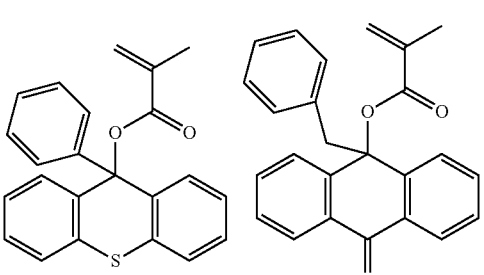

-continued
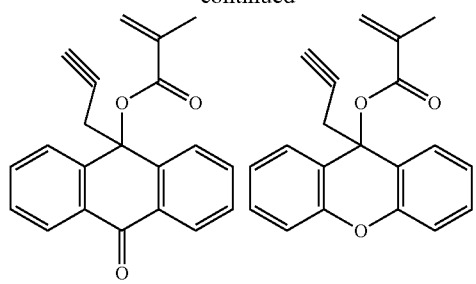
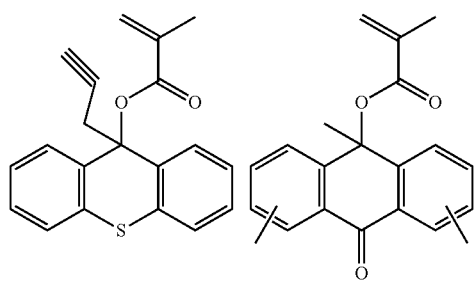
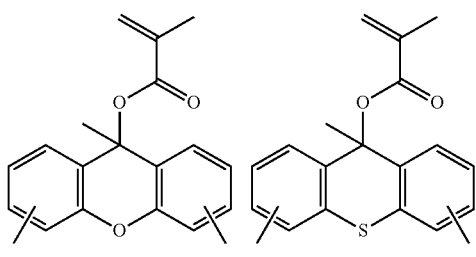
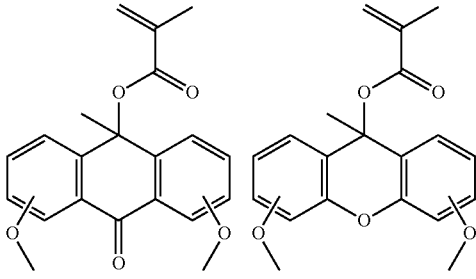
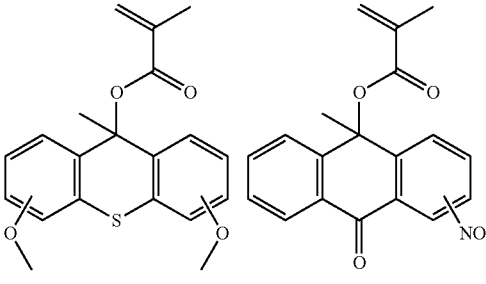
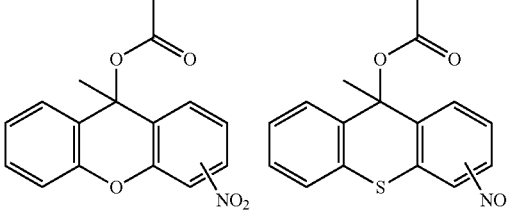
-continued
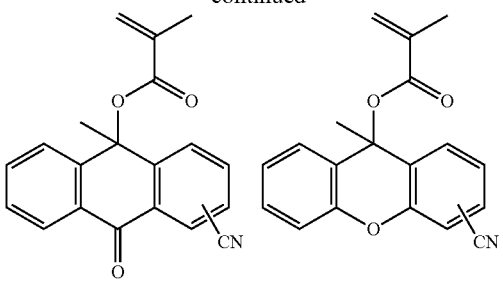
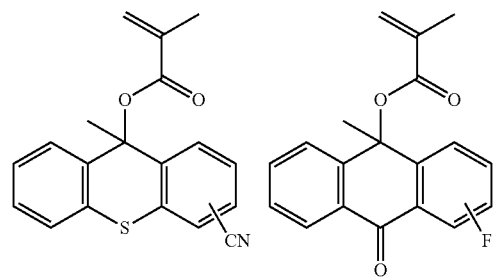
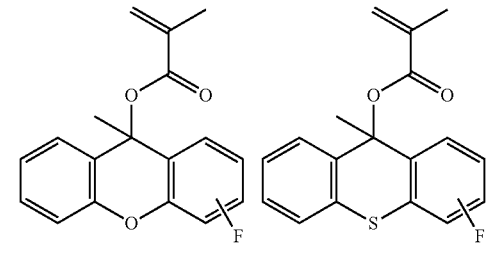
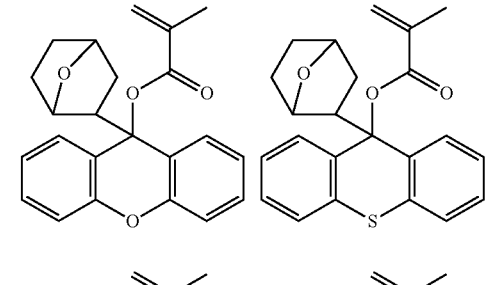
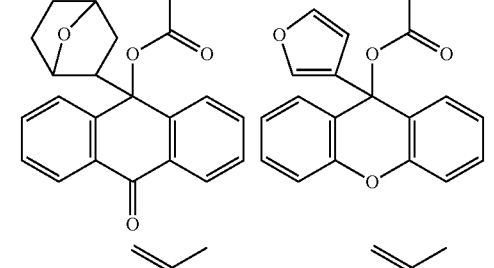
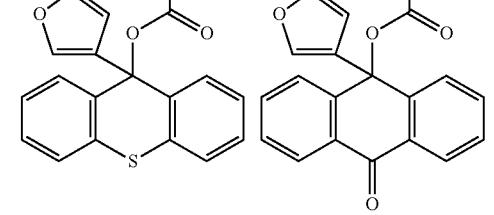

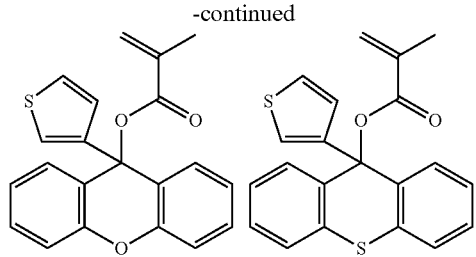
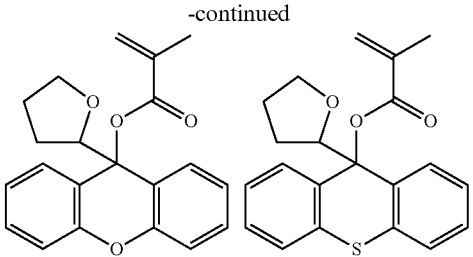
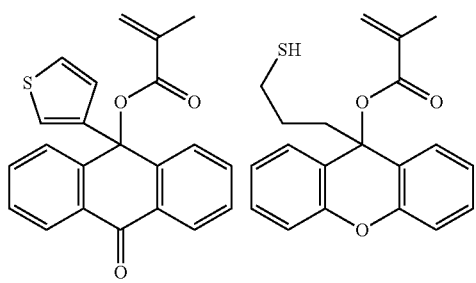
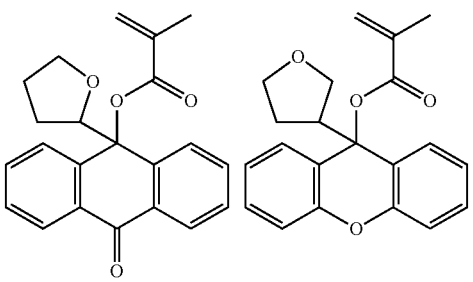
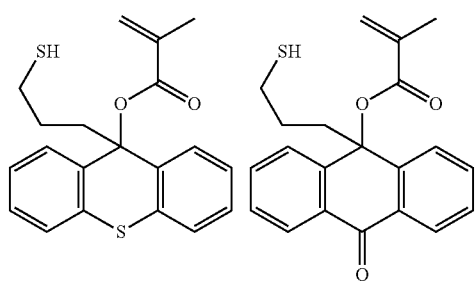
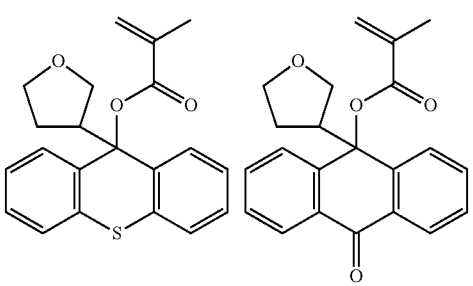
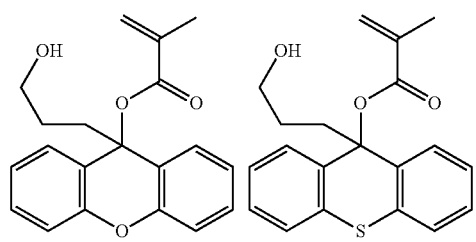
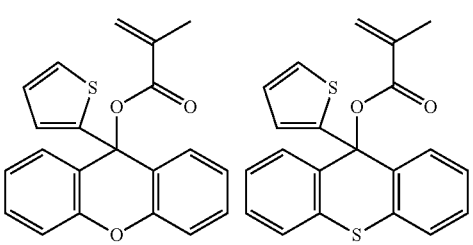
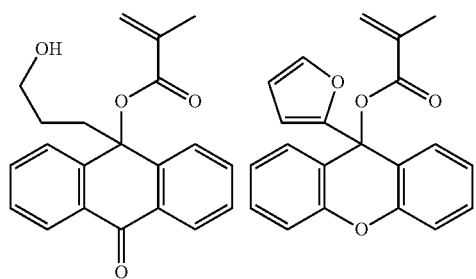
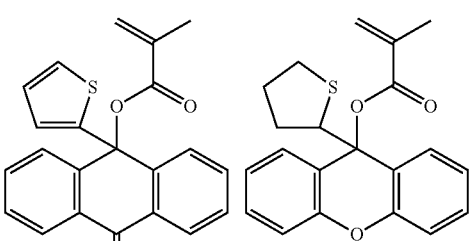
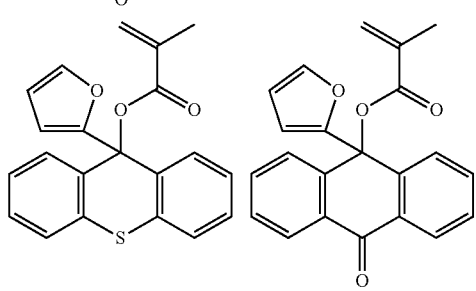
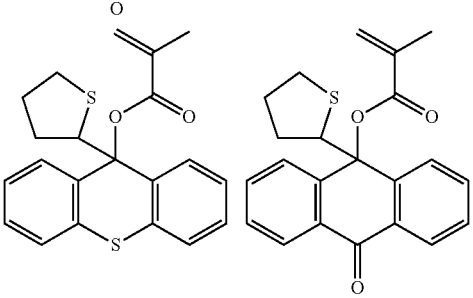

107
-continued
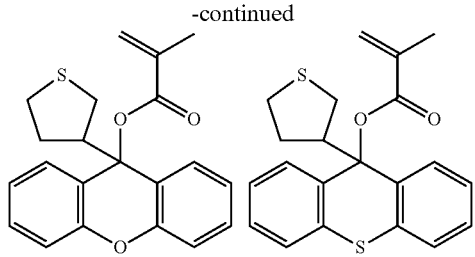
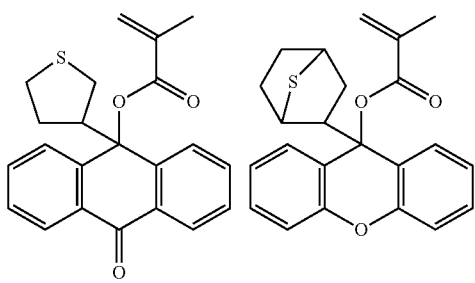
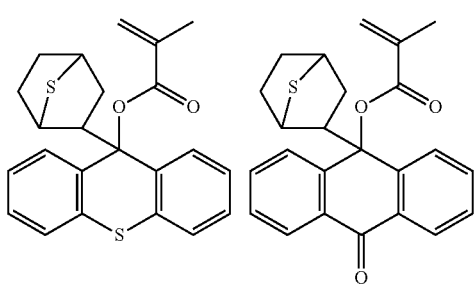
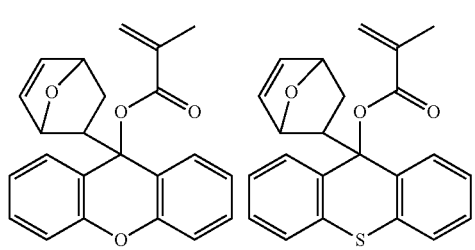
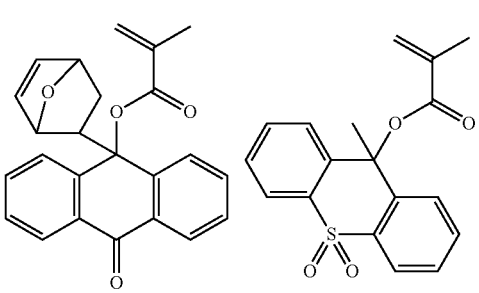
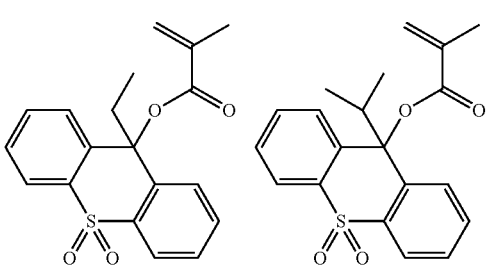
108
-continued
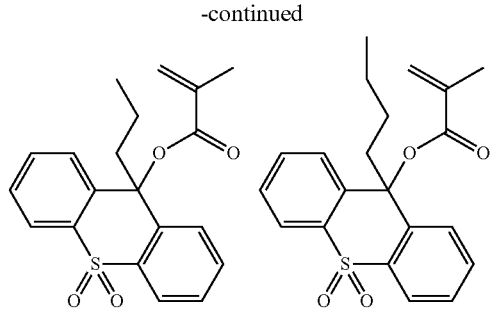
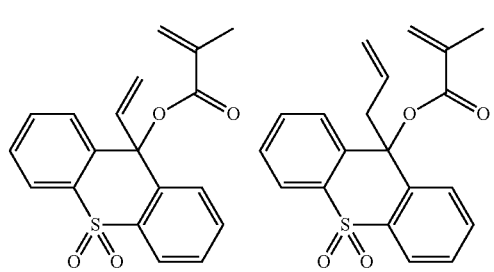
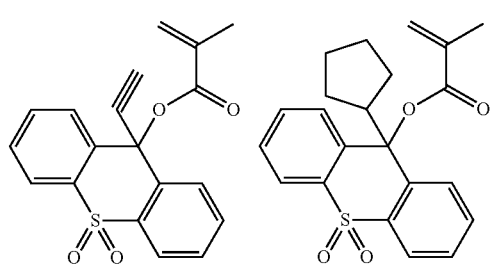
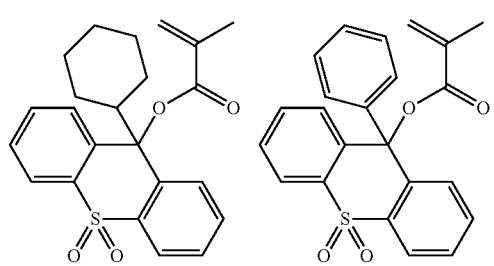
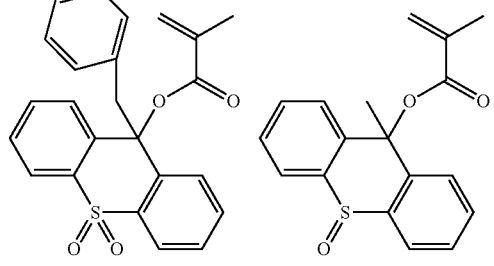
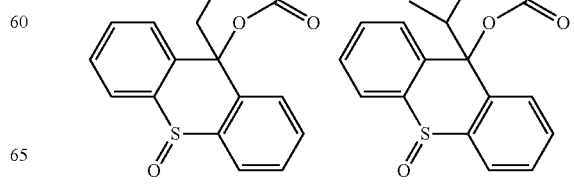

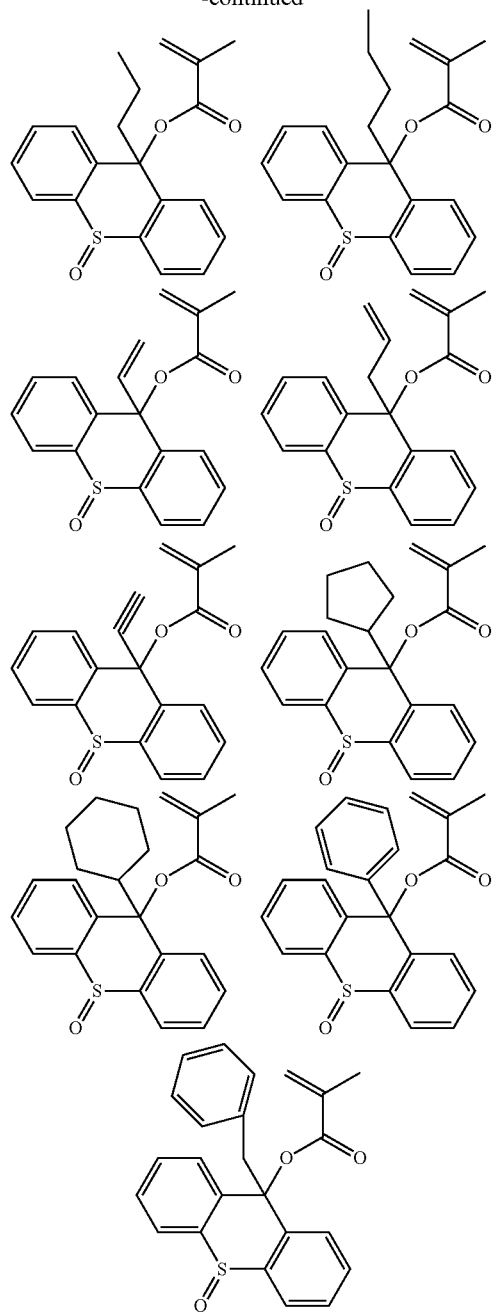
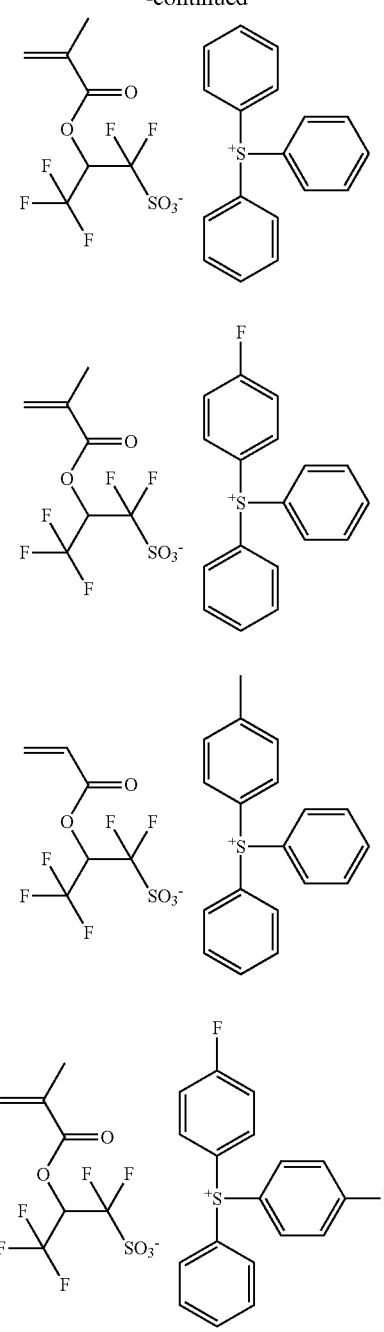
Examples of the monomer from which recurring units (b2) of sulfonium salt in formula (2) are derived are shown below.
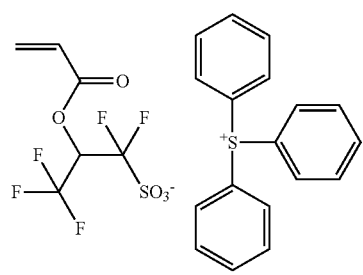
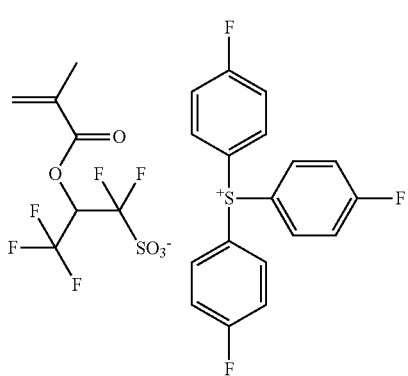

-continued
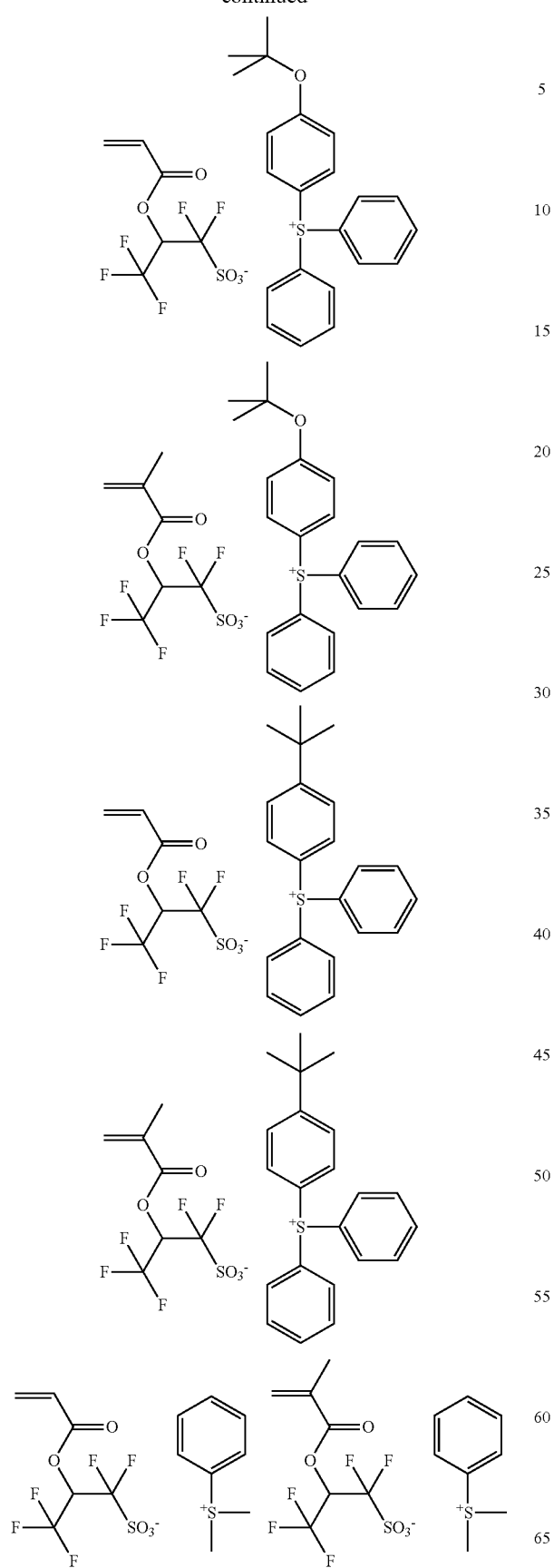
-continued
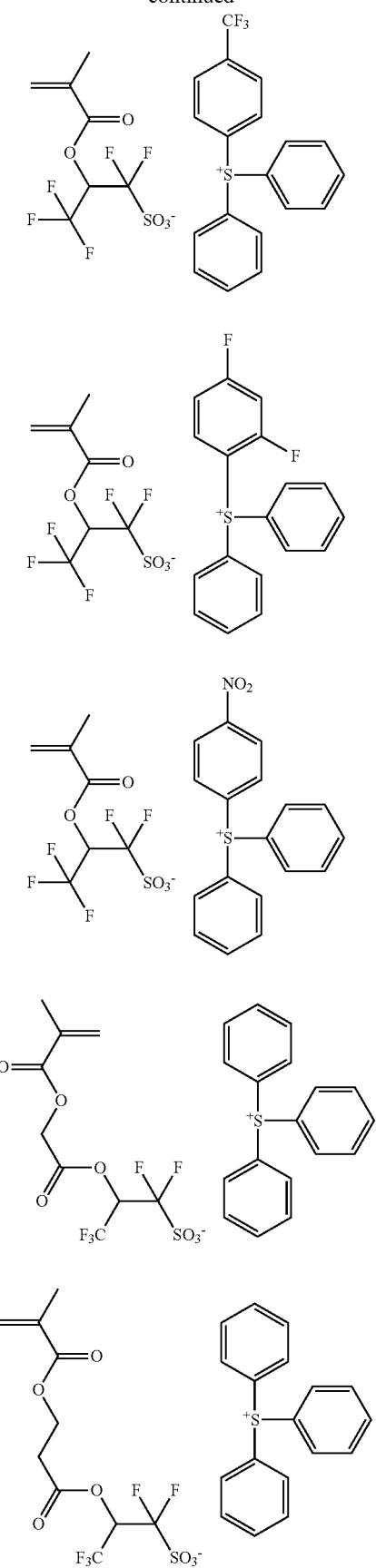

113
-continued
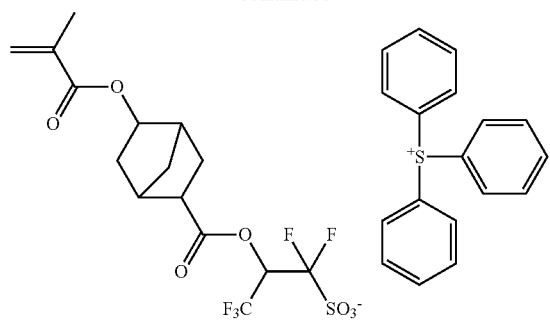
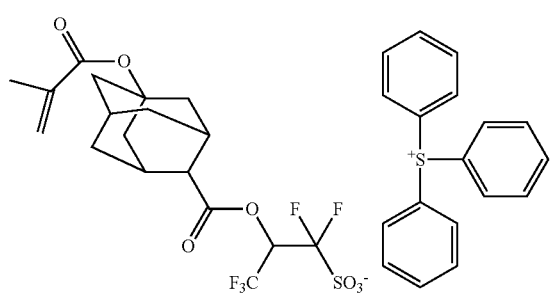
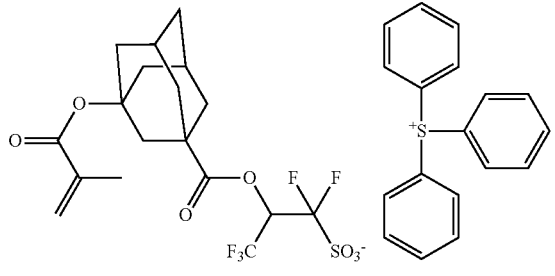
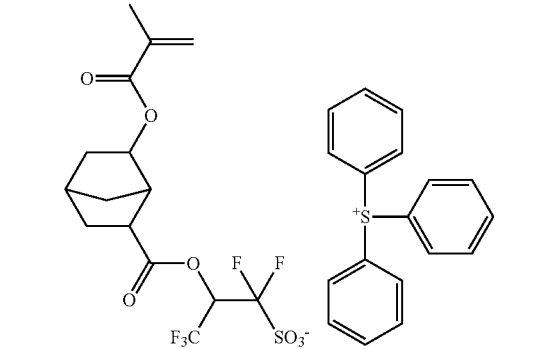
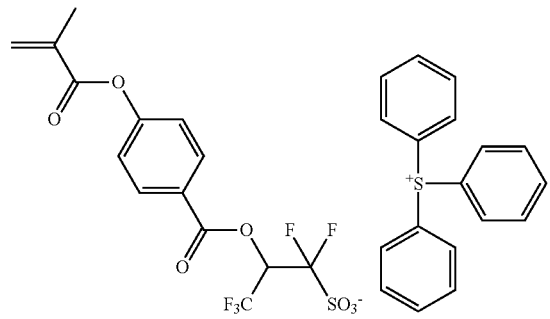
114
-continued
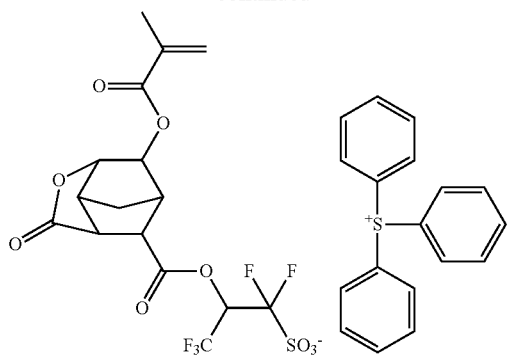
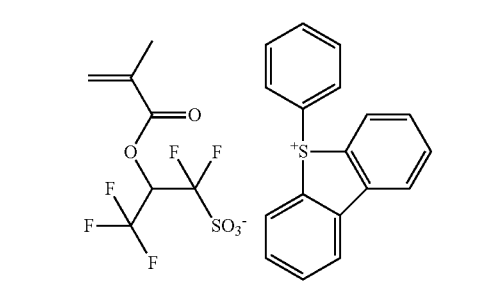
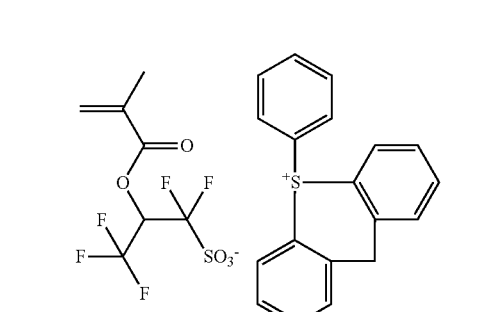
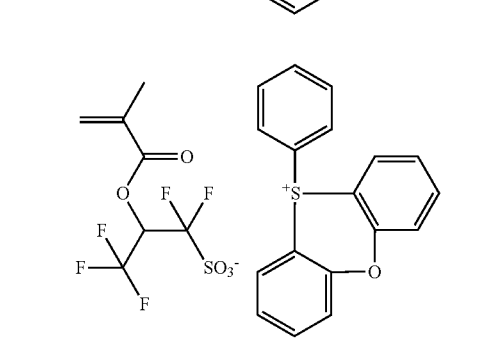
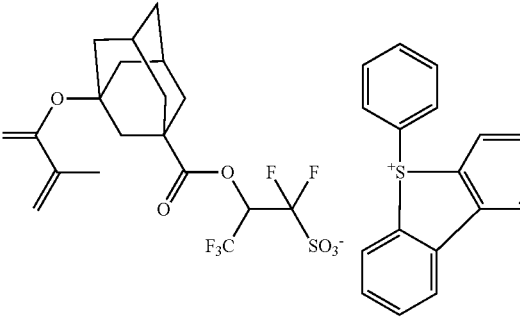

115
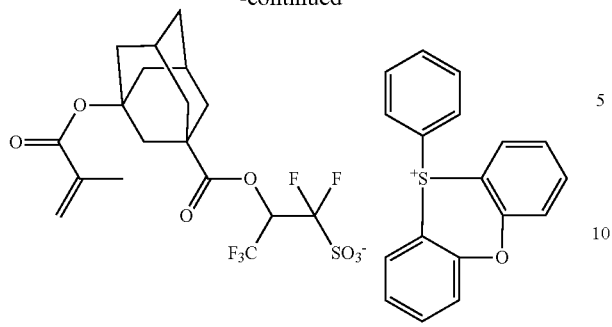
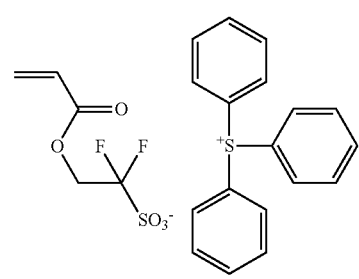
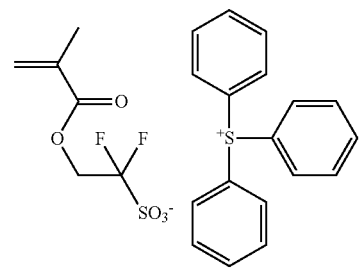
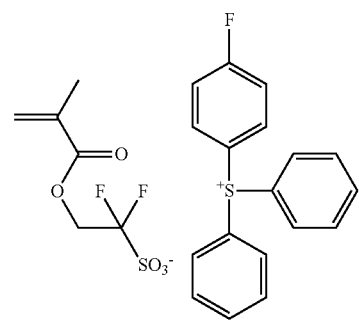
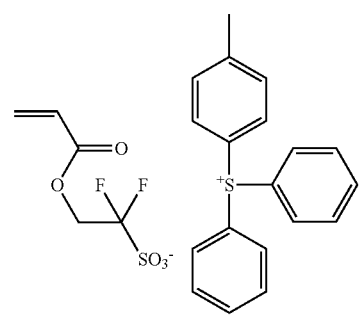
116
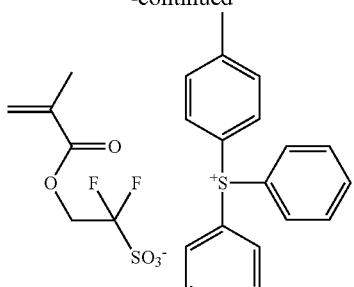
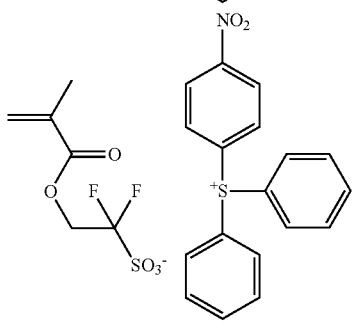
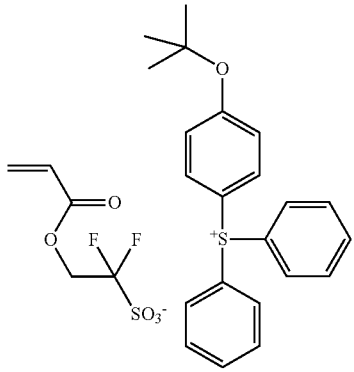
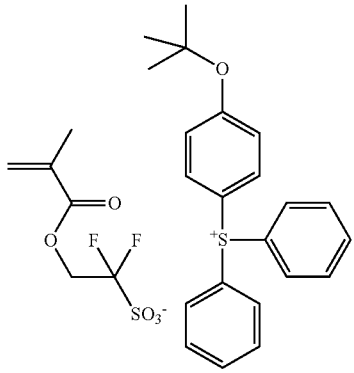
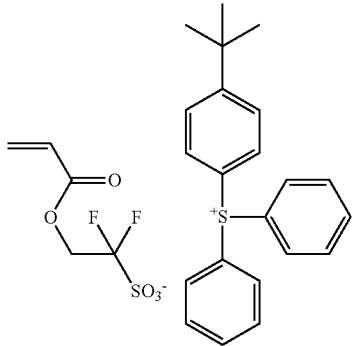

117
-continued
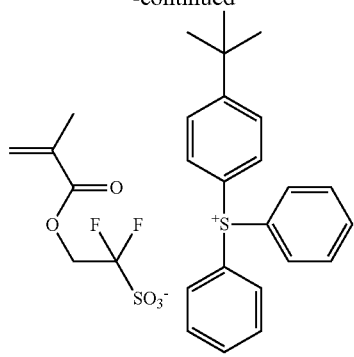
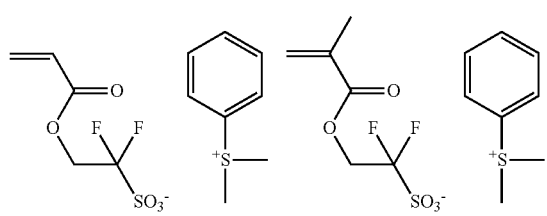
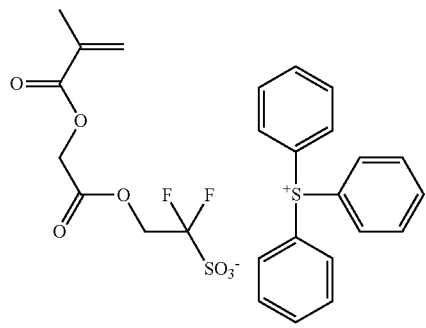
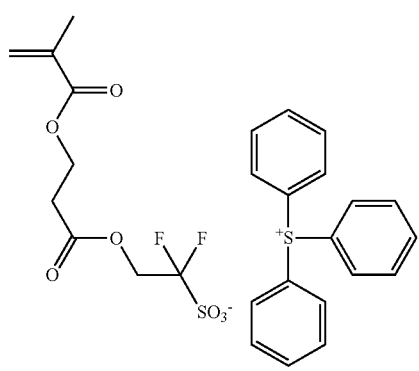
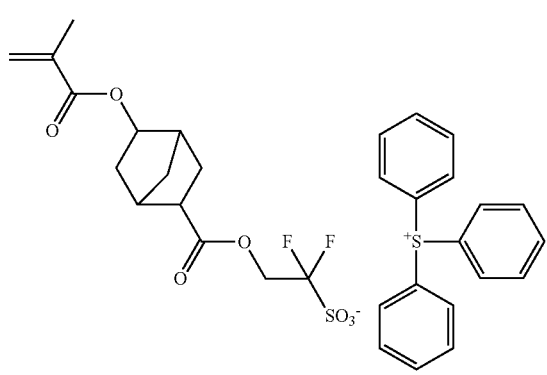
118
-continued
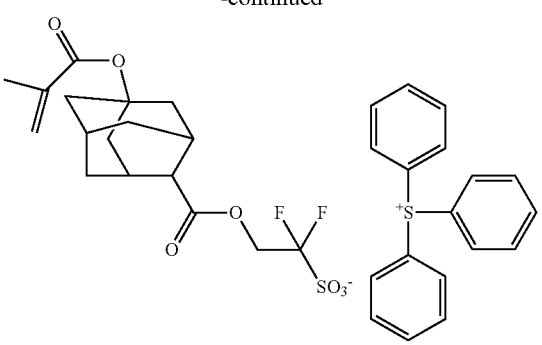
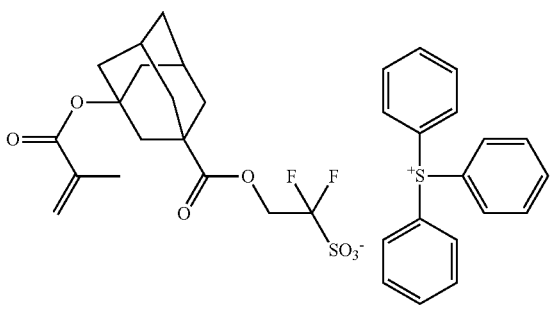
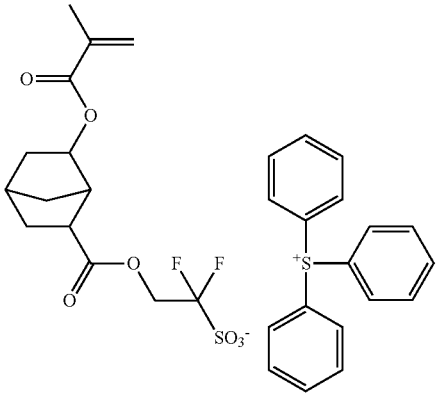
Examples of the monomer from which recurring units (b3) of sulfonium salt in formula (2) are derived are shown below.

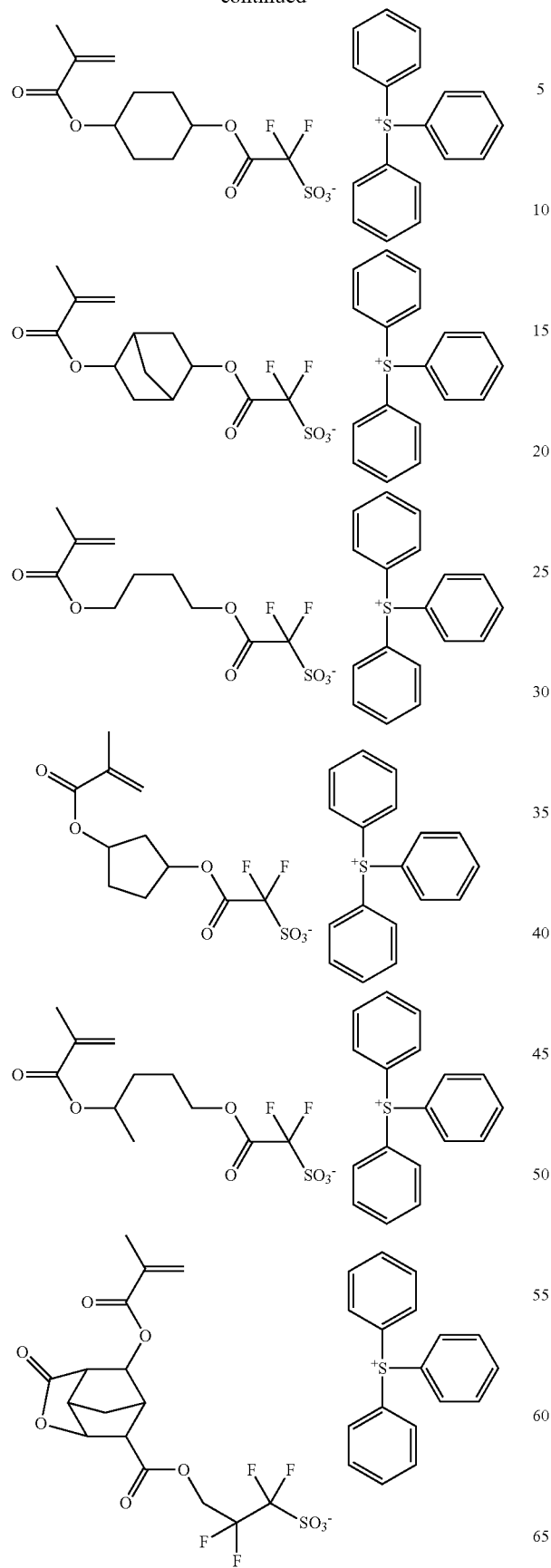
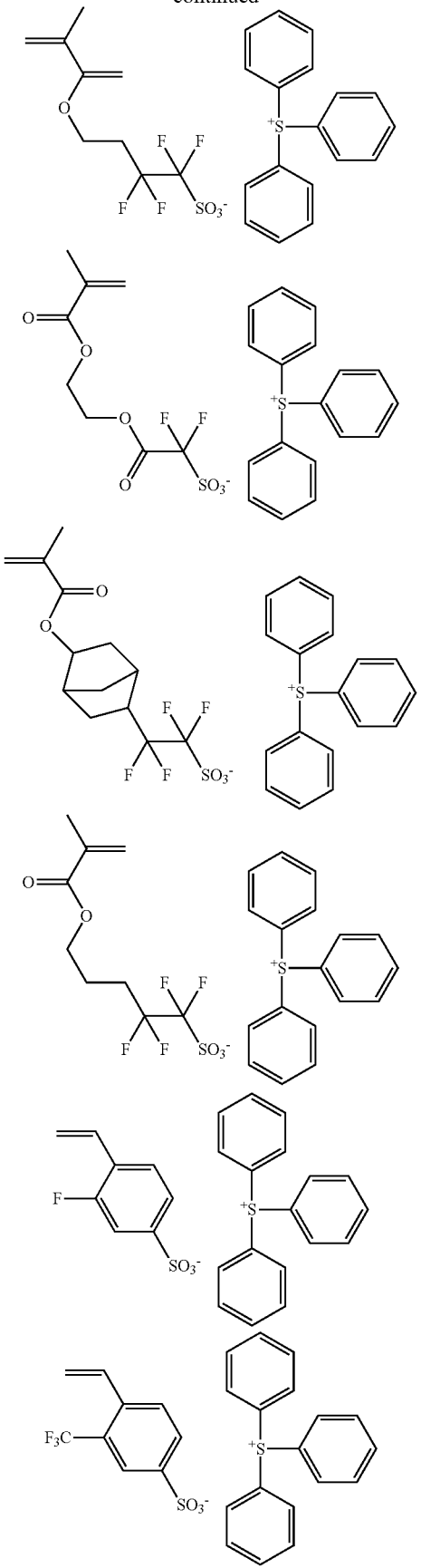

121 122
-continued -continued
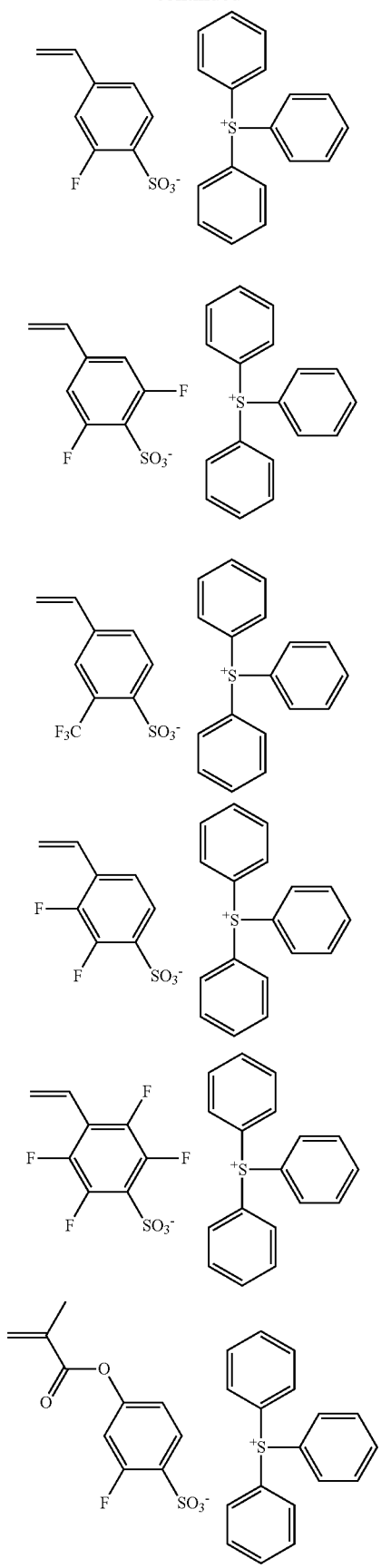

123
-continued
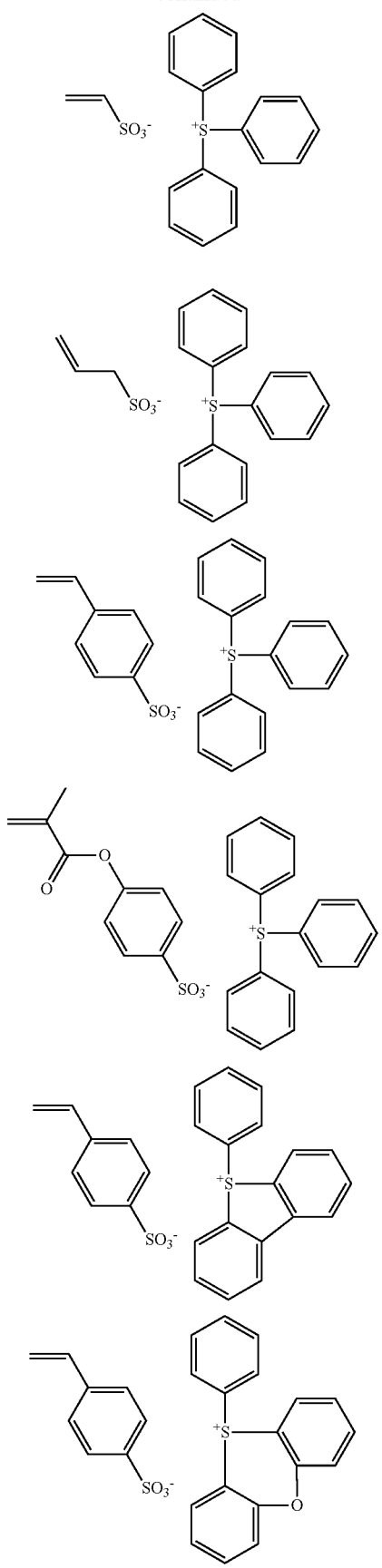
124
-continued
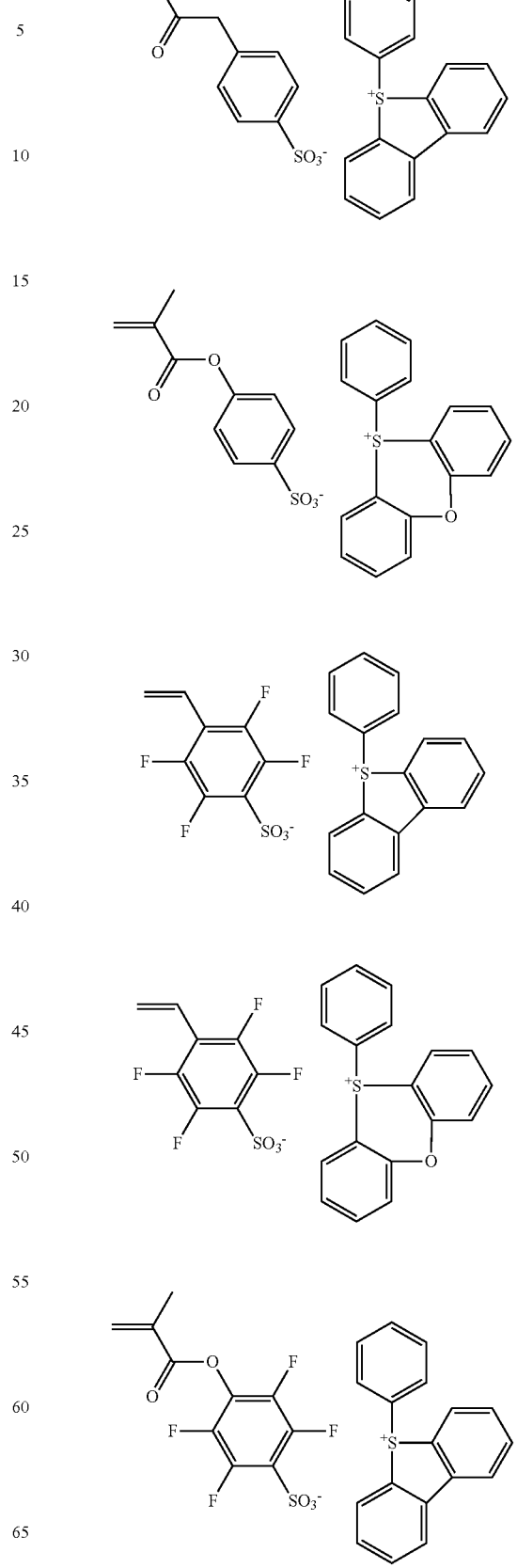

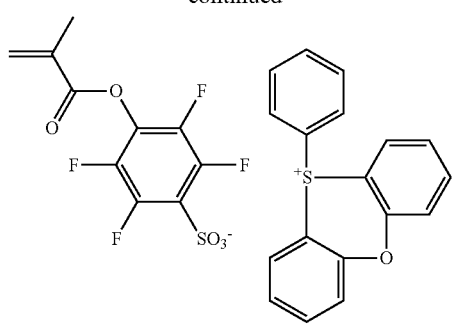
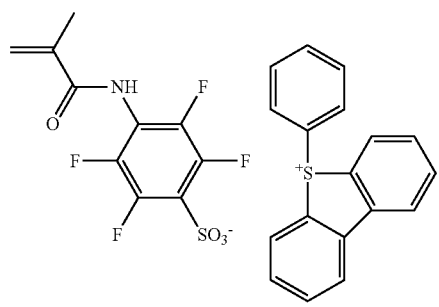
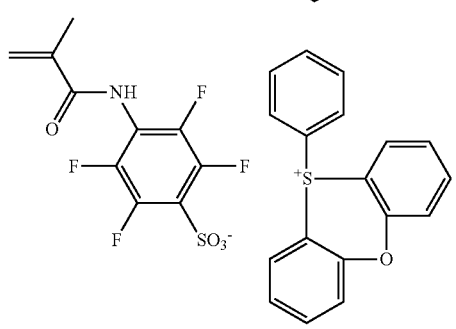

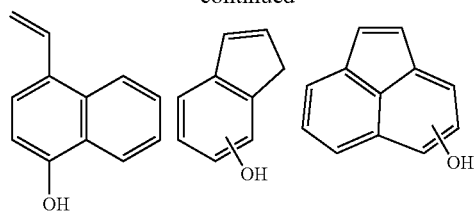
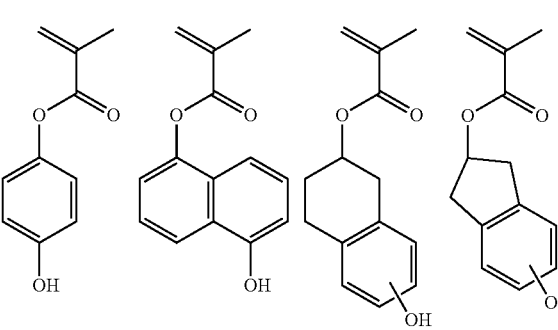
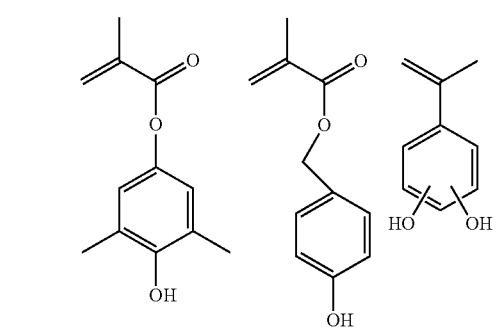

While the polymer is characterized by comprising, in copolymerized form, recurring units (a1) of acid labile group-substituted (meth)acrylic acid, styrenecarboxylic acid or vinylnaphthalenecarboxylic acid and/or recurring units (a2) having an acid labile group-substituted phenolic hydroxyl group, and preferably acid generator-bearing recurring units (b1) to (b3), recurring units (c) having a phenolic hydroxyl group as the adhesive group may be further copolymerized.

Examples of the monomer from which recurring units (c) having a phenolic hydroxyl group are derived are shown below.

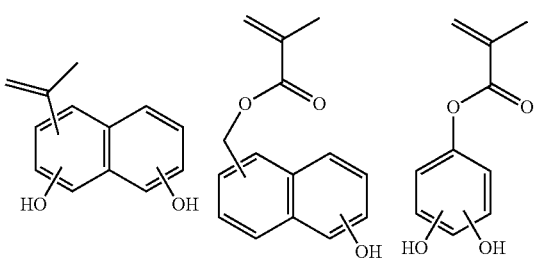

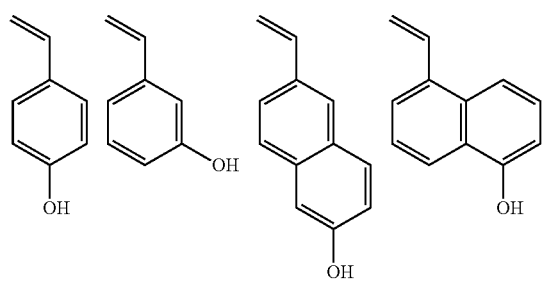
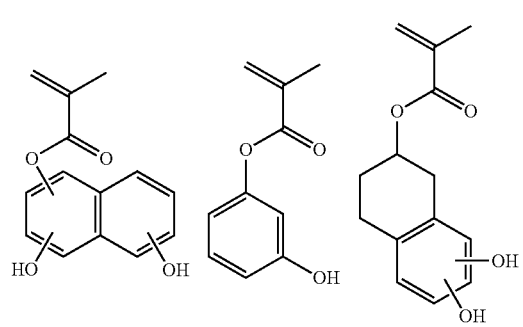

127
-continued
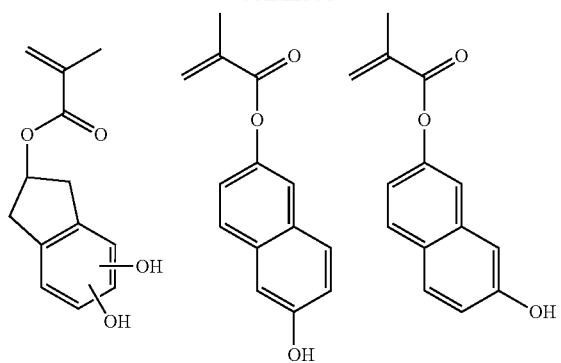
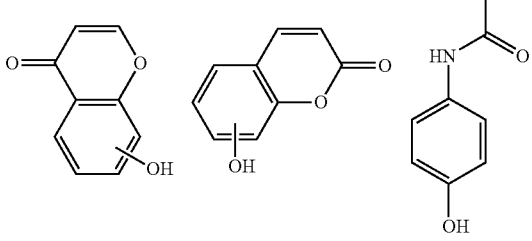
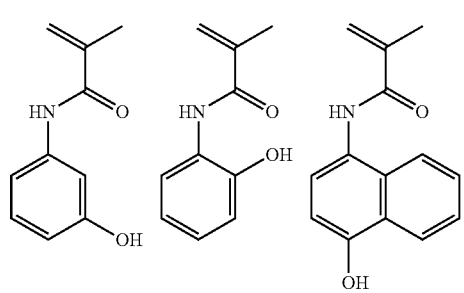
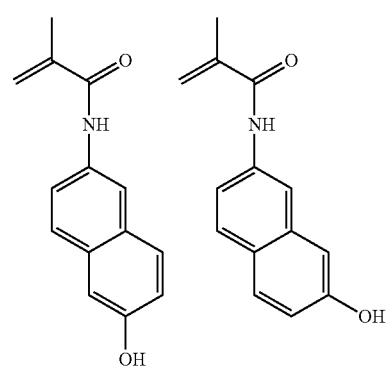
128
-continued
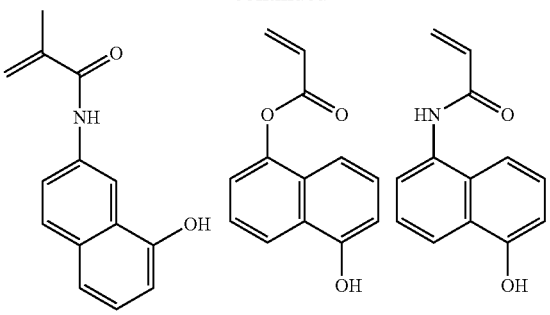
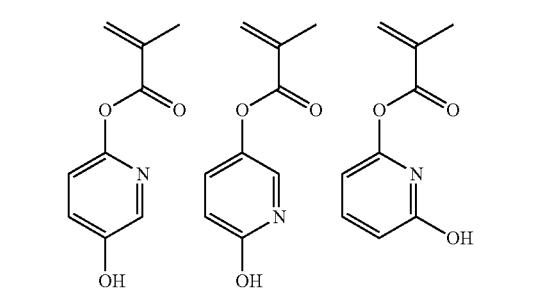
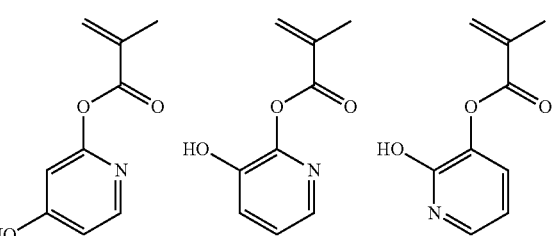
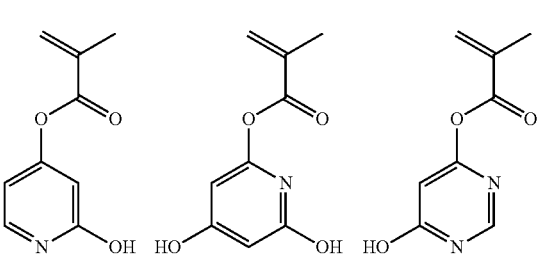
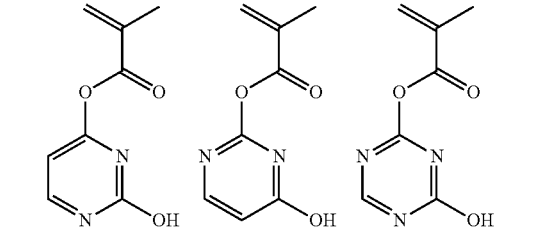
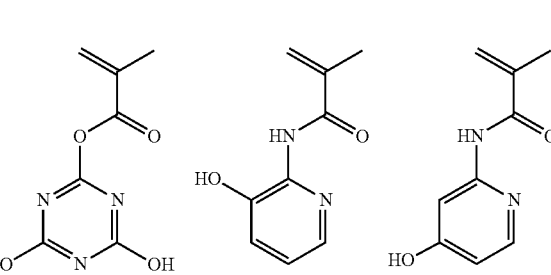

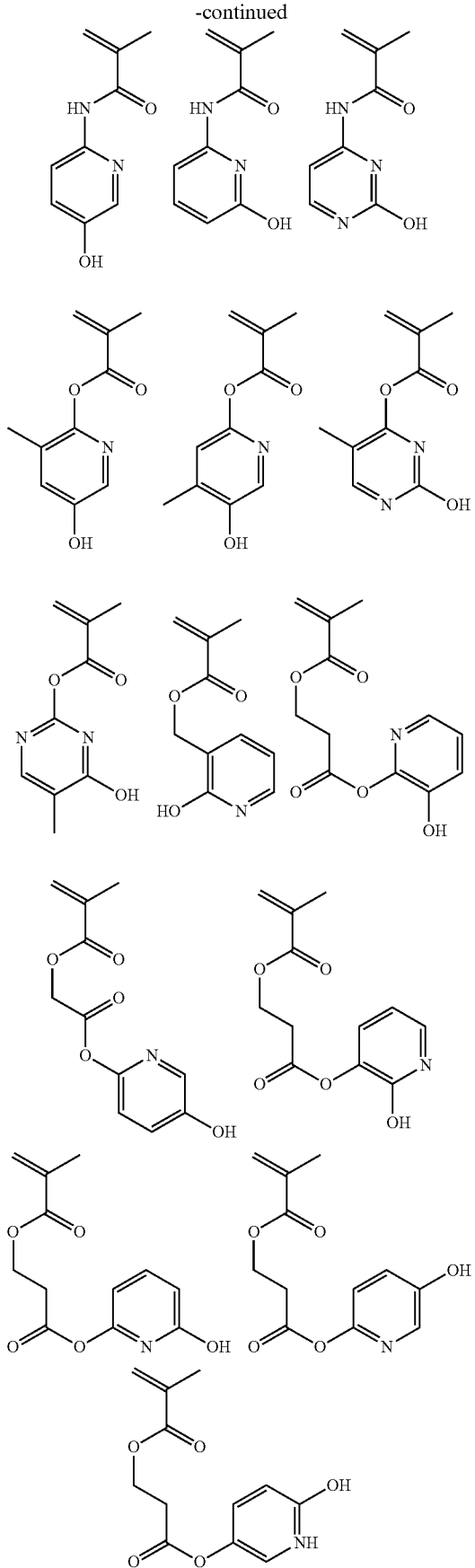

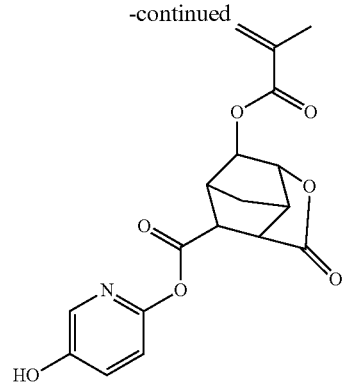

Recurring units (d) having another adhesive group may also be copolymerized. Examples of the other adhesive group include hydroxyl (other than the phenolic hydroxyl), carboxyl, lactone ring, carbonate, thiocarbonate, carbonyl, cyclic acetal, ether, ester, sulfonic acid ester, cyano, amide, and —O—C(=O)-G- wherein G is sulfur or NH.

Examples of the monomer from which recurring units (d) having another adhesive group are derived are shown below.

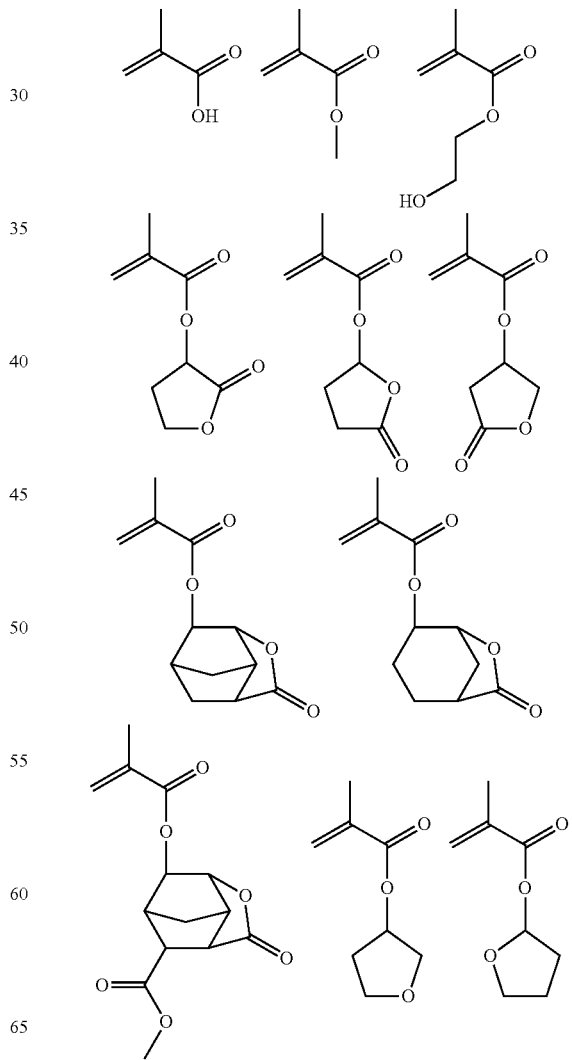

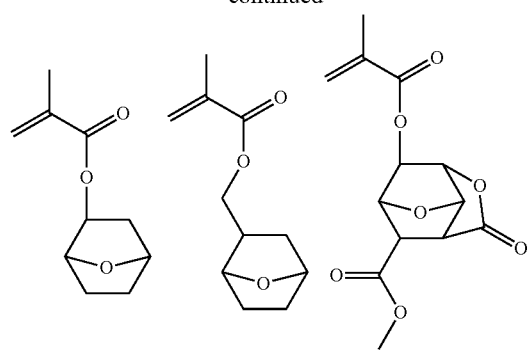
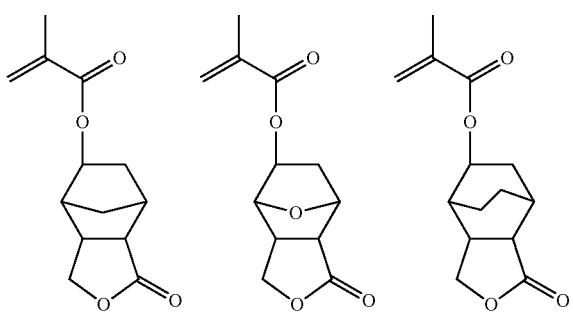
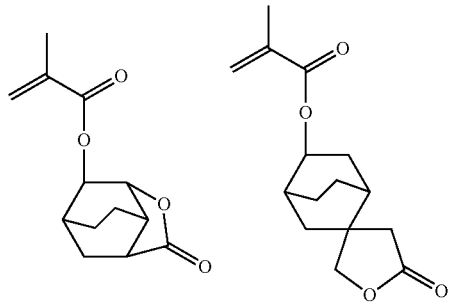
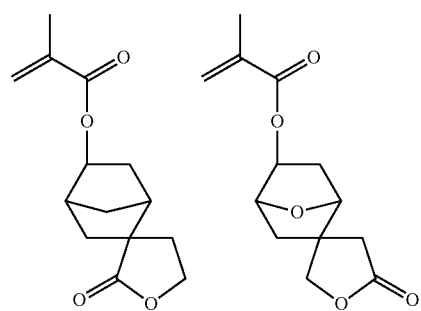
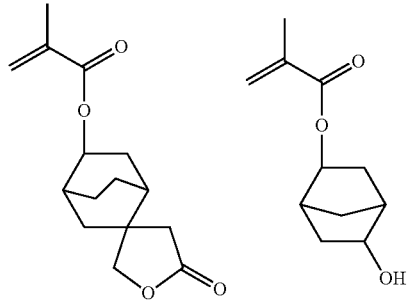
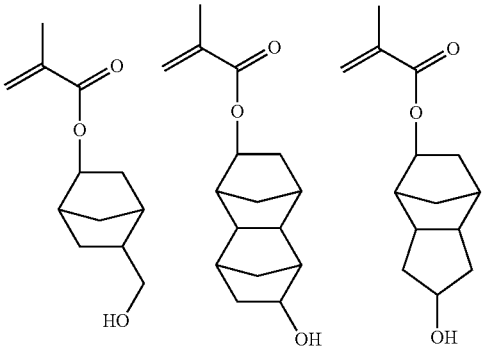
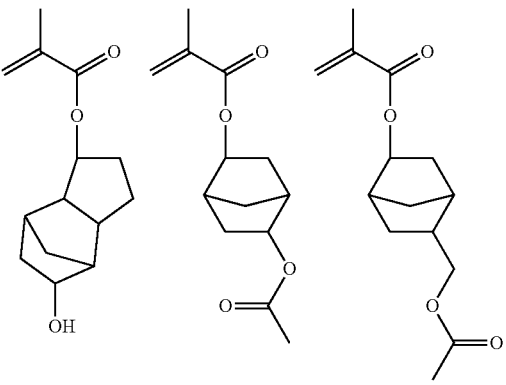
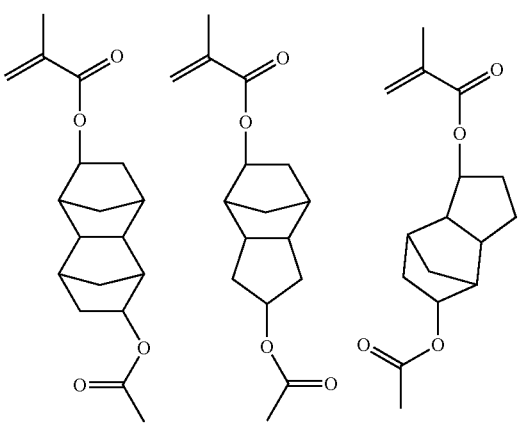
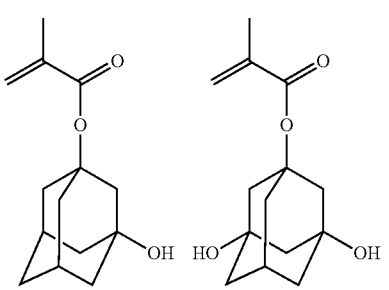

133
-continued
134
-continued
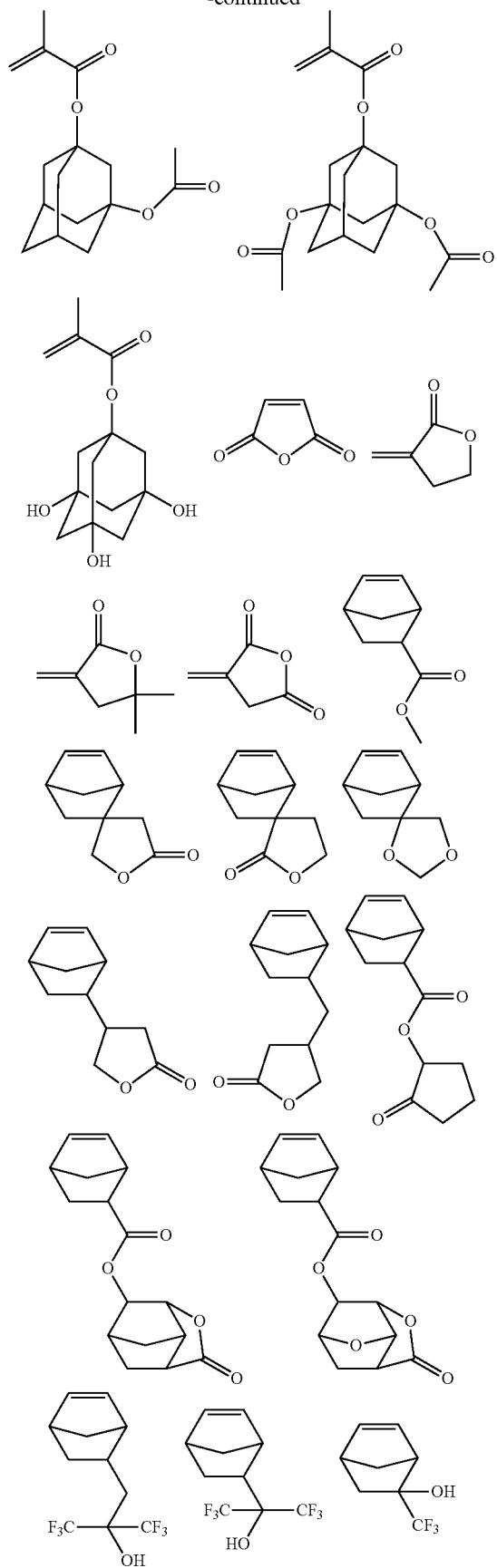
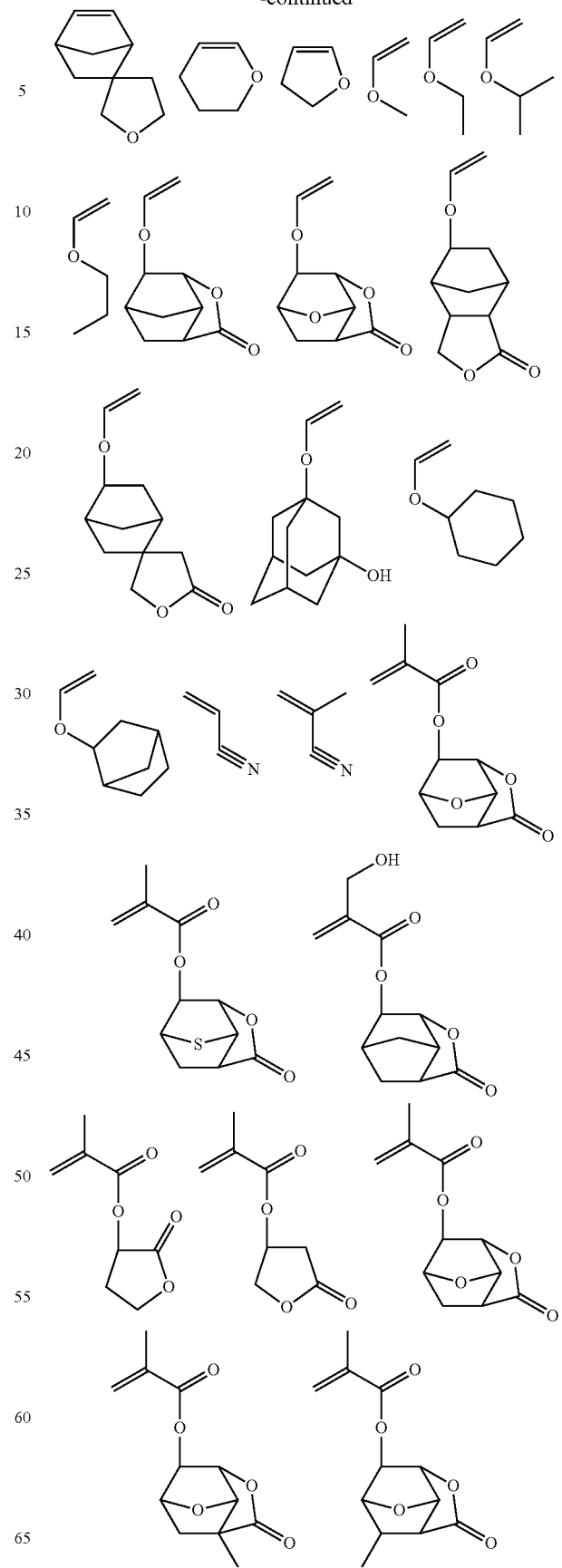

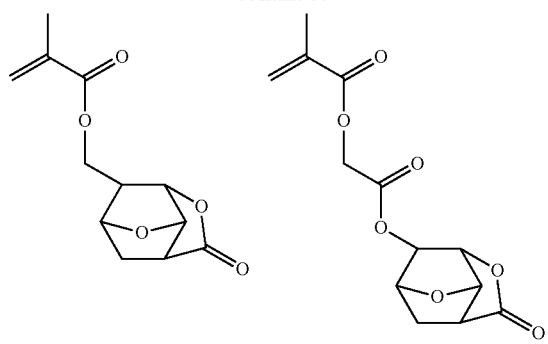
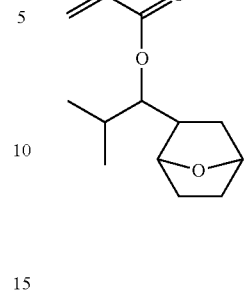
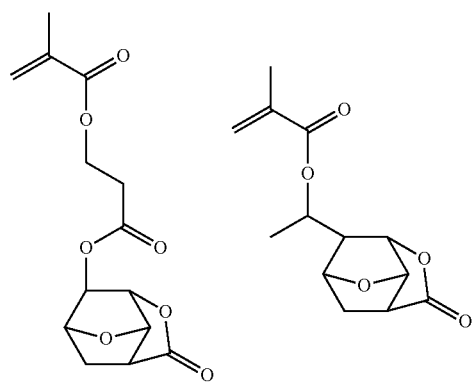
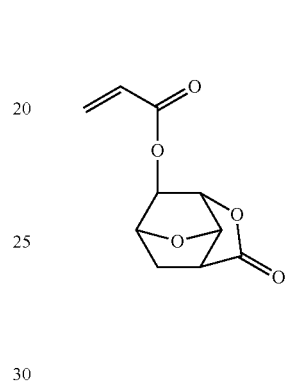
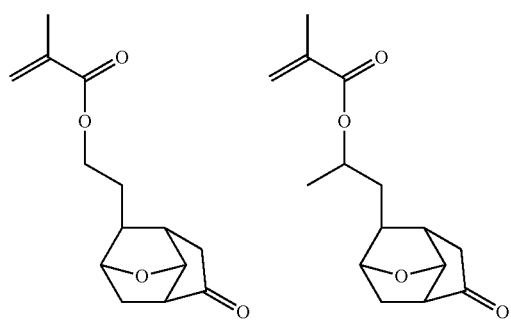
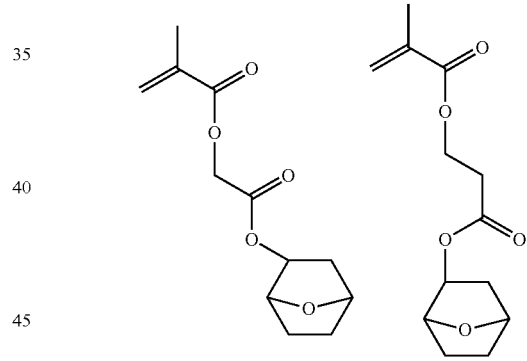
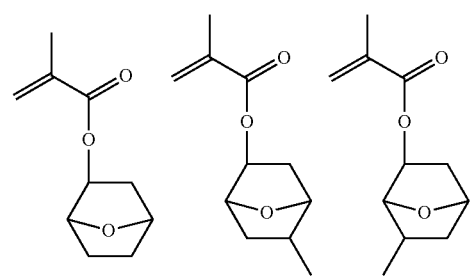
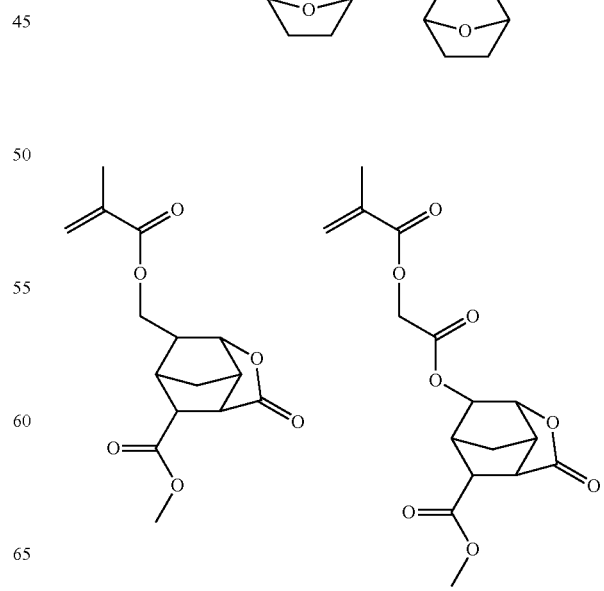

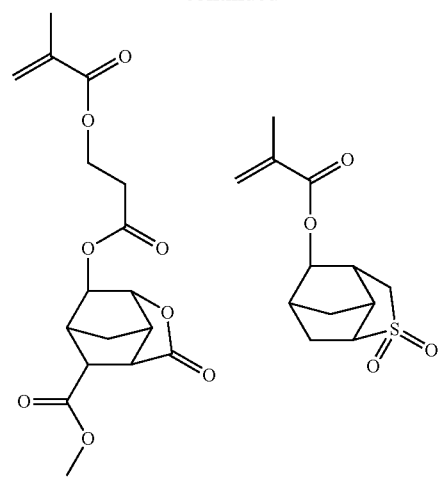
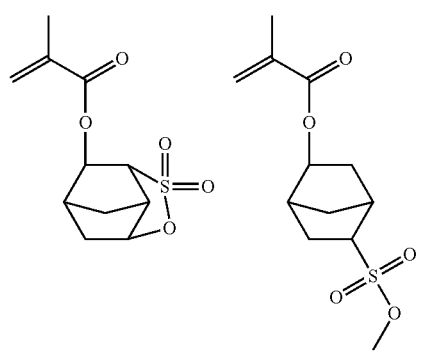
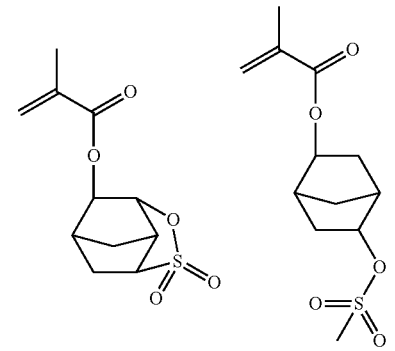
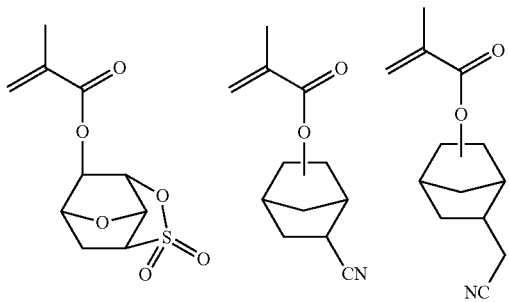
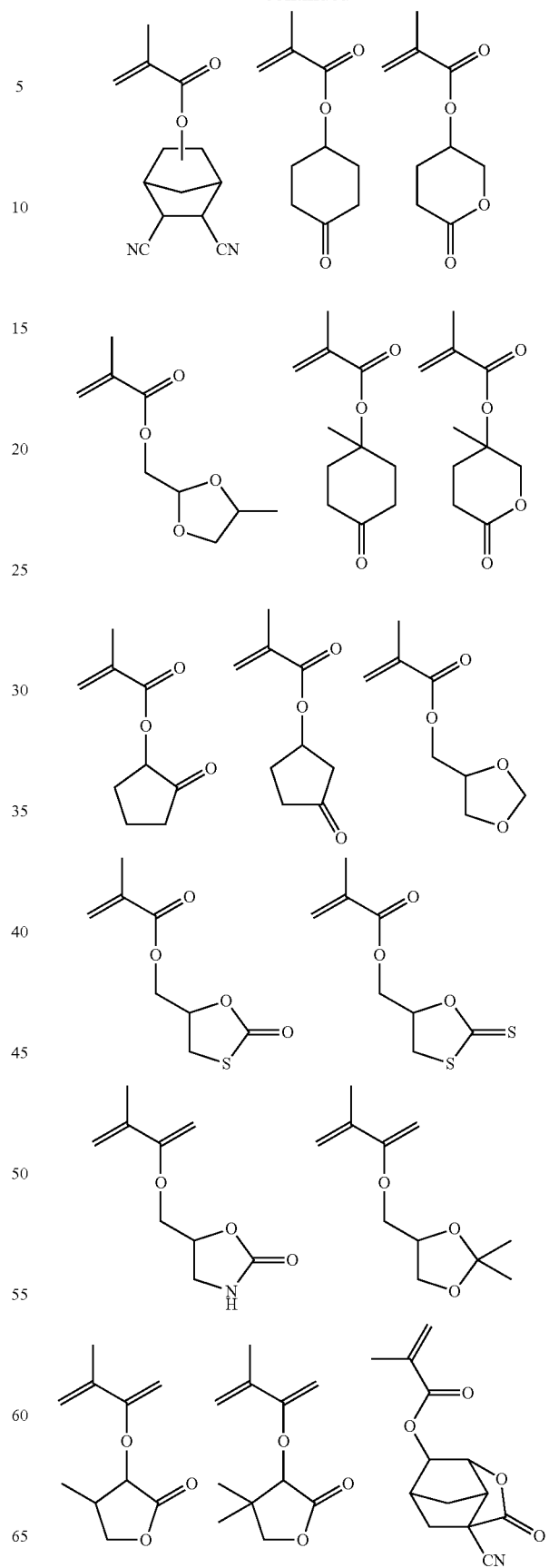

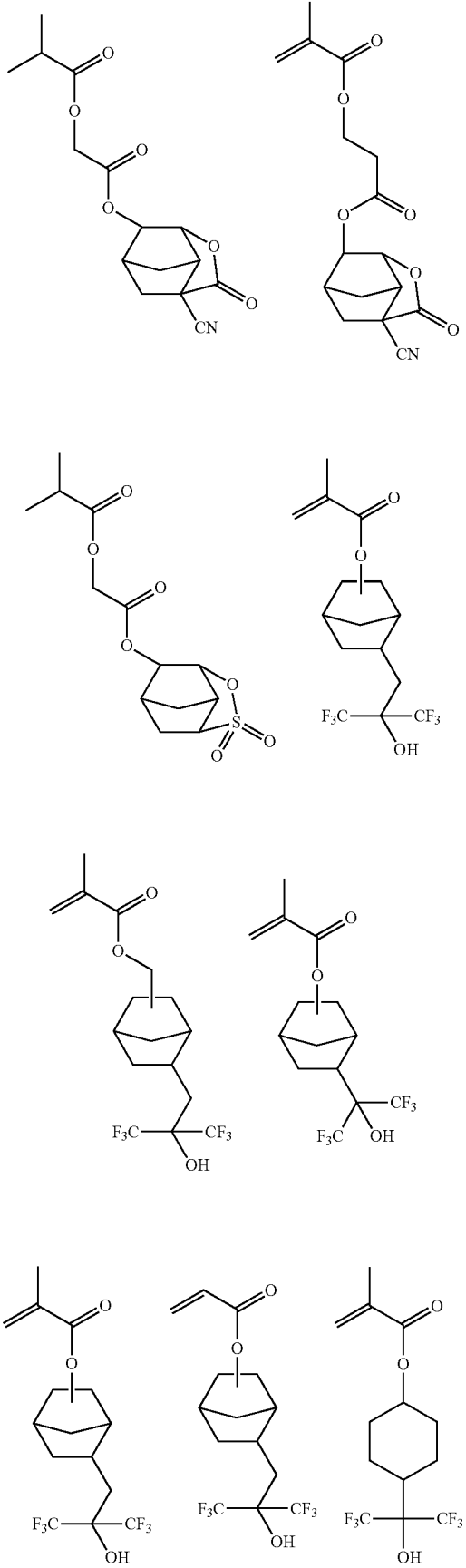
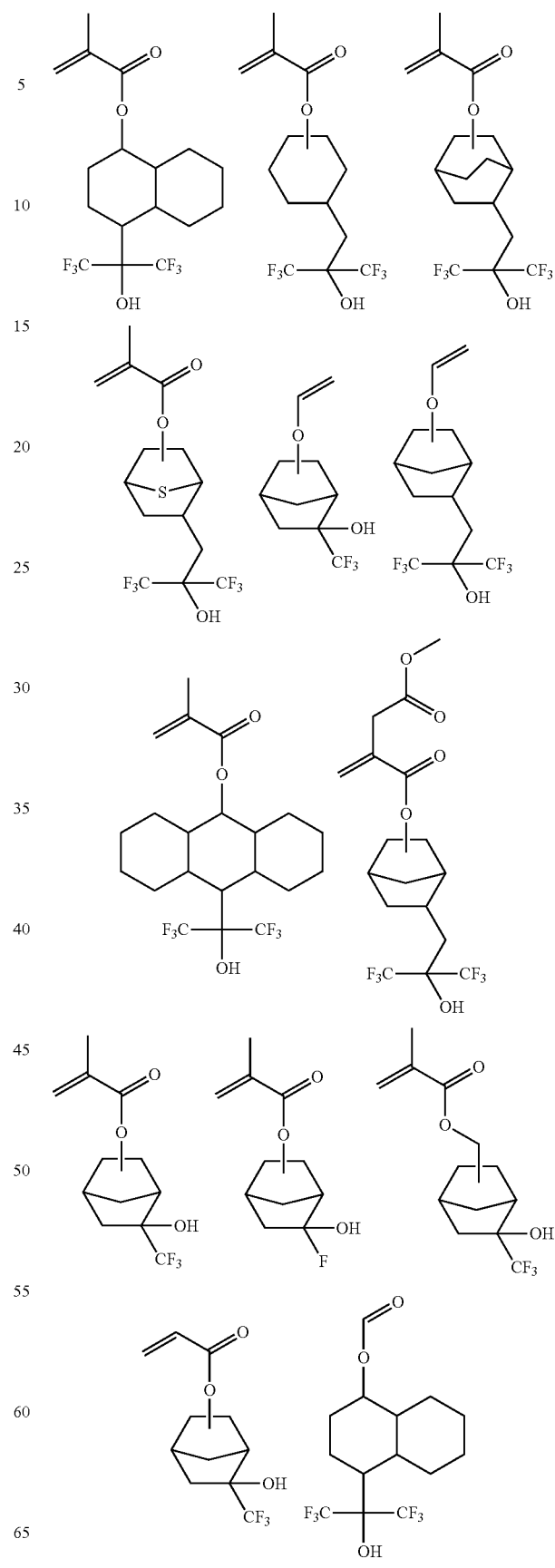

-continued
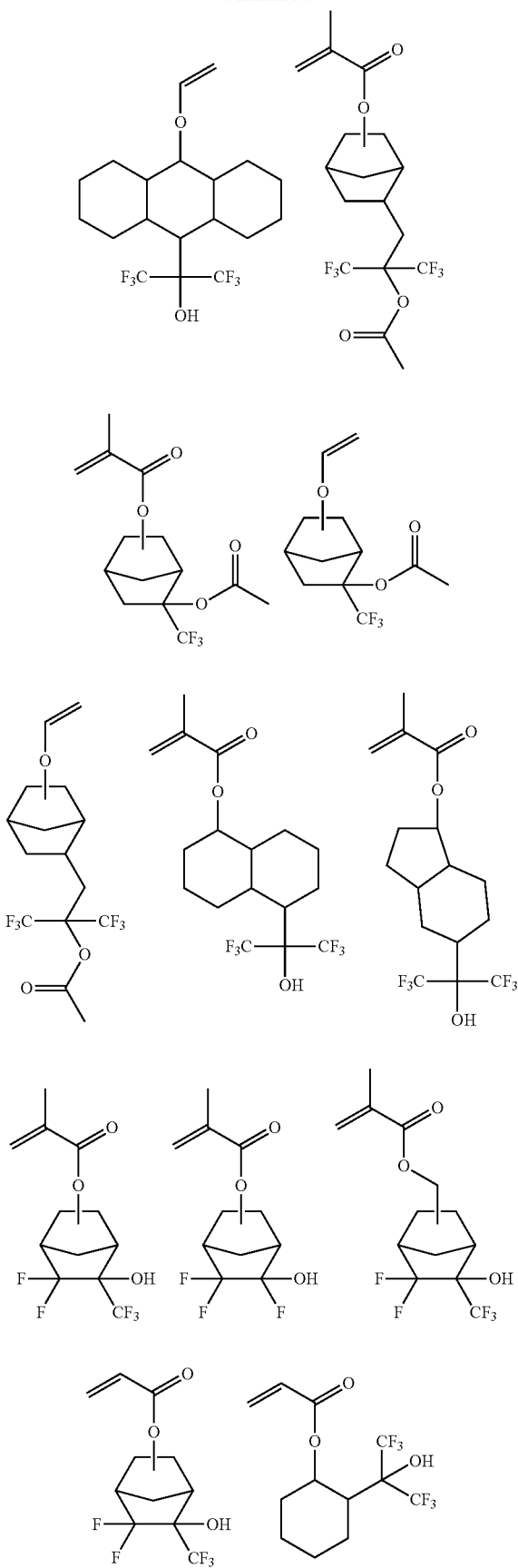
-continued
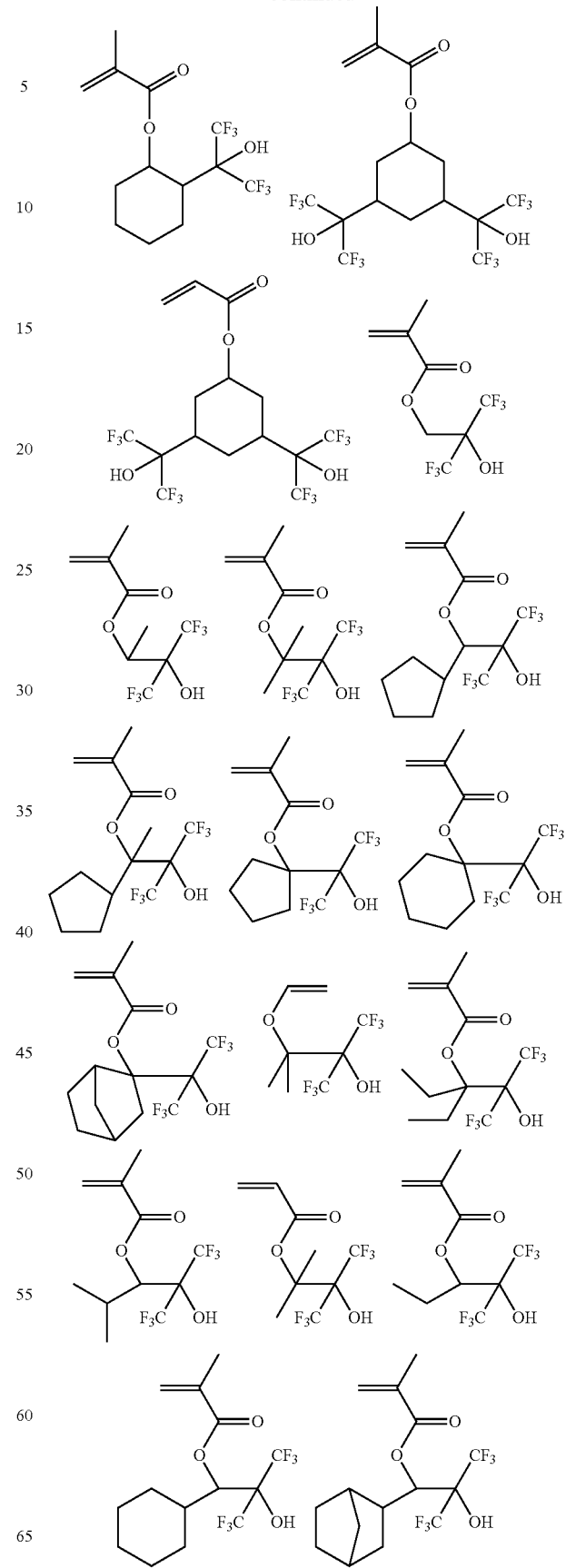

-continued
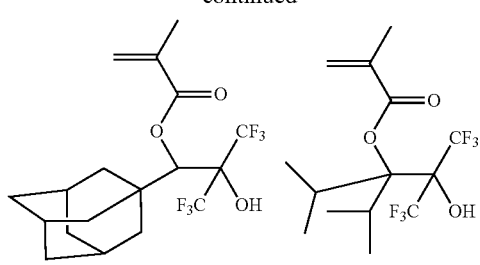
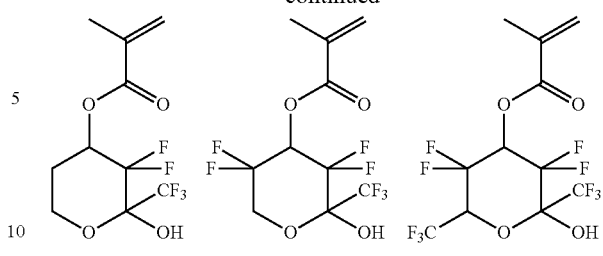
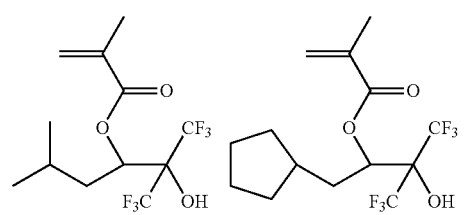
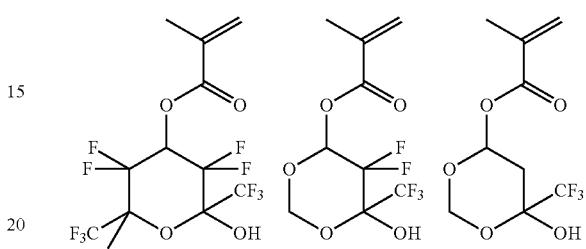
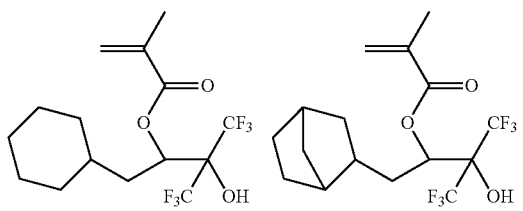
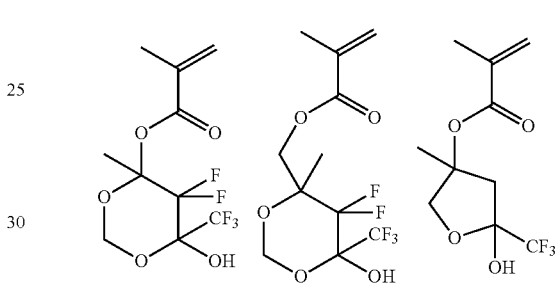
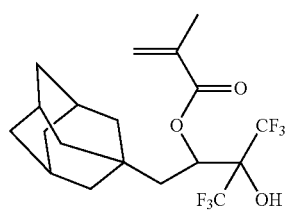
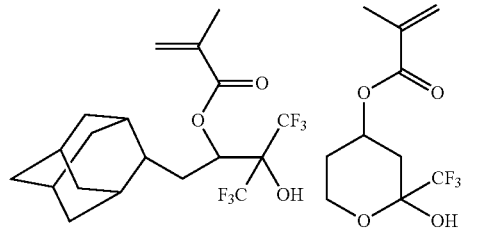
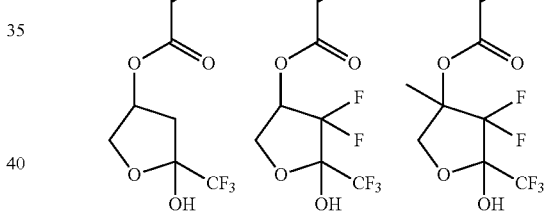
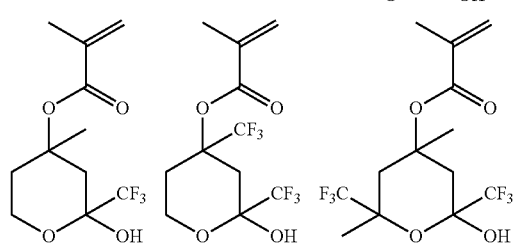
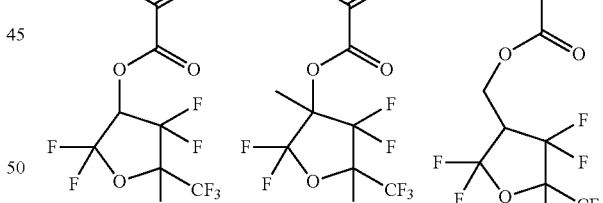
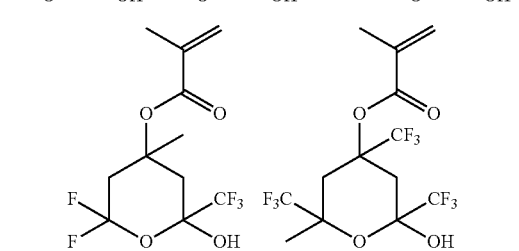
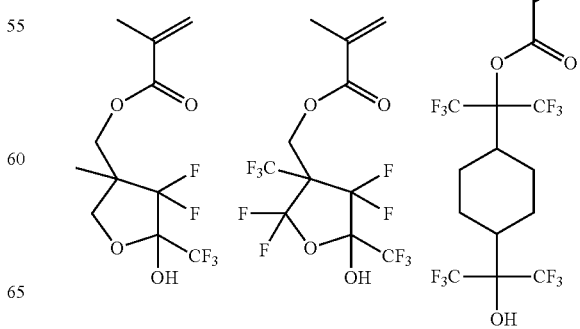

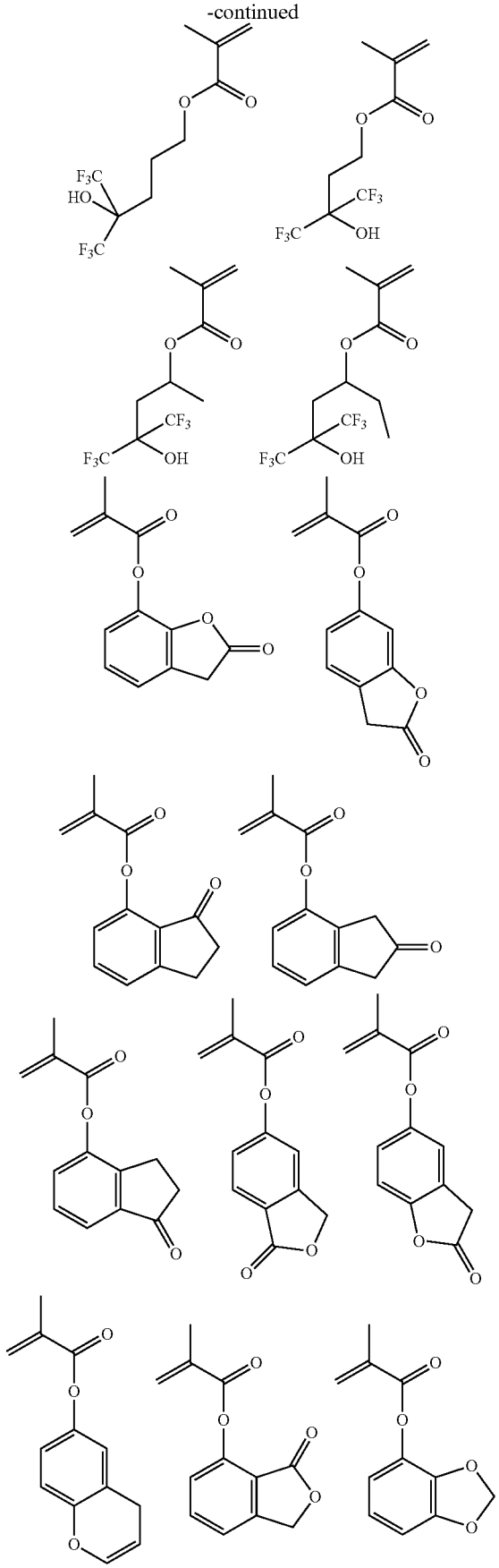
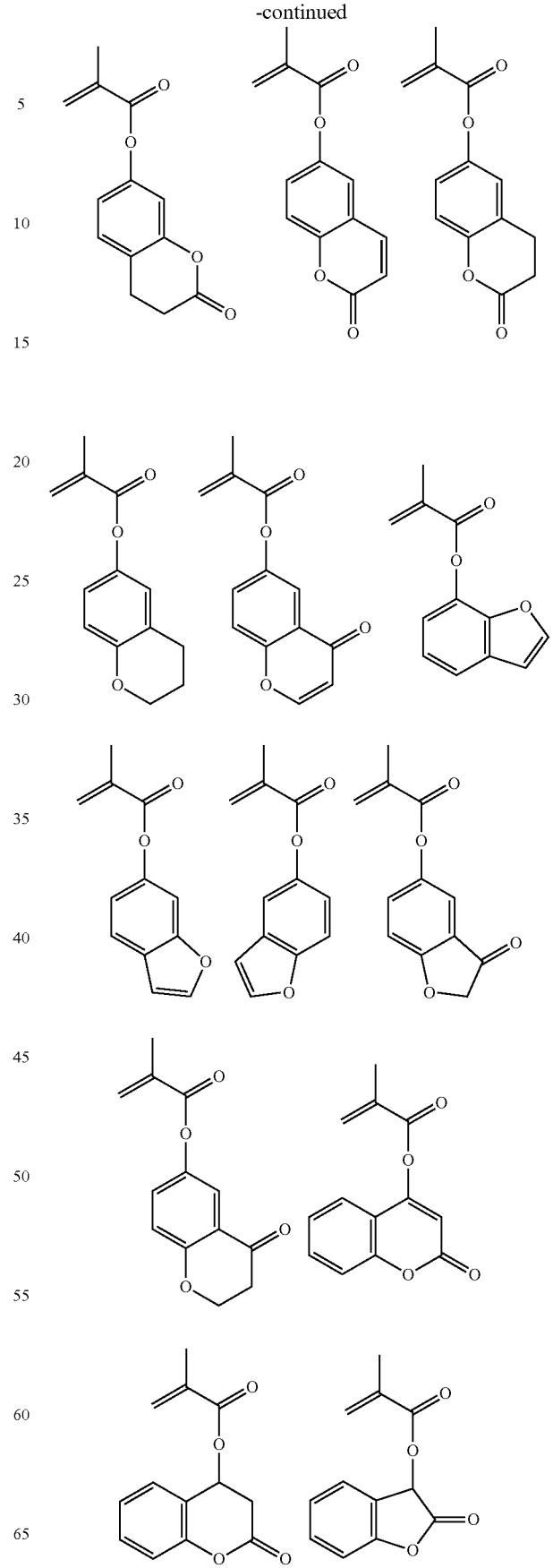

147
-continued

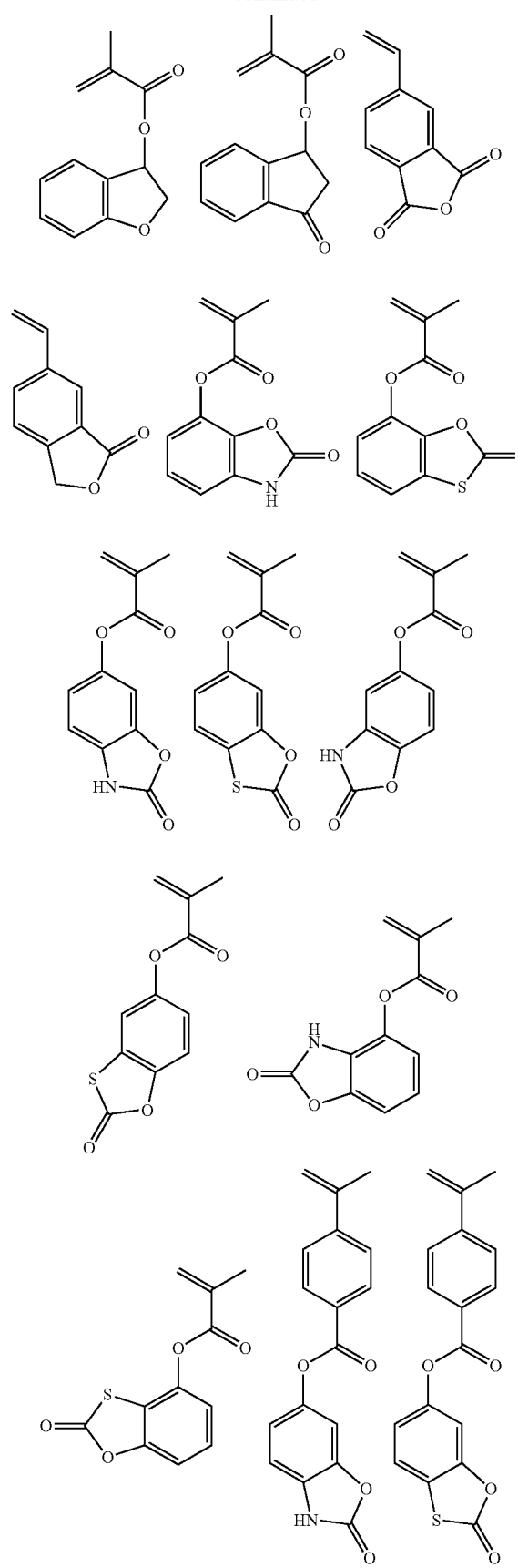

148
-continued

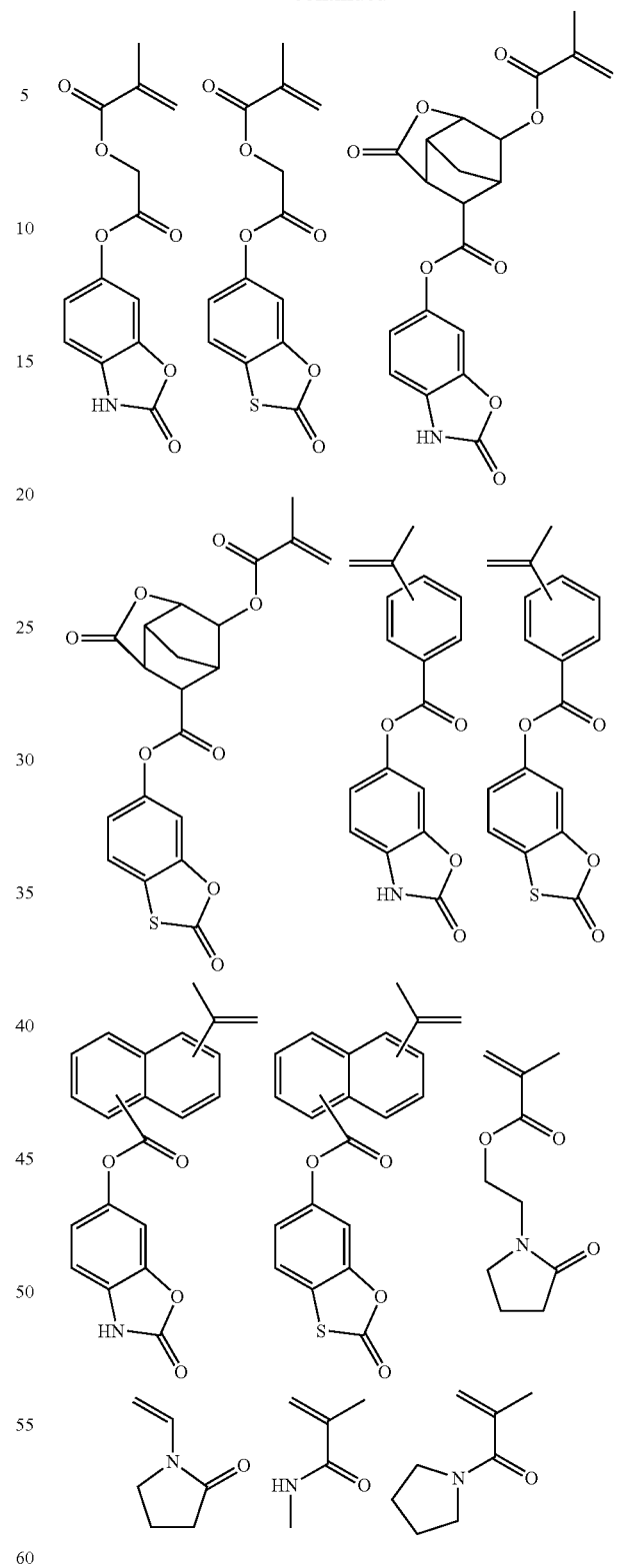

In the case of a hydroxyl-containing monomer, a corresponding monomer in which the hydroxyl group has been replaced by an acetal group which is susceptible to deprotection with acid, typically ethoxyethoxy, may be used, and polymerization be followed by deprotection with weak acid and water. Alternatively, the hydroxyl group may have been replaced by an acetyl, formyl or pivaloyl group, and polymerization be followed by alkaline hydrolysis.

Further, another monomer (e) may be copolymerized, for example, indene, benzofuran, benzothiophene, acenaphthylene, chromone, coumarin, norbornadiene, and derivatives thereof. Examples are shown below.

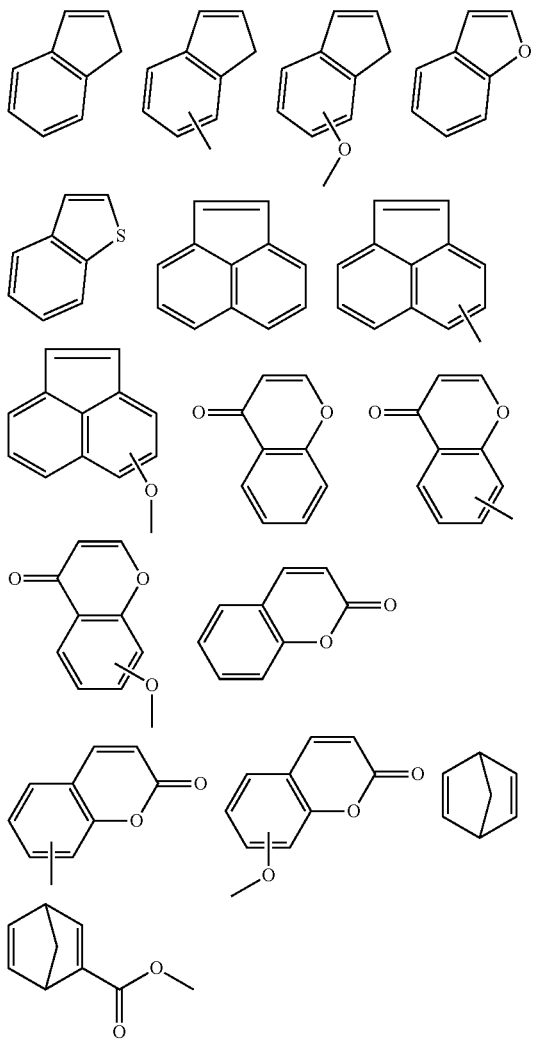

Examples of recurring units (f) other than the foregoing which can be copolymerized herein include styrene, vinylnaphthalene, vinylanthracene, vinylpyrene, and methyleneindane, but are not limited thereto.

In a copolymer having units (a1), (a2), (b1), (b2), (b3), (c), (d), (e), and (f) copolymerized therein, the copolymerization ratio may preferably fall in the range: $0 \leq a1 \leq 0.9$, $0 \leq a2 \leq 0.9$, $0 < a1+a2 \leq 1$, $0 \leq b1 \leq 0.5$, $0 \leq b2 \leq 0.5$, $0 \leq b3 \leq 0.5$, $0 \leq b1+b2+b3 \leq 0.5$, $0 \leq c \leq 0.9$, $0 \leq d \leq 0.9$, $0 \leq e \leq 0.9$, and $0 \leq f \leq 0.5$; more preferably $0 \leq a1 \leq 0.8$, $0 \leq a2 \leq 0.8$, $0.1 \leq a1+a2 \leq 0.8$, $0 \leq b1 \leq 0.4$, $0 \leq b2 \leq 0.4$, $0 \leq b3 \leq 0.4$, $0 \leq b1+b2+b3 \leq 0.4$, $0 \leq c \leq 0.8$, $0 \leq d \leq 0.8$, $0 \leq e \leq 0.8$, and $0 \leq f \leq 0.4$; even more preferably $0 \leq a1 \leq 0.7$, $0 \leq a2 \leq 0.7$, $0.15 \leq a1+a2 \leq 0.75$, $0 \leq b1 \leq 0.3$, $0\ b2 \leq 0.3$, $0\ b3 \leq 0.3$, $0 \leq b1+b2+b3 \leq 0.3$, $0 \leq c \leq 0.7$, $0 \leq d \leq 0.7$, $0 \leq e \leq 0.7$, and $0 \leq f \leq 0.3$; provided $a1+a2+b1+b2+b3+c+d+e+f=1$.

The polymer as used herein may be synthesized by any desired method, for example, by dissolving monomers corresponding to the respective units (a1), (a2), (b1), (b2), (b3), (c), (d), (e), and (f) in an organic solvent, adding a radical polymerization initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethyl-valeronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to hours.

When hydroxystyrene or hydroxyvinylnaphthalene is to be copolymerized, one possible procedure is by carrying out polymerization using acetoxystyrene or acetoxyvinylnaphthalene instead of hydroxystyrene or hydroxyvinylnaphthalene, and effecting alkaline hydrolysis for deprotection of the acetoxy group for converting back to polyhydroxystyrene or hydroxypolyvinylnaphthalene. Suitable bases used for alkaline hydrolysis include ammonia water and triethylamine. The reaction conditions include a temperature of −20° C. to 100° C., preferably 0° C. to 60° C. and a time of 0.2 to 100 hours, preferably 0.5 to 20 hours.

The polymer used herein should preferably have a weight average molecular weight (Mw) in the range of 1,000 to 500,000, and more preferably 2,000 to 30,000, as measured in tetrahydrofuran solvent by GPC versus polystyrene standards. With a Mw of at least 1,000, the resist composition is fully heat resistant. A polymer with a Mw of up to 500,000 may be devoid of a loss of alkaline solubility or a footing phenomenon after pattern formation.

If a multi-component polymer has a broad molecular weight distribution or dispersity (Mw/Mn), which indicates the presence of lower and higher molecular weight polymer fractions, there is a possibility that following exposure, foreign matter is left on the pattern or the pattern profile is exacerbated. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

While the polymer is characterized by comprising, in copolymerized form, recurring units (a1) of acid labile group-substituted (meth)acrylic acid, styrenecarboxylic acid or vinylnaphthalenecarboxylic acid and/or recurring units (a2) having an acid labile group-substituted phenolic hydroxyl group, and optionally acid generator-bearing recurring units (b1), (b2) or (b3), it is acceptable to use a blend of two or more such polymers which differ in compositional ratio, molecular weight or dispersity.

The polymer defined above is especially suited as a base resin in a positive resist composition. When a positive resist composition is prepared by using the relevant polymer as the base resin and combining it with suitable other components such as organic solvent, acid generator, dissolution inhibitor, basic compound, and surfactant, the resist composition has a very high sensitivity in that the polymer in the exposed region accelerates its dissolution rate in developer through catalytic reaction. The resist composition has many advantages including a high dissolution contrast, a high resolution, exposure latitude, process adaptability, a good pattern profile after exposure, high etch resistance, and minimized proximity bias due to controlled acid diffusion. Because of these advantages, the resist composition is fully viable in commercial processes and best suited as the micropatterning resist material for the fabrication of VLSIs.

Specifically, when an acid generator is added to formulate a chemically amplified positive resist composition capable of utilizing acid catalyzed reaction, a higher sensitivity is given and the aforementioned properties are further improved. When a dissolution inhibitor is added to the positive resist composition, the difference in dissolution rate between the exposed and unexposed regions is enhanced, with the resolution being further improved. When a basic compound is added, the rate of acid diffusion in the resist film can be suppressed, with the resolution being further improved. When a surfactant is added, the resist composition is further improved or controlled in coating operation.

In one embodiment, an acid generator is added to the resist composition in order that the composition function as a chemically amplified positive resist composition. Typical of the acid generator used herein is a photoacid generator (PAG) capable of generating an acid in response to actinic radiation or high-energy radiation. Suitable PAGs include sulfonium salts, iodonium salts, sulfonyldiazomethane, N-sulfonyloxyimide, and oxime-O-sulfonate acid generators. The PAGs may be used alone or in admixture of two or more. Exemplary acid generators are described in U.S. Pat. No. 7,537,880 (JP-A 2008-111103, paragraphs [0122] to [0142]).

Examples of the organic solvent used herein are described in JP-A 2008-111103, paragraphs [0144] to [0145], exemplary basic compounds or quenchers in paragraphs [0146]-[0164], and exemplary surfactants in paragraphs [0165]-[0166]. Examples of the dissolution inhibitor used herein are described in JP-A 2008-122932, paragraphs [0155]-[0178]. Also polymeric quenchers as described in JP-A 2008-239918 may be added. If necessary, acetylene alcohols may be added, for example, those described in JP-A 2008-122932, paragraphs [0179]-[0182].

Since the polymeric surfactant segregates at the surface of a resist film as coated, it is effective for rendering the resist pattern more rectangular. The polymeric quencher is effective for reducing a film loss and preventing the pattern from being rounded at the top when a protective topcoat for the immersion lithography is applied.

The salt of mono- to tetra-functional $C_1$-$C_{20}$ carboxylic acid or complex of β-diketone with a metal selected from among sodium, magnesium, chromium, manganese, iron, cobalt, nickel, copper, zinc, silver, cadmium, indium, tin, antimony, cesium, zirconium, and hafnium functions as a quencher through salt exchange with sulfonic acid, imide acid or methide acid generated by the acid generator. The metal salt of carboxylic acid or metal complex of β-diketone is used an amount of 0.01 to 30 parts, preferably 0.02 to 20 parts by weight per 100 parts by weight of the polymer or base resin. The metal salt or complex serving as a quencher may be combined with the amine quencher.

When used, the acid generator is preferably added in an amount of 0.1 to 50 parts by weight per 100 parts by weight of the polymer or base resin. When used, the basic compound or quencher is preferably added in an amount of 0.01 to 20 parts, more preferably 0.02 to 15 parts by weight per 100 parts by weight of the base resin. When used, the dissolution inhibitor is preferably added in an amount of 0.5 to 50 parts, more preferably 1.0 to 30 parts by weight per 100 parts by weight of the base resin. When used, the surfactant is preferably added in an amount of 0.0001 to 10 parts, more preferably 0.001 to 5 parts by weight per 100 parts by weight of the base resin. When used, the solvent is preferably added in an amount of 100 to 10,000 parts, more preferably 200 to 8,000 parts by weight per 100 parts by weight of the base resin.

Process

Another embodiment of the invention is a pattern forming process comprising the steps of coating the resist composition defined above onto a substrate, baking the coating to form a resist film, exposing the resist film to high-energy radiation, and developing the exposed resist film with a developer.

The step of exposing the resist film to high-energy radiation may use EUV radiation having a wavelength of 3 to nm or an accelerated electron beam, specifically an electron beam at an accelerating voltage of 1 to 150 keV.

In the resist film, the salt of mono- to tetra-functional $C_1$-$C_{20}$ carboxylic acid or complex of β-diketone with a metal selected from among sodium, magnesium, chromium, manganese, iron, cobalt, nickel, copper, zinc, silver, cadmium, indium, tin, antimony, cesium, zirconium, and hafnium is a conductive metal salt which serves as an antistatic agent effective for preventing the resist film from being charged during EB image writing. This eliminates a need for an antistatic film on the resist film. In addition, since the salt of mono- to tetra-functional $C_1$-$C_{20}$ carboxylic acid or complex of β-diketone with a metal selected from among sodium, magnesium, chromium, manganese, iron, cobalt, nickel, copper, zinc, silver, cadmium, indium, tin, antimony, cesium, zirconium, and hafnium has a strong absorption of EUV of wavelength 13.5 nm, the sensitivity of the resist is improved upon exposure to EUV by the mechanism that the outer shell electrons of the metal are excited, and the electrons transfer to the acid generator, whereby the efficiency of acid generation is enhanced.

When the resist composition, typically chemically amplified positive resist composition comprising the polymer of formula (1), the salt of mono- to tetra-functional $C_1$-$C_{20}$ carboxylic acid or complex of β-diketone with a metal selected from among sodium, magnesium, chromium, manganese, iron, cobalt, nickel, copper, zinc, silver, cadmium, indium, tin, antimony, cesium, zirconium, and hafnium, an acid generator and a basic compound in an organic solvent is used for the microfabrication of various integrated circuits, any well-known lithography processes may be applied.

For example, the resist composition is applied onto a substrate for integrated circuit fabrication or a processable layer thereon (e.g., Si, $SiO_2$, SiN, SiON, TiN, WSi, BPSG, SOG, or organic antireflective coating) or a substrate for mask circuit fabrication or a processable layer thereon (e.g., Cr, CrO, CrON, MoSi, or $SiO_2$) by any suitable technique such as spin coating, roll coating, flow coating, dip coating, spray coating or doctor coating. The coating is prebaked on a hot plate at a temperature of 60 to 150° C. for 10 seconds to 30 minutes, preferably 80 to 120° C. for 30 seconds to 20 minutes to form a resist film having a thickness of 0.1 to 2.0 μm.

Next the resist film is exposed imagewise to high-energy radiation selected from among UV, DUV, EB, x-ray, excimer laser, γ-ray, synchrotron radiation, or EUV (or soft x-ray) directly or through a mask having the desired pattern. The exposure is preferably carried out to provide a dose of 1 to 200 $mJ/cm^2$, preferably 10 to 100 $mJ/cm^2$, or 0.1 to 100 $\mu C/cm^2$, preferably 0.5 to 50 $\mu C/cm^2$. This is followed by baking (PEB) on a hot plate at 60 to 150° C. for 10 seconds to minutes, preferably at 80 to 120° C. for 30 seconds to 20 minutes.

Finally, the exposed resist film is developed with a developer which is an aqueous alkaline solution, typically a 0.1 to 5%, preferably 2 to 3% by weight of tetramethylammonium hydroxide (TMAH), choline hydroxide, tetraethylammonium hydroxide (TEAH), tetrapropylammonium hydroxide (TPAH) or tetrabutylammonium hydroxide (TBAH). Development is carried out for 3 seconds to 3 minutes, preferably 5 seconds to 2 minutes by any conventional techniques such as dip, puddle and spray techniques. The exposed region of resist film is dissolved in the developer, but not the unexposed region. In this way, the desired positive pattern is formed on the substrate.

Alternatively, a negative tone pattern may be formed by organic solvent development. The organic solvent used as the developer is preferably selected from 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, phenyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate. These organic solvents may be used alone or in admixture of two or more.

At the end of organic solvent development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-amyl ether, and di-n-hexyl ether. The solvents may be used alone or in admixture. Besides the foregoing solvents, aromatic solvents may be used, for example, toluene, xylene, ethylbenzene, isopropylbenzene, tert-butylbenzene and mesitylene.

Of the variety of high-energy radiation, the resist composition is best suited in micropatterning with EB, EUV (or soft x-ray), x-ray, γ-ray, or synchrotron radiation. Particularly when EUV radiation having a wavelength of 3 to nm or an EB at an accelerating voltage of up to 100 keV, especially an EB at an accelerating voltage of up to 50 keV is used, a finer size pattern can be formed.

EXAMPLE

Examples are given below by way of illustration of the invention and not by way of limitation. The abbreviation "pbw" is parts by weight. For all polymers, Mw and Mn are determined by GPC versus polystyrene standards using tetrahydrofuran solvent.

Synthesis Example

Various polymers (Polymers 1 to 15) for use in resist compositions were prepared by combining suitable monomers, effecting copolymerization reaction in tetrahydrofuran solvent, pouring into methanol for crystallization, repeatedly washing with hexane, isolation, and drying. The polymers were analyzed by $^1$H-NMR to determine their composition and by GPC to determine Mw and dispersity Mw/Mn.

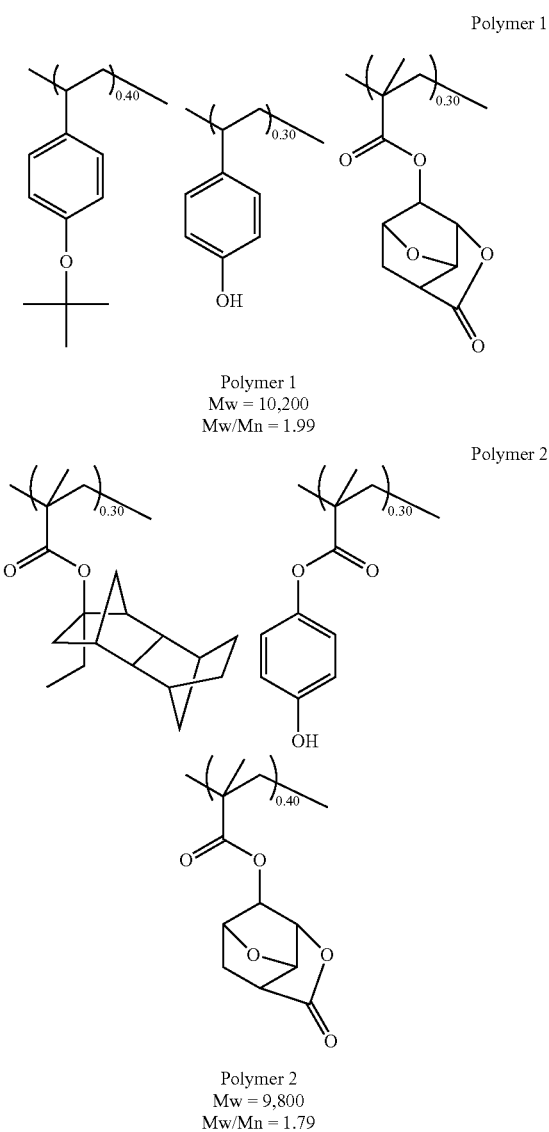

Polymer 3
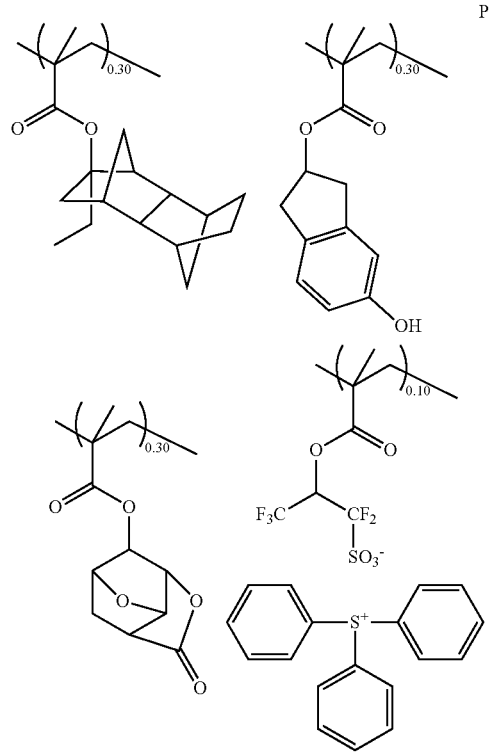
Polymer 3
Mw = 7,500
Mw/Mn = 1.79
Polymer 4
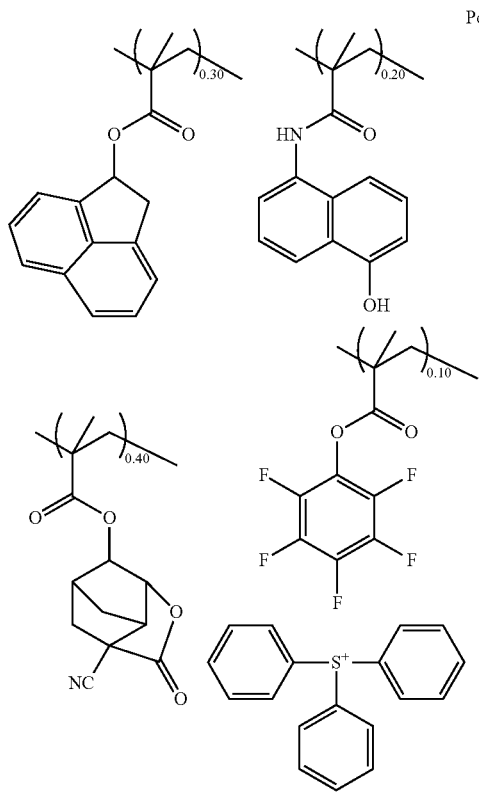
Polymer 4
Mw = 7,900
Mw/Mn = 1.97
Polymer 5
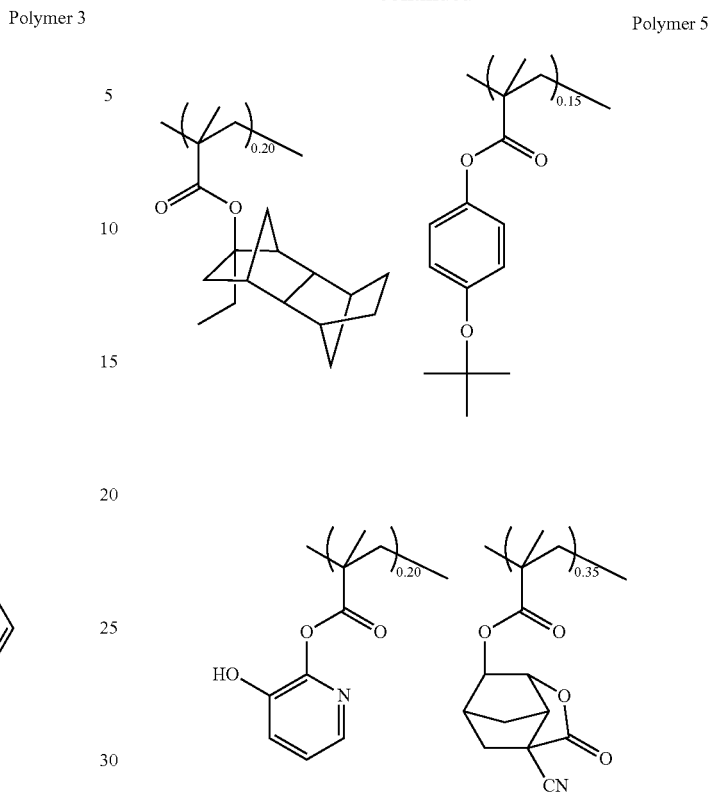
Polymer 5
Mw = 9,000
Mw/Mn = 1.98
Polymer 6
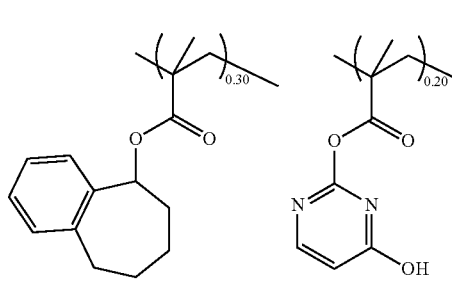

-continued
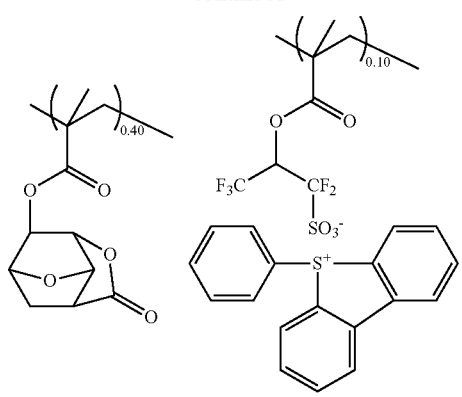
Polymer 6
Mw = 9,900
Mw/Mn = 1.86
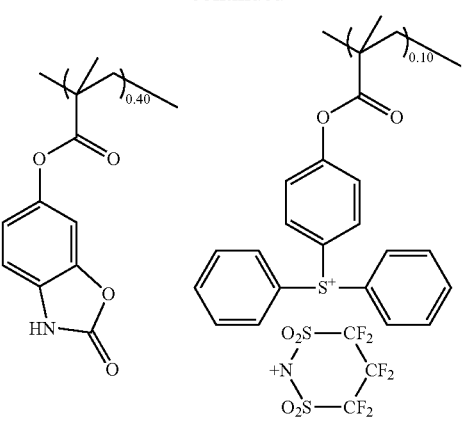
Polymer 8
Mw = 7,800
Mw/Mn = 1.78
Polymer 7
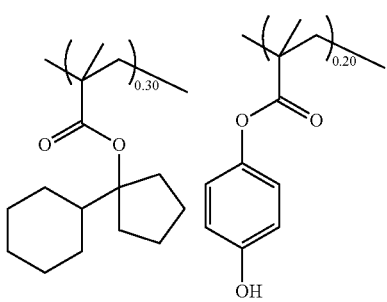
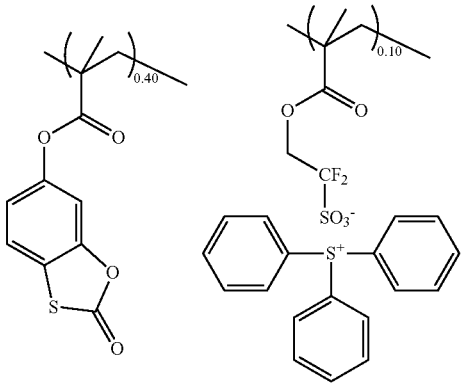
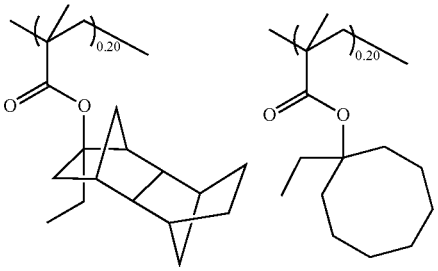
Polymer 9
Polymer 7
Mw = 7,900
Mw/Mn = 1.79
Polymer 8
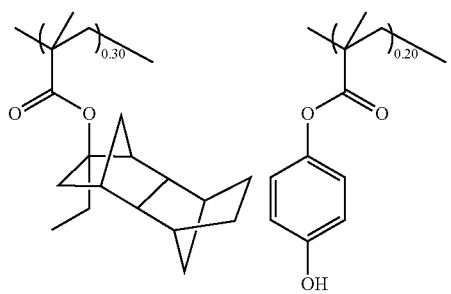
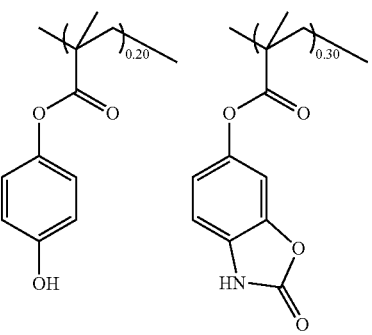

-continued
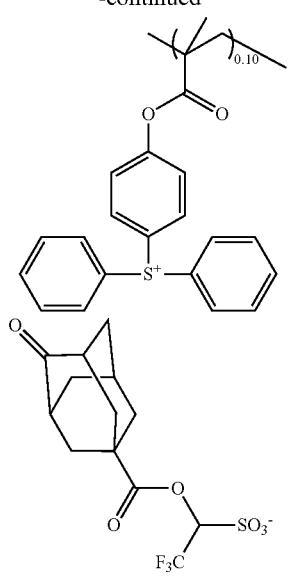
Polymer 9
Mw = 7,100
Mw/Mn = 1.75
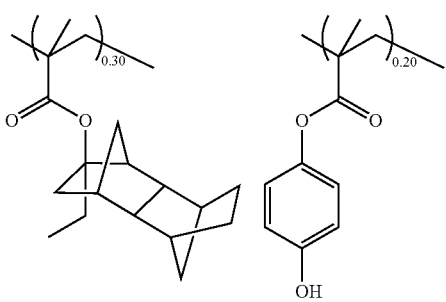
Polymer 10
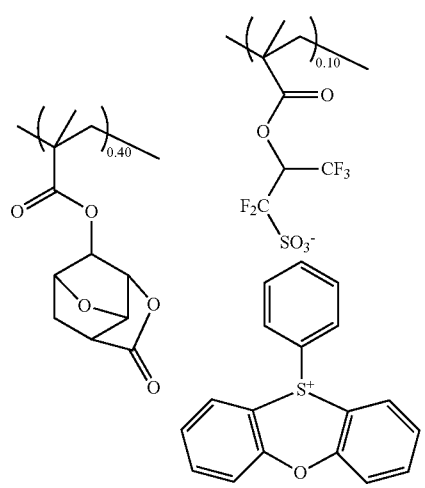
Polymer 10
Mw = 7,400
Mw/Mn = 1.99
-continued
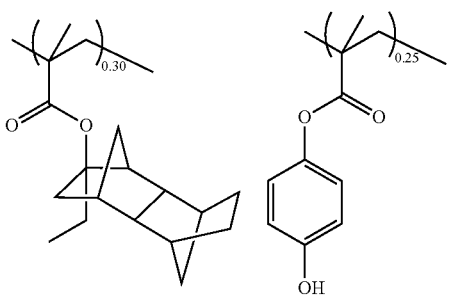
Polymer 11
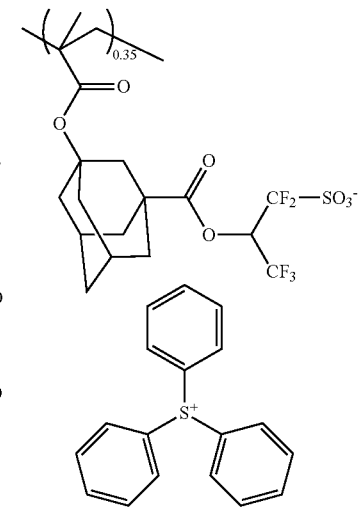
Polymer 11
Mw = 7,900
Mw/Mn = 1.64
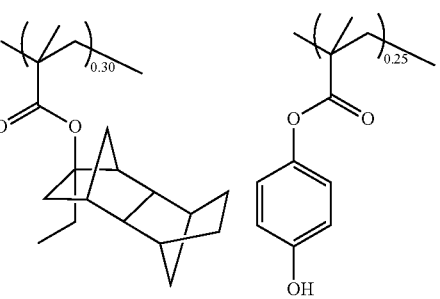
Polymer 12

-continued
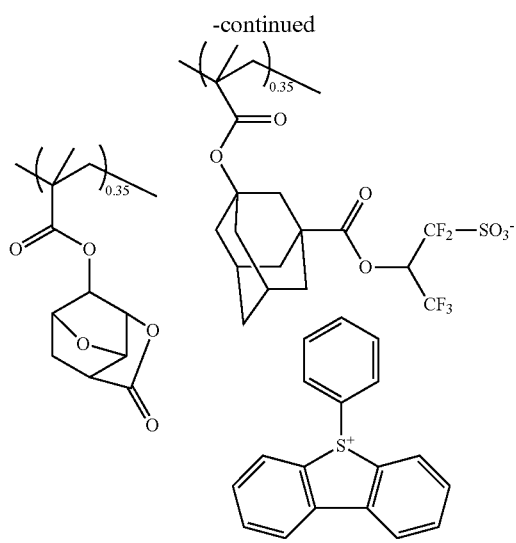
Polymer 12
Mw = 7,800
Mw/Mn = 1.68
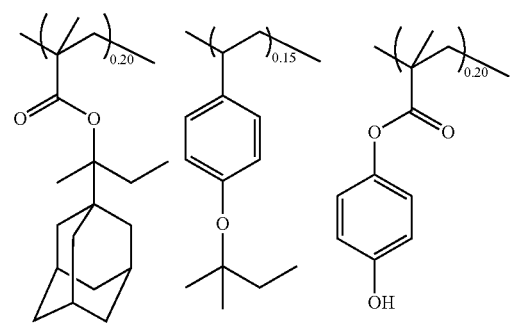
Polymer 13
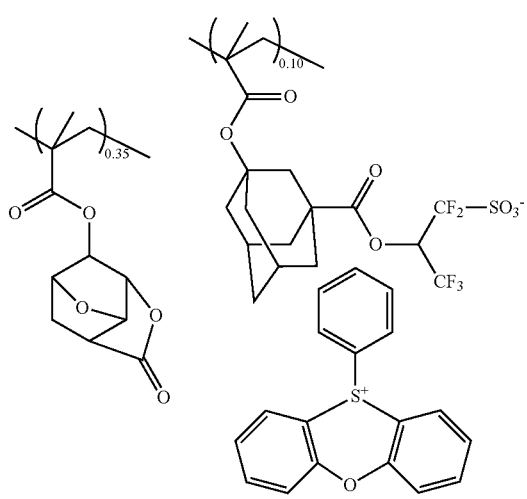
Polymer 13
Mw = 7,300
Mw/Mn = 1.63
-continued
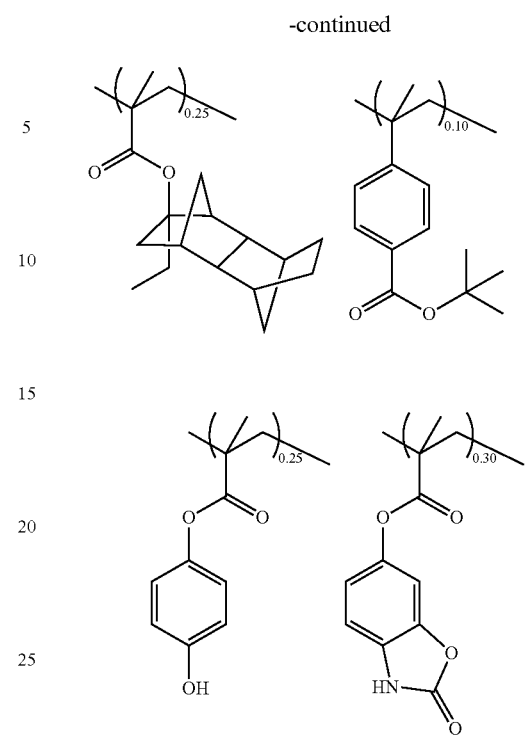
Polymer 14
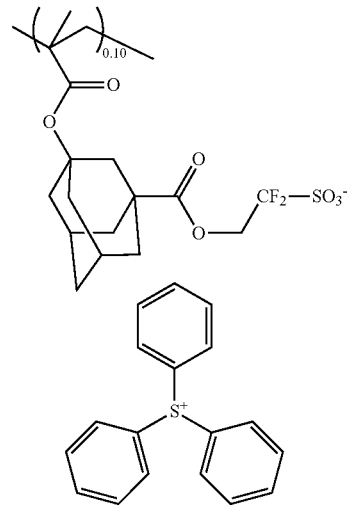
Polymer 14
Mw = 7,300
Mw/Mn = 1.63
Polymer 15
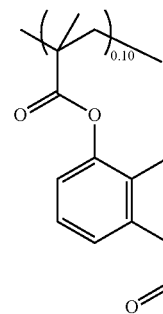

-continued

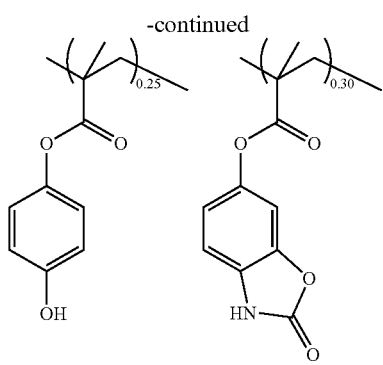

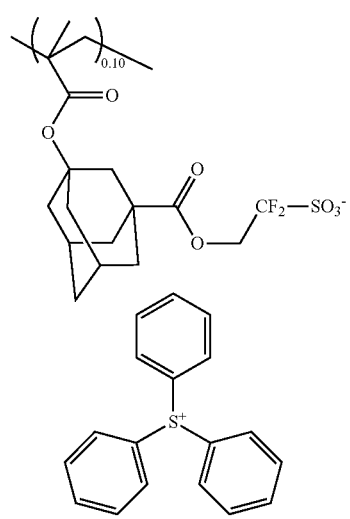

Polymer 15
Mw = 7,600
Mw/Mn = 1.76

Positive resist compositions in solution form were prepared by dissolving a polymer (Polymers 1 to 15) and components in a solvent in accordance with the formulation of Table 1 and filtering through a filter with a pore size of 0.2 μm. The solvent contained 100 ppm of surfactant FC-4430 (commercially available from 3M). The components in Table 1 are identified below.

Organic Solvents:
  PGMEA (propylene glycol monomethyl ether acetate)
  CyH (cyclohexanone)
  CyP (cyclopentanone)
  PGME (propylene glycol monomethyl ether)
  PGEE (propylene glycol monoethyl ether)
  PGPE (propylene glycol monopropyl ether)

Acid generator: PAG1 of the following structural formula

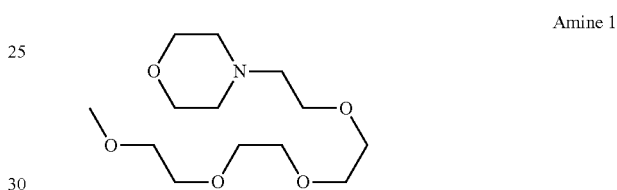

PAG 1

Basic compound: Amine 1 of the following structural formula

Amine 1

Metal compounds: the following structural formulae

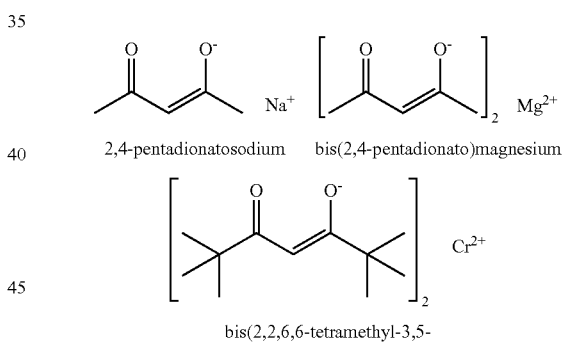

2,4-pentadionatosodium    bis(2,4-pentadionato)magnesium bis(2,2,6,6-tetramethyl-3,5-heptanedionato) chromium

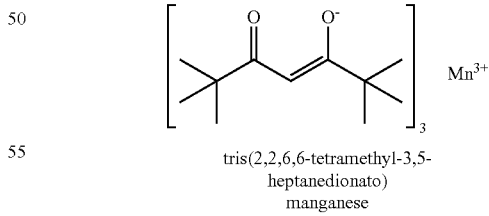

tris(2,2,6,6-tetramethyl-3,5-heptanedionato) manganese tris(2,2,6,6-tetramethyl-3,5-heptanedionato) iron

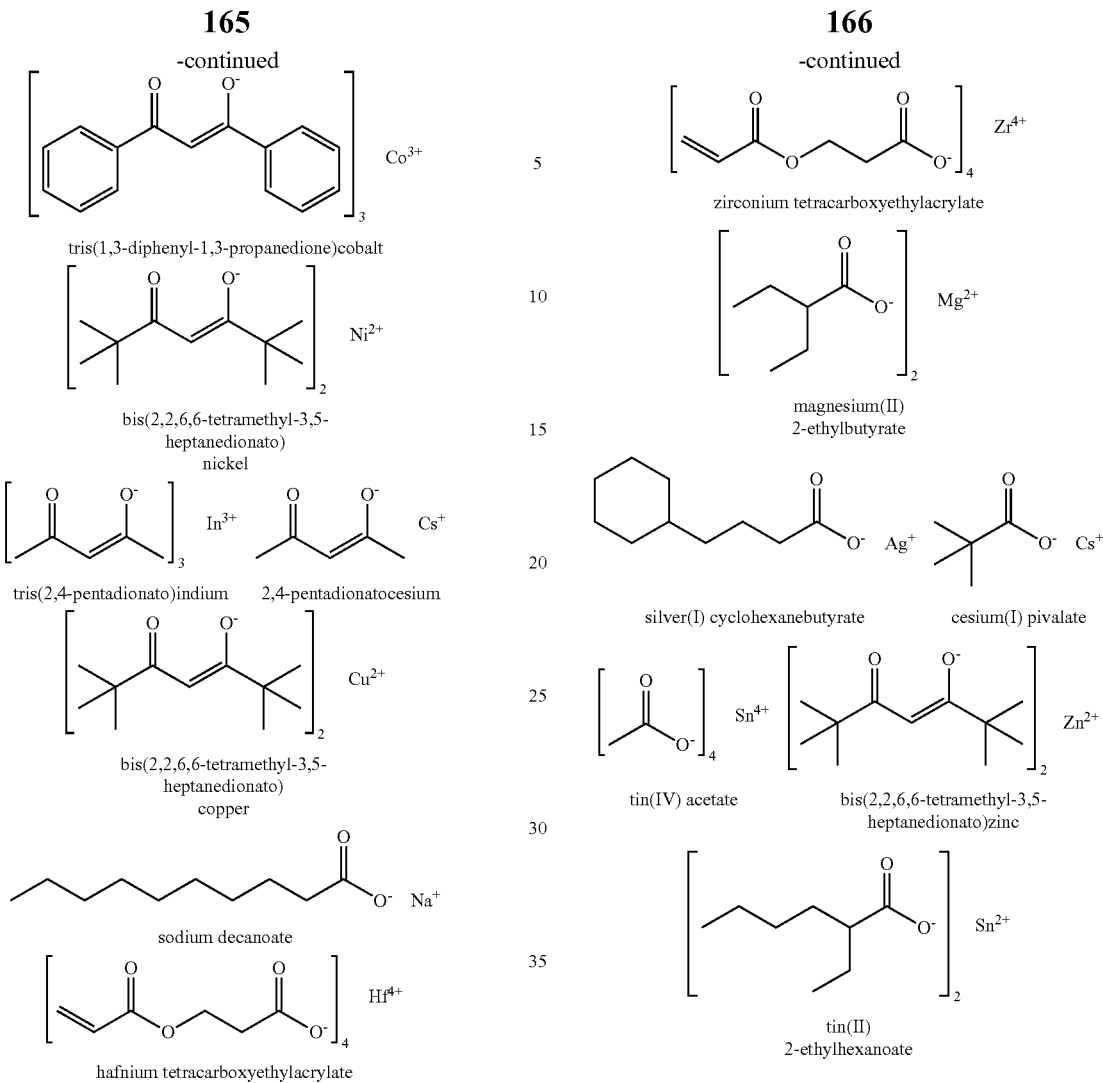

TABLE 1

|  | Polymer (pbw) | Metal compound (pbw) | Acid generator (pbw) | Quencher (pbw) | Organic solvent (pbw) |
| --- | --- | --- | --- | --- | --- |
| Resist 1 | Polymer 1 (100) | 2,4-pentadionatosodium (0.8) | PAG1 (15) | — | PGMEA(1,500) CyH(500) |
| Resist 2 | Polymer 2 (100) | bis(2,4-pentadionato)magnesium (0.8) | PAG1 (15) | — | PGMEA(1,500) CyH(500) |
| Resist 3 | Polymer 3 (100) | bis(2,2,6,6-tetramethyl-3,5-heptanedionato)chromium (1.0) | — | Amine1 (0.3) | PGMEA(400) CyH(1,500) PGME(100) |
| Resist 4 | Polymer 4 (100) | tris(2,2,6,6-tetramethyl-3,5-heptanedionato)manganese (1.0) | — | — | PGMEA(400) CyH(1,500) PGME(100) |
| Resist 5 | Polymer 5 (100) | tris(2,2,6,6-tetramethyl-3,5-heptanedionato)iron (1.0) | — | — | PGMEA(400) CyH(1,500) PGME(100) |
| Resist 6 | Polymer 6 (100) | tris(1,3-diphenyl-1,3-propanedione)cobalt (1.0) | — | — | PGMEA(400) CyP(1,000) PGPE(600) |
| Resist 7 | Polymer 7 (100) | bis(2,2,6,6-tetramethyl-3,5-heptanedionato)nickel (1.1) | — | — | PGMEA(300) CyH(1,450) CyP(250) |
| Resist 8 | Polymer 8 (100) | tris(2,4-pentadionato)indium (1.2) | — | — | PGMEA(300) CyH(1,450) CyP(250) |
| Resist 9 | Polymer 9 (100) | 2,4-pentadionatocesium (1.2) | — | — | PGMEA(300) CyH(1,450) CyP(250) |

TABLE 1-continued

| | Polymer (pbw) | Metal compound (pbw) | Acid generator (pbw) | Quencher (pbw) | Organic solvent (pbw) |
|---|---|---|---|---|---|
| Resist 10 | Polymer 10 (100) | bis(2,2,6,6-tetramethyl-3,5-heptanedionato)copper (1.3) | — | — | PGMEA(300) CyH(1,450) CyP(250) |
| Resist 11 | Polymer 11 (100) | 2,4-pentadionatocesium (1.2) | — | — | PGEE(1,000) CyH(1,000) |
| Resist 12 | Polymer 12 (100) | 2,4-pentadionatocesium (1.2) | — | — | PGEE(1,000) CyH(1,000) |
| Resist 13 | Polymer 13 (100) | 2,4-pentadionatocesium (1.2) | — | — | PGEE(1,000) CyH(1,000) |
| Resist 14 | Polymer 14 (100) | 2,4-pentadionatocesium (1.2) | — | — | PGEE(1,000) CyH(1,000) |
| Resist 15 | Polymer 15 (100) | 2,4-pentadionatocesium (1.2) | — | — | PGEE(1,000) CyH(1,000) |
| Resist 16 | Polymer 10 (100) | sodium decanoate (0.55) | — | — | PGEE(1,000) CyH(1,000) |
| Resist 17 | Polymer 10 (100) | hafnium tetracarboxyethylacrylate (1.8) | — | Amine1 (0.4) | PGEE(1,000) CyH(1,000) |
| Resist 18 | Polymer 10 (100) | zirconium tetracarboxyethylacrylate (1.6) | — | Amine1 (0.4) | PGEE(1,000) CyH(1,000) |
| Resist 19 | Polymer 10 (100) | magnesium(II) 2-ethylbutyrate (0.72) | — | — | PGEE(1,000) CyH(1,000) |
| Resist 20 | Polymer 10 (100) | silver(I) cyclohexanebutyrate (0.80) | — | — | PGEE(1,000) CyH(1,000) |
| Resist 21 | Polymer 10 (100) | cesium(I) pivalate (0.66) | — | — | PGEE(1,000) CyH(1,000) |
| Resist 22 | Polymer 10 (100) | tin(II) 2-ethylhexanoate (0.72) | — | Amine1 (0.8) | PGPE(1,000) CyH(1,000) |
| Resist 23 | Polymer 10 (100) | bis(2,2,6,6-tetramethyl-3,5-heptanedionato)zinc (1.2) | — | Amine1 (0.4) | PGMEA(300) CyH(1,450) CyP(250) |
| Resist 24 | Polymer 10 (100) | tin(IV) acetate (1.0) | — | Amine1 (0.8) | PGPE(1000) CyH(1,000) |
| Comparative Resist 1 | Polymer 2 (100) | — | PAG1 (12) | Amine1 (1.0) | PGMEA(1,500) CyH(500) |
| Comparative Resist 2 | Polymer 10 (100) | — | — | Amine1 (1.0) | PGMEA(400) CyH(1,500) PGME(100) |

EB Writing Test

Using a coater/developer system Clean Track Mark 5 (Tokyo Electron Ltd.), the positive resist composition was spin coated onto a silicon substrate (diameter 6 inches, vapor primed with hexamethyldisilazane (HMDS)) and pre-baked on a hot plate at 110° C. for 60 seconds to form a resist film of 70 nm thick. Using a system HL-800D (Hitachi Ltd.) at a HV voltage of 50 keV, the resist film was exposed imagewise to EB in a vacuum chamber.

Using Clean Track Mark 5, immediately after the imagewise exposure, the resist film was baked (PEB) on a hot plate at the temperature shown in Table 2 for 60 seconds and puddle developed in a 2.38 wt % tetramethylammonium hydroxide (TMAH) aqueous solution for 30 seconds to form a positive pattern.

Resolution is a minimum size at the exposure dose (sensitivity) that provides a 1:1 resolution of a 100-nm line-and-space pattern. The 100-nm line-and-space pattern was measured for line width roughness (LWR) under SEM.

The resist composition is shown in Table 2 along with the sensitivity and resolution of EB lithography.

TABLE 2

| | Resist | PEB temperature (° C.) | Sensitivity (μC/cm$^2$) | Resolution (nm) | LWR (nm) |
|---|---|---|---|---|---|
| Example 1-1 | Resist 1 | 85 | 23.5 | 90 | 8.9 |
| Example 1-2 | Resist 2 | 90 | 28.5 | 90 | 8.3 |
| Example 1-3 | Resist 3 | 90 | 22.0 | 80 | 6.1 |
| Example 1-4 | Resist 4 | 110 | 29.0 | 80 | 6.5 |
| Example 1-5 | Resist 5 | 95 | 22.0 | 80 | 6.1 |
| Example 1-6 | Resist 6 | 95 | 22.0 | 80 | 6.1 |
| Example 1-7 | Resist 7 | 85 | 22.0 | 80 | 6.1 |
| Example 1-8 | Resist 8 | 90 | 26.0 | 80 | 6.7 |
| Example 1-9 | Resist 9 | 85 | 26.0 | 80 | 6.5 |
| Example 1-10 | Resist 10 | 95 | 25.0 | 75 | 6.2 |
| Example 1-11 | Resist 11 | 95 | 23.0 | 75 | 5.9 |
| Example 1-12 | Resist 12 | 95 | 24.0 | 70 | 5.6 |
| Example 1-13 | Resist 13 | 80 | 27.0 | 75 | 6.0 |
| Example 1-14 | Resist 14 | 95 | 27.0 | 80 | 6.5 |
| Example 1-15 | Resist 15 | 100 | 25.0 | 80 | 6.6 |
| Example 1-16 | Resist 16 | 95 | 24.0 | 75 | 6.4 |
| Example 1-17 | Resist 17 | 95 | 28.0 | 75 | 6.4 |
| Example 1-18 | Resist 18 | 95 | 29.0 | 75 | 6.9 |
| Example 1-19 | Resist 19 | 95 | 22.0 | 75 | 6.9 |
| Example 1-20 | Resist 20 | 95 | 26.0 | 75 | 6.3 |
| Example 1-21 | Resist 21 | 95 | 19.0 | 75 | 6.6 |
| Example 1-22 | Resist 22 | 95 | 19.0 | 75 | 6.5 |
| Example 1-23 | Resist 23 | 95 | 23.0 | 75 | 6.4 |
| Example 1-24 | Resist 24 | 95 | 22.0 | 75 | 6.5 |
| Comparative Example 1-1 | Comparative Resist 1 | 90 | 36.5 | 80 | 9.9 |
| Comparative Example 1-2 | Comparative Resist 2 | 95 | 36.5 | 80 | 7.2 |

EUV Exposure Test

The positive resist composition was spin coated onto a silicon substrate (diameter 4 inches, vapor primed with hexamethyldisilazane (HMDS)) and pre-baked on a hot plate at 105° C. for 60 seconds to form a resist film of 50 nm thick. The resist film was exposed imagewise to EUV under conditions: NA 0.3 and dipole illumination.

Immediately after the imagewise exposure, the resist film was baked (PEB) on a hot plate at the temperature shown in Table 3 for 60 seconds and puddle developed in a 2.38 wt % TMAH aqueous solution for 30 seconds to form a positive pattern.

Sensitivity was an exposure dose that provided a 1:1 resolution of a 35-nm line-and-space pattern. The 35-nm line-and-space pattern at that dose was measured for LWR under SEM.

The resist composition is shown in Table 3 along with the sensitivity and resolution of EUV lithography.

TABLE 3

| | Resist | PEB temperature (° C.) | Sensitivity (mJ/cm$^2$) | LWR (nm) |
|---|---|---|---|---|
| Example 2-1 | Resist 17 | 95 | 10.0 | 3.1 |
| Example 2-2 | Resist 18 | 95 | 10.0 | 3.1 |
| Example 2-3 | Resist 19 | 95 | 9.0 | 3.3 |
| Example 2-4 | Resist 20 | 95 | 9.0 | 3.2 |
| Example 2-5 | Resist 21 | 95 | 9.0 | 3.1 |
| Example 2-6 | Resist 22 | 95 | 10.5 | 3.3 |
| Example 2-7 | Resist 23 | 95 | 11.0 | 3.3 |
| Example 2-8 | Resist 24 | 95 | 10.0 | 3.4 |
| Comparative Example 2-1 | Comparative Resist 2 | 95 | 13.5 | 4.3 |

It is evident from Tables 2 and 3 that the resist compositions of Examples have a sufficient resolution and a high sensitivity and are fully reduced in edge roughness. The resist compositions of Comparative Examples have a sufficient resolution, but their sensitivity and LWR values are noticeably inferior to those of Examples.

It is demonstrated that the resist composition comprising a polymer comprising acid labile group-substituted recurring units and preferably acid generator-bearing recurring units, to which a salt of mono- to tetra-functional $C_1$-$C_{20}$ carboxylic acid or complex of β-diketone with a metal selected from among sodium, magnesium, chromium, manganese, iron, cobalt, nickel, copper, zinc, silver, cadmium, indium, tin, antimony, cesium, zirconium, and hafnium is added, exhibits a high resolution, a high sensitivity, and a minimal LER. The resist composition is best suited as the resist material for VLSIs and patterning material for masks.

While the invention has been described with reference to a preferred embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application No. 2011-161640 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified resist composition comprising a polymer comprising recurring units (a1) of acid labile group-substituted (meth)acrylic acid, styrenecarboxylic acid or vinylnaphthalenecarboxylic acid, recurring units (a2) having an acid labile group-substituted phenolic hydroxyl group represented by the following formula (1) or both recurring units (a1) and recurring units (a2):

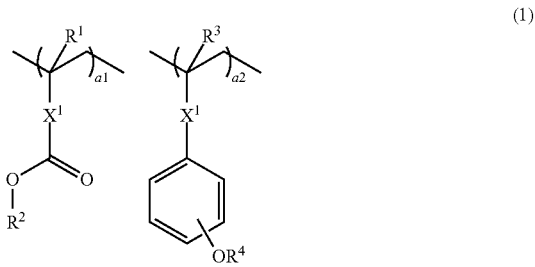

wherein $R^1$ and $R^3$ are each independently hydrogen or methyl, $R^2$ and $R^4$ each are an acid labile group, $X_1$ is a single bond, a $C_1$-$C_{12}$ linking group having at least one of ester moiety, lactone ring, phenylene moiety or naphthylene moiety, a phenylene group, or a naphthylene group, $X_2$ is a single bond or an ester or amide group, a1 and a2 are numbers in the range: 0≤a1≤0.9, 0≤a2≤0.9, and 0≤a1+a2<1, and an acid generator, said resist composition further comprising a metal salt selected from the group consisting of the following general formulae:

| | | |
|---|---|---|
| $Cr^{2+}(R^{11}COO^-)_2$ | $Cr^{2+}R^{12}(COO^-)_2$ | |
| $Cr^{3+}(R^{11}COO^-)_3$ | $(Cr^{3+})_2(R^{12}(COO^-)_2)_3Cr_3^{3+}(R^{11}COO^-)_7(OH)_2$ | |
| $(Cr^{3+})_2(R^{13}COO^-)_6$ | | |
| $Mn^{2+}(R^{11}COO^-)_2$ | $Mn^{2+}R^{12}(COO^-)_2$ | $Mn^{3+}(R^{11}COO^-)_3$ |
| $(Mn^{3+})_2(R^{12}(COO^-)_2)_3$ | | |
| $Fe^{2+}R^{12}(COO^-)_2$ | $Fe^{3+}(R^{11}COO^-)_3$ | $(Fe^{3+})_2(R^{12}(COO^-)_2)_3$ |
| $Fe^{3+}R^{13}(COO^-)_3$ | $Fe^{2+}(R^{11}COO^-)_2$ | |
| $Co^{2+}(R^{11}COO^-)_2$ | $Co^{2+}R^{12}(COO^-)_2$ | |
| $Ni^{2+}(R^{11}COO^-)_2$ | $Ni^{2+}R^{12}(COO^-)_2$ | |
| $Cu^+R^{11}COO^-$ | $(Cu^+)_2R^{12}(COO^-)_2$ | $Cu^{2+}(R^{11}COO^-)_2$ |
| $Cu^{2+}R^{12}(COO^-)_2$ | | |
| $Zn^+R^{11}COO^-$ | $(Zn^+)_2R^{12}(COO^-)_2$ | $Zn^{2+}(R^{11}COO^-)_2$ |
| $Ag^+R^{11}COO^-$ | $(Ag^+)_2R^{12}(COO^-)_2$ | |
| $Cd^{2+}(R^{11}COO^-)_2$ | $Cd^{2+}R^{12}(COO^-)_2$ | |
| $Sn^{2+}(R^{11}COO^-)_2$ | $Sn^{2+}R^{12}(COO^-)_2$ | $Sn^{4+}(R^{11}COO^-)_4$ |
| $Sn^{4+}(R^{12}(COO^-)_2)_2$ | $Sn^{4+}R^{14}(COO^-)_4$ | |
| $Sb^{3+}(R^{11}COO^-)_3$ | $(Sb^{3+})_2(R^{12}(COO^-)_2)_3$ | $Sb^{3+}R^{11}(COO^-)_3$ |
| $Hf^{4+}(R^{11}COO^-)_4$ | $Hf^{4+}(R^{12}COO^-)_2)_2$ | $Hf^{4+}R^{14}(COO^-)_4$ | wherein $R^{11}$ is each independently hydrogen, or a straight, branched or cyclic $C_1$-$C_{20}$ alkyl, $C_2$-$C_{20}$ alkenyl, $C_2$-$C_{20}$ alkynyl, or $C_6$-$C_{20}$ aryl group which may have a hydroxyl, ether, ester, amino, amide, sulfonic acid ester, halogen, cyano, nitro, carbonate, carbamate, thiol, sulfide, thioketone radical or hetero-aromatic ring; $R^{12}$ is a single bond, or a straight, branched or cyclic $C_1$-$C_{20}$ alkylene, alkenylene, alkynylene, or $C_6$-$C_{20}$ arylene group which may have a hydroxyl, ether, ester, amino, amide, sulfonic acid ester, halogen, cyano, nitro, carbonate, carbamate, thiol, sulfide, thioketone radical or hetero-aromatic ring; $R^{13}$ and $R^{14}$ each are an alkylene, arylene, alkenylene or alkynylene group as defined for $R^{12}$, in which one or two hydrogen atoms are substituted by one or two carboxyl groups, said metal salt being present in an amount of 0.02 to 30 parts by weight per 100 parts by weight of the polymer.

2. The chemically amplified resist composition of claim 1, wherein in addition to the recurring units (a1) and (a2), the copolymer comprises recurring units (b1), (b2) or (b3) of a sulfonium salt having the general formula (2):

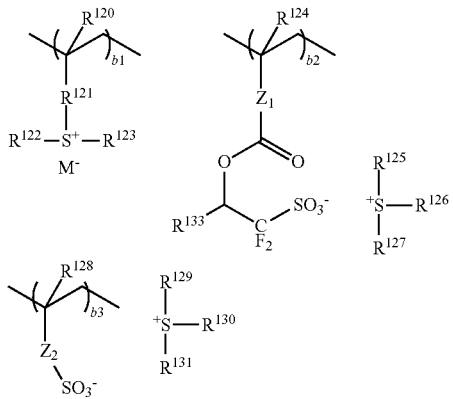

(2)

wherein $R^{120}$, $R^{124}$, and $R^{128}$ each are hydrogen or methyl, $R^{121}$ is a single bond, phenylene, —O—R—, or —C(=O)—Y—R—, Y is oxygen or NH, R is a straight, branched or cyclic $C_1$-$C_6$ alkylene group, $C_3$-$C_{10}$ alkenylene or phenylene group, which may contain a carbonyl, ester, ether or hydroxyl moiety, $R^{122}$, $R^{123}$, $R^{125}$, $R^{126}$, $R^{127}$, $R^{129}$, $R^{130}$, and $R^{131}$ are each independently a straight, branched or cyclic $C_1$-$C_{12}$ alkyl group which may contain a carbonyl, ester or ether moiety, or a $C_6$-$C_{12}$ aryl, $C_7$-$C_{20}$ aralkyl, or thiophenyl group which may contain a straight, branched or cyclic $C_1$-$C_{10}$ alkyl, halogen, trifluoromethyl, cyano, nitro, hydroxyl, alkoxy, alkoxycarbonyl or acyloxy radical, $Z_1$ is a single bond or —C(=O)—$Z_3$—$R^{132}$—, $Z_2$ is a single bond, methylene, ethylene, phenylene, fluorinated phenylene —O—$R^{132}$— or —C(=O)—$Z_3$—$R^{132}$, $Z_3$ is oxygen or NH, $R^{132}$ is a straight, branched or cyclic $C_1$-$C_6$ alkylene group, alkenylene, or phenylene group, which may contain a carbonyl, ester, ether or hydroxyl moiety, a pair of $R^{122}$ and $R^{123}$, $R^{125}$ and $R^{126}$, $R^{125}$ and $R^{127}$, $R^{126}$ and $R^{127}$, $R^{129}$ and $R^{130}$, $R^{129}$ and $R^{131}$, or $R^{130}$ and $R^{131}$ may bond directly or via a methylene moiety or ether bond to form a ring with the sulfur atom, $R^{133}$ is hydrogen or trifluoromethyl, M⁻ is a non-nucleophilic counter ion, b1, b2 and b3 are in the range of 0≤b1≤0.5, 0≤b2≤0.5, 0≤b3≤0.5, and 0≤b1+b2+b3≤0.5.

3. The chemically amplified resist composition of claim 1, further comprising at least one component selected from the group consisting of an organic solvent, a dissolution inhibitor, an acid generator, a basic compound, and a surfactant.

4. The chemically amplified resist composition of claim 1, wherein the metal salt is present in an amount of 0.55 to 20 parts by weight per 100 parts by weight of the polymer.

5. The chemically amplified resist composition of claim 1, wherein said metal salt is selected from the group consisting of the following general formulae:

| | | |
|---|---|---|
| $Cr^{2+}(R^{11}COO^-)_2$ | $Cr^{2+}R^{12}(COO^-)_2$ | |
| $Cr^{3+}(R^{11}COO^-)_3$ | $(Cr^{3+})_2(R^{12}COO^-)_2)_3$ | $Cr_3^{3+}(R^{11}COO^-)_7(OH)_2$ |
| $(Cr^{3+})_2(R^{13}COO^-)_6$ | | |
| $Mn^{2+}(R^{11}COO^-)_2$ | $Mn^{2+}R^{12}(COO^-)_2$ | $Mn^{3+}(R^{11}COO^-)_3$ |
| $(Mn^{3+})_2(R^{12}(COO^-)_2)_3$ | | |
| $Fe^{2+}R^{12}(COO^-)_2$ | $Fe^{3+}(R^{11}COO^-)_3$ | $(Fe^{3+})_2(R^{12}(COO^-)_2)_3$ |
| $Fe^{3+}R^{13}(COO^-)_3$ | $Fe^{2+}(R^{11}COO^-)_2$ | |
| $Co^{2+}(R^{11}COO^-)_2$ | $Co^{2+}R^{12}(COO^-)_2$ | |
| $Ni^{2+}(R^{11}COO^-)_2$ | $Ni^{2+}R^{12}(COO^-)_2$ | |
| $Zn^+R^{11}COO^-$ | $(Zn^+)_2R^{12}(COO^-)_2$ | $Zn^{2+}(R^{11}COO^-)_2$ |
| $Ag^+R^{11}COO^-$ | $(Ag^+)_2R^{12}(COO^-)_2$ | |
| $Cd^{2+}(R^{11}COO^-)_2$ | $Cd^{2+}R^{12}(COO^-)_2$ | |
| $Sn^{2+}(R^{11}COO^-)_2$ | $Sn^{2+}R^{12}(COO^-)_2$ | $Sn^{4+}(R^{11}COO^-)_4$ |
| $Sn^{4+}(R^{12}(COO^-)_2)_2$ | $Sn^{4+}R^{14}(COO^-)_4$ | |
| $Sb^{3+}(R^{11}COO^-)_3$ | $(Sb^{3+})_2(R^{12}(COO^-)_2)_3$ | $Sb^{3+}R^{13}(COO^-)_3$ |
| $Hf^{4+}(R^{11}COO^-)_4$ | $Hf^{4+}(R^{12}(COO^-)_2)_2$ | $Hf^{4+}R^{14}(COO^-)_4$ | wherein $R^{11}$ is each independently hydrogen, or a straight, branched or cyclic $C_1$-$C_{20}$ alkyl, $C_2$-$C_{20}$ alkenyl, $C_2$-$C_{20}$ alkynyl, or $C_6$-$C_{20}$ aryl group which may have a hydroxyl, ether, ester, amino, amide, sulfonic acid ester, halogen, cyano, nitro, carbonate, carbamate, thiol, sulfide, thioketone radical or hetero-aromatic ring; $R^{12}$ is a single bond, or a straight, branched or cyclic $C_1$-$C_{20}$ alkylene, alkenylene, alkynylene, or $C_6$-$C_{20}$ arylene group which may have a hydroxyl, ether, ester, amino, amide, sulfonic acid ester, halogen, cyano, nitro, carbonate, carbamate, thiol, sulfide, thioketone radical or hetero-aromatic ring; $R^{13}$ and $R^{14}$ each are an alkylene, arylene, alkenylene or alkynylene group as defined for $R^{12}$, in which one or two hydrogen atoms are substituted by one or two carboxyl groups.

6. A pattern forming process comprising the steps of coating the chemically amplified resist composition of claim 1 onto a substrate, baking, exposing to high-energy radiation, and developing with a developer.

7. The process of claim 6 wherein the high-energy radiation is EUV radiation having a wavelength of 3 to 15 nm.

8. The process of claim 6 wherein the high-energy radiation is an electron beam at an accelerating voltage of 1 to 150 keV.

* * * * *